US012477856B2

(12) United States Patent
Lu et al.

(10) Patent No.: US 12,477,856 B2
(45) Date of Patent: Nov. 18, 2025

(54) PHOTO-DETECTING APPARATUS WITH LOW DARK CURRENT

(71) Applicant: Artilux, Inc., Menlo Park, CA (US)

(72) Inventors: Yen-Cheng Lu, Zhubei (TW); Yun-Chung Na, San Jose, CA (US); Shu-Lu Chen, Zhubei (TW); Yen-Ju Lin, Zhubei (TW)

(73) Assignee: Artilux, Inc., Menlo Park, CA (US)

(*) Notice: Subject to any disclaimer, the term of this patent is extended or adjusted under 35 U.S.C. 154(b) by 462 days.

(21) Appl. No.: 17/687,397

(22) Filed: Mar. 4, 2022

(65) Prior Publication Data

US 2022/0262974 A1 Aug. 18, 2022

Related U.S. Application Data

(63) Continuation-in-part of application No. 17/005,288, filed on Aug. 27, 2020, now Pat. No. 11,777,049.
(Continued)

(51) Int. Cl.
*H10F 55/255* (2025.01)
*G01S 7/481* (2006.01)
(Continued)

(52) U.S. Cl.
CPC .......... *H10F 55/255* (2025.01); *G01S 7/4813* (2013.01); *G01S 7/4814* (2013.01);
(Continued)

(58) Field of Classification Search
CPC ................. H01L 31/173; H01L 25/167; H01L 27/14645; H01L 31/02027; H01L 31/1075;
(Continued)

(56) References Cited

U.S. PATENT DOCUMENTS 3,621,466 A 11/1971 Toshio
4,275,404 A * 6/1981 Cassiday .............. H01L 31/173 257/85

(Continued)

FOREIGN PATENT DOCUMENTS

CN 1853276 10/2006
CN 104617119 5/2015

(Continued)

OTHER PUBLICATIONS

Bamji et al., "A 0.13 μm CMOS System-on-Chip for a 512×424 Time-of-Flight Image Sensor With Multi-Frequency Photo-Demodulation up to 130 MHz and 2 GS/s ADC," IEEE J. Solid-State Circuits, Jan. 2015, 50(1):303-319.

(Continued)

*Primary Examiner* — Bitew A Dinke
(74) *Attorney, Agent, or Firm* — Fish & Richardson P.C.

(57) ABSTRACT

An optical sensing apparatus is provided. The optical sensing apparatus includes a semiconductor substrate composed of a first material; a transmitter-receiver set supported by the semiconductor substrate and including: (1) a photodetector includes an absorption region composed of a second material including germanium and configured to receive an optical signal and to generate photo-carriers in response to the optical signal; and (2) a light source including a light-emitting region composed of a third material including germanium and configured to emit a light toward a target; wherein the absorption region includes at least a property different from a property of the light-emitting region, wherein the property includes strain, conductivity type, peak doping concentration, or a ratio of the peak doping concentration to a peak doping concentration of the semiconductor substrate; wherein the first material is different from the second material and the third material.

18 Claims, 91 Drawing Sheets

Related U.S. Application Data

(60) Provisional application No. 62/892,551, filed on Aug. 28, 2019, provisional application No. 62/899,153, filed on Sep. 12, 2019, provisional application No. 62/929,089, filed on Oct. 31, 2019, provisional application No. 63/053,723, filed on Jul. 20, 2020, provisional application No. 63/173,488, filed on Apr. 11, 2021, provisional application No. 63/174,567, filed on Apr. 14, 2021, provisional application No. 63/180,063, filed on Apr. 26, 2021, provisional application No. 63/191,335, filed on May 21, 2021.

(51) Int. Cl.
*H01L 25/16* (2023.01)
*H10F 39/18* (2025.01)

(52) U.S. Cl.
CPC .......... *G01S 7/4816* (2013.01); *H01L 25/167* (2013.01); *H10F 39/182* (2025.01)

(58) Field of Classification Search
CPC ....... H01L 27/14806; H01L 31/035281; H01L 27/1461; G01S 7/4813; G01S 7/4814; G01S 7/4816; G01S 7/4811; H10F 55/25
See application file for complete search history.

(56) References Cited

U.S. PATENT DOCUMENTS 4,341,918 A 7/1982 Evans, Jr. et al.
4,695,859 A * 9/1987 Guha ................ H04N 1/02805 257/65
5,453,611 A 9/1995 Oozu
5,466,948 A * 11/1995 Worley ................ H01L 31/173 257/77
5,673,284 A 9/1997 Congdon et al.
5,780,875 A * 7/1998 Tsuji ................... G02B 6/4249 385/83
5,965,875 A 10/1999 Merrill
6,316,286 B1 * 11/2001 Trezza .................... G02B 6/43 438/129
6,509,203 B2 1/2003 Spartiotis et al.
6,527,456 B1 * 3/2003 Trezza .................... G02B 6/43 385/116
6,806,111 B1 * 10/2004 Ehrichs ............ H01L 21/76801 257/E21.582
7,090,133 B2 8/2006 Zhu
7,340,709 B1 3/2008 Masini et al.
7,411,265 B2 8/2008 Sekiguchi
7,495,583 B2 * 2/2009 Tan ................... G01D 5/34715 341/11
7,629,661 B2 12/2009 Rafferty et al.
7,750,958 B1 7/2010 Dierickx
7,826,058 B1 11/2010 Ulrich et al.
7,884,310 B2 2/2011 Buettgen
7,961,301 B2 6/2011 Earhart et al.
8,129,813 B2 3/2012 Herz
8,405,823 B2 3/2013 Pfaff
8,471,895 B2 6/2013 Banks
9,030,832 B2 * 5/2015 Kwong ................ G01J 1/0488 361/752
9,236,520 B2 1/2016 Okhonin
9,643,181 B1 * 5/2017 Chang ............... G01N 21/6486
10,254,389 B2 4/2019 Na et al.
10,310,060 B2 6/2019 Na et al.
10,353,056 B2 7/2019 Na et al.
10,418,407 B2 9/2019 Na et al.
10,613,202 B2 4/2020 Roy et al.
10,690,495 B2 6/2020 Takagi et al.
10,739,443 B2 8/2020 Na et al.
10,741,598 B2 8/2020 Na et al.
10,795,003 B2 10/2020 Na et al.
10,840,239 B2 11/2020 Or-Bach et al.
10,886,309 B2 1/2021 Na et al.
10,886,312 B2 1/2021 Na et al.
10,896,931 B1 1/2021 Sekar et al.
11,105,928 B2 8/2021 Cheng et al.
11,131,757 B2 9/2021 Na et al.
11,579,267 B2 2/2023 Na et al.
11,637,142 B2 4/2023 Na et al.
11,652,184 B2 5/2023 Lu et al.
11,747,450 B2 9/2023 Na et al.
11,777,049 B2 10/2023 Lu et al.
12,072,448 B2 8/2024 Na et al.
12,243,901 B2 3/2025 Na et al.
12,278,252 B2 4/2025 Lu et al.
2001/0000316 A1 * 4/2001 Kawai ................. G02B 6/4266 385/33
2001/0017786 A1 8/2001 Woodward
2002/0070417 A1 * 6/2002 Kimura .............. H01L 27/1443 257/E27.128
2002/0072138 A1 * 6/2002 Trezza ................. H01S 5/0262 438/455
2003/0042500 A1 3/2003 Rhodes et al.
2003/0183893 A1 * 10/2003 Li ........................... G02B 6/43 257/451
2004/0208439 A1 * 10/2004 Bell ........................ G02B 6/43 385/32
2005/0051730 A1 3/2005 Kuijk et al.
2005/0167709 A1 8/2005 Augusto
2006/0291362 A1 * 12/2006 Nakanishi ............... G11B 7/22
2007/0114626 A1 5/2007 Kang et al.
2007/0164767 A1 7/2007 Herz
2008/0017883 A1 1/2008 Sarid et al.
2008/0303058 A1 12/2008 Mori et al.
2009/0121236 A1 * 5/2009 Worley ................ H01L 31/173 257/E33.044
2009/0166684 A1 7/2009 Yahav et al.
2009/0173976 A1 7/2009 Augusto
2009/0237770 A1 9/2009 Kim et al.
2010/0291730 A1 11/2010 Uya et al.
2011/0031578 A1 2/2011 Miura et al.
2011/0128430 A1 6/2011 Fossum
2011/0255071 A1 10/2011 Van Der Tempel et al.
2012/0001234 A1 1/2012 Lim et al.
2012/0148190 A1 * 6/2012 Tamanuki ........... G02B 6/4246 385/33
2012/0290255 A1 * 11/2012 Kelkar ................. H01L 25/167 257/E33.076
2012/0307232 A1 12/2012 Mase
2012/0326259 A1 12/2012 Huang et al.
2013/0026548 A1 1/2013 McCarten
2013/0119234 A1 5/2013 Lee et al.
2013/0155390 A1 * 6/2013 Jensen .............. G01B 11/0675 356/630
2013/0202005 A1 * 8/2013 Dutt ..................... H01S 5/3201 372/50.1
2013/0214161 A1 8/2013 Cazuax et al.
2013/0292741 A1 11/2013 Huang et al.
2014/0002700 A1 1/2014 Oishi
2014/0111664 A1 4/2014 Kumano
2014/0117428 A1 5/2014 Lee et al.
2014/0133508 A1 5/2014 Huang et al.
2014/0225173 A1 8/2014 Kim et al.
2014/0312206 A1 10/2014 Okhonin et al.
2014/0340487 A1 11/2014 Gilliland et al.
2014/0367740 A1 12/2014 Morse
2015/0001664 A1 1/2015 Van Der Tempel et al.
2015/0097256 A1 4/2015 Ang et al.
2015/0236478 A1 8/2015 Huang et al.
2015/0277043 A1 * 10/2015 Shimizu ............ G02B 6/12004 438/31
2016/0014352 A1 1/2016 Moriyama et al.
2016/0056315 A1 2/2016 Shibata et al.
2016/0064439 A1 * 3/2016 Or-Bach ........... H01L 27/14623 257/443
2016/0103278 A1 * 4/2016 Cheng .................. H10F 30/223 438/24
2016/0141329 A1 5/2016 Cheng et al.
2016/0148959 A1 5/2016 Cheng et al.
2016/0150174 A1 5/2016 Hynecek

(56) References Cited

U.S. PATENT DOCUMENTS

| | | | | |
|---|---|---|---|---|
| 2016/0155883 | A1 | 6/2016 | Shi et al. | |
| 2016/0161599 | A1 | 6/2016 | Seliuchenko | |
| 2016/0211402 | A1 | 7/2016 | Joo et al. | |
| 2016/0225922 | A1 | 8/2016 | Akkaya et al. | |
| 2016/0233370 | A1* | 8/2016 | Jiang | H01L 33/08 |
| 2016/0316159 | A1 | 10/2016 | Yoneda | |
| 2017/0025454 | A1 | 1/2017 | Cheng et al. | |
| 2017/0040361 | A1 | 2/2017 | Ikeda et al. | |
| 2017/0040362 | A1* | 2/2017 | Na | H01L 31/1876 |
| 2017/0062508 | A1 | 3/2017 | Na et al. | |
| 2017/0084775 | A1* | 3/2017 | Li | B01L 3/502707 |
| 2017/0131389 | A1 | 5/2017 | Na et al. | |
| 2017/0213821 | A1 | 7/2017 | Or-Bach et al. | |
| 2017/0230598 | A1 | 8/2017 | Takayanagi et al. | |
| 2017/0261425 | A1* | 9/2017 | Deliwala | G01N 33/18 |
| 2018/0061883 | A1 | 3/2018 | Na et al. | |
| 2018/0102442 | A1* | 4/2018 | Wang | H01L 31/02327 |
| 2018/0114878 | A1* | 4/2018 | Danesh | H01L 25/50 |
| 2018/0175095 | A1 | 6/2018 | Sallin et al. | |
| 2018/0180546 | A1 | 6/2018 | Rothberg et al. | |
| 2018/0182913 | A1* | 6/2018 | Chen | G01S 17/04 |
| 2018/0188356 | A1 | 7/2018 | Na et al. | |
| 2018/0190698 | A1 | 7/2018 | Na et al. | |
| 2018/0190702 | A1 | 7/2018 | Na et al. | |
| 2018/0233521 | A1 | 8/2018 | Na et al. | |
| 2018/0247968 | A1 | 8/2018 | Na et al. | |
| 2018/0308882 | A1 | 10/2018 | Cheng et al. | |
| 2018/0341020 | A1 | 11/2018 | Magee et al. | |
| 2019/0006630 | A1 | 1/2019 | Chen et al. | |
| 2019/0019899 | A1* | 1/2019 | Wang | H01L 31/02 |
| 2019/0033432 | A1 | 1/2019 | Na et al. | |
| 2019/0035831 | A1 | 1/2019 | Cao et al. | |
| 2019/0049564 | A1 | 2/2019 | Na et al. | |
| 2019/0064372 | A1 | 2/2019 | Cao et al. | |
| 2019/0103435 | A1 | 4/2019 | Na et al. | |
| 2019/0113387 | A1* | 4/2019 | Lee | G01J 3/42 |
| 2019/0140133 | A1 | 5/2019 | Chen et al. | |
| 2019/0235677 | A1* | 8/2019 | Liu | G06F 3/042 |
| 2019/0267498 | A1 | 8/2019 | Cheng et al. | |
| 2019/0302243 | A1 | 10/2019 | Na et al. | |
| 2019/0312158 | A1 | 10/2019 | Na et al. | |
| 2019/0319139 | A1 | 10/2019 | Cho et al. | |
| 2019/0348463 | A1 | 11/2019 | Na et al. | |
| 2020/0028000 | A1* | 1/2020 | Wang | H01L 31/09 |
| 2020/0035862 | A1* | 1/2020 | Zhang | H10F 77/206 |
| 2020/0052016 | A1 | 2/2020 | Na et al. | |
| 2020/0091217 | A1 | 3/2020 | Horikoshi et al. | |
| 2020/0177829 | A1 | 6/2020 | Takahashi et al. | |
| 2020/0192032 | A1 | 6/2020 | Na et al. | |
| 2020/0194480 | A1 | 6/2020 | Na et al. | |
| 2020/0249327 | A1 | 8/2020 | Na et al. | |
| 2020/0303581 | A1 | 9/2020 | Immer et al. | |
| 2020/0319345 | A1 | 10/2020 | Cheng et al. | |
| 2020/0356016 | A1* | 11/2020 | Sampayan | G03G 5/04 |
| 2020/0382736 | A1 | 12/2020 | Na et al. | |
| 2020/0395393 | A1 | 12/2020 | Na et al. | |
| 2021/0003448 | A1* | 1/2021 | Siess | G01J 3/28 |
| 2021/0058042 | A1 | 2/2021 | Na et al. | |
| 2021/0066529 | A1 | 3/2021 | Lu et al. | |
| 2021/0084249 | A1 | 3/2021 | Nakazawa et al. | |
| 2021/0091246 | A1 | 3/2021 | Chern | |
| 2021/0126027 | A1 | 4/2021 | Na et al. | |
| 2021/0272990 | A1 | 9/2021 | Lo et al. | |
| 2021/0273024 | A1 | 9/2021 | Wang | |
| 2021/0302549 | A1 | 9/2021 | Na et al. | |
| 2021/0348967 | A1* | 11/2021 | Leirer | G01N 21/35 |
| 2021/0351223 | A1 | 11/2021 | Nomoto | |
| 2021/0391370 | A1 | 12/2021 | Lu et al. | |
| 2022/0042877 | A1* | 2/2022 | Fukuda | H01L 33/34 |
| 2022/0181378 | A1 | 6/2022 | Lu et al. | |
| 2022/0262835 | A1 | 8/2022 | Chen et al. | |
| 2023/0184907 | A1 | 6/2023 | Na et al. | |
| 2023/0215902 | A1 | 7/2023 | Na et al. | |
| 2023/0275177 | A1 | 8/2023 | Lu et al. | |

FOREIGN PATENT DOCUMENTS

| | | | |
|---|---|---|---|
| CN | 105789347 | | 7/2016 |
| EP | 0278408 | | 8/1988 |
| EP | 2081004 | | 7/2009 |
| EP | 2330637 | | 6/2011 |
| JP | H0548139 | | 2/1993 |
| JP | 2007-506269 | | 3/2007 |
| JP | 2007-150261 | | 6/2007 |
| JP | 2009-047658 | | 3/2009 |
| JP | 2011-066097 | | 3/2011 |
| JP | 2011-128024 | | 6/2011 |
| JP | 2011-211019 | | 10/2011 |
| JP | 2012-029130 | | 2/2012 |
| JP | 2013-084786 | | 5/2013 |
| JP | 2013-541860 | | 11/2013 |
| JP | 2015-050463 | | 3/2015 |
| JP | 2016-092738 | | 5/2016 |
| JP | 2017-147352 | | 8/2017 |
| JP | 2017-220581 | | 12/2017 |
| JP | 2018-021764 | | 2/2018 |
| JP | 2018-032810 | A | 3/2018 |
| JP | 2018-082089 | | 5/2018 |
| JP | 2018-124218 | A | 8/2018 |
| JP | 2018-152489 | A | 9/2018 |
| JP | 2019-510365 | | 4/2019 |
| JP | 2020-516200 | | 5/2020 |
| KR | 10-2006-0077183 | | 7/2006 |
| WO | WO 2005/036647 | | 4/2005 |
| WO | WO 2013/104718 | | 7/2013 |
| WO | WO 2015/104307 | | 7/2015 |
| WO | WO 2015/151790 | | 10/2015 |
| WO | WO 2016/038416 | | 3/2016 |
| WO | WO 2016/077791 | | 5/2016 |
| WO | WO 2016/187566 | | 11/2016 |
| WO | WO 2016/208215 | | 12/2016 |
| WO | WO 2017/018477 | | 2/2017 |
| WO | WO 2017/022219 | | 2/2017 |

OTHER PUBLICATIONS

Bandaru et al., "Fabrication and characterization of low temperature (<450° C.) grown p-Ge/n-Si photodetectors for silicon based photonics," Materials Scoence and Engineering B, 2004, 113:79-84.

Bianco et al., "A Comparative Analysis between Active and Passive Techniques for Underwater 3D Reconstruction of Close-Range Objects," Sensors, Aug. 20, 2013, 13(8):11007-11031.

Chen et al., "Self-Aligned Microbonded Germanium Metal-Semiconductor-Metal Photodetectors Butt-Coupled to Si Waveguides," IEEE J. Sel. Top. Quant. Electron. Nov. 2014, 20(6):3800605, 5 pages.

Dalla Betta et al., "Design and Characterization of Current-Assisted Photonic Demodulators in 0.18-μm CMOS Technology," IEEE Trans. Electron. Dev., Jun. 2011, 58(6):1702-1709.

Fang et al., "An Integration PIN/MISS OEIC for High Current Photoreceiver Applications," IEEE Transactions on Electron Devices, Jan. 1997, 44(1):34-38.

Feng et al., "Vertical p-i-n germanium photodetector with high external responsivity integrated with large core Si waveguides," Optics Express, Jan. 4, 2010, 18(1):96-101.

Foix et al., "Lock-in Time-of-Flight (ToF) Cameras: A Survey," IEEE Sensors J., Sep. 2011, 11(9):1917-1926.

Fossum et al., "A Review of the Pinned Photodiode for CCD and CMOS Image Sensors," IEEE J. Electron Devices Soc. May 1, 2014, 2(3):33-43.

Geng, "Structured-light 3D surface imaging: a tutorial," Advances in Optics and Photonics, Jun. 30, 2011, 3(2):128-160.

Gulden et al., "Novel optical distance sensor based on MSM technology." IEEE Sensors Journal. Oct. 2004, 4(5):612-8.

Hutchinson et al., "High-Resolution Aliasing-Free Optical Beam Steering," Optica, vol. 3, No. 8, dated Aug. 5, 2016, 4 pages.

Joo et al., "High-sensitivity 10 Gbps Ge-on-Si photoreceiver operating at λ~1.55 μm," Optics Express, Aug. 2, 2010, 18(16):16474-16479.

(56) References Cited

OTHER PUBLICATIONS

Kato et al., "320×240 Back-Illuminated 10-μm CAPD Pixels for High-Speed Modulation Time-of-Flight CMOS Image Sensor," IEEE J. Solid-State Circuits Apr. 2018, 53(4):1071-1078.
Kawahito et al., "A CMOS Time-of-Flight Range Image Sensor With Gates-on-Field-Oxide Structure," IEEE Sensors J. Dec. 2007, 7(12):1578-1586.
Kim et al., "A Three-Dimensional Time-of-Flight CMOS Image Sensor With Pinned-Photodiode Pixel Structure," IEEE Electron. Dev. Lett., Nov. 2010, 31(11):1272-1274.
Koester et al., "Ge-on-SOI-Detector/Si-CMOS-Amplifier Receivers for High-Performance Optical-Communication Applications," J. Lightw. Technol., Jan. 2001, 25(1):46-57.
Lange et al., "Solid-State Time-of-Flight Range Camera," IEEE J. Quant. Electron, Mar. 2001, 37(3):390-397.
Li et al., "High-responsivity verticalillumination Si/Ge uni-travelingcarrier photodiodes based on silicon-on-insulator substrate," Science Reports, Jun. 9, 2016, 6(27743):1-9.
Li et al., "High-Bandwidth and High-Responsivity Top-Illuminated Germanium Photodiodes for Optical Interconnection," IEEE Trans. Electron Dev., Mar. 2013, 60(3):1183-1187.
Lischke et al., "High bandwidth, high responsivity waveguide-coupled germanium p-i-n photodiode," Optics Express, Oct. 19, 2015, 23(21):27213-27220.
Liu et al., "Backside-incidence critically coupled Ge on SOI photodetector," Proc. SPIE 10100, Optical Components and Materials, Feb. 16, 2017, XIV, 101001X, 6 pages.
Michel et al., "High-performance Ge-on-Si photodetectors," Nature Photon. Jul. 30, 2010, 4:527-534.
Morse et al., "Performance of Ge-on-Si p-i-n Photodetectors for Standard Receiver Modules," IEEE Photon. Technol. Lett., Dec. 1, 2006, 18(23):2442-2444.
Perenzoni et al., "Compact SPAD-Based Pixel Architectures for Time-Resolved Image Sensors," Sensors, May 23, 2016, 16(5):745, 12 pages.
Piels et al., "40 GHz Si/Ge Uni-Traveling Carrier Waveguide Photodiode," Journal of Lightwave Technology, Oct. 15, 2014, 32(20):3502-2508.
Place et al., "Rad tolerant CMOS image sensor based on hole collection 4T pixel pinned photodiode." IEEE Transactions on Nuclear Science. Dec. 6, 2012. 59(6):2888-93.
Rafferty et a., "Monolithic germanium SWIR imaging array," 2008 IEEE Conference on Technologies for Homeland Security, Waltham, MA, May 12, 2008, p. 577-582.
Ringbeck et al., "Multidimensional measurement by using 3-D PMD sensors," Adv. Radio Sci., Jan. 1, 2007, 5:135-146.
Tseng et al., "High-performance silicon-on-insulator grating coupler with completely vertical emission," Sep. 21, 2015, 23(19):24433-9.
Tseng et al., "A self-assembled microbonded germanium/silicon heterojunction photodiode for 25 Gb/s high-speed optical interconnects," Sci. Rep. Nov. 15, 2013, 3:3225, 6 pages.
Van Der Tempel et al., "Lock-in Pixel Using a Current-Assisted Photonic Demodulator Implemented in 0.6 μm Standard Complementary Metal-Oxide-Semiconductor," Jpn. J. Appl. Phys., Apr. 24, 2017 46(4B):2377-2380.
Van Nieuwenhove et al., "Photonic Demodulator With Sensitivity Control," IEEE Sensors J. Mar. 2007, 7(3):317-318.
Wu et al., "A critically coupled Germanium photodetector under vertical illumination," Opt. Express, Dec. 31, 2012, 20(28):29338-29346.
Yin et al., "31GHz Ge n-i-p waveguide photodetectors on Silicon-on-Insulator substrate," Optics Express Oct. 17, 2007, 15(21):13965-13971.
Yokogawa et al., "IR sensitivity enhancement of CMOS Image Sensor with diffractive light trapping pixels," Sci. Rep. Jun. 19, 2017, 7(1):3832, 9 pages.

* cited by examiner

PHOTO-DETECTING APPARATUS WITH LOW DARK CURRENT

CROSS REFERENCE TO RELATED APPLICATIONS

This application is a continuation-in-part of U.S. patent application Ser. No. 17/005,288, filed Aug. 27, 2020, which claims priority to U.S. Provisional Patent Application No. 63/053,723, filed Jul. 20, 2020, U.S. Provisional Patent Application No. 62/929,089, filed Oct. 31, 2019, U.S. Provisional Patent Application No. 62/899,153, filed Sep. 12, 2019 and U.S. Provisional Patent Application No. 62/892,551, filed Aug. 28, 2019. This application also claims the benefit of U.S. Provisional Patent Application No. 63/173,488, filed Apr. 11, 2021, U.S. Provisional Patent Application No. 63/174,567, filed Apr. 14, 2021, U.S. Provisional Patent Application No. 63/180,063, filed Apr. 26, 2021, U.S. Provisional Patent Application No. 63/191,335, filed May 21, 2021, which are each incorporated by reference herein in its entirety.

BACKGROUND

Photodetectors may be used to detect optical signals and convert the optical signals to electrical signals that may be further processed by another circuitry. Photodetectors may be used in consumer electronics products, image sensors, high-speed optical receiver, data communications, direct/indirect time-of-flight (TOF) ranging or imaging sensors, medical devices, and many other suitable applications.

SUMMARY

The present disclosure relates generally to a photo-detecting apparatus and an image system including the same.

According to another embodiment of the present disclosure, a photo-detecting apparatus is provided. The photo-detecting apparatus includes an absorption region including a first dopant having a first peak doping concentration; and a substrate supporting the absorption region, where the substrate includes a second dopant having a second peak doping concentration lower than the first peak doping concentration; where the absorption region includes a material different from a material of the substrate.

According to an embodiment of the present disclosure, a photo-detecting apparatus is provided. The photo-detecting apparatus, includes a photo-detecting device including: a carrier conducting layer having a first surface and a second surface; an absorption region in contact with the carrier conducting layer and configured to receive an optical signal and to generate photo-carriers in response to the optical signal, wherein the absorption region is doped with a first dopant having a first conductivity type and a first peak doping concentration, wherein the carrier conducting layer is doped with a second dopant having a second conductivity type and a second peak doping concentration, wherein the carrier conducting layer includes a material different from a material of the absorption region, wherein the carrier conducting layer is in contact with the absorption region to form at least one heterointerface, wherein a ratio between a doping concentration of the absorption region and a doping concentration of the carrier conducting region at the at least one heterointerface is equal to or greater than 10; and a first electrode and a second electrode formed over a same side of the carrier conducting layer.

According to an embodiment of the present disclosure, a photo-detecting apparatus is provided. The photo-detecting apparatus, includes a photo-detecting device including: a carrier conducting layer having a first surface and a second surface; an absorption region in contact with the carrier conducting layer and configured to receive an optical signal and to generate photo-carriers in response to the optical signal, wherein the absorption region is doped with a first dopant having a first conductivity type and a first peak doping concentration, wherein the carrier conducting layer is doped with a second dopant having a second conductivity type and a second peak doping concentration, wherein the carrier conducting layer includes a material different from a material of the absorption region, wherein the carrier conducting layer is in contact with the absorption region to form at least one heterointerface, wherein a ratio between a doping concentration of the absorption region and a doping concentration of the carrier conducting region at the at least one heterointerface is equal to or greater than 10 or a ratio between the first peak doping concentration of the absorption region and the second peak doping concentration of the carrier conducting region is equal to or greater than 10; and a second doped region in the carrier conducting layer and in contact with the absorption region, wherein the second doped region is doped with a fourth dopant having a conductivity type the same as the first conductivity type and having a fourth peak doping concentration higher than the first peak doping concentration.

According to an embodiment of the present disclosure, a photo-detecting apparatus is provided. The photo-detecting apparatus, includes a photo-detecting device including: a carrier conducting layer having a first surface and a second surface; an absorption region in contact with the carrier conducting layer and configured to receive an optical signal and to generate photo-carriers in response to the optical signal, wherein the absorption region is doped with a first dopant having a first conductivity type and a first peak doping concentration, wherein the carrier conducting layer is doped with a second dopant having a second conductivity type and a second peak doping concentration, wherein the carrier conducting layer includes a material different from a material of the absorption region, wherein the carrier conducting layer is in contact with the absorption region to form at least one heterointerface, wherein a ratio between a doping concentration of the absorption region and a doping concentration of the carrier conducting region at the at least one heterointerface is equal to or greater than 10, a ratio between the first peak doping concentration of the absorption region and the second peak doping concentration of the carrier conducting region is equal to or greater than 10 and at least 50% of the absorption region is doped with a doping concentration of the first dopant equal to or greater than $1\times10^{16}$ $cm^{-3}$.

According to an embodiment of the present disclosure, a photo-detecting apparatus is provided. The photo-detecting apparatus, includes a photo-detecting device including: a carrier conducting layer having a first surface and a second surface; an absorption region in contact with the carrier conducting layer and configured to receive an optical signal and to generate photo-carriers in response to the optical signal, wherein the absorption region is doped with a first dopant having a first conductivity type and a first peak doping concentration, wherein the carrier conducting layer is doped with a second dopant having a second conductivity type and a second peak doping concentration, wherein the carrier conducting layer includes a material different from a material of the absorption region, wherein the carrier conducting layer is in contact with the absorption region to form at least one heterointerface, wherein a ratio between the first peak doping concentration of the absorption region and the second peak doping concentration of the carrier conducting region is equal to or greater than 10; and a first electrode formed over the first surface of the carrier conducting layer and electrically coupled to the carrier conducting layer, wherein the first electrode is separated from the absorption region, wherein the first electrode is configured to collect a portion of the photo-carriers; and a second electrode formed over the first surface of the carrier conducting layer and electrically coupled to the absorption region.

According to another embodiment of the present disclosure, a photo-detecting apparatus is provided. The photo-detecting apparatus, includes a photo-detecting device including: a substrate having a first surface and a second surface; an absorption region over a first surface of the substrate and configured to receive an optical signal and to generate photo-carriers in response to the optical signal, wherein the absorption region is doped with a first dopant having a first conductivity type and a first peak doping concentration, wherein the substrate is doped with a second dopant having a second conductivity type and a second peak doping concentration, wherein the substrate includes a material different from a material of the absorption region, wherein the substrate is in contact with the absorption region to form at least one heterointerface, wherein a ratio between the first peak doping concentration of the absorption region and the second peak doping concentration of the substrate is equal to or greater than 10 or a ratio between a doping concentration of the absorption region and a doping concentration of the substrate at the at least one heterointerface is equal to or greater than 10; and a first electrode formed over the first surface of the substrate and electrically coupled to the substrate, wherein the first electrode is separated from the absorption region, wherein the first electrode is configured to collect a portion of the photo-carriers; and a second electrode formed over the first surface of the substrate and electrically coupled to the absorption region.

According to another embodiment of the present disclosure, a photo-detecting apparatus is provided. The photo-detecting apparatus, includes a photo-detecting device including: an absorption region configured to receive an optical signal and to generate photo-carriers in response to the optical signal, wherein the absorption region is doped with a first dopant having a first conductivity type and a first peak doping concentration; a passivation layer over the absorption region and having a first surface and a second surface opposite to the first surface; wherein the passivation layer is doped with a second dopant having a second conductivity type and a second peak doping concentration, wherein the passivation layer includes a material different from a material of the absorption region, wherein the passivation layer is in contact with the absorption region to form at least one heterointerface, wherein a ratio between the first peak doping concentration of the absorption region and the second peak doping concentration of the passivation layer is equal to or greater than 10 or a ratio between a doping concentration of the absorption region and a doping concentration of the passivation layer at the at least one heterointerface is equal to or greater than 10; and a first electrode formed over the first surface of the passivation layer and electrically coupled to the passivation layer, wherein the first electrode is separated from the absorption region, wherein the first electrode is configured to collect a portion of the photo-carriers; and a second electrode formed over the first surface of the passivation layer and electrically coupled to the absorption region.

According to another embodiment of the present disclosure, a photo-detecting apparatus is provided. The photo-detecting apparatus includes a photo-detecting device including: a carrier conducting layer having a first surface and a second surface; an absorption region in contact with the carrier conducting layer and configured to receive an optical signal and to generate photo-carriers in response to the optical signal, wherein the absorption region is doped with a first dopant having a first conductivity type and a first peak doping concentration, wherein the carrier conducting layer is doped with a second dopant having a second conductivity type and a second peak doping concentration, wherein the carrier conducting layer includes a material different from a material of the absorption region, wherein the carrier conducting layer is in contact with the absorption region to form at least one heterointerface, wherein a ratio between a doping concentration of the absorption region and a doping concentration of the carrier conducting layer at the at least one heterointerface is equal to or greater than 10 or a ratio between the first peak doping concentration of the absorption region and the second peak doping concentration of the carrier conducting layer is equal to or greater than 10; and one or more switches electrically coupled to the absorption region and partially formed in the carrier conducting layer, wherein each of the one or more switches includes a control electrode and a readout electrode that are formed over the first surface and are separated from the absorption region; and an electrode formed over the first surface, and the electrode electrically coupled to the absorption region.

According to another embodiment of the present disclosure, a photo-detecting apparatus is provided. The photo-detecting apparatus includes a photo-detecting device including: a carrier conducting layer having a first surface and a second surface; an absorption region in contact with the carrier conducting layer and configured to receive an optical signal and to generate photo-carriers in response to the optical signal, wherein the absorption region is doped with a first dopant having a first conductivity type and a first peak doping concentration, wherein the carrier conducting layer is doped with a second dopant having a second conductivity type and a second peak doping concentration, wherein the carrier conducting layer includes a material different from a material of the absorption region, wherein the carrier conducting layer is in contact with the absorption region to form at least one heterointerface, wherein a ratio between a doping concentration of the absorption region and a doping concentration of the carrier conducting layer at the at least one heterointerface is equal to or greater than 10 or a ratio between the first peak doping concentration of the absorption region and the second peak doping concentration of the carrier conducting layer is equal to or greater than 10; and one or more switches electrically coupled to the absorption region and partially formed in the carrier conducting layer, wherein each of the one or more switches includes a control electrode and a readout electrode that are formed a same side of the carrier conducting layer; a second doped region in the carrier conducting layer and in contact with the absorption region, wherein the second doped region is doped with a fourth dopant having a conductivity type the same as the first conductivity type and having a fourth peak doping concentration higher than the first peak doping concentration; and an electrode electrically coupled to the second doped region.

According to another embodiment of the present disclosure, a photo-detecting apparatus is provided. The photo-detecting apparatus includes a photo-detecting device including: a carrier conducting layer having a first surface and a second surface; an absorption region in contact with the carrier conducting layer and configured to receive an optical signal and to generate photo-carriers in response to the optical signal, wherein the absorption region is doped with a first dopant having a first conductivity type and a first peak doping concentration, wherein the carrier conducting layer is doped with a second dopant having a second conductivity type and a second peak doping concentration, wherein the carrier conducting layer includes a material different from a material of the absorption region, wherein the carrier conducting layer is in contact with the absorption region to form at least one heterointerface, wherein a ratio between a doping concentration of the absorption region and a doping concentration of the carrier conducting layer at the at least one heterointerface is equal to or greater than 10 or a ratio between the first peak doping concentration of the absorption region and the second peak doping concentration of the carrier conducting layer is equal to or greater than 10; and one or more switches electrically coupled to the absorption region and partially formed in the carrier conducting layer. The photo-detecting apparatus further includes one or more readout circuits electrically to the respective switch, and the one or more readout circuits includes a voltage-control transistor between a transfer transistor and a capacitor.

According to another embodiment of the present disclosure, a photo-detecting apparatus is provided. The photo-detecting apparatus includes an absorption region doped with a conductivity type and includes a first dopant having a first peak doping concentration; a carrier conducting layer in contact with the absorption region, wherein the carrier conducting layer includes a conducting region doped with a conductivity type and including a second dopant having a second peak doping concentration lower than the first peak doping concentration, wherein the carrier conducting layer includes or is composed of a material different from a material of the absorption region, and wherein the conducting region has a depth less than 5 μm.

According to another embodiment of the present disclosure, a photo-detecting apparatus is provided. The photo-detecting apparatus includes an absorption region doped with a first dopant having a first peak doping concentration; a first contact region having a conductivity type; a second contact region having a conductivity type different from the conductivity type of the first contact region; a charge region having a conductivity type the same as the conductivity type of the second contact region, where a part of the charge region is between the first contact region and the second contact region; a substrate supporting the absorption region, and the substrate includes a second dopant having a second peak doping concentration lower than the first peak doping concentration; where the absorption region includes a material different from a material of the substrate.

According to another embodiment of the present disclosure, a photo-detecting apparatus is provided. The photo-detecting apparatus includes a substrate; an absorption region supported by the substrate and doped with a first dopant having a first conductivity type; multiple first contact regions each having a conductivity type different from the first conductivity type and formed in the substrate; a second doped region formed in the absorption region and having a conductivity type the same as the first conductivity type; and multiple third contact regions each having a conductivity type the same as the first conductivity type and formed in the substrate; wherein the first contact regions are arranged along a first plane, and the third contact regions are arranged along a second plane different form the first plane. In some embodiments, multiple multiplication regions are formed between the multiple third contact regions and multiple first contact regions.

According to another embodiment of the present disclosure, a photo-detecting apparatus is provided. The photo-detecting apparatus includes an absorption region; a first contact region having a conductivity type; a second contact region in the absorption region and having a conductivity type different from the conductivity type of the first contact region; a charge region having a conductivity type the same as the conductivity type of the second contact region, where the charge region is closer to the second contact region than the first contact region is; a substrate supporting the absorption region, wherein the charge region and the first contact region are formed in the substrate. The photo-detecting apparatus further includes a modification element integrated with the substrate for modifying a position where multiplication occurs in the substrate.

According to another embodiment of the present disclosure, a photo-detecting apparatus is provided. The photo-detecting apparatus includes a substrate; an absorption region supported by the substrate; a first contact region having a conductivity type formed in the substrate; a second contact region formed in the absorption region and having a conductivity type different from the conductivity type of the first contact region; a charge region formed in the substrate and having a conductivity type the same as the conductivity type of the second contact region; wherein a depth of the charge region is less than a depth of the first contact region. In some embodiments, the depth of the charge region is between the depth of the second contact region and the depth of the first contact region.

According to another embodiment of the present disclosure, a photo-detecting apparatus is provided. The photo-detecting apparatus includes a photo-detecting device including: a substrate having a first surface and a second surface; an absorption region over a first surface of the substrate and configured to receive an optical signal and to generate photo-carriers in response to the optical signal, wherein the absorption region is doped with a first dopant having a first conductivity type and a first peak doping concentration, wherein the substrate is doped with a second dopant having a second conductivity type and a second peak doping concentration, wherein the substrate includes a material different from a material of the absorption region, wherein the substrate is in contact with the absorption region to form at least one heterointerface, wherein a ratio between a doping concentration of the absorption region and a doping concentration of the substrate at the at least one heterointerface is equal to or greater than 10 or a ratio between the first peak doping concentration of the absorption region and the second peak doping concentration of the substrate is equal to or greater than 10; wherein the substrate further includes a waveguide configured to guide and confine the optical signal propagating through a defined region of the substrate to couple the optical signal to the absorption region.

According to another embodiment of the present disclosure, a photo-detecting apparatus is provided. The photo-detecting apparatus includes a photo-detecting device including: a carrier conducting layer having a first surface and a second surface; an absorption region in contact with the carrier conducting layer and configured to receive an optical signal and to generate photo-carriers in response to the optical signal, wherein the absorption region is doped with a first dopant having a first conductivity type and a first peak doping concentration, wherein the carrier conducting layer is doped with a second dopant having a second conductivity type and a second peak doping concentration, wherein the carrier conducting layer includes a material different from a material of the absorption region, wherein the carrier conducting layer is in contact with the absorption region to form at least one heterointerface, wherein a ratio between a doping concentration of the absorption region and a doping concentration of the carrier conducting layer at the at least one heterointerface is equal to or greater than 10; and N switches electrically coupled to the absorption region and partially formed in the carrier conducting layer. The photo-detecting apparatus further includes Y control signals different from each other and electrically coupled to the photo-detecting device, wherein Y≤N and Y is a positive integer. Each of the control signal controls one or more of the switches of the photo-detecting device.

According to another embodiment of the present disclosure, a photo-detecting apparatus is provided. The photo-detecting apparatus includes an absorption region including a first dopant having a first peak doping concentration; and a substrate supporting the absorption region, where the substrate includes a second dopant having a second peak doping concentration lower than the first peak doping concentration, where the absorption region includes a material having a bandgap less than a bandgap of a material of the substrate, where a built-in electrical field region is across an interface between the substrate and the absorption region, where a first width of the built-in electrical field region in the substrate is greater than a second width of the built-in electrical field region in the absorption region so that the dark current is generated mostly from the substrate.

According to another embodiment of the present disclosure, a photodiode is provided. The photodiode includes a carrier conducting layer having a low-barrier region and a high-barrier region. The photodiode further includes an absorption region in contact with the carrier conducting layer and configured to receive an optical signal and to generate photo-carriers in response to the optical signal, where the absorption region is doped with a first dopant having a first conductivity type and a first peak doping concentration, where the low-barrier region of the carrier conducting layer is doped with a second dopant having a second conductivity type and a second peak doping concentration, where the carrier conducting layer includes a material different from a material of the absorption region, and where the carrier conducting layer is in contact with the absorption region to form at least one heterointerface.

According to another embodiment of the present disclosure, an optical apparatus for optical spectroscopy is provided. The optical apparatus includes a substrate formed using at least silicon. The optical apparatus further includes a plurality of sensors formed using at least germanium, where the plurality of sensors is supported by the substrate. The optical apparatus further includes a plurality of wavelength filters arranged between the plurality of sensors and a target object, where the plurality of wavelength filters are configured to receive reflected light from the target object and to filter the reflected light into a plurality of light beams having different wavelength ranges, and where each of the plurality of sensors is configured to receive a respective light beam of the plurality of light beams having a specific wavelength range.

According to an embodiment of the present disclosure, an imaging system is provided. The imaging system includes a transmitter unit capable of emitting light, and a receiver unit including an image sensor including the photo-detecting apparatus, the optical apparatus or the photodiode. The imaging system further includes a signal processor in electrical communication with the receiver unit. The imaging system further includes a controller in electrical communication with the signal processor and the transmitter unit.

According to another embodiment of the present disclosure, a method for operating an optical apparatus for optical spectroscopy is provided. The method includes receiving, by a plurality of wavelength filters, light reflected from a target object. The method further includes filtering, by the plurality of wavelength filters, the received light into a plurality of light beams having different wavelength ranges. The method further includes receiving, by one or more respective sensors of a plurality of sensors, each of the plurality of light beams having a specific wavelength range. The method further includes generating, by the plurality of sensors, electrical signals based on the plurality of light beams. The method further includes providing, by readout circuitry, the electrical signals to one or more processors. The method further includes determining, by the one or more processors, a property of the target object based on the electrical signals.

According to another embodiment of the present disclosure, an optical sensing apparatus is provided. The optical sensing apparatus includes a semiconductor substrate composed of a first material and a transmitter-receiver set supported by the semiconductor substrate. The transmitter-receiver includes a photodetector including an absorption region configured to receive an optical signal and to generate photo-carriers in response to the optical signal, where the absorption region is composed of a second material including germanium and is doped with a first dopant having a first conductivity type and a first peak doping concentration. The photodetector further includes a first region formed in the semiconductor substrate and in contact with the absorption region. A first energy barrier is formed between the first region and the absorption region for the photo-carriers to be collected. The photodetector further includes a second region formed in the semiconductor substrate and in contact with the absorption region, a second energy barrier is formed between the second region and the absorption region for the photo-carriers to be collected, where the second energy barrier is larger than the first energy barrier, and a first contact area between the first region and the absorption region is less than a second contact area between the second region and the absorption region. The transmitter-receiver further includes a light source including a light-emitting region composed of a third material including germanium and configured to emit a light toward a target, where the first material is different from the second material and the third material.

In some embodiments, the first region includes a low-barrier region or a dumping region.

In some embodiments, the second region includes a high-barrier region or a blocking region.

According to an embodiment of the present disclosure, a display apparatus is provided. The display apparatus includes the photo-detecting apparatus, the optical apparatus or the photodiode.

According to another embodiment of the present disclosure, an optical sensing apparatus is provided. The optical sensing apparatus includes a semiconductor substrate composed of a first material and a transmitter-receiver set supported by the semiconductor substrate. The transmitter-receiver set includes a photodetector including an absorption region configured to receive an optical signal and to generate photo-carriers in response to the optical signal, where the absorption region is composed of a second material including germanium and is doped with a first dopant having a first conductivity type and a first peak doping concentration. The photodetector further includes a carrier guiding region formed in the semiconductor substrate and in contact with the absorption region, where the carrier guiding region is doped with a second dopant having a second conductivity type different from the first conductivity type and a second peak doping concentration. The photodetector further includes a carrier confined region formed in the semiconductor substrate and in contact with the absorption region, where the carrier confined region is of the first conductivity type. The transmitter-receiver set further includes a light source including a light-emitting region composed of a third material including germanium and configured to emit a light toward a target, where the first material is different from the second material and the third material.

In some embodiments, the photodetector includes a one-dimensional array or two-dimensional array of absorption regions.

In some embodiments, the photodetector includes optical filters that each corresponds to one of the absorption regions.

According to an embodiment of the present disclosure, an imaging system is provided. The imaging system includes a transmitter-receiver set capable of emitting light and detecting reflected optical signal. The transmitter-receiver set includes the photo-detecting apparatus, the optical apparatus or the photodiode. The imaging system further includes a signal processor in electrical communication with the transmitter-receiver set. The imaging system further includes a controller in electrical communication with the transmitter-receiver set.

According to an embodiment of the present disclosure, a display apparatus is provided. The display apparatus includes a transmitter-receiver set capable of emitting light and detecting reflected optical signal.

These and other objectives of the present disclosure will no doubt become obvious to those of ordinary skill in the art after reading the following detailed description of the preferred embodiment that is illustrated in the various figures and drawings.

BRIEF DESCRIPTION OF THE DRAWINGS

The foregoing aspects and many of the attendant advantages of this application will become more readily appreciated as the same becomes better understood by reference to the following detailed description, when taken in conjunction with the accompanying drawings, wherein.

DETAILED DESCRIPTION

As used herein, the terms such as "first", "second", "third", "fourth" and "fifth" describe various elements, components, regions, layers and/or sections, these elements, components, regions, layers and/or sections should not be limited by these terms. These terms may be only used to distinguish one element, component, region, layer or section from another. The terms such as "first", "second", "third", "fourth" and "fifth" when used herein do not imply a sequence or order unless clearly indicated by the context. The terms "photo-detecting", "photo-sensing", "light-detecting", "light-sensing" and any other similar terms can be used interchangeably.

Spatial descriptions, such as "above", "top", and "bottom" and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of embodiments of this disclosure are not deviated by such arrangement.

As used herein, the term "intrinsic" means that the semiconductor material is without intentionally adding dopants.

Figure 1A:
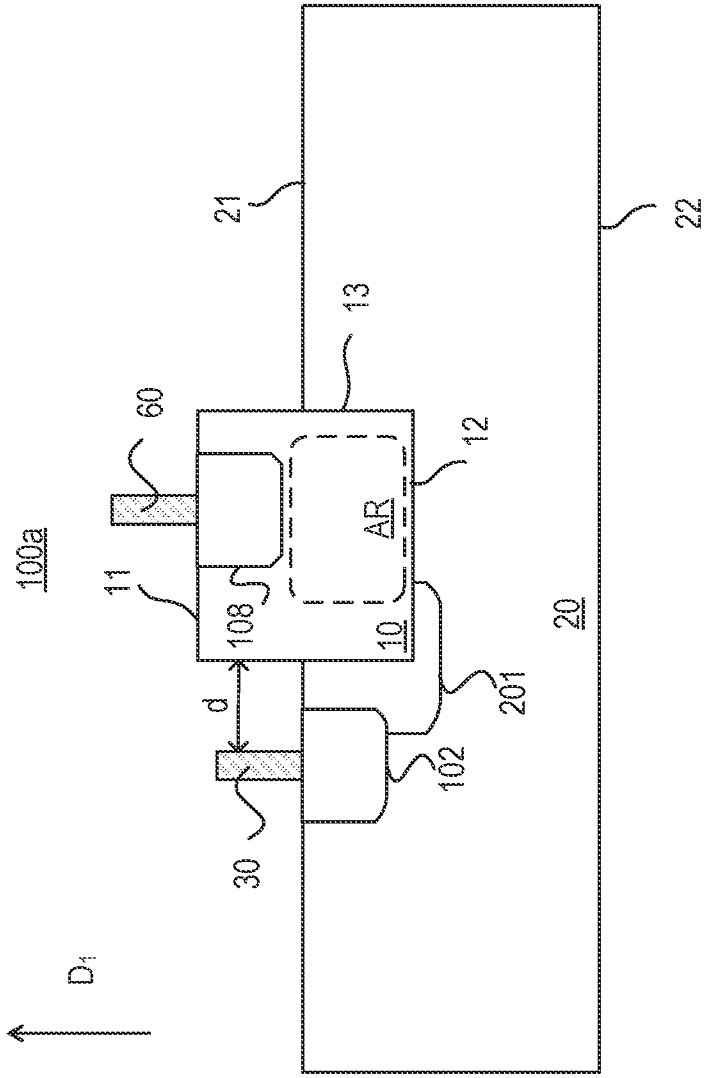
FIGS. 1A-1D illustrate cross-sectional views of a photo-detecting device, according to some embodiments.

FIG. 1A illustrates a cross-sectional view of a photo-detecting device **100*a*, such as a photodiode, according to some embodiments. The photo-detecting device 100*a* includes an absorption region 10 and a substrate 20 supporting the absorption region 10. In some embodiments, the absorption region 10 is entirely embedded in the substrate 20. In some embodiments, the absorption region 10 is partially embedded in the substrate 20. In some embodiments, the photo-detecting device 100*a* includes at least one heterointerface between the absorption region 10 and a carrier conducting layer including or be composed of a material different from that of the absorption region 10. In some embodiments, the carrier conducting layer is the substrate 20. For example, in some embodiments, the substrate 20 includes a first surface 21 and a second surface 22 opposite to the first surface 21. In some embodiments, the absorption region 10 includes a first surface 11, a second surface 12 and one or more side surfaces 13. The second surface 12 is between the first surface 11 of the absorption region 10 and the second surface 22 of the substrate 20. The side surfaces 13 are between the first surface 11 of the absorption region 10 and the second surface 12 of the absorption region 10. At least one of the first surface 11, second surface 12 and the side surfaces 13 of the absorption region 10 is at least partially in direct contact with the substrate 20 and thus the heterointerface is formed between the absorption region 10 and the substrate 20**.

In some embodiments, the absorption region 10 is doped with a conductivity type and includes a first dopant having a first peak doping concentration. In some embodiments, the absorption region 10 is configured to convert an optical signal, for example, an incident light, to an electrical signal. In some embodiments, the optical signal enters the absorption region 10 from the first surface 21 of the substrate 20. In some embodiments, the optical signal enters the absorption region 10 from the second surface 22 of the substrate 20. In some embodiments, the absorption region 10 includes an absorbed region AR, which is defined by a light shield (not shown) including an optical window. The absorbed region AR is a virtual area receiving an optical signal incoming through the optical window.

In some embodiments, the carrier conducting layer, that is the substrate 20 in some embodiments, is doped with a conductivity type and includes a second dopant having a second peak doping concentration lower than the first peak doping concentration to reduce the dark current of the photo-detecting device 100*a*, which may improve the signal-to-noise ratio, sensitivity, dynamic range properties of the photo-detecting device 100*a*.

In some embodiments, the first peak doping concentration is equal to or greater than $1\times10^{16}$ $cm^{-3}$. In some embodiments, the first peak doping concentration can be between $1\times10^{16}$ $cm^{-3}$ and $1\times10^{20}$ $cm^{-3}$. In some embodiments, the first peak doping concentration can be between $1\times10^{17}$ $cm^{-3}$ and $1\times10^{20}$ $cm^{-3}$. In some embodiments, a ratio of the first peak doping concentration to the second peak doping concentration is equal to or greater than 10 such that the photo-detecting device 100*a* can further achieve low dark current. In some embodiments, a ratio of the first peak doping concentration to the second peak doping concentration is equal to or greater than 100 such that the photo-detecting device 100*a* can achieve further low dark current and high quantum efficiency at the same time. In some embodiments, the conductivity type of the substrate 20 is p-type or n-type. In some embodiments, if the conductivity type of the substrate 20 is p-type, e.g., using boron (B) and/or gallium (Ga) as dopant, the second peak doping concentration can be between $1\times10^{12}$ $cm^{-3}$ and $1\times10^{16}$ $cm^{-3}$ such that the photo-detecting device 100*a* is can achieve low dark current and high quantum efficiency at the same time. In some embodiments, if the conductivity type of the substrate 20 is of n-type, e.g., using phosphorus (P) and/or arsenic (As) as dopant, the second peak doping concentration can be between $1\times10^{14}$ $cm^{-3}$ and $1\times10^{18}$ $cm^{-3}$ such that the photo-detecting device 100*a* can achieve with low dark current and high quantum efficiency at the same time.

In some embodiments, when the conductivity type of the carrier conducting layer, that is the substrate 20 in some embodiments, is different from the conductivity type of the absorption region 10, and by having the second peak doping concentration of the substrate 20 lower than the first peak doping concentration of the absorption region 10, a depletion region is across the heterointerface between the substrate 20 and the absorption region 10. A major part of the depletion region is in the substrate 20 when the photo-detecting device is in operation. In other words, a first width of the depletion region in the substrate 20 is greater than a second width of the depletion region in the absorption region 10. In some embodiments, a ratio of the first width to the second width is greater than 10. In some embodiments, a built-in electrical field region is across an heterointerface between the substrate 20 and the absorption region 10, where a first width of the built-in electrical field region in the substrate 20 is greater than a second width of the built-in electrical field region in the absorption region 10 so that the dark current is generated mostly from the substrate 20. Therefore, the photo-detecting device can achieve lower dark current. In some embodiments, a bandgap of the carrier conducting layer, that is the substrate 20, is greater than a bandgap of the absorption region 10.

In some embodiments, when the conductivity type of the carrier conducting layer, that is the substrate 20 in some embodiments, is the same as the conductivity type of the absorption region 10, such as when the substrate 20 is of p-type and the absorption region 10 is of p-type, by having the second peak doping concentration of the substrate 20 lower than the first peak doping concentration of the absorption region 10, the electric field across the absorption region 10 can be reduced and thus the electric field across the substrate 20 is increased. That is, a difference between the electric field across the absorption region 10 and the electric field across the substrate 20 presents. As a result, the dark current of the photo-detecting device is further lower. In some embodiments, a bandgap of the carrier conducting layer, that is the substrate 20, is greater than a bandgap of the absorption region 10.

The carrier conducting layer, that is the substrate 20 in some embodiments, includes a first doped region 102 separated from the absorption region 10. The first doped region 102 is doped with a conductivity type and includes a third dopant having a third peak doping concentration. The conductivity type of the first doped region 102 is different from the conductivity type of the absorption region 10. In some embodiments, the third peak doping concentration is higher than the second peak doping concentration. In some embodiments, the third peak doping concentration of the first doped region 102 can be between $1\times10^{18}$ $cm^{-3}$ and $5\times10^{20}$ $cm^{-3}$.

In some embodiments, at least 50% of the absorption region 10 is doped with a doping concentration of the first dopant equal to or greater than $1\times10^{16}$ $cm^{-3}$. In other words, at least half of the absorption region 10 is intentionally doped with the first dopant having a doping concentration equal to or greater than $1\times10^{16}$ $cm^{-3}$. For example, a ratio of the depth of the doping region in the absorption region 10 to the thickness of the absorption region 10 is equal to or greater than ½. In some embodiments, at least 80% of the absorption region 10 is intentionally doped with the first dopant having a doping concentration equal to or greater than $1\times10^{16}$ $cm^{-3}$ for further reducing the dark current of the photo-detecting device. For example, a ratio of the depth of the doping region in the absorption region 10 to the thickness of the absorption region 10 is equal to or greater than ⅘.

In some embodiments, the carrier conducting layer, can be majorly doped with the second dopant. For example, at least 50% of the carrier conducting layer, that is the substrate 20 in some embodiments, has a doping concentration of the second dopant equal to or greater than $1\times10^{12}$ $cm^{-3}$. In other words, at least half of the carrier conducting layer is intentionally doped with the second dopant having a doping concentration equal to or greater than $1\times10^{12}$ $cm^{-3}$. For example, a ratio of the depth of the doping region in the substrate 20 to the thickness of the substrate 20 is equal to or greater than ½. In some embodiments, at least 80% of the carrier conducting layer, is intentionally doped with the second dopant having a doping concentration equal to or greater than $1\times10^{12}$ $cm^{-3}$. For example, a ratio of the depth of the doping region in the substrate 20 to the thickness of the substrate 20 is equal to or greater than ⅘.

In some embodiments, the carrier conducting layer can be regionally doped with the second dopant as a low-barrier region or a dumping region, and the other region not doped with the second dopant serves as a high-barrier region or a blocking region. In some embodiments, the low-barrier region or a dumping region serves as a carrier guiding region for the photo-carriers to be collected (e.g., electrons when the first doped region 102 is n-type). In some embodiments, the high-barrier region or a blocking region serves as a carrier confined region for the photo-carriers to be collected (e.g., electrons when the first doped region 102 is n-type). In some embodiments, the high-barrier region or a blocking region may be intrinsic, doped with the second dopant with a peak concentration lower than the peak concentration of the low-barrier region or a dumping region or doped with a dopant with a conductivity type different from the second dopant. For example, the first doped region 102 is n-type, the absorption region 10 is p-type, the high-barrier region or a blocking region is p-type, and the low-barrier region or a dumping region is n-type. In some embodiments, if the first electrode 30 is designed to collect electrons, the energy barrier for the electrons is higher in high-barrier region or the blocking region than in the low-barrier region or the dumping region. In some embodiment, a first energy barrier is formed between the low-barrier region or the dumping region and the absorption region 10 for the photo-carriers to be collected (e.g., electrons when the first doped region 102 is n-type). In some embodiment, a second energy barrier is formed between the high-barrier region or the blocking region and the absorption region 10 for the photo-carriers to be collected (e.g., electrons when the first doped region 102 is n-type), and the second energy barrier is larger than the first energy barrier. As a result, electrons can be directed toward and be collected by the first doped region 102. In some embodiments, an area of the high-barrier region is greater than an area of the low-barrier region, which confines a path for the carriers passing through and leads to a confined region at the heterointerface interface for the carriers exiting from the absorption region 10, which reduces the dark-current of the photodiode.

For example, the carrier conducting layer, that is the substrate 20 in some embodiments, includes a conducting region 201, which is a low-barrier region or a dumping region as mentioned above. At least a part of the conducting region 201 is between the first doped region 102 and the absorption region 10. In some embodiments, the conducting region 201 is partially overlapped with the absorption region 10 and the first doped region 102 for confining a path of the carriers generated from the absorption region 10 moving towards the first doped region 102. In some embodiments, the conducting region 201 has a depth measured from the first surface 21 of the substrate 20 along a direction D1 substantially perpendicular to the first surface 21 of the substrate 20. The depth is to a position where the dopant profile of the second dopant reaches a certain concentration, such as a concentration between $1\times10^{14}$ $cm^{-3}$ and $1\times10^{15}$ $cm^{-3}$. In some embodiments, the depth of the conducting region 201 is less than 5 μm for better efficiently transporting the carriers. In some embodiments, the conducting region 201 may be overlapped with the entire first doped region 102. In some embodiments, the conducting region 201 has a width greater than a width of the absorption region 10. In some embodiments, since the carriers to be collected, for example, electrons, is blocked by the high-barrier region or a blocking region and flow from the absorption region 10 toward the first doped region 102 through the low-barrier region or the dumping region.

In some embodiments, the first dopant and the second dopant are different, for example, the first dopant is boron, and the second dopant is phosphorous. In some embodiments, a doping concentration of the first dopant at the heterointerface between the absorption region 10 and the carrier conducting layer, that is the substrate 20 in some embodiment, is equal to or greater than $1\times10^{16}$ $cm^{-3}$. In some embodiments, the doping concentration of the first dopant at the heterointerface can be between $1\times10^{16}$ $cm^{-3}$ and $1\times10^{20}$ $cm^{-3}$ or between $1\times10^{17}$ $cm^{-3}$ and $1\times10^{20}$ $cm^{-3}$. In some embodiments, a doping concentration of the second dopant at the heterointerface is lower than the doping concentration of the first dopant at the heterointerface. In some embodiments, a doping concentration of the second dopant at the heterointerface between $1\times10^{12}$ $cm^{-3}$ and $1\times10^{17}$ $cm^{-3}$.

In some embodiments, since the doping concentration of the first dopant at the heterointerface is sufficiently high, it may reduce the interface dark current generation at the heterointerface. As a result, the interface combination velocity can be reduced and thus the dark current at the heterointerface can be lower. In some embodiments, since the doping concentration of the second dopant at the heterointerface is lower than the doping concentration of the first dopant at the heterointerface, the bulk dark current generation in the absorption region 10 is also reduced. In some embodiments, the photo-detecting device 100*a* can have an interface recombination velocity lower than $10^4$ cm/s.

In some embodiments, a ratio of the doping concentration of the first dopant to the doping concentration of the second dopant at the heterointerface is equal to or greater than 10 such that the photo-detecting device 100*a* can achieve low dark current at the heterointerface and high quantum efficiency at the same time. In some embodiments, a ratio of the doping concentration of the first dopant to the doping concentration of the second dopant at the heterointerface is equal to or greater than 100 such that the photo-detecting device 100*a* can exhibit further low dark current at the heterointerface and high quantum efficiency at the same time.

In some embodiments, the second dopant may be in the absorption region 10, but also may present outside the absorption region 10 due to thermal diffusion or implant residual etc. In some embodiments, the first dopant may be in the carrier conducting layer, that is the substrate 20 in some embodiments, but also may present outside the substrate 20 region due to thermal diffusion or implant residual etc.

In some embodiments, the first dopant may be introduced in the absorption region 10 by any suitable process, such as in-situ growth, ion implantation, and/or thermal diffusion etc.

In some embodiments, the second dopant may be introduced in the substrate 20 by any suitable process, such as in-situ growth, ion implantation, and/or thermal diffusion etc.

In some embodiments, the absorption region 10 is made by a first material or a first material-composite. The carrier conducting layer, that is the substrate 20 in some embodiments, is made by a second material or a second material-composite. The second material or a second material-composite is different from the first material or a first material-composite. For example, in some embodiments, the combinations of elements of second material or a second material-composite is different from the combinations of elements in the first material or a first material-composite.

In some embodiments, a bandgap of the carrier conducting layer, that is the substrate 20 in some embodiments, is greater than a bandgap of the absorption region 10. In some embodiments, the absorption region 10 includes or is composed of a semiconductor material. In some embodiments, the substrate 20 includes or is composed of a semiconductor material. In some embodiments, the absorption region 10 includes or is composed of a Group III-V semiconductor material. In some embodiments, the substrate 20 includes or is composed of a Group III-V semiconductor material. The Group III-V semiconductor material may include, but is not limited to, GaAs/AlAs, InP/InGaAs, GaSb/InAs, or InSb. For example, in some embodiments, the absorption region 10 includes or is composed of InGaAs, and the substrate 20 include or is composed of InP. In some embodiments, the absorption region 10 includes or is composed of a semiconductor material including a Group IV element. For example, Ge, Si or Sn. In some embodiments, the absorption region 10 includes or is composed of the $Si_xGe_ySn_{1-x-y}$, where 0≤x≤1, 0≤y≤1, 0≤x+y≤1. In some embodiments, the absorption region 10 includes or is composed of $Ge_{1-a}Sn_a$, where 0≤a≤0.1. In some embodiments, the absorption region 10 includes or is composed of $Ge_xSi_{1-x}$, where 0≤x≤1. In some embodiments, the absorption region 10 composed of intrinsic germanium is of p-type due to material defects formed during formation of the absorption region, where the defect density is from $1\times10^{14}$ $cm^{-3}$ to $1\times10^{16}$ $cm^{-3}$. In some embodiments, the carrier conducting layer, that is the substrate 20 in some embodiments, includes or is composed of a semiconductor material including a Group IV element. For example, Ge, Si or Sn. In some embodiments, the substrate 20 includes or is composed of the $Si_xGe_ySn_{1-x-y}$, where 0≤x≤1, 0≤y≤1, 0≤x+y≤1. In some embodiments, the substrate 20 includes or is composed of $Ge_{1-a}Sn_a$, where 0≤a≤0.1. In some embodiments, the substrate 20 includes or is composed of $Ge_xSi_{1-x}$, where 0≤x≤1.

In some embodiments, the substrate 20 composed of intrinsic germanium is of p-type due to material defects formed during formation of the absorption region, where the defect density is from $1\times10^{14}$ $cm^{-3}$ to $1\times10^{16}$ $cm^{-3}$. For example, in some embodiments, the absorption region 10 includes or is composed of Ge, and the substrate 20 include or is composed of Si.

In some embodiments, the conductivity type of the absorption region 10 is p-type. In some embodiments, the first dopant is a Group III element. In some embodiments, the conductivity type of the substrate 20 is n-type. the second dopant is a Group V element.

In some embodiments, the photo-detecting device includes a first electrode 30 electrically coupled to the first doped region 102. The first electrode 30 is separated from the absorption region 10. An ohmic contact may be formed between the first electrode 30 and the first doped region 102 depending on the material of the first electrode 30 and the third peak doping concentration of the first doped region 102. In some embodiments, a nearest distance d between the first electrode 30 and one of the side surfaces 13 of the absorption region can be between 0.1 μm and 20 μm. In some embodiments, a nearest distance d between the first electrode 30 and one of the side surfaces 13 of the absorption region can be between 0.1 μm and 5 μm. In some embodiments, the distance can be between 0.5 μm and 3 μm. If the distance d between the first electrode 30 and the side surfaces 13 is greater than 20 μm, the speed of the photo-detecting device **100*a* is lower. If the distance d between the first electrode 30 and the side surfaces 13** is less than 0.1 μm, the dark current of the photo-detecting device may be increased.

In some embodiments, the photo-detecting device **100*a* includes a second doped region 108 in the absorption region 10 and near the first surface 11 of the absorption region 10. The second doped region 108 is doped with a conductivity type the same as the conductivity type of the absorption region 10. In some embodiments, the second doped region 108 includes a fourth dopant having a fourth peak doping concentration higher than the first peak doping concentration. For example, the fourth peak doping concentration of the second doped region 108 can be between $1\times10^{18}$ $cm^{-3}$ and $5\times10^{20}$ $cm^{-3}$. In some embodiments, the second doped region 108 is not arranged over the first doped region 102 along the direction D1**.

In some embodiments, the photo-detecting device **100*a* further includes a second electrode 60 electrically coupled to the second doped region 108. An ohmic contact may be formed between the second electrode 60 and the second doped region 108 depending on the material of the second electrode 60 and the fourth peak doping concentration of the second doped region 108. The second electrode 60 is over the first surface 11 of the absorption region 10**.

In some embodiments, the carrier conducting layer includes a first surface and a second surface opposite to the first surface 21. The first electrode 30 and second electrode 60 are both disposed over the of the first surface of the carrier conducting layer. That is, the first electrode 30 and second electrode 60 are disposed over a same side of the carrier conducting layer, that is the substrate 20 in some embodiment, which is benefit for the backend fabrication process afterwards.

The first doped region 102 and the second doped region 108 can be semiconductor contact regions. In some embodiments, depending on the circuits electrically coupled to the first doped region 102 and the second doped region 108, the carriers with a first type collected by one of the first doped region 102 and the second doped region 108 can be further processed, and the carriers with second type collected by the other doped region can be evacuated. Therefore, the photo-detecting device can have improved reliability and quantum efficiency.

In some embodiments, the absorption region 10 is doped with a graded doping profile. In some embodiments, the largest concentration of the graded doping profile is higher than the second peak doping concentration of the second dopant. In some embodiments, the smallest concentration of the graded doping profile is higher than the second peak doping concentration of the second dopant. In some embodiments, the graded doping profile can be graded from the first surface 11 of the absorption region 10 or from the second doped region 108 to the second surface 12 of the absorption region 10. In some embodiments, the graded doping profile can be a gradual decrease/increase or a step like decrease/increase depending on the moving direction of the carriers. In some embodiments, the concentration of the graded doping profile is gradually deceased/increased from the first surface 11 or the second doped region 108 of the absorption region 10 to the second surface 12 of the absorption region 10 depending on the moving direction of the carriers. In some embodiments, the concentration of the graded doping profile is gradually and radially deceased/increased from a center of the first surface 11 or the second doped region 108 of the absorption region 10 to the second surface 12 and to the side surfaces 13 of the absorption region 10 depending on the moving direction of the carriers. For example, if the absorption region 10 is entirely over the substrate 20, the carriers with the first type, such as electrons when the first doped region 102 is of n-type, move in the absorption region 10 substantially along a direction from the first surface 11 to the second surface 12, the concentration of the graded doping profile of the first dopant, for example, boron, is gradually deceased from the first surface 11 or from the second doped region 108 of the absorption region 10 to the second surface 12 of the absorption region 10. In some embodiments, the concentration of the graded doping profile is gradually and laterally decreased/increased from an edge of the first surface 11 or the second doped region 108 of the absorption region 10 to the side surfaces 13 of the absorption region 10 depending on the moving direction of the carriers.

Figure 1B:
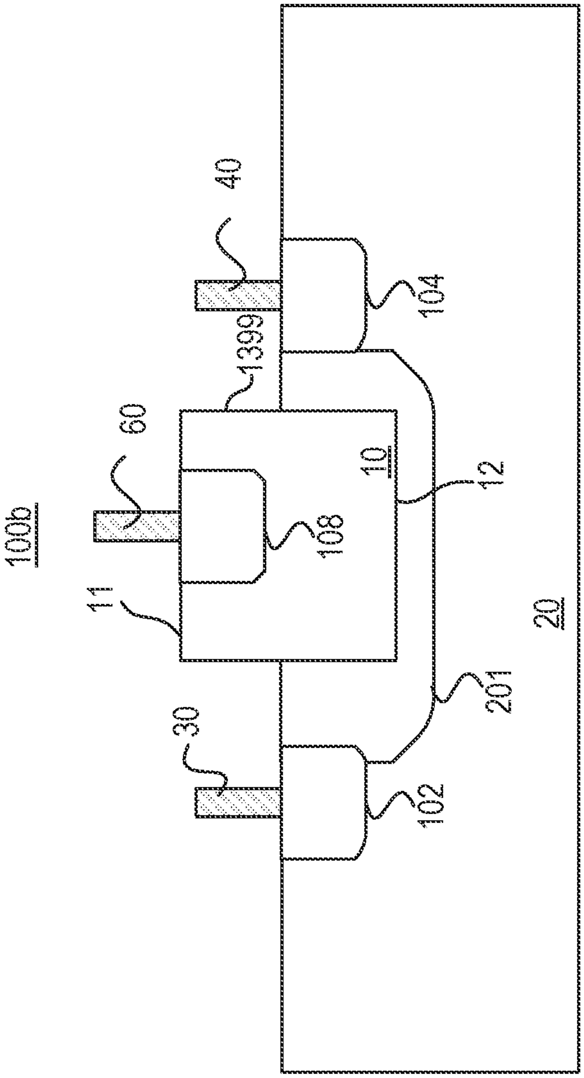

In some embodiments, the dark current of the photo-detecting device is about several pA or lower, for example, lower than $1\times10^{-12}$ A. FIG. 1B illustrates a cross-sectional view of a photo-detecting device, according to some embodiments. The photo-detecting device 100*b* in FIG. 1B is similar to the photo-detecting device 100*a* in FIG. 1A. The difference is described below.

The photo-detecting device 100*b* further includes another first doped region 104 in the substrate 20. The first doped region 104 is similar to the first doped region 102 as described in FIG. 1A. The first doped region 104 is separated from the absorption region 10. At least a part of the conducting region 201 is also between the first doped region 104 and the absorption region 10. In some embodiments, the conducting region 201 is partially overlapped with the absorption region 10 and the first doped region 104 for confining a path of the carriers with a first type generated from the absorption region 10 moving towards the first doped region 104.

In some embodiments, the two first doped regions 104, 102 are separated from each other. In some embodiments, the two first doped regions 104, 102 may be a continuous region, for example, a ring. The photo-detecting device 100*b* further includes a third electrode 40 electrically coupled to the first doped region 104. In some embodiment, the first electrode 30 and the third electrode 40 may be electrically coupled to the same circuit.

In some embodiments, the dark current of the photo-detecting device 100*b* is about several pA or lower, for example, lower than $1\times10^{-12}$ A.

A photo-detecting device in accordance to a comparative example includes structures substantially the same as the structures of a photo-detecting device 100*b* in FIG. 1B. The difference is that in the photo-detecting device of the comparative example, the doping concentration of the absorption region 10 is not higher than the second peak doping concentration of the substrate 20, and the doping concentration of the second dopant at the heterointerface is not lower than the doping concentration of the first dopant at the heterointerface The details of the photo-detecting device in accordance to a comparative example and the photo-detecting device 100*b* are listed in Table 1 and Table 2.

TABLE 1

Details of the photo-detecting device in accordance to a comparative example

| | |
|---|---|
| Conductivity type of the absorption region | p-type, |
| First peak doping concentration | $1\times10^{15}$ cm−3 |
| Conductivity type of the substrate | n-type |
| Second peak doping concentration | $1\times10^{15}$ cm−3 |
| Reference dark current | 100% |

TABLE 2

Details of the photo-detecting device 100b

| | |
|---|---|
| Conductivity type of the absorption region | p-type, |
| First peak doping concentration | Referring to Table 3 |
| Conductivity type of the substrate | n-type |
| Second peak doping concentration | $1\times10^{15}$ cm−3 |
| Dark current | Referring to Table 3 |

Referring to Table 3, compared to the comparative example, since the first peak doping concentration of the absorption region 10 in the photo-detecting device 100*b* is higher than the second peak doping concentration of the substrate 20, the photo-detecting device 100*b* can have lower dark current, for example, at least two times lower.

TABLE 3

Dark current vs. First peak doping concentration of photo-detecting device 100b in accordance to different embodiments

| first peak doping concentration | Dark current (compared to the reference dark current in comparative example) |
|---|---|
| 1.00E+16 | 42% |
| 1.00E+17 | 0.29% |
| 1.00E+18 | 0.0052% |
| 1.00E+19 | 0.001% |

Another photo-detecting device in accordance to a comparative example includes structures substantially the same as the structures of a photo-detecting device 100*b* in FIG. 1B. The difference is that the in the other photo-detecting device of the comparative example, the doping concentration of the absorption region 10 is not higher than the second peak doping concentration of the substrate 20, and the doping concentration of the second dopant at the heterointerface is not lower than the doping concentration of the first dopant at the heterointerface. The details of the other photo-detecting device in accordance to a comparative example and the photo-detecting device 100*b* are listed in Table 4 and Table 5.

TABLE 4

Details of the other photo-detecting device in accordance to a comparative example

| | |
|---|---|
| Conductivity type of the absorption region | p-type, |
| First peak doping concentration | $1\times10^{15}$ cm−3 |
| Conductivity type of the substrate | p-type |
| Second peak doping concentration | $1\times10^{15}$ cm−3 |
| Reference dark current | 100% |

TABLE 5

Details of the photo-detecting device 100b

| | |
|---|---|
| Conductivity type of the absorption region | p-type |
| First peak doping concentration | Referring to Table 6 |
| Conductivity type of the substrate | p-type |
| Second peak doping concentration | $1\times10^{15}$ cm−3 |
| Dark current | Referring to Table 6 |

Referring to Table 6, compared to the other comparative example, since the first peak doping concentration of the absorption region 10 in the photo-detecting device 100*b* is higher than the second peak doping concentration of the substrate 20, the photo-detecting device 100*b* can have lower dark current, for example, at least 20 times lower.

TABLE 6

Dark current vs. First peak doping concentration of photo-detecting device 100b in accordance to different embodiments

| first peak doping concentration | Dark current (compared to the Reference dark current in comparative example) |
|---|---|
| 1.00E+16 | 4.6% |
| 1.00E+17 | 0.1% |
| 1.00E+18 | 0.01% |
| 1.00E+19 | 0.0017% |

Figure 1C:
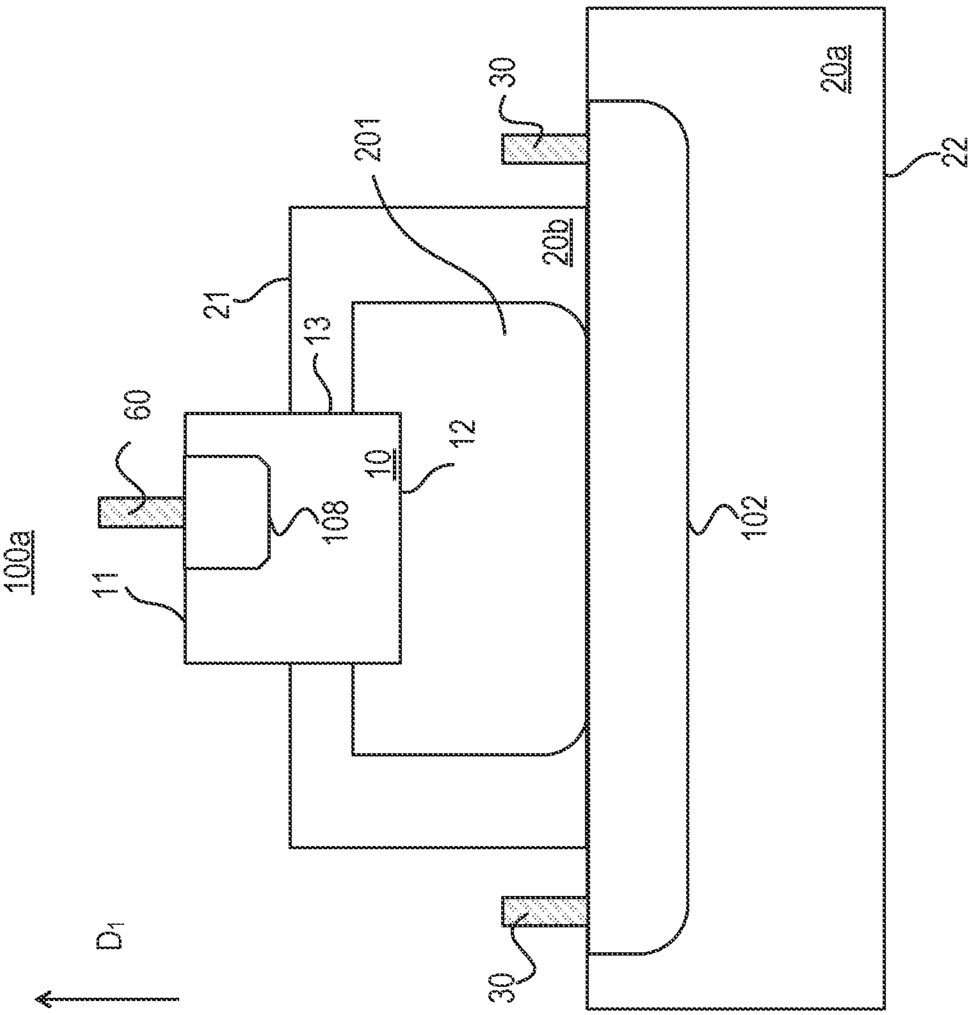

FIG. 1C illustrates a cross-sectional view of a photo-detecting device, according to some embodiments. The photo-detecting device 100*c* in FIG. 1C is similar to the photo-detecting device 100*a* in FIG. 1A. The difference is described below.

The substrate 20 includes a base portion 20*a* and an upper portion 20*b* supporting by the base portion 20*a*. The upper portion 20*b* has a width less than a width of the base portion 20*a*. The absorption region 10 is supported by the upper portion 20*b* of the substrate 20. The conducting region 201 is in the upper portion 20*b*. The first doped region 102 is in the base portion 20*a*. The first doped region 102 has a width greater than the width of the upper portion 20*b* of the substrate 20 and thus a part of the first doped region 102 is not covered by the upper portion 20*b*. The second doped region 108 is arranged over the first doped region 102 along the direction D1, and the conducting region 201 is between the first doped region 102 and the second doped region 108. The carriers with a first type generated from the absorption region 10, for example, electrons, will move towards first doped region 102 through the conducting region 201 along the direction D1.

In some embodiments, the first electrode 30 may be in any suitable shape, such as a ring from a top view of the photo-detecting device. In some embodiments, the photo-detecting device 100*c* includes two first electrodes 30 electrically coupled to the first doped region 102 and separated from each other. In some embodiments, the first electrodes 30 are disposed at opposite sides of the absorption region 10.

In some embodiments, based on the reverse bias voltage applied to the second doped region 108 and the first doped region 102, if an impact ionization occurs, the photo-detecting device 100*c* can be an avalanche photodiode operated in linear mode (reverse bias voltage<breakdown voltage) or Geiger mode (reverse bias voltage>breakdown voltage), and the portion of the conducting region 201 in between the absorption region 10 and the first doping region 102 can be a multiplication region. The multiplication region is then capable of generating one or more additional charge carriers in response to receiving the one or more carriers generated from the absorption region 10.

Figure 1D:
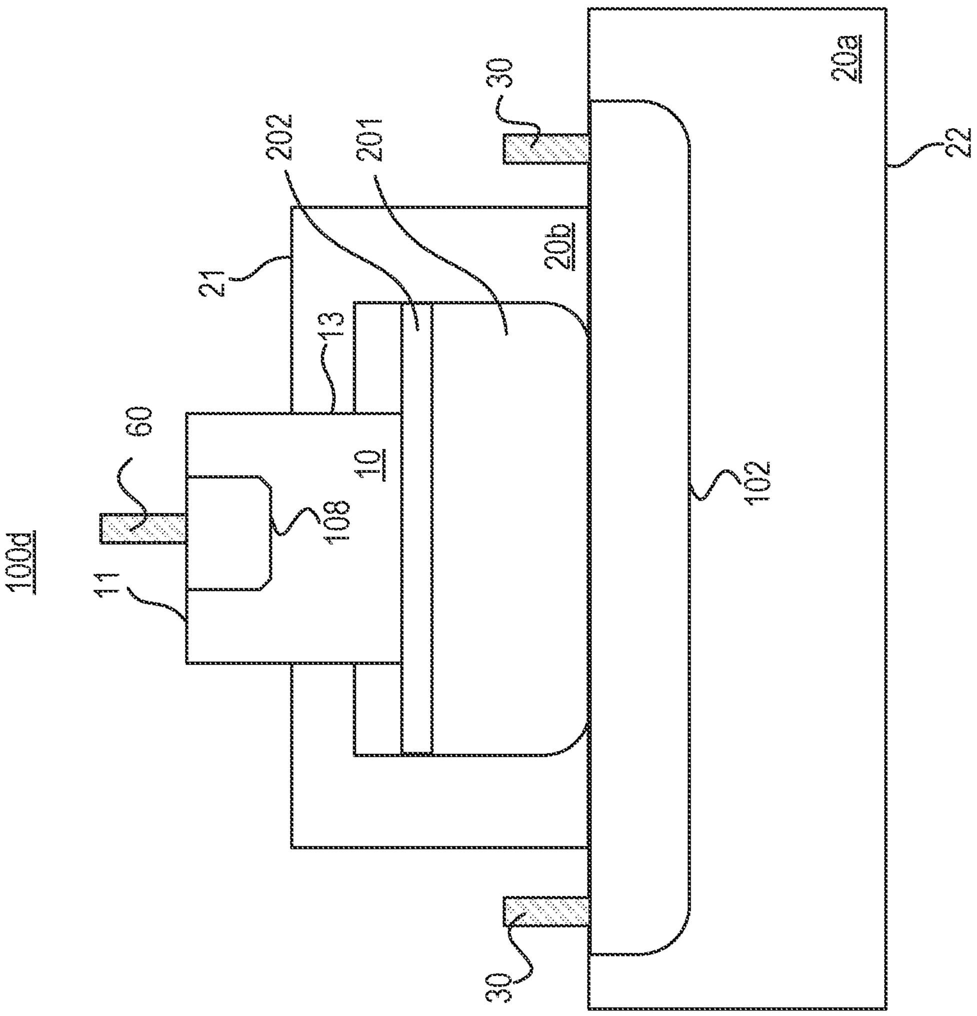

FIG. 1D illustrates a cross-sectional view of a photo-detecting device, according to some embodiments. The photo-detecting device 100*d* in FIG. 1D is similar to the photo-detecting device 100*c* in FIG. 1C. The difference is described below.

The photo-detecting device 100*d* further includes a charge layer 202 in the upper portion 20*b* of the substrate 20. The charge layer 202 is in direct contact with the absorption region 10 or overlapped with a portion of the absorption region 10. The charge layer 202 is of a conductivity type the same as the conductivity type of the absorption region 10. For example, if the conductivity type of the absorption region 10 is p, the conductivity type of the charge layer 202 is p. The charge layer 202 is with a peak doping concentration higher than the second peak doping concentration of the conducting region 201 and lower than the first peak doping concentration of the absorption region 10. In some embodiments, the charge layer 202 is with a thickness between 10 nm and 500 nm. The charge layer can reduce the electric field across the absorption region 10 and thus increase the electric field across the conducting region 201. That is, a difference between the electric field across the absorption region 10 and the electric field across the conducting region 201 presents. As a result, the speed and the responsivity of the photo-detecting device 100*d* is also higher, and the dark current of the photo-detecting device 100*d* is also lower.

Figure 2A:
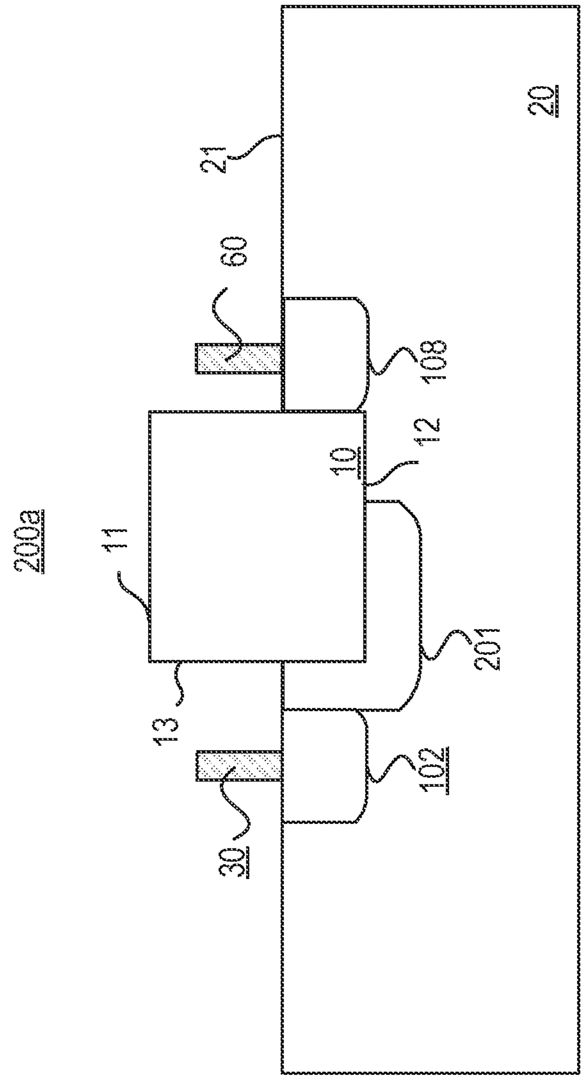
FIGS. 2A-2D illustrate cross-sectional views of a photo-detecting device, according to some embodiments.

FIG. 2A illustrates a cross-sectional view of a photo-detecting device, according to some embodiments. The photo-detecting device 200*a* in FIG. 2A is similar to the photo-detecting device 100*a* in FIG. 1A. The difference is described below. The second doped region 108 is in the substrate 20. In other words, the fourth peak doping concentration of the second doped region 108 lies in the substrate 20. In some embodiment, the second doped region 108 is below the first surface 21 of the substrate 20 and is in direct contact with the absorption region 10, for example, the second doped region 108 may be in contact with or overlapped with one of the side surfaces 13 of the absorption region 10. As a result, the carriers generated from the absorption region 10 can move from the absorption region 10 towards the second doped region 108 through the heterointerface between the absorption region 10 and the substrate 20. The second electrode 60 is over the first surface 21 of the substrate 20.

By having the second doped region 108 in the substrate 20 instead of in the absorption region 10, the second electrode 60 and the first electrode 30 can both be formed above the first surface 21 of the substrate 20. Therefore, a height difference between the second electrode 60 and the first electrode 30 can be reduced and thus the fabrication process afterwards will be benefit from this design. Besides, the area of the absorption region 10 absorbing the optical signal can be larger.

Figure 2B:
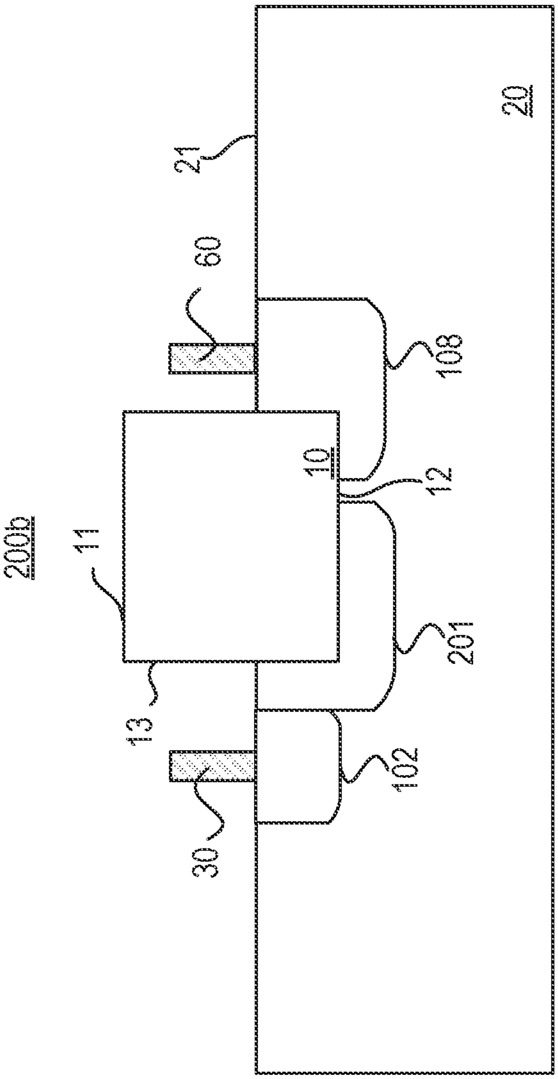

FIG. 2B illustrates a cross-sectional view of a photo-detecting device, according to some embodiments. The photo-detecting device 200*b* in FIG. 2B is similar to the photo-detecting device 200*a* in FIG. 2A. The difference is described below. The second doped region 108 can be also in contact with or overlapped with the second surface 12 of the absorption region 10.

Figure 2C:
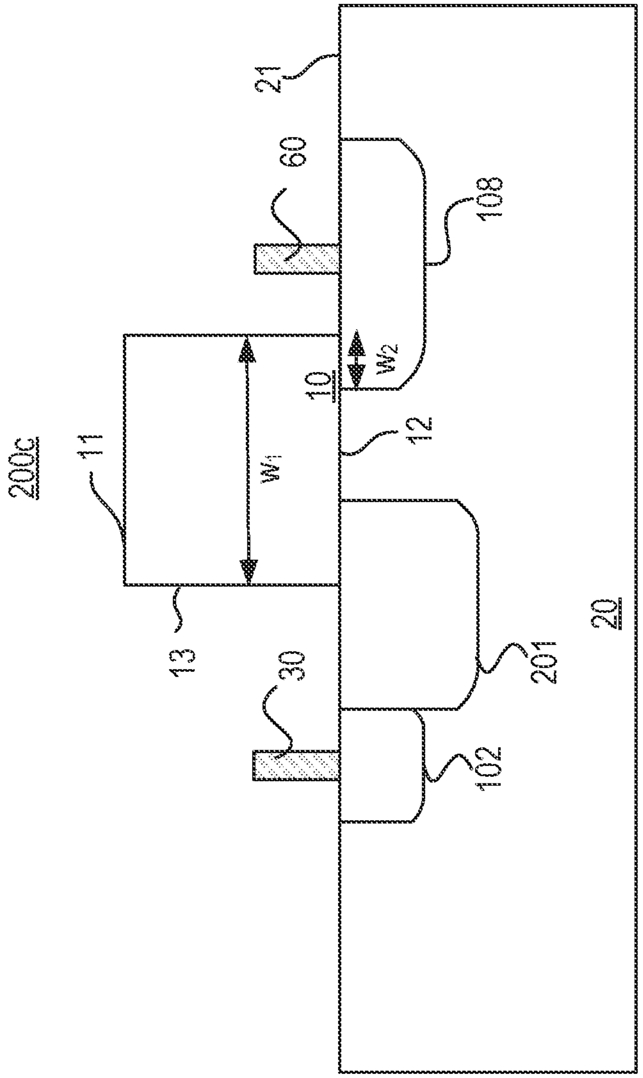

FIG. 2C illustrates a cross-sectional view of a photo-detecting device, according to some embodiments. The photo-detecting device 200*c* in FIG. 2C is similar to the photo-detecting device 200*b* in FIG. 2B. The difference is described below. The absorption region 10 is entirely over the substrate 20. A part of the second doped region 108 is covered by the absorption region 10. In some embodiments, a width w2 of the second doped region 108 covered by the absorption region 10 may be greater than 0.2 μm. In some embodiments, the absorption region 10 has a width w1. The width $w_2$ is not greater than 0.5 $w_1$. By this design, two different types of the carriers can move from the absorption region 10 to the first doped region 102 and from the absorption region 10 to the second doped region 108 respectively without obstruction.

Figure 2D:
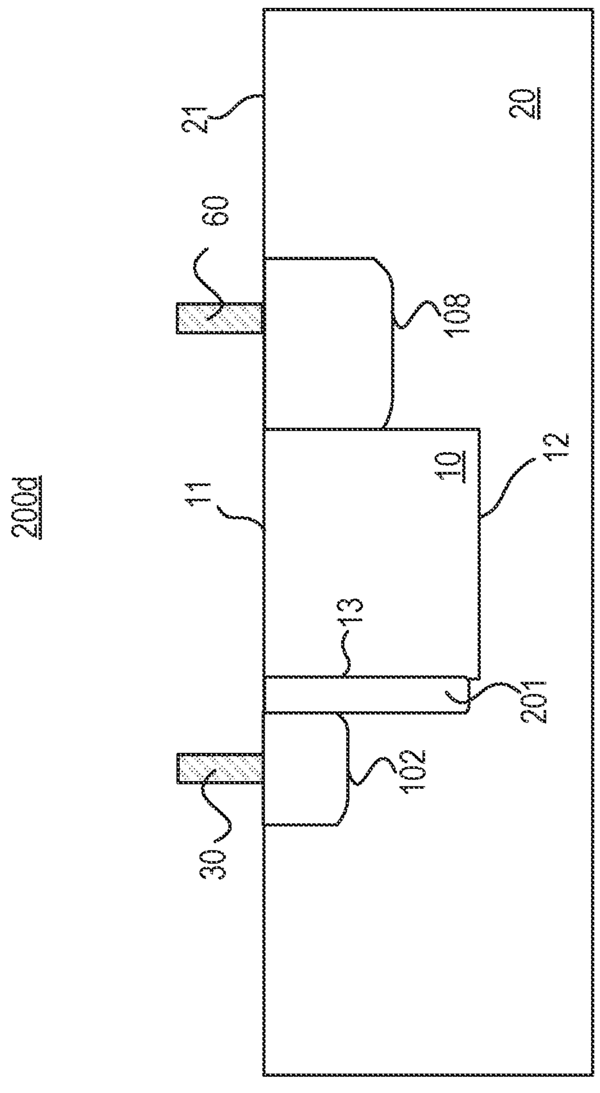
Figure 2E:
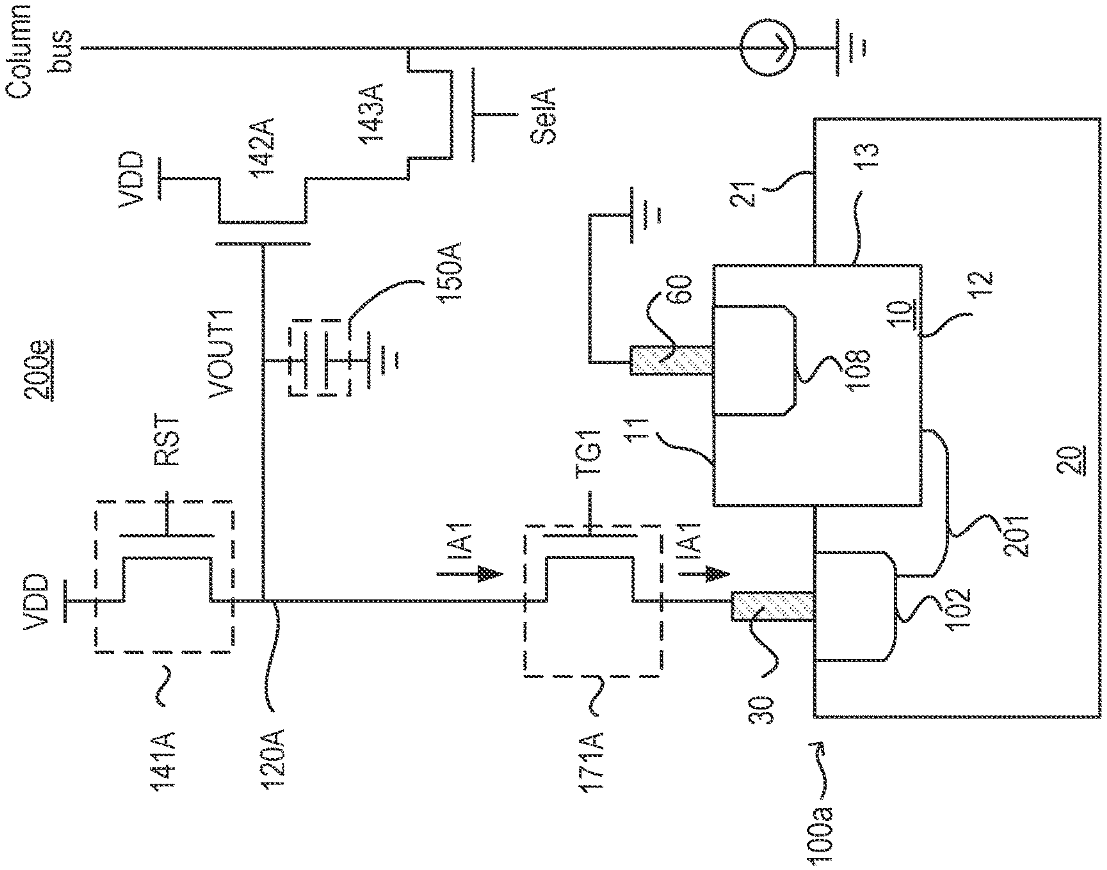
FIGS. 2E-2F show schematic diagrams of circuits of a photo-detecting apparatus, according to some embodiments.

FIG. 2D illustrates a cross-sectional view of a photo-detecting device, according to some embodiments. The photo-detecting device 200*d* in FIG. 2D is similar to the photo-detecting device 200*a* in FIG. 2A. The difference is described below. The absorption region 10 is entirely embedded in the substrate 20. In some embodiments, the graded doping profile of the first dopant is gradually and laterally decreased from the side surface 13 near the second doped region 108 to the side surface 13 near the conducting region 201. FIG. 2E shows a schematic diagram of a photo-detecting apparatus, according to some embodiments. The photo-detecting apparatus 200*e* includes a pixel (not labeled) and a column bus electrically coupled to the pixel. The pixel includes a photo-detecting device and a readout circuit (not labeled) electrically coupled to the photo-detecting device and the column bus. The photo-detecting device can be any photo-detecting device in FIG. 1A through FIG. 1D and FIG. 2A through FIG. 2D, for example, the photo-detecting device 100*a* in FIG. 1A. In some embodiments, the readout circuit (not labeled) and the column bus may be fabricated on another substrate and integrated/co-packaged with the photo-detecting device via die/wafer bonding or stacking. In some embodiments, the photo-detecting apparatus 200*e* includes a bonding layer (not shown) between the readout circuit and the photo-detecting device. The bonding layer may include any suitable material such as oxide or semiconductor or metal or alloy.

In some embodiments, the readout circuit can be electrically coupled to the first doped region 102 or the second doped region 108 to process the collected carriers with a first type, and a supply voltage or a ground voltage can be applied to the other doped region to evacuate other carriers with a second type opposite to the first type.

For example, if the first doped region 102 is of n-type and the second doped region 108 is of p-type, the readout circuit can be electrically coupled to the first doped region 102 for processing the collected electrons for further application, and a ground voltage can be applied to the second doped region 108 to evacuate holes. For another example, the readout circuit can also be electrically coupled to the second doped region 108 for processing the collected holes for further application, and a supply voltage can be applied to the first doped region 102 to evacuate electrons.

In some embodiments, the readout circuit may be in a three-transistor configuration consisting of a reset gate, a source-follower, and a selection gate, or in a four-transistor configuration including an additional transfer gate, or any suitable circuitry for processing collected charges. For example, the readout circuit includes a transfer transistor 171A, a reset transistor 141A, a capacitor 150A coupled to the reset transistor 141A, a source follower 142A, and a row selection transistor 143A. Examples of the capacitor 150A include, but not limited to, floating-diffusion capacitors, metal-oxide-metal (MOM) capacitors, metal-insulator-metal (MIM) capacitors, and metal-oxide-semiconductor (MOS) capacitors.

The transfer transistor 171A transfers carriers from the photo-detecting device 100*a* to the capacitor 150A. In other words, the transfer transistor 171A is configured to output the photo-current IA1 according to a switch signal TG1. When the switch signal TG1 turns on the transfer transistor 171A, the photo-current IA1 will be generated.

At the beginning, the reset signal RST resets the output voltage VOUT1 to VDD. Then, when the switch signal TG1 turns on the transfer transistor 171A, the photo-current IA1 is generated, the output voltage VOUT1 on the capacitor 150A will drop until the switch signal TG1 turns off the transistor 171A.

In some other embodiments, the readout circuit may be fabricated on another substrate and integrated/co-packaged with the photo-detecting device 100*a* via die/wafer bonding or stacking.

In some embodiments, the photo-detecting apparatus is an CMOS image sensor is operated at a frame rate not more than 1000 frames per second fps.

Figure 2F:
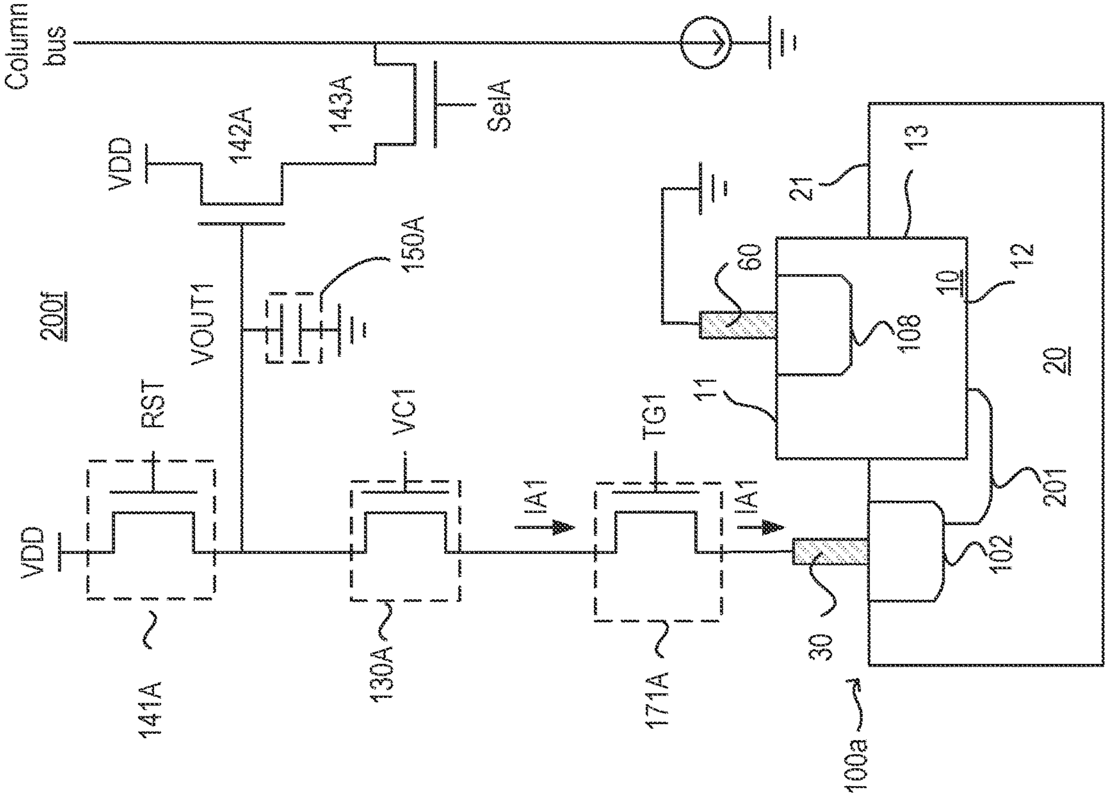

FIG. 2F shows a schematic diagram of circuits of a photo-detecting apparatus, according to some embodiments. The photo-detecting apparatus 200*f* is similar to the photo-detecting apparatus 200*e* in FIG. 2E. The difference is described below.

The readout circuit of the photo-detecting apparatus 200*f* further includes a voltage-control transistor 130A between the transfer transistor 171A and the capacitor 150A. The voltage-control transistor 130A is configured as a current buffer. Specifically, an output terminal of the voltage-control transistor 130A is coupled to the input terminal of the capacitor 150A, and the input terminal of the voltage-control transistor 130A is coupled to the output terminal of the transistor 171A. The control terminal of the voltage-control transistor 130A is coupled to a control voltage VC1.

Since the voltage-control transistor 130A is coupled between the transfer transistor 171A and the capacitor 150A, the output terminal of the transfer transistor 171A and the input terminal of capacitor 150A are separated. When the voltage-control transistor 130A is operated in a subthreshold or saturation region, the output terminal of the transfer transistor 171A can be controlled or biased at a constant voltage VA1 to reduce the dark current generated by the photo-detecting device 100*a*.

Figure 3A:
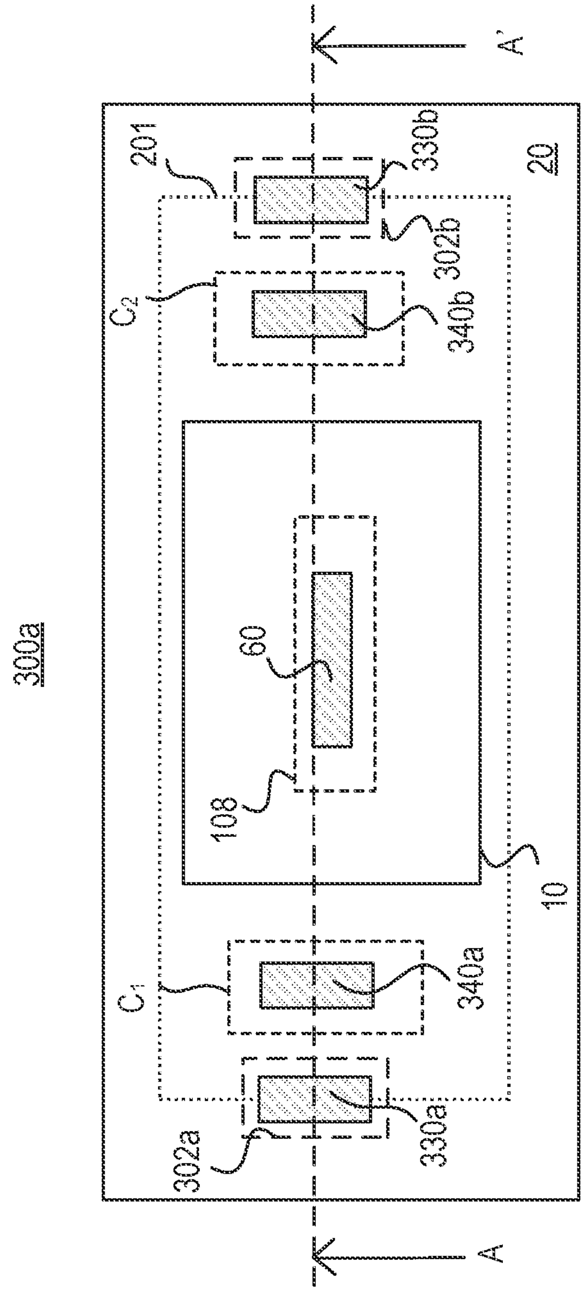
FIG. 3A illustrates a top view of a photo-detecting device, according to some embodiments.
Figure 3B:
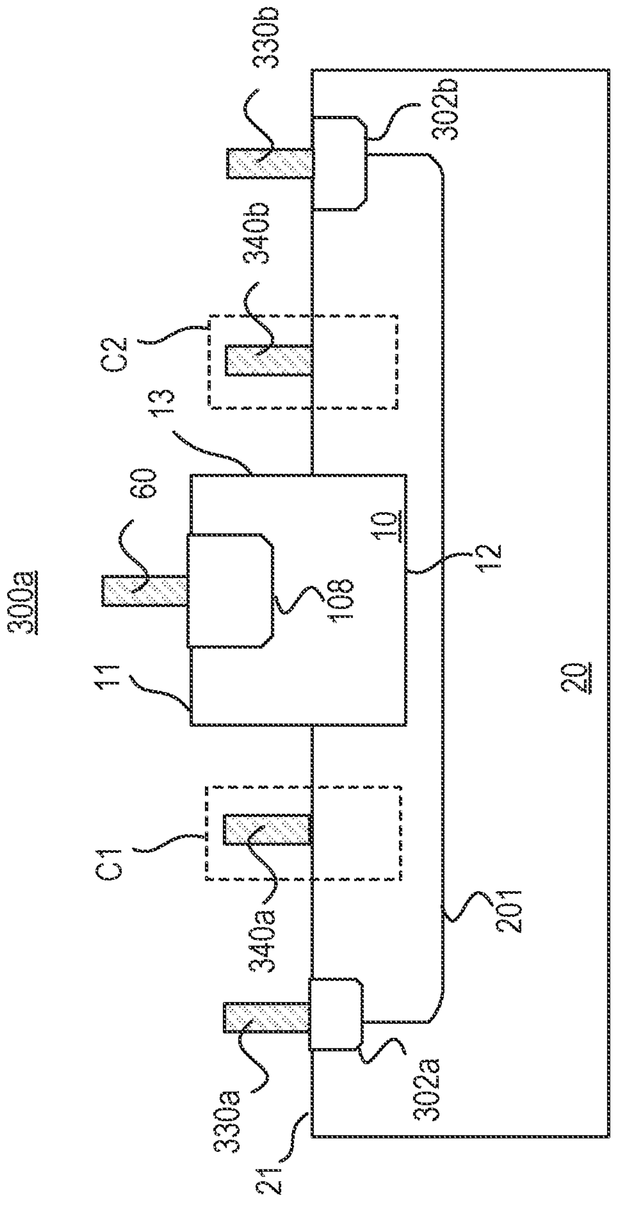
FIG. 3B illustrates a cross-sectional view along an A-A' line in FIG. 3A, according to some embodiments.

FIG. 3A illustrates a top view of a photo-detecting device, according to some embodiments. FIG. 3B illustrates a cross-sectional view along an A-A' line in FIG. 3A, according to some embodiments. The photo-detecting device includes an absorption region 10 and a substrate 20 supporting the absorption region 10. The absorption region 10 is similar to the absorption region 10 as described in FIG. 1A. The substrate 20 is similar to the substrate 20 as described in FIG. 1A. The difference between the photo-detecting device 300*a* in FIG. 3A and the photo-detecting device 100*a* in FIG. 1A is described below. The photo-detecting device 300*a* includes a first switch (not labeled) and a second switch (not labeled) electrically coupled to the absorption region 10 and partially formed in the carrier conducting layer, that is the substrate 20 in some embodiments. The first switch includes a control region C1 including a control electrode 340*a*. The first switch further includes a readout electrode 330*a* separated from the control electrode 340*a*. The second switch includes a control region C2 including a control electrode 340*b*. The second switch further includes a readout electrode 330*b* separated from the control electrode 340*b*. In some embodiments, the readout electrodes 330*a*, 330*b*, and the control electrodes 340*a*, 340*b* are formed over a first surface 21 of the substrate 20 and are separated from the absorption region 10. In some embodiments, the readout electrode 330*a* and the readout electrode 330*b* are disposed at opposite sides of the absorption region 10. In some embodiments, a nearest distance between one of the control electrodes and the one or more side surfaces of the absorption region is between 0.1 μm and 20 μM.

In some embodiments, a photo-detecting apparatus includes a pixel including the photo-detecting device 300*a* as mentioned above, and the pixel further includes two control signals, for example, a first control signal and a second control signal, controlling the control regions C1, C2 respectively for controlling the moving direction of the electrons or holes generated by the absorbed photons in the absorption region 10. In some embodiments, the first control signal is different from the second control signal. For example, when voltages are used, if one of the control signals is biased against the other control signal, an electric field is created between the two portions right under the control electrodes 340*a*, 340*b* as well as in the absorption region 10, and free carriers in the absorption region 10 drift towards one of the portions right under the readout electrodes 330*b* 330*a* depending on the direction of the electric field. In some embodiments the first control signal includes a first phase, and the second control signal includes second phase, where the first control phase is not overlapped with the second control phase. In some embodiments, the first control signal is fixed at a voltage value V, and the second control signal is alternate between voltage values V±ΔV. In some embodiments, ΔV is generated by a varying voltage signal, e.g., sinusoid signal, clock signal or pulse signal operated between 0V and 3V. The direction of the bias value determines the drift direction of the carriers generated from the absorption region 10. The control signals are modulated signals.

In some embodiments, the first switch includes a first doped region 302*a* under the readout electrodes 330*a*. The second switch includes a first doped region 302*b* under the readout electrodes 330*b*. In some embodiments, the first doped regions 302*a*, 302*b* are of a conductivity type different from conductivity type of the absorption region 10. In some embodiments, the first doped regions 302*a*, 302*b* include a dopant and a dopant profile with a peak dopant concentration. In some embodiments, the peak doping concentrations of the first doped regions 302*a*, 302*b* are higher than the second peak doping concentration. In some embodiments, the peak dopant concentrations of the first doped regions 302*a*, 302*b* depend on the material of the readout electrodes 330*a*, 330*b* and the material of the substrate 20, for example, can be between $5\times10^{18}$ $cm^{-3}$ to $5\times10^{20}$ $cm^{-3}$. The first doped regions 302*a*, 302*b* are carrier collection regions for collecting the carriers with the first type generated from the absorption region 10 based on the control of the two control signals.

In some embodiments, the absorption function and the carrier control function such as demodulation of the carriers and collection of the carriers operate in the absorption region 10 and the carrier conducting layer, that is, the substrate 20 in some embodiments, respectively.

In some embodiments, the photo-detecting device 300*a* may include a second doped region 108 and a second electrode 60 similar to the second doped region 108 and the second electrode 60 respectively in FIG. 1A. The second doped region 108 is for evacuating the carriers of the second type opposite to the first type, which are not collected by the first doped regions 302*a*, 302*b*, during the operation of the photo-detecting device. In some embodiments, the control electrodes 340*a* is symmetric to the control electrode 340*b* with respect to an axis passing through the second electrode 60. In some embodiments, the readout electrode 330*a* is symmetric to the readout electrodes 330*b* with respect to an axis passing through the second electrode 60. The control electrodes 340*a*, 340*b*, the readout electrodes 330*a*, 330*b* and the second electrode 60 are all disposed over the of the first surface of the carrier conducting layer. That is, the control electrodes 340*a*, 340*b*, the readout electrodes 330*a*, 330*b* and the second electrode 60 are over a same side of the carrier conducting layer, that is the substrate 20 in some embodiment.

In some embodiments, the substrate 20 of the photo-detecting device 300*a* includes a conducting region 201 similar to the conducting region 201 as described in FIG. 1A. The difference is described below. In some embodiments, from a cross-sectional view of the photo-detecting device 300*a*, a width of the conducting region 201 can be greater than a distance between the two readout electrodes 330*a*, 330*b*. In some embodiments, the conducting region 201 is overlapped with the entire first doped regions 302*a*, 302*b*. In some embodiments, a width of the conducting region 201 can be less than a distance between the two readout electrodes 330*a*, 330*b* and greater than a distance between the two control electrodes 340*a*, 340*b*. In some embodiments, the conducting region 201 is overlapped with a portion of first doped region 302*a* and a portion of the first doped region 302*b*. Since the conducting region 201 is overlapped with at least a portion of first doped region 302*a* and at least a portion of the first doped region 302*b*, the carriers with a first type that are generated from the absorption region 10 can be confined in the conducting region 201 and move towards one of the first doped regions 302*a*, 302*b* based on the control of the two control signals. For example, if the first doped regions 302*a*, 302*b* are of n-type, the conducting region 201 is of n-type, the second doped region 108 is p-type, the electrons generated from the absorption region 10 can be confined in the conducting region 201 and move towards one of the first doped regions 302*a*, 302*b* based on the control of the two control signals, and the holes can move towards the second doped region 108 and can be further evacuated by a circuit.

In some embodiments, the photo-detecting apparatus includes a pixel array including multiple repeating pixels. In some embodiments, the pixel array may be a one-dimensional or a two-dimensional array of pixels.

A photo-detecting device in accordance to a comparative example includes structures substantially the same as the structures of a photo-detecting device 300*a* in FIG. 3A, the difference is that in the photo-detecting device of the comparative example, the doping concentration of the absorption region 10 is not higher than the second peak doping concentration of the substrate 20 and the doping concentration of the second dopant at the heterointerface is not lower than the doping concentration of the first dopant at the heterointerface.

The details of the photo-detecting device in accordance to a comparative example and the photo-detecting device 300*a* are listed in Table 7 and Table 8.

TABLE 7

| Details of the photo-detecting device in accordance to a comparative example | |
|---|---|
| Conductivity type of the absorption region | p-type, |
| First peak doping concentration | $1\times10^{15}$ cm−3 |
| Conductivity type of the substrate | n-type |
| Second peak doping concentration | $1\times10^{15}$ cm−3 |
| Reference photocurrent | $1\times10^{-6}$ A |

TABLE 8

| Details of the photo-detecting device 300a | |
|---|---|
| Conductivity type of the absorption region | p-type, |
| First peak doping concentration | $1\times10^{17}$ $cm^{-3}$ |
| Conductivity type of the substrate | n-type |
| Second peak doping concentration | $1\times10^{15}$ cm−3 |
| Photocurrent | Referring to Table 10 |

Referring to Table 9 and Table 10, compared to the comparative example, since the first peak doping concentration of the absorption region 10 in the photo-detecting device 300*a* is higher than the second peak doping concentration of the substrate 20, the photo-detecting device 300*a* can have lower dark current, for example, at least 100 times lower.

TABLE 9

| Results of the comparative example | | | |
|---|---|---|---|
| Current measured at: | second electrode 60 @ 0 V | control electrode 330b @ 3.2 V | readout electrode 340b @3.3 V |
| Without incident light | ~L | ~L | ~D |
| With incident light | ~L | ~L | ~P |

Unit: Arbitrary Unit

TABLE 10

| Results of the photo-detecting device 300a | | | |
|---|---|---|---|
| Current measured at: | second electrode 60 @ 0 V | control electrode 330b @ 3.2 V | readout electrode 340b @3.3 V |
| Without incident light | ~10 L | ~10 L | ~0.01 D |
| With incident light | ~10 L | ~10 L | ~0.9 P |

Unit: Arbitrary Unit

In some embodiments, a voltage can be applied to the second electrode 60. In some embodiments, the voltage applied to the second electrode 60 can reduce a leakage current between the second doped region 108 and the control regions C1, C2. In some embodiment, the voltage is between the voltage applied to the control electrode 340*a* and the voltage applied to the control electrode 340*b* when operating the photo-detecting device 300*a*.

Figure 4A:
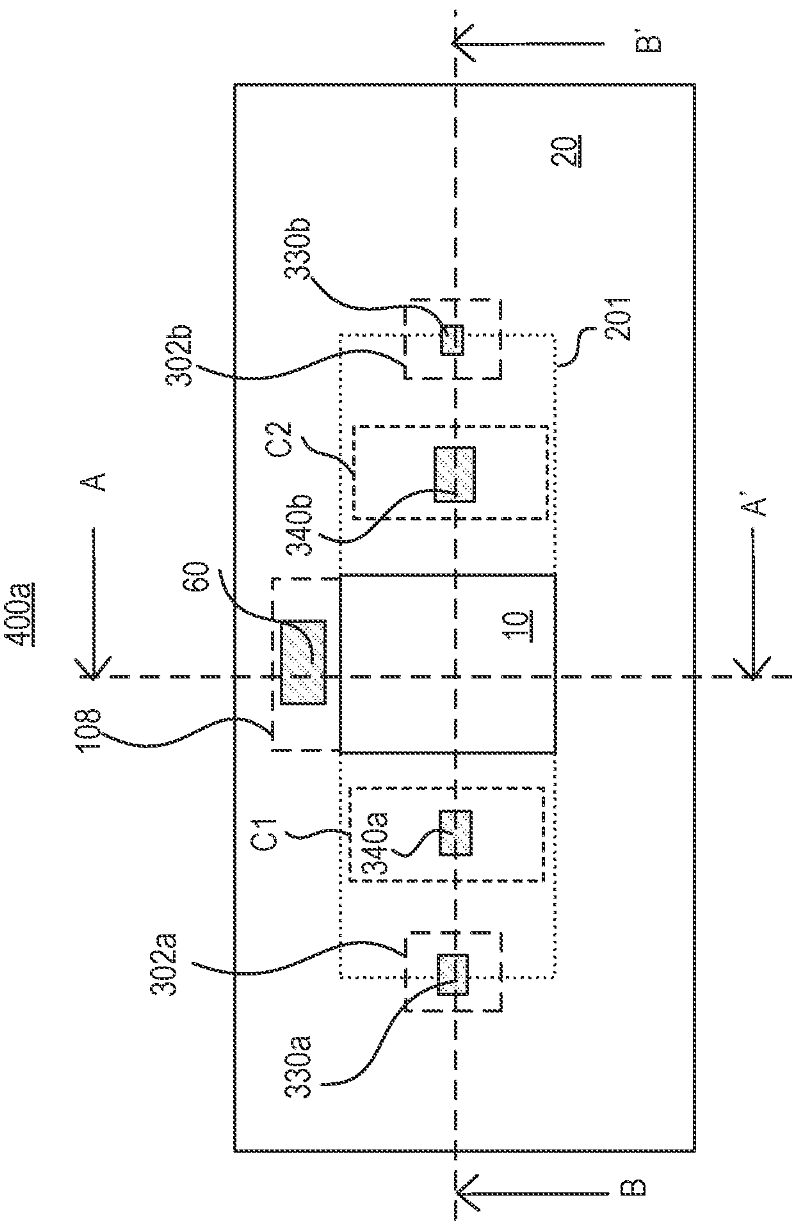
FIG. 4A illustrates a top view of a photo-detecting device, according to some embodiments.
Figure 4B:
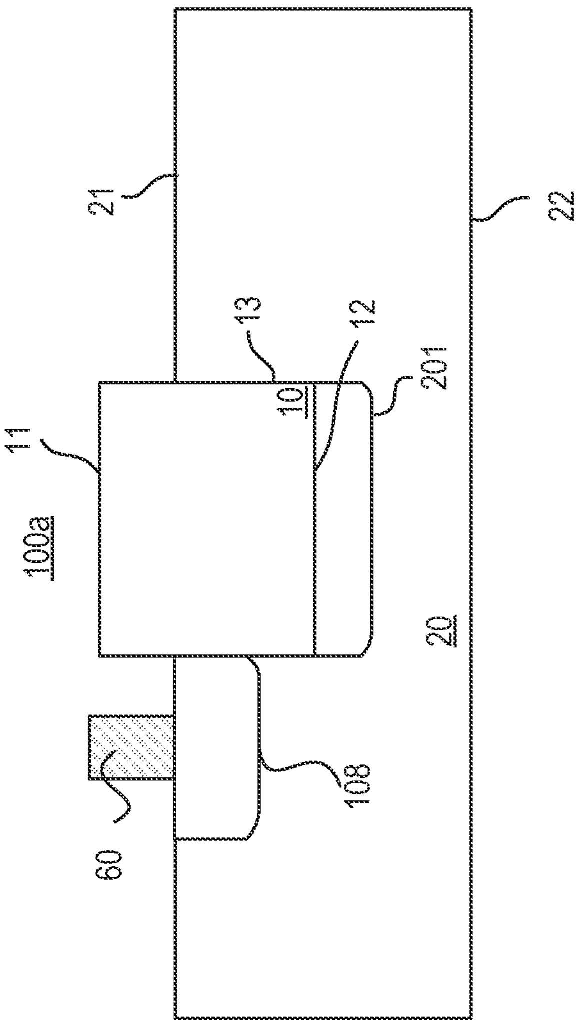
FIG. 4B illustrates a cross-sectional view along an A-A' line in FIG. 4A, according to some embodiments.
Figure 4C:
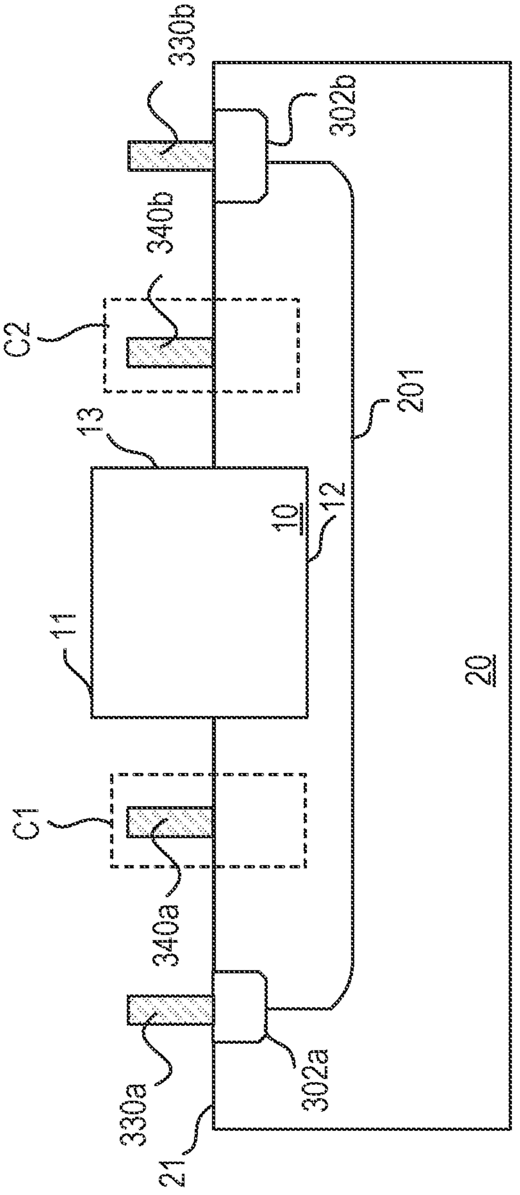
FIG. 4C illustrates a cross-sectional view along a B-B' line in FIG. 4A, according to some embodiments.

FIG. 4A illustrates a top view of a photo-detecting device, according to some embodiments. FIG. 4B illustrates a cross-sectional view along an A-A' line in FIG. 4A, according to some embodiments. FIG. 4C illustrates a cross-sectional view along a B-B' line in FIG. 4A, according to some embodiments. The photo-detecting device 400*a* in FIG. 4A is similar to the photo-detecting device 300*a* in FIG. 3A. The difference is described below.

Referring to FIG. 4A and FIG. 4B, the second doped region 108 is in the substrate 20. In other words, the fourth peak doping concentration of the second doped region 108 lies in the substrate 20. The second doped region 108 is below the first surface 21 of the substrate 20 and is in direct contact with the absorption region 10, for example, the second doped region 108 may be in contact with or overlapped with one of the side surfaces 13 of the absorption region 10. As a result, the carriers with the second type, which are not collected by the first doped regions 302*a*, 302*b*, can move from the absorption region 10 towards the second doped region 108 through the heterointerface between the absorption region 10 and the substrate 20.

For example, if the first doped regions 302*a*, 302*b* are of n-type, the conducting region 201 is of n-type, the second doped region 108 is p-type, the electrons generated from the absorption region 10 can be confined in the conducting region 201 and move towards one of the first doped regions 302*a*, 302*b* based on the control of the two control signals, and the holes can move towards the second doped region 108 through the heterointerface between the absorption region 10 and the substrate 20 and can be further evacuated by a circuit.

The second electrode 60 is over the first surface 21 of the substrate 20. By having the second doped region 108 in the substrate 20 instead of in the absorption region 10, the second electrode 60, the readout electrodes 330*a*, 330*b*, and the control electrodes 340*a*, 340*b* can all be coplanarly formed above the first surface 21 of the substrate 20. Therefore, a height difference between any two of the second electrode 60 and the four electrodes 330*a*, 330*b*, 340*a*, 340*b* can be reduced and thus the fabrication process afterwards will be benefit from this design. Besides, the area of the absorption region 10 absorbing the optical signal can be larger.

Figure 5A:
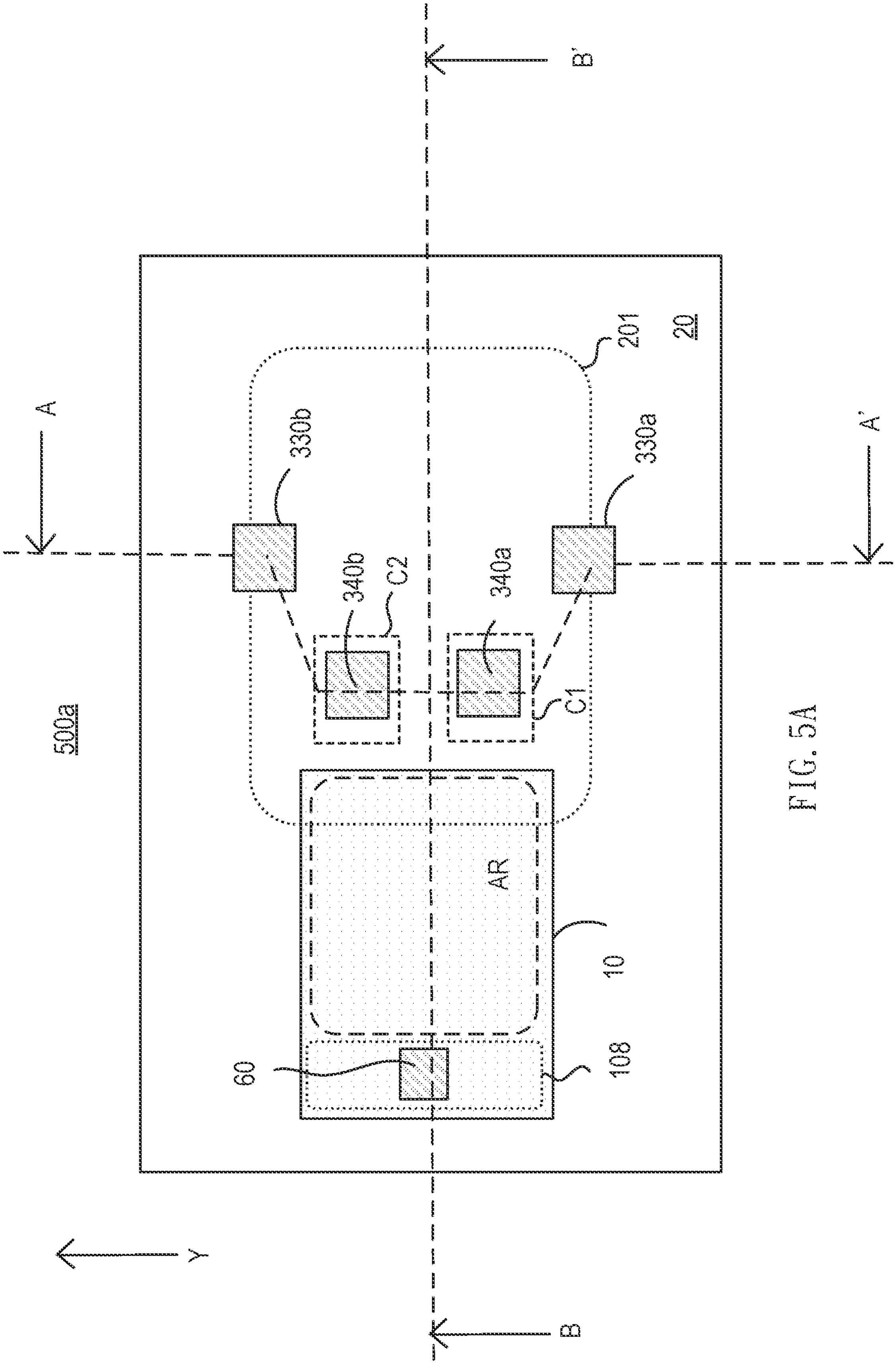
FIG. 5A illustrates a top view of a photo-detecting device, according to some embodiments.
Figure 5B:
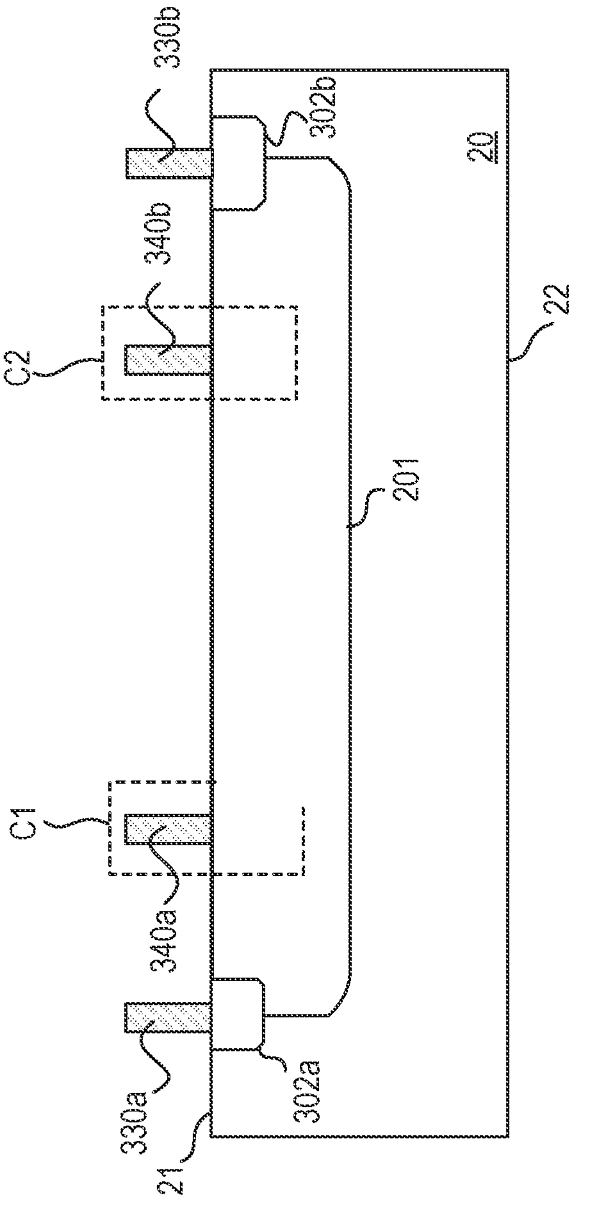
FIG. 5B illustrates a cross-sectional view along an A-A' line in FIG. 5A, according to some embodiments.
Figure 5C:
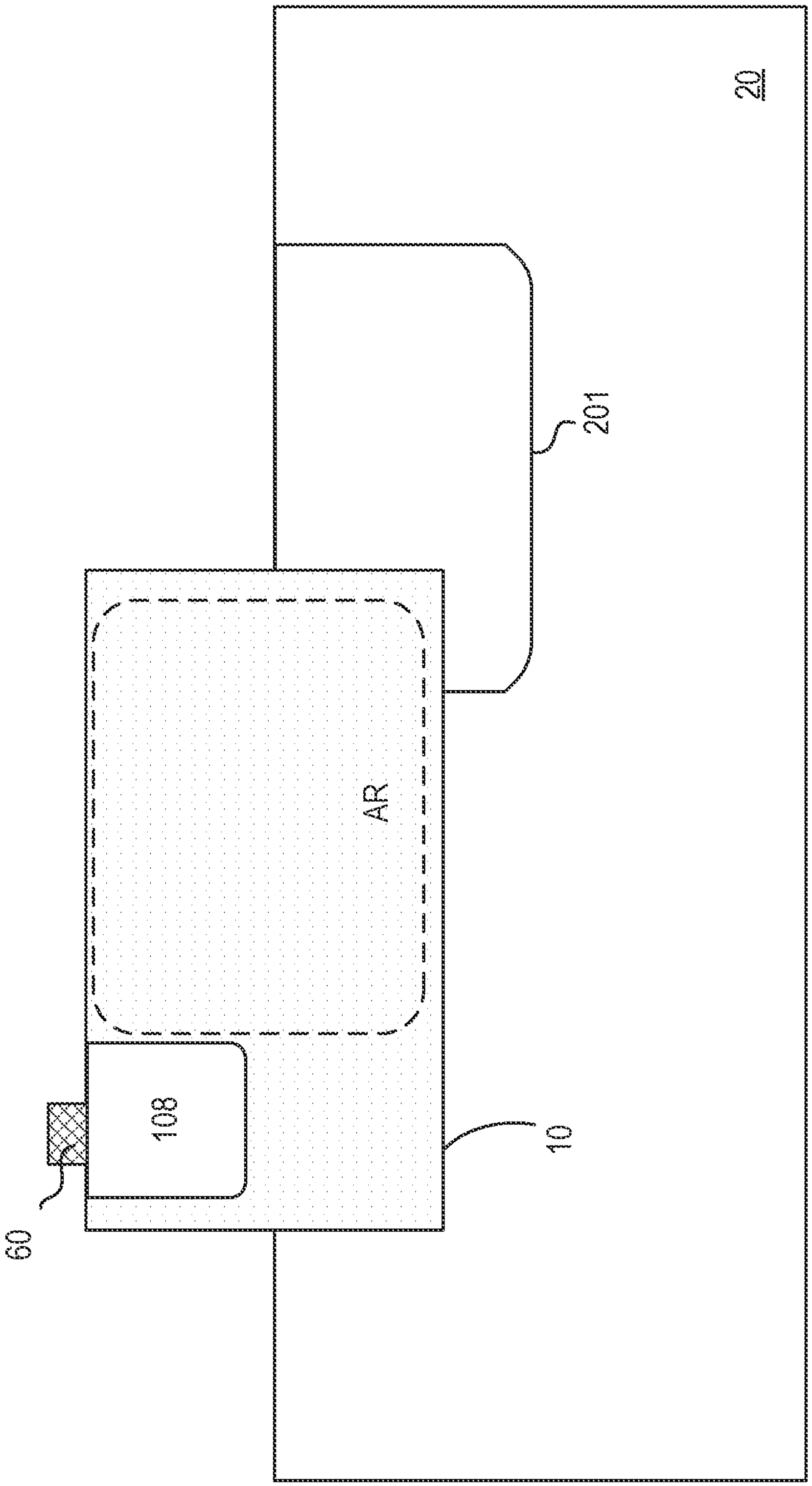
FIG. 5C illustrates a cross-sectional view along a B-B' line in FIG. 4A, according to some embodiments.

FIG. 5A illustrates a top view of a photo-detecting device, according to some embodiments. FIG. 5B illustrates a cross-sectional view along an A-A' line in FIG. 5A, according to some embodiments. FIG. 5C illustrates a cross-sectional view along a B-B' line in FIG. 5A, according to some embodiments. The photo-detecting device 500*a* in FIG. 5A is similar to the photo-detecting device 400*a* in FIG. 4A. The difference is described below. The readout electrodes 330*a*, 330*b* and the control electrodes 340*a*, 340*b* are disposed at the same side of the absorption region 10, which improves the contrast ratio of the photo-detecting device 400*a* since the carriers are forced to move out from the absorption region 10 through one of the side surfaces 13. In some embodiments, the distance between the readout electrodes 330*a*, 330*b* along a direction Y can be greater than the distance between the control electrodes 340*a*, 340*b* along the direction Y. In some embodiments, the distance between the readout electrodes 330*a*, 330*b* along a direction Y can be substantially the same as the distance between the control electrodes 340*a*, 340*b* along the direction Y.

Figure 6A:
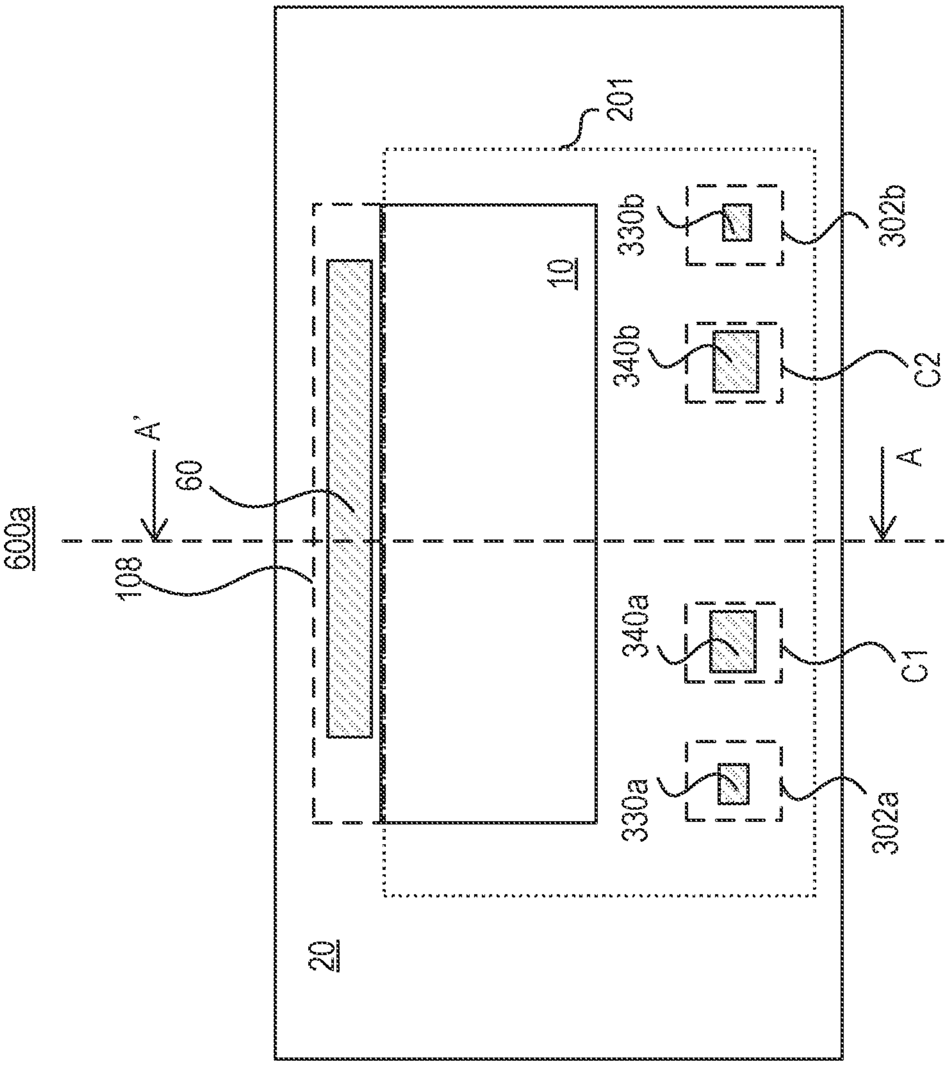
FIG. 6A illustrates a top view of a photo-detecting device, according to some embodiments.
Figure 6B:
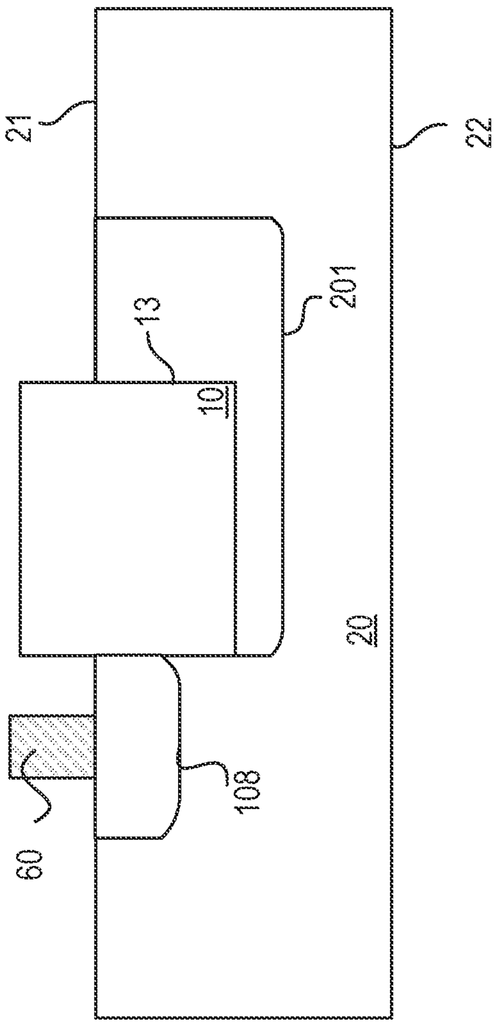
FIG. 6B illustrates a cross-sectional view along an A-A' line in FIG. 6A, according to some embodiments.

FIG. 6A illustrates a top view of a photo-detecting device, according to some embodiments. FIG. 6B illustrates a cross-sectional view along an A-A' line in FIG. 6A, according to some embodiments. The photo-detecting device 600*a* in FIG. 6A is similar to the photo-detecting device 500*a* in FIG. 5A, for example, the readout electrodes 330*a*, 330*b* and the control electrodes 340*a*, 340*b* are disposed at the same side of the absorption region 10. The difference is described below.

Referring to FIG. 6A and FIG. 6B, the second doped region 108 is in the substrate 20. In other words, the fourth peak doping concentration of the second doped region 108 lies in the substrate 20. The second doped region 108 is below the first surface 21 of the substrate 20 and is in direct contact with the absorption region 10, for example, the second doped region 108 may be in contact with or overlapped with one of the side surfaces 13 of the absorption region 10. As a result, the carriers with the second type, which are not collected by the first doped regions 302*a*, 302*b*, can move from the absorption region 10 towards the second doped region 108 through the heterointerface between the absorption region 10 and the substrate 20. The second electrode 60 is over the first surface 21 of the substrate 20. The absorption region 10 is between the second electrode 60 and the four electrodes 330*a*, 330*b*, 340*a*, 340*b*.

By having the second doped region 108 in the substrate 20 instead of in the absorption region 10, the second electrode 60 and the four electrodes 330*a*, 330*b*, 340*a*, 340*b* can both be coplanarly formed above the first surface 21 of the substrate 20. Therefore, a height difference between any two of the second electrode 60 and the four electrodes 330*a*, 330*b*, 340*a*, 340*b* can be reduced and thus the fabrication process afterwards will be benefit from this design. Besides, the area of the absorption region 10 absorbing the optical signal can be larger.

In some embodiments, the conducting region 201 can be overlapped with the entire first doped regions 302*a*, 302*b*.

Figure 6C:
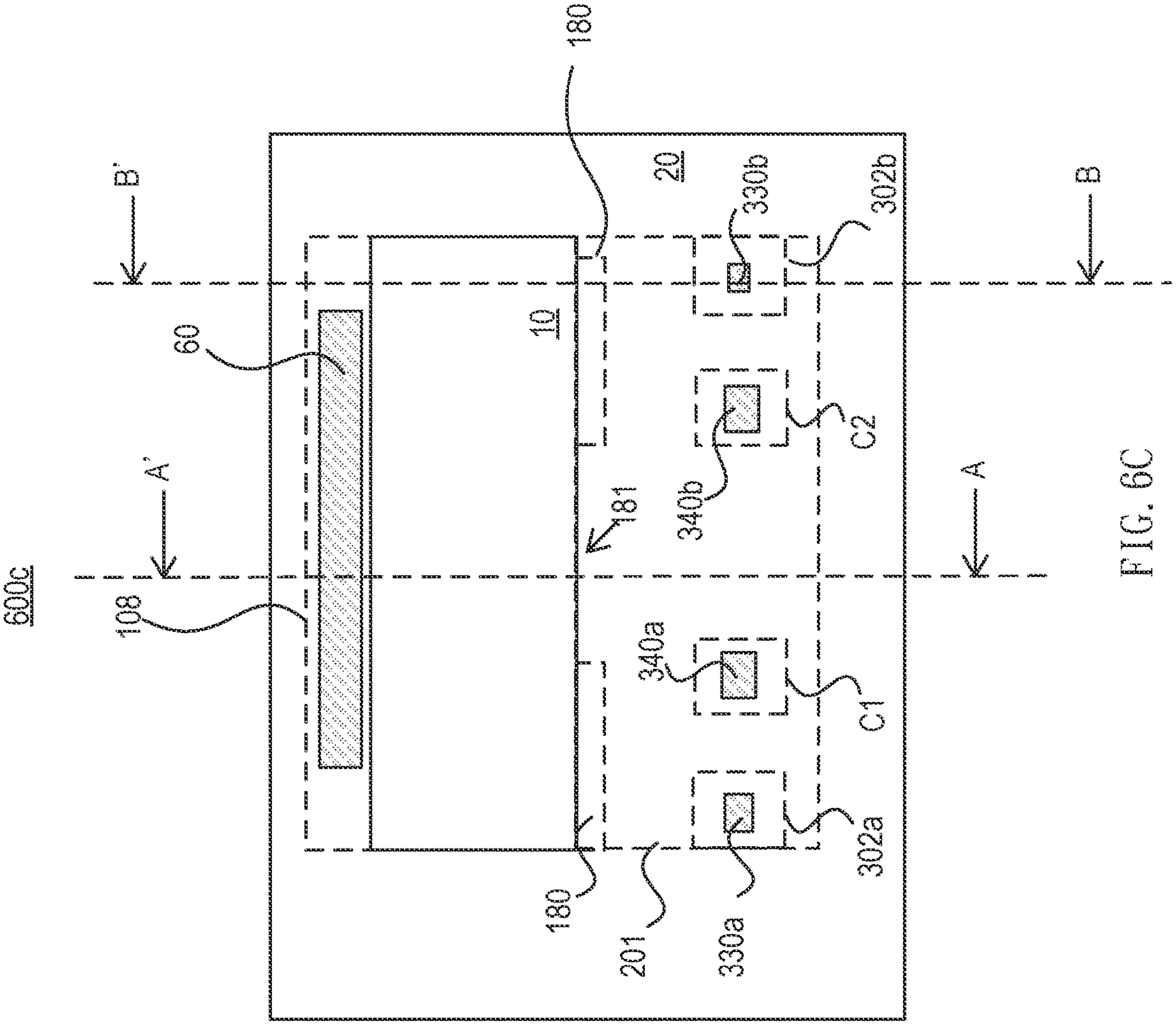
FIG. 6C illustrates a top view of a photo-detecting device, according to some embodiments.
Figure 6D:
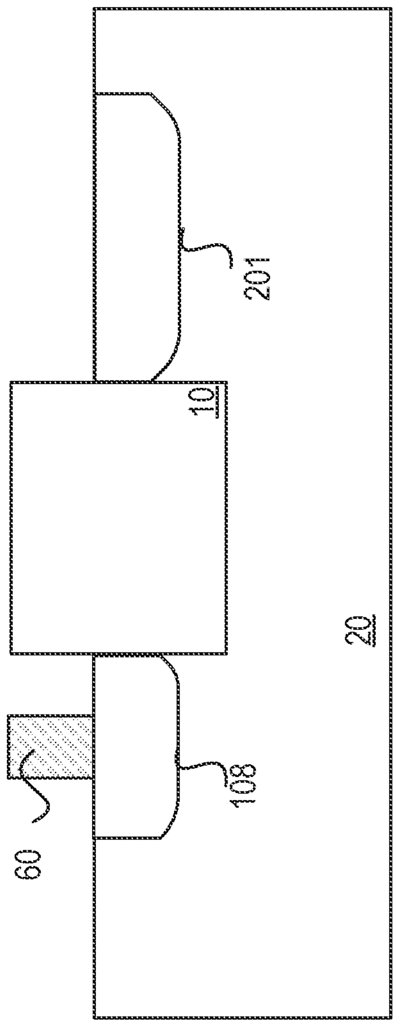
FIG. 6D illustrates a cross-sectional view along an A-A' line in FIG. 6C, according to some embodiments.
Figure 6E:
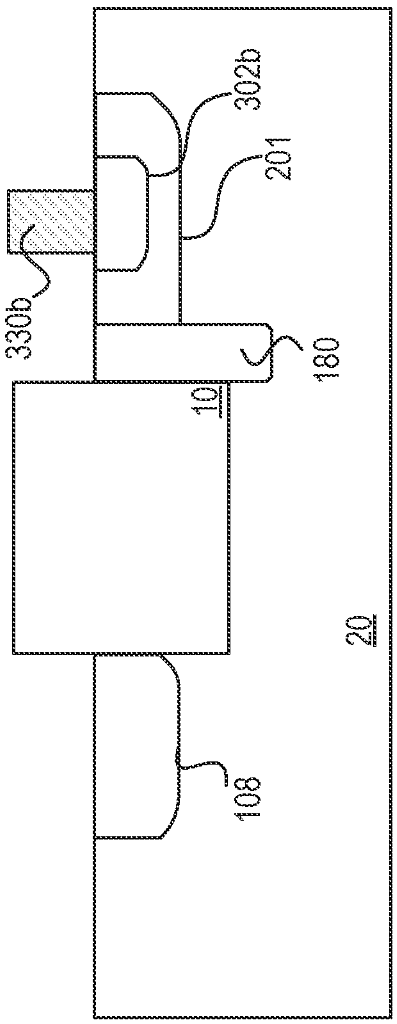
FIG. 6E illustrates a cross-sectional view along a B-B' line in FIG. 6C, according to some embodiments.

FIG. 6C illustrates a top view of a photo-detecting device, according to some embodiments. FIG. 6D illustrates a cross-sectional view along an A-A' line in FIG. 6C, according to some embodiments. FIG. 6E illustrates a cross-sectional view along a B-B' line in FIG. 6C, according to some embodiments. The photo-detecting device 600*c* in FIG. 6C is similar to the photo-detecting device 600*a* in FIG. 6A, the difference is described below. The photo-detecting device 600*c* further includes a confined region 180 between the absorption region 10 and the first doped regions 302*a*, 302*b* to cover at least a part of the heterointerface between the absorption region 10 and the substrate 20. The confined region 180 has a conductivity type different from the conductivity type of the first doped regions 302*a*, 302*b*. In some embodiments, the confined region 180 includes a dopant having a peak doping concentration. The peak doping concentration is equal to or greater than $1\times10^{16}$ $cm^{-3}$. The conducting region 201 has a channel 181 formed through the confined region 180, so as to keep a part of the conducting region 201 in direct contact with the absorption region 10 for allowing photo-carriers to move from the absorption region 10 towards the first doped regions 302*a*, 302*b*. That is, the channel 181 is not covered by the confined region 180. In some embodiments, the peak doping concentration of the confined region 180 is lower than the second peak doping concentration of the conducting region 201. In some embodiments, the peak doping concentration of the confined region 180 is higher than the second peak doping concentration of the conducting region 201. For example, when the photo-detecting device is configured to collect electrons, the confined region 180 is of p-type, and the first doped regions 302*a*, 302*b*. are of n-type. After the photo-carriers are generated from the absorption region 10, the holes will be evacuated through the second doped region 108 and the second electrode 60, and the electrons will be confined by the confined region 180 and move from the absorption region 10 towards one of the first doped regions 302*a*, 302*b* through the channel 181 instead of moving out from the whole heterointerface between the absorption region 10 and the substrate 20. Accordingly, the photo-detecting device 600*c* can have improved demodulation contrast by including the confined region 180 between the absorption region 10 and the first doped regions 302*a*, 302*b*.

Figure 6F:
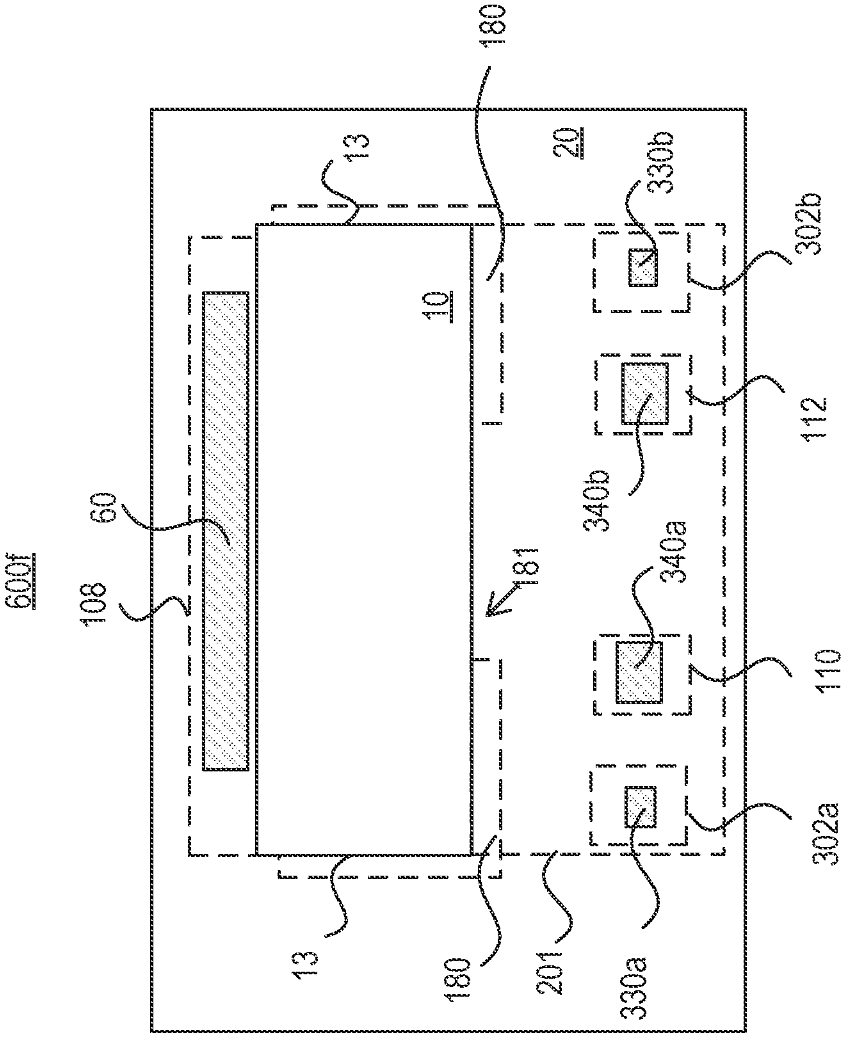
FIG. 6F illustrates a top view of a photo-detecting device, according to some embodiments.

FIG. 6F illustrates a top view of a photo-detecting device, according to some embodiments. The photo-detecting device 600*f* in FIG. 6F is similar to the photo-detecting device 600*c* in FIG. 6C. The difference is that the confined region 180 is extended to cover two other side surfaces 13 of the absorption region 10 to further confine the carriers to pass through the channel 181 at one of the side surfaces 13 of the absorption region 10 instead of moving out from other side surfaces 13 of the absorption region 10. In some embodiments, the peak doping concentration of the confined region 180 is lower than the peak doping concentration of the second doped region 108. In some embodiments, the confined region 180 and the second doped region 108 are formed by two different fabrication process steps, such as using different masks.

Figure 6G:
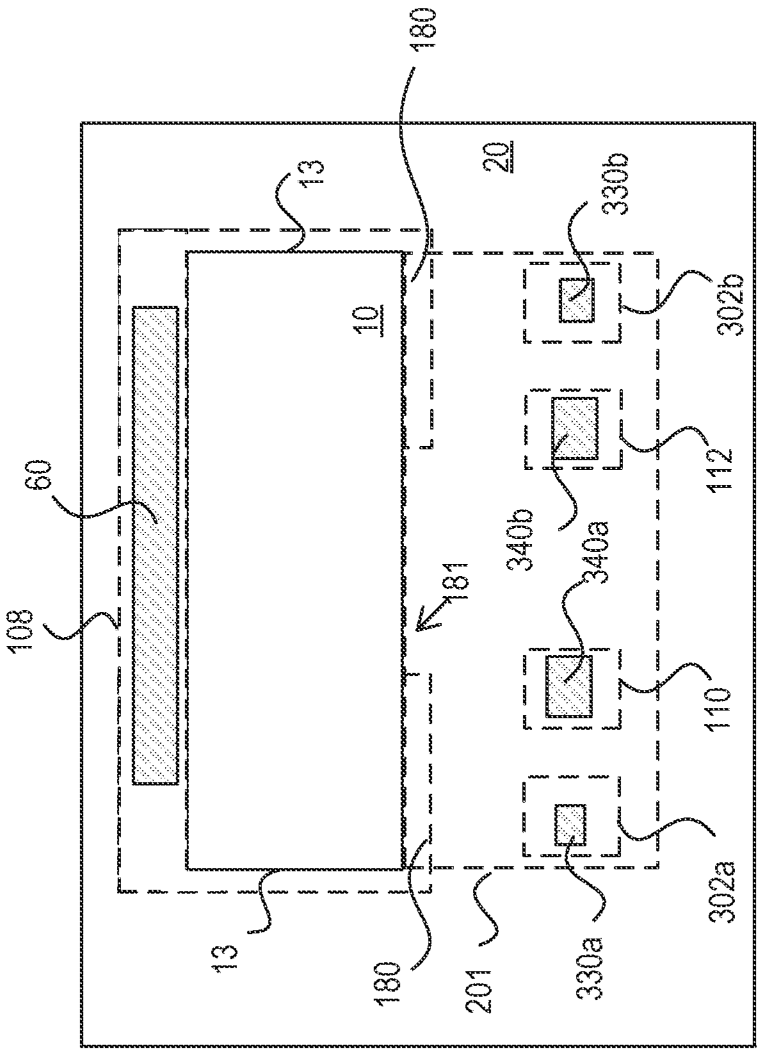
FIG. 6G illustrates a top view of a photo-detecting device, according to some embodiments.

FIG. 6G illustrates a top view of a photo-detecting device, according to some embodiments. The photo-detecting device 600*g* in FIG. 6G is similar to the photo-detecting device 600*f* in FIG. 6F. The difference is the second doped region 108 may function as the confined region 180 described in FIG. 6F. In other words, the second doped region 108 can both evacuate the carriers not collected by the first doped regions 302*a*, 302*b* and confine the carriers to be collected from the absorption region 10 towards one of the first doped regions 302*a*, 302*b* through the channel 181 at one of the side surfaces 13 instead of moving out from other side surfaces 13 of the absorption region 10.

Figure 15A:
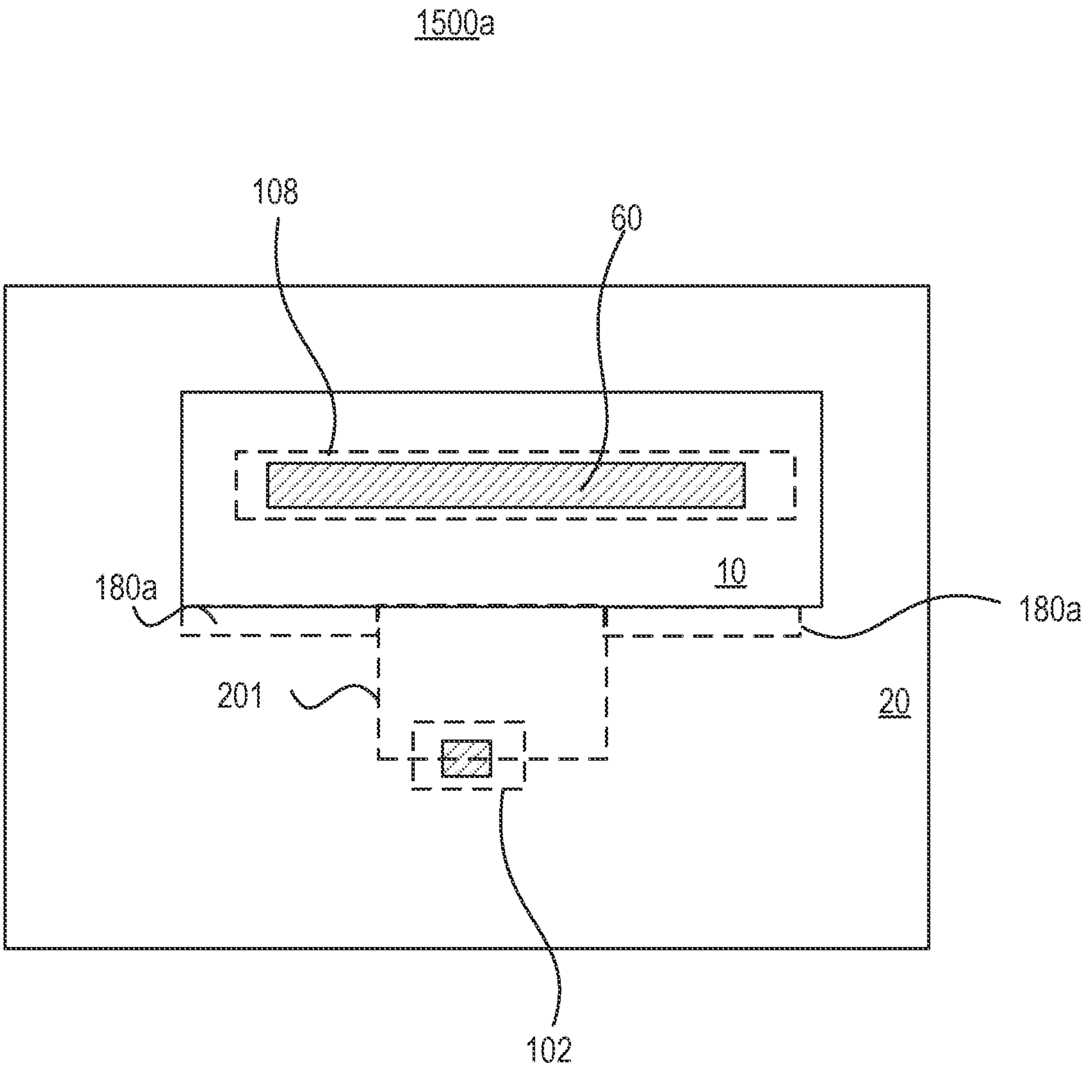
FIGS. 15A-15C illustrates a top view of a photo-detecting device, according to some embodiments.
Figure 15B:
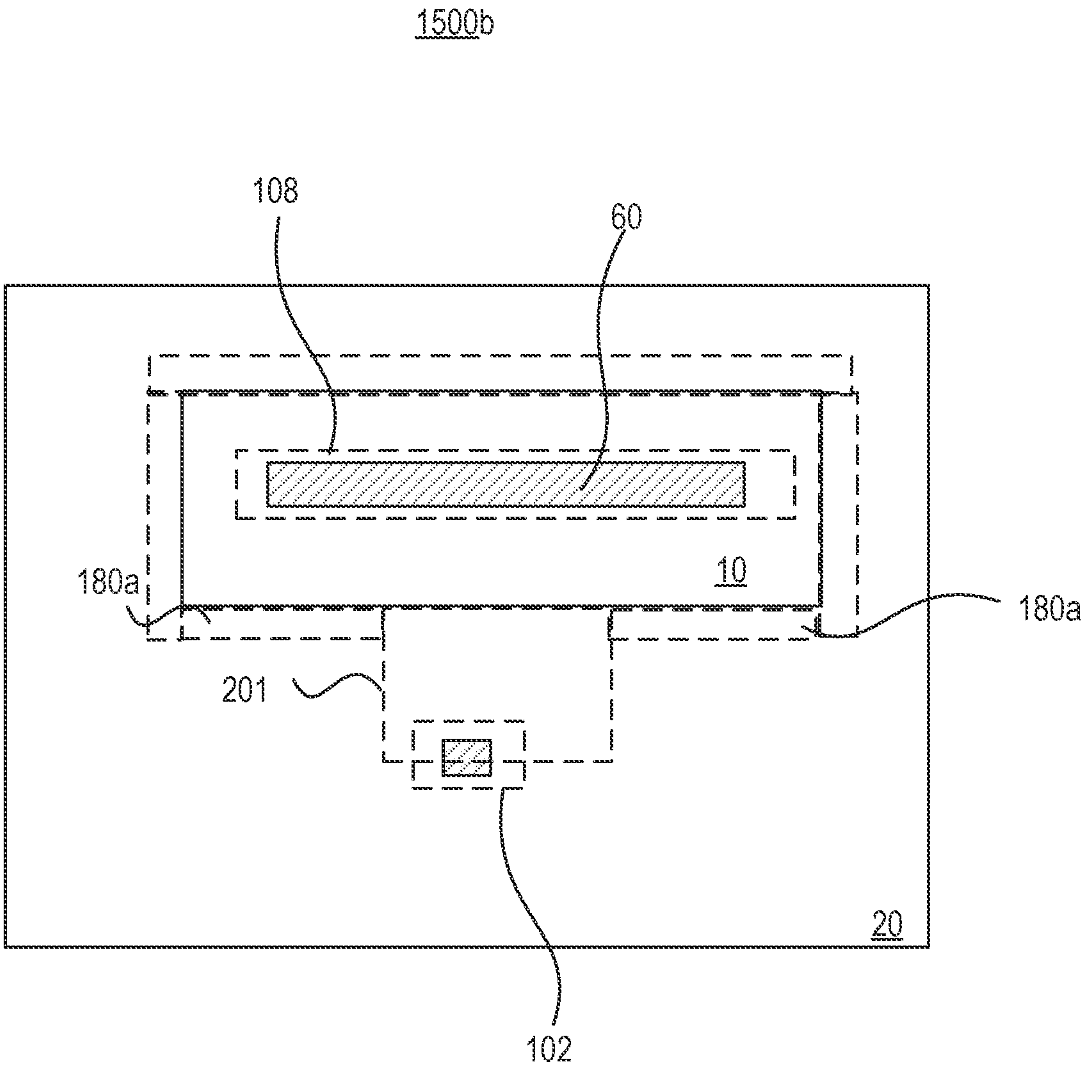
Figure 15C:
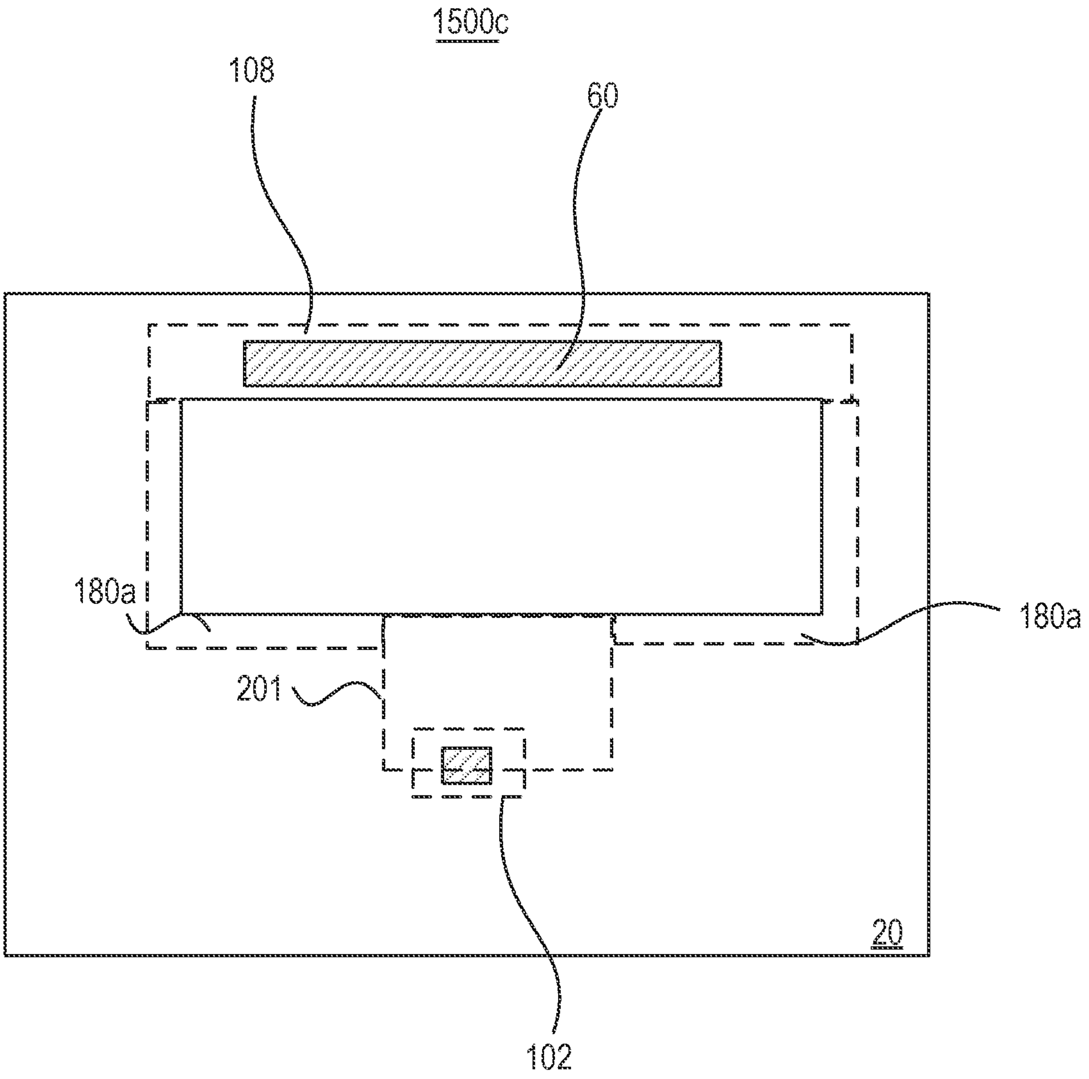

In some embodiments, the photo-detecting device 100*a* as disclosed in FIG. 1A may also include the confined region 180 (e.g., confined region 180*a* in FIGS. 15A-15C) as discussed with further details in FIGS. 15A-15C.

Figure 7A:
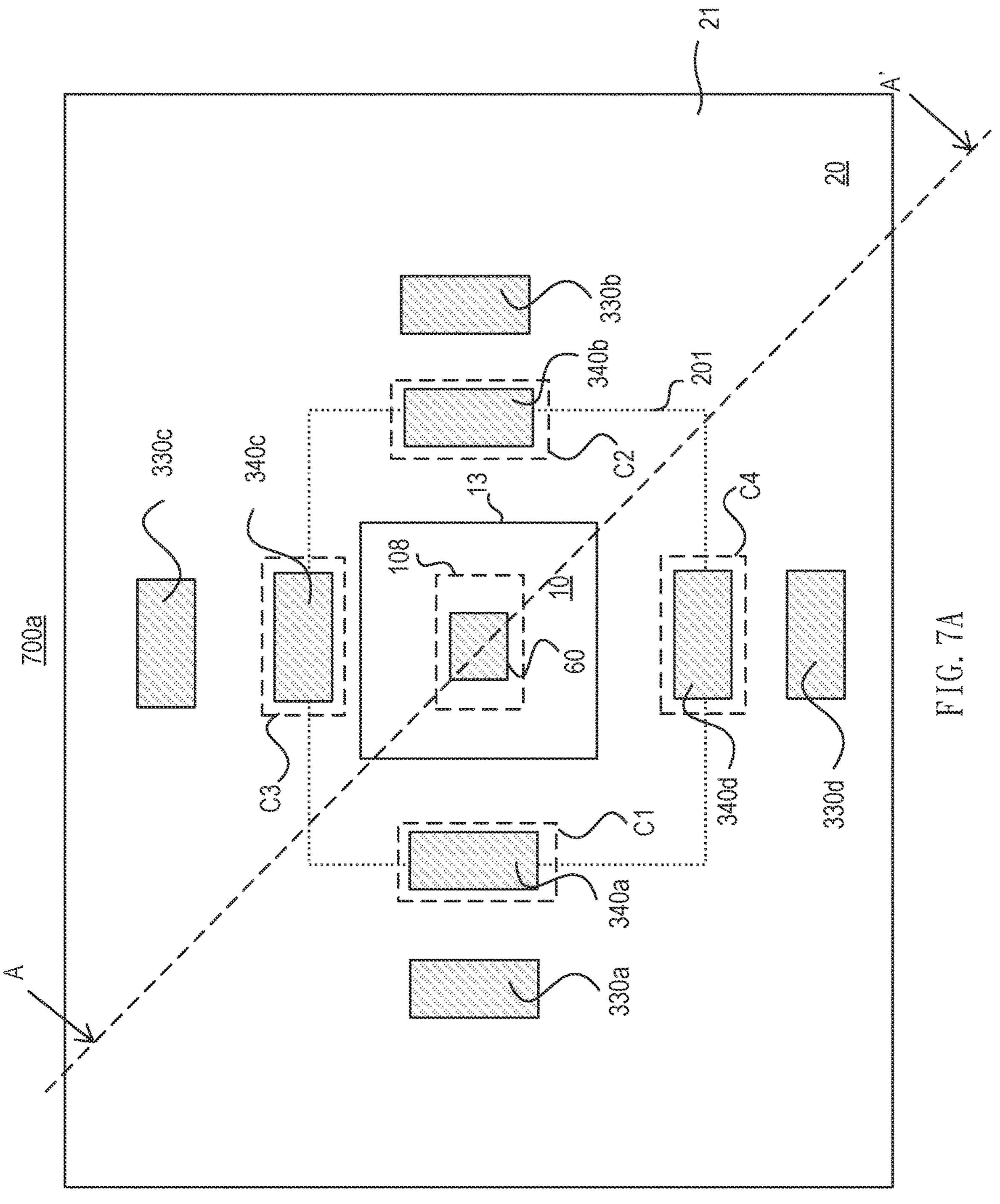
FIG. 7A illustrates a top view of a photo-detecting device, according to some embodiments.
Figure 7B:
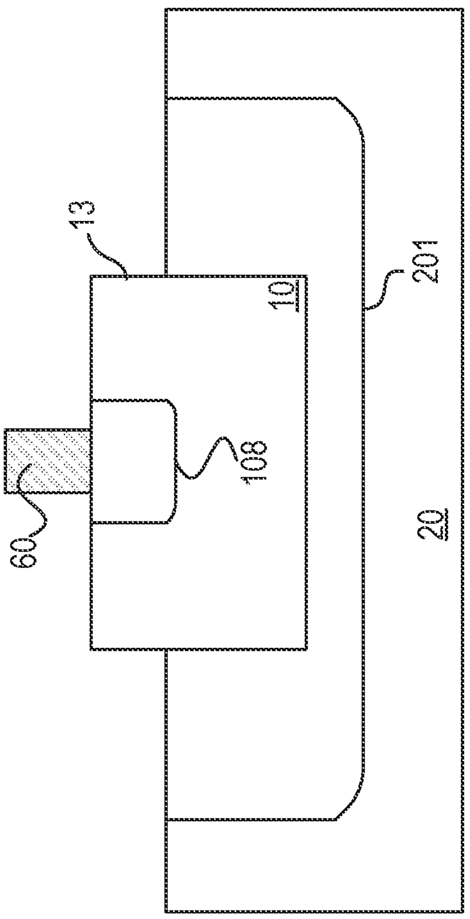
FIG. 7B illustrates a cross-sectional view along an A-A' line in FIG. 7A, according to some embodiments.

FIG. 7A illustrates a top view of a photo-detecting device, according to some embodiments. FIG. 7B illustrates a cross-sectional view along an A-A' line in FIG. 7A, according to some embodiments. The photo-detecting device 700*a* is similar to the photo-detecting device 300*a* in FIG. 3A. The difference is described below. In some embodiments, the photo-detecting device includes N switches electrically coupled to the absorption region 10 and partially formed in the substrate 20, where N is a positive integer and is ≥3. For example, N may be 3, 4, 5, etc. In some embodiments, the pixel of the photo-detecting apparatus further includes Y control signals different from each other, wherein 3≤Y≤N and Y is a positive integer, each of the control signal controls one or more of the control regions of the photo-detecting device 700*a*. In some embodiments, each of the control signals includes a phase, where the phase of one of the control signals is not overlapped with the phase of another control signal of the control signals. Referring to FIGS. 7A and 7B, in some embodiments, the photo-detecting device 700*a* includes four switches (not labeled) electrically coupled to the absorption region 10 and partially formed in the substrate 20. Each of the switches includes a control region C1, C2, C3, C4 including a control electrode 340*a*, 340*b*, 340*c*, 340*d*. Each of the switches further includes a readout electrode 330*a*, 330*b*, 330*c*, 330*d* separated from the control electrode 340*a*, 340*b*, 340*c*, 340*d*. In some embodiments, the readout electrodes 330*a*, 330*b*, 330*c*, 330*d* and the control electrodes 340*a*, 340*b*, 340*c*, 340*d* are formed over a first surface 21 of the substrate 20 and are separated from the absorption region 10.

In some embodiments, the four switches are disposed at four side surfaces 13 respectively.

In some embodiments, each of the switched includes a first doped region (not shown) under the readout electrodes 330*a*, 330*b*, 330*c*, 330*d*, the first doped regions are similar to the first doped region 302*a*, 302*b* as described in FIG. 3A.

In some embodiments, the pixel of the photo-detecting apparatus includes four control signals for controlling the control regions C1, C2, C3, C4 respectively so as to control the moving direction of the electrons or holes generated by the absorption region 10. For example, when voltages are used, if the control signal controlling the control region C1 is biased against other control signals, an electric field is created between the four portions right under the control electrodes 340*a*, 340*b*, 340*c*, 340*d* as well as in the absorption region 10, and free carriers in the absorption region 10 drift towards one of the first doped regions under the readout electrodes 330*a*, 330*b*, 330*c*, 330*d* depending on the direction of the electric field. In some embodiments, each of the control signals has a phase not overlapped by the phase of one another.

In some embodiments, the conducting region 201 can be in any suitable shape, such as rectangle or square.

Figure 7C:
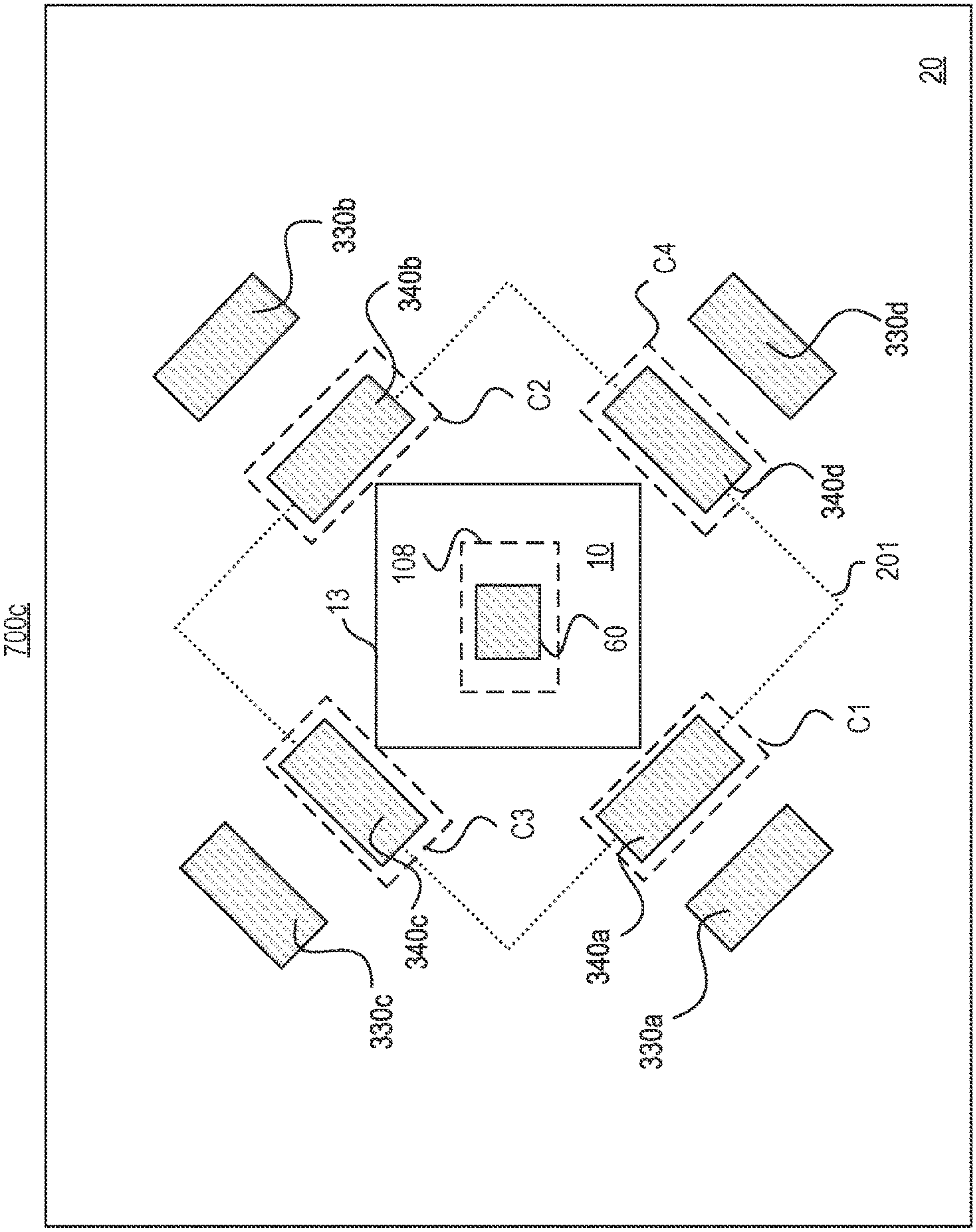
FIGS. 7C-7E illustrate top views of a photo-detecting device, according to some embodiments.

FIG. 7C illustrates a top view of a photo-detecting device, according to some embodiments. The photo-detecting device 700*c* is similar to the photo-detecting device 700*a* in FIG. 7A. The difference is described below. The arrangements of the readout electrodes 330*a*, 330*b*, 330*c*, 330*d* and the control electrodes 340*a*, 340*b*, 340*c*, 340*d* are different.

For example, the four switches are disposed at the four corners of the absorption region 10 respectively.

Figure 7D:
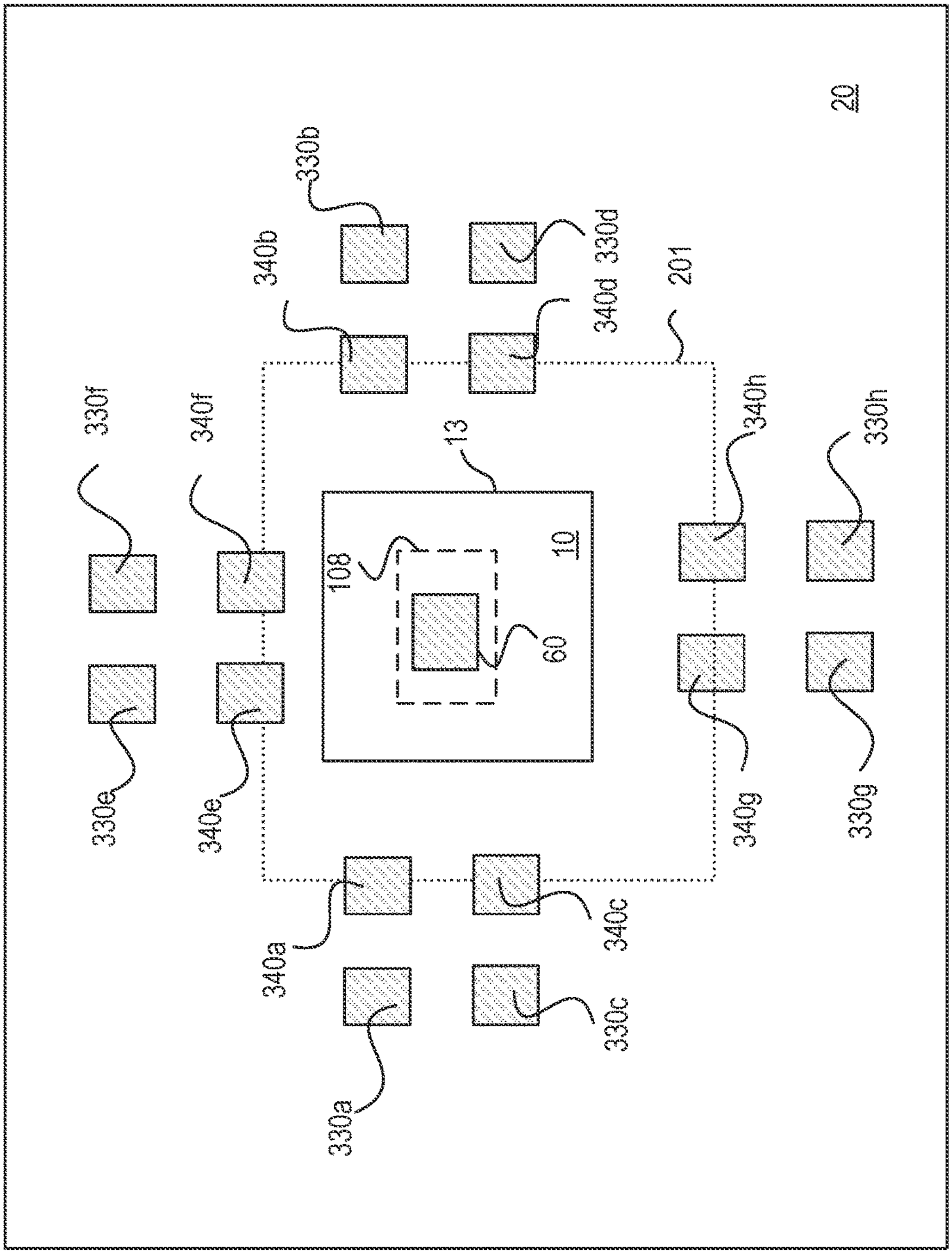

FIG. 7D illustrates a top view of a photo-detecting device, according to some embodiments. The photo-detecting device 700*d* is similar to the photo-detecting device 700*a* in FIG. 7A. The difference is described below. The photo-detecting device 700*d* includes eight switches (not labeled) electrically coupled to the absorption region 10 and partially formed in the substrate 20. Similarly, each of the switches includes a control region (not labeled) including a control electrode 340*a*, 340*b*, 340*c*, 340*d*, 340*e*, 340*f*, 340*g*, 340*h* and includes a readout electrode 330*a*, 330*b*, 330*c*, 330*d*, 330*e*, 330*f*, 330*g*, 330*h* separated from the control electrode 340*a*, 340*b*, 340*c*, 340*d*, 340*e*, 340*f*, 340*g*, 340*h*.

In some embodiments, a photo-detecting apparatus includes a pixel including the photo-detecting device 700*d* as mentioned above, and the pixel includes multiple control signals different from each other and controlling multiple switches of the photo-detecting device 700*d*. That is, in a same pixel, a number of the control signals is less than a number of the switches. For example, the pixel may include two control signals different from each other and each of the control signal controls two of the switches. For example, the control electrode 340*a* and the control electrode 340*c* may be electrically coupled to and controlled by the same control signal. In some embodiments, the pixel may include multiple control signals controlling respective switch. That is, in a same pixel, a number of the control signals is equal to a number of the switches. For example, the pixel of the photo-detecting apparatus includes eight control signals different from each other and controlling respective switches of the photo-detecting device 700*d*.

Figure 7E:
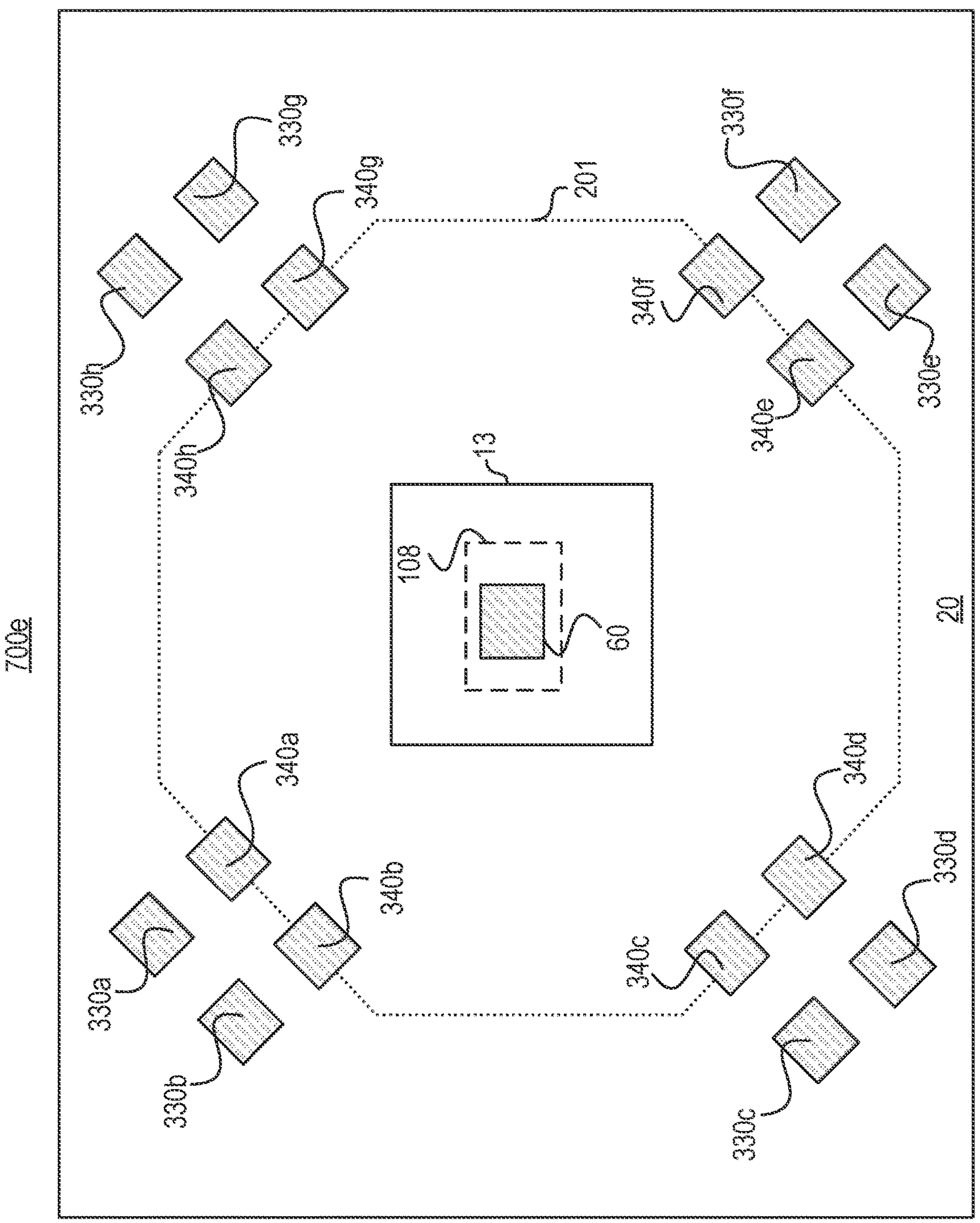

FIG. 7E illustrates a top view of a photo-detecting device, according to some embodiments. The photo-detecting device 700*e* is similar to the photo-detecting device 700*d* in FIG. 7D. The difference is described below. The arrangements of the readout electrodes 330*a*, 330*b*, 330*c*, 330*d*, 330*e*, 330*f*, 330*g*, 330*h* and the control electrodes 340*a*, 340*b*, 340*c*, 340*d*, 340*e*, 340*f*, 340*g*, 340*h* are different. For example, every two switches of the eight switches are disposed at the four corners of the absorption region 10 respectively. The conducting region 201 can be, but not limited to octagon.

Figure 8A:
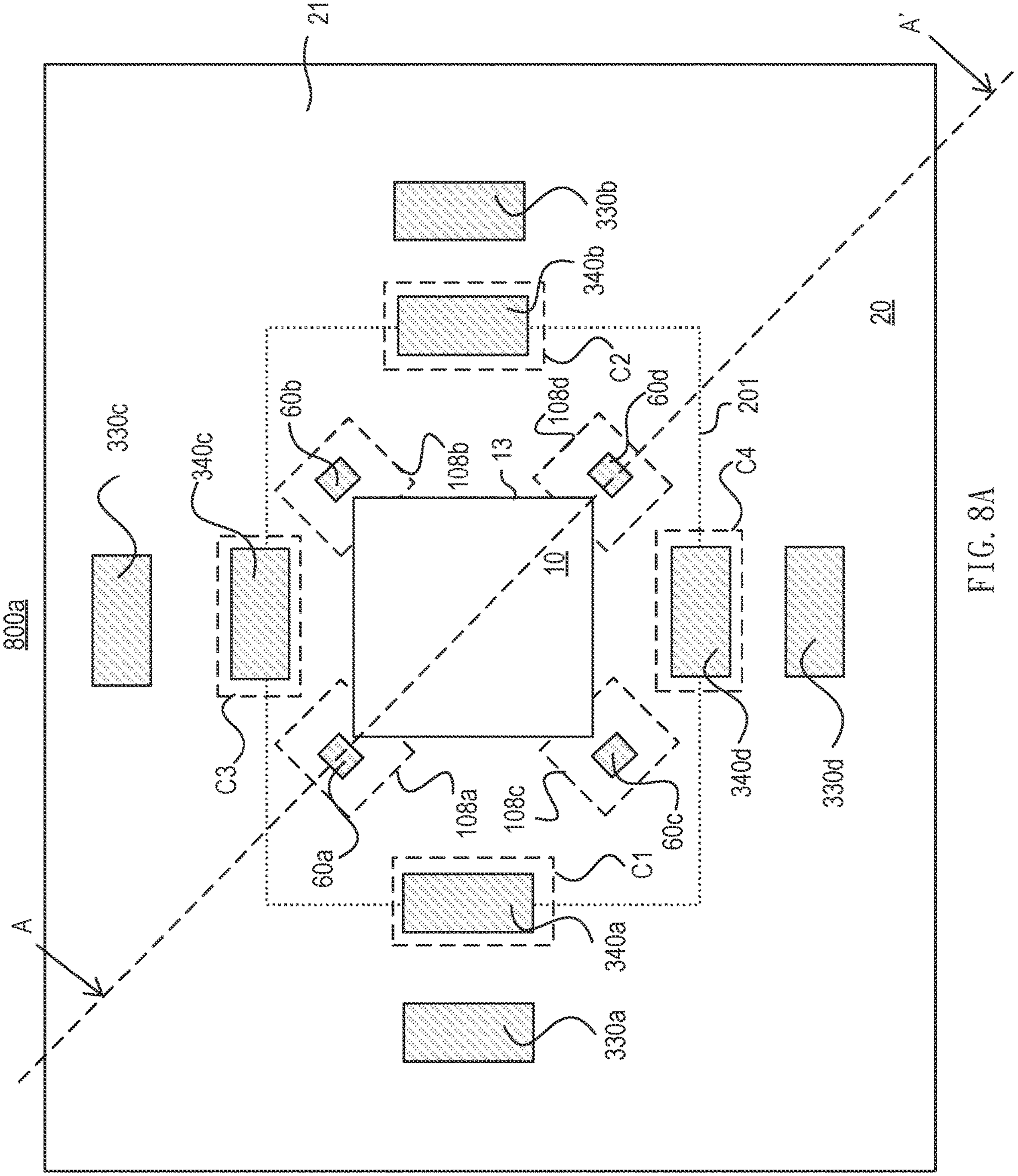
FIG. 8A illustrates a top view of a photo-detecting device, according to some embodiments.
Figure 8B:
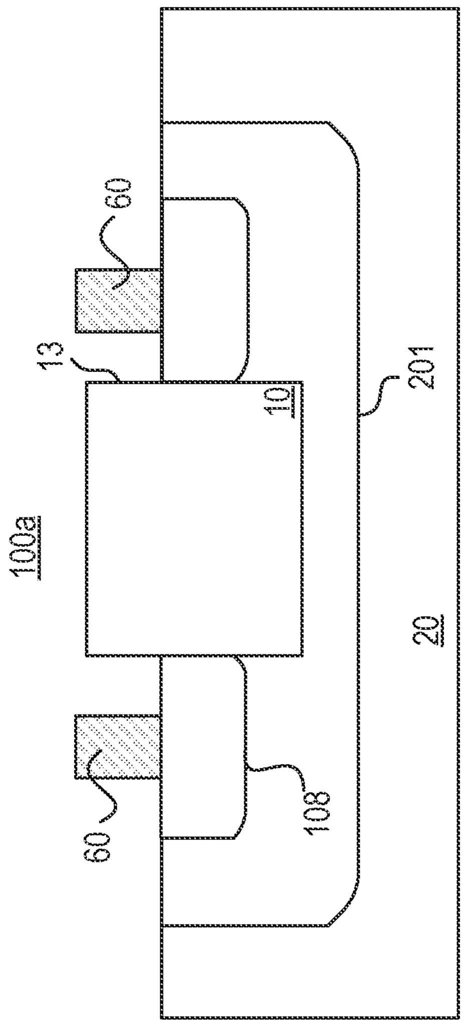
FIG. 8B illustrates a cross-sectional view along an A-A' line in FIG. 8A, according to some embodiments.

FIG. 8A illustrates a top view of a photo-detecting device, according to some embodiments. FIG. 8B illustrates a cross-sectional view along an A-A' line in FIG. 8A, according to some embodiments. The photo-detecting device 800*a* in FIG. 8A is similar to the photo-detecting device 700*a* in FIG. 7A. The difference is described below. The second doped region 108 is in the substrate 20. In other words, the fourth peak doping concentration of the second doped region 108 lies in the substrate 20. In some embodiments, the second doped region 108 includes multiple subregions 108*a*, 108*b*, 108*c*, 108*d* separated from one another and are in direct contact with the absorption region 10, for example, the subregions 108*a*, 108*b*, 108*c*, 108*d* may be in contact with or overlapped with at least a part of the side surfaces 13 of the absorption region 10. As a result, the carriers generated from the absorption region 10 and are not collected by the first doped regions can move from the absorption region 10 towards one or more of the subregions 108*a*, 108*b*, 108*c*, 108*d* through the heterointerface between the absorption region 10 and the substrate 20. In some embodiments, the subregions 108*a*, 108*b*, 108*c*, 108*d* are not between the absorption region 10 and the first doped region of any switches to avoid blocking the path of the carriers to be collected from moving from the absorption region 10 towards one of the first doped regions. For example, in some embodiments, the subregions 108*a*, 108*b*, 108*c*, 108*d* are disposed at the four corners of the absorption region 10 respectively, and the four switches are disposed at the four side surfaces 13 respectively, such that the path of the holes moving from the absorption region 10 towards one or more of the subregions 108*a*, 108*b*, 108*c*, 108*d* and the path of the electrons moving from the absorption region 10 towards one of the first doped regions are different.

In some embodiment, the second electrode 60 includes sub-electrodes 60*a*, 60*b*, 60*c*, 60*d* electrically coupled to the subregions 108*a*, 108*b*, 108*c*, 108*d* respectively. The sub-electrodes 60*a*, 60*b*, 60*c*, 60*d* are disposed over the first surface 21 of the substrate 20.

By having the second doped region 108 in the substrate 20 instead of in the absorption region 10, the sub-electrodes 60*a*, 60*b*, 60*c*, 60*d*, the readout electrodes 330*a*, 330*b*, 330*c*, 330*d*, and the control electrodes 340*a*, 340*b*, 340*c*, 340*d*, can all be coplanarly formed above the first surface 21 of the substrate 20. Therefore, a height difference between any two of the sub-electrodes 60*a*, 60*b*, 60*c*, 60*d*, the readout electrodes 330*a*, 330*b*, 330*c*, 330*d*, and the control electrodes 340*a*, 340*b*, 340*c*, 340*d* can be reduced and thus the fabrication process afterwards will be benefit from this design. Besides, the area of the absorption region 10 absorbing the optical signal can be larger.

Figure 8C:
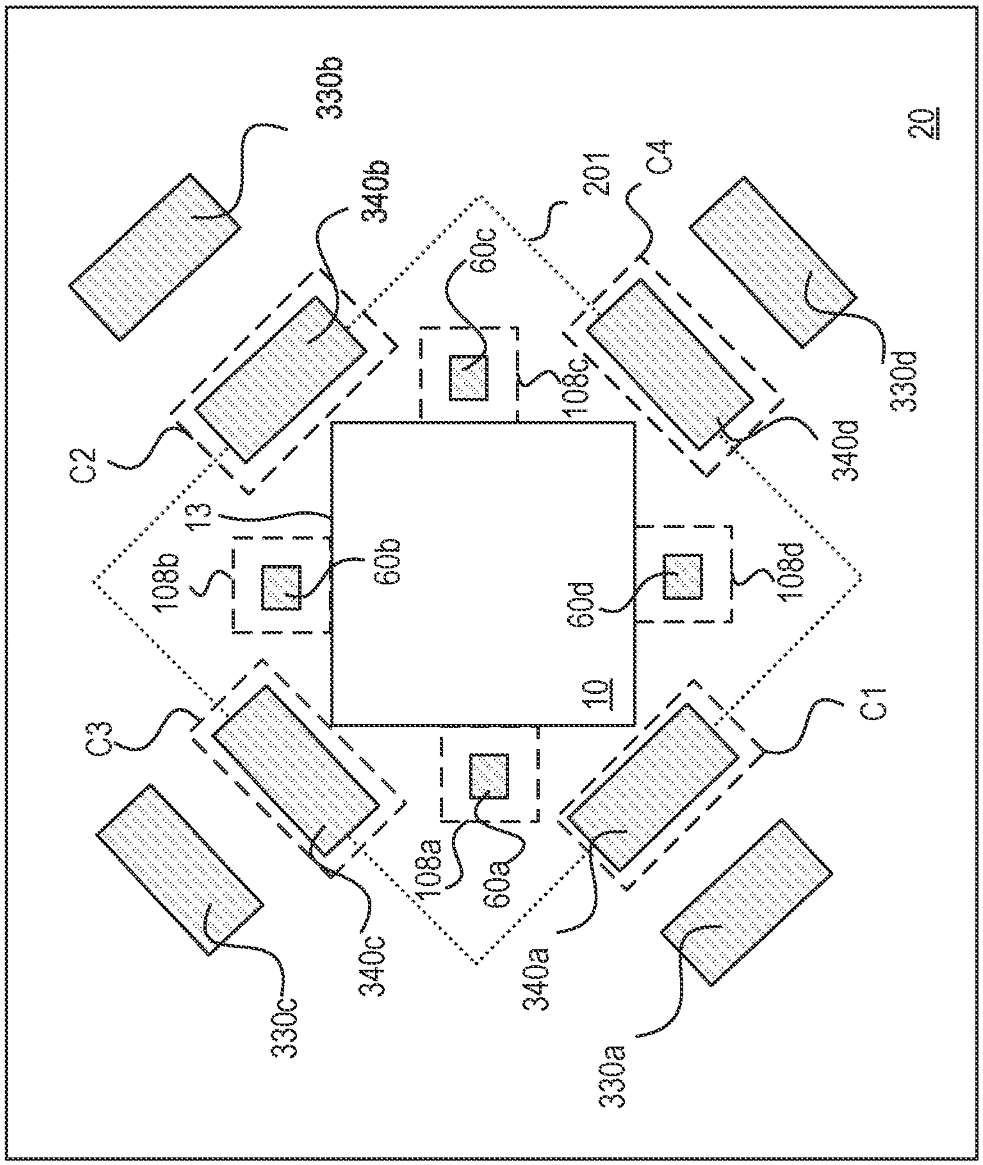
FIGS. 8C-8E illustrate top views of a photo-detecting device, according to some embodiments.

FIG. 8C illustrates a top view of a photo-detecting device, according to some embodiments. The photo-detecting device 800*c* in FIG. 8C is similar to the photo-detecting device 800*a* in FIG. 8A. The difference is described below. The arrangements of the readout electrodes 330*a*, 330*b*, 330*c*, 330*d* and the control electrodes 340*a*, 340*b*, 340*c*, 340*d* are different, the arrangement of the sub-electrodes 60*a*, 60*b*, 60*c*, 60*d* is different, and the arrangement of the subregions 108*a*, 108*b*, 108*c*, 108*d* is different. For example, the four switches are disposed at the four corners of the absorption region 10 respectively, and the subregions 108*a*, 108*b*, 108*c*, 108*d* and the sub-electrodes 60*a*, 60*b*, 60*c*, 60*d* are disposed at respective side surfaces 13 of the absorption region 10.

Figure 8D:
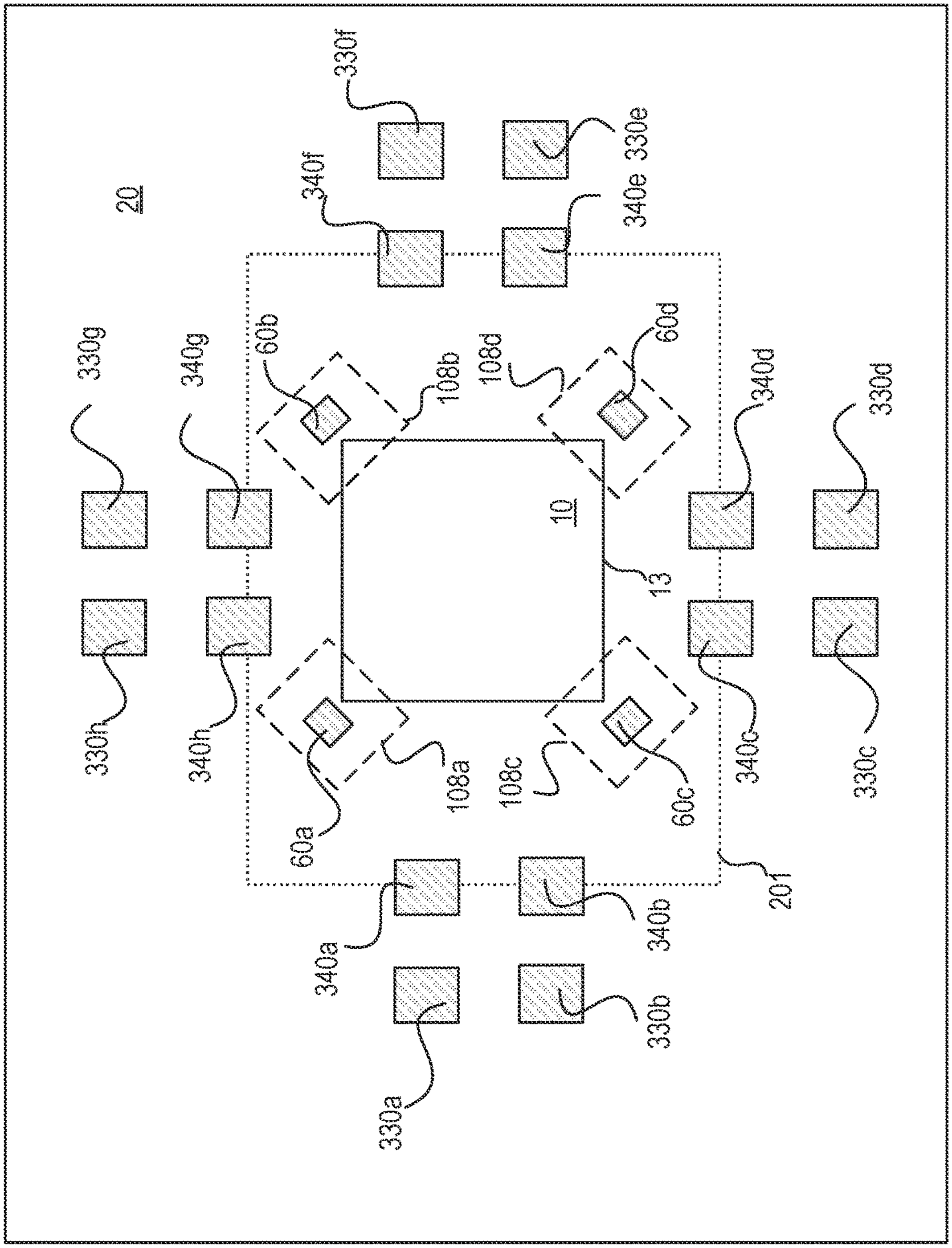

FIG. 8D illustrates a top view of a photo-detecting device, according to some embodiments. The photo-detecting device 800*d* is similar to the photo-detecting device 800*a* in FIG. 8A. The difference is described below. The photo-detecting device 800*d* includes eight switches (not labeled) electrically coupled to the absorption region 10 and partially formed in the substrate 20, which are similar to the photo-detecting device 700*d* in FIG. 7D. The pixel of the photo-detecting apparatus also includes multiple control signals as described in FIG. 7D.

Figure 8E:
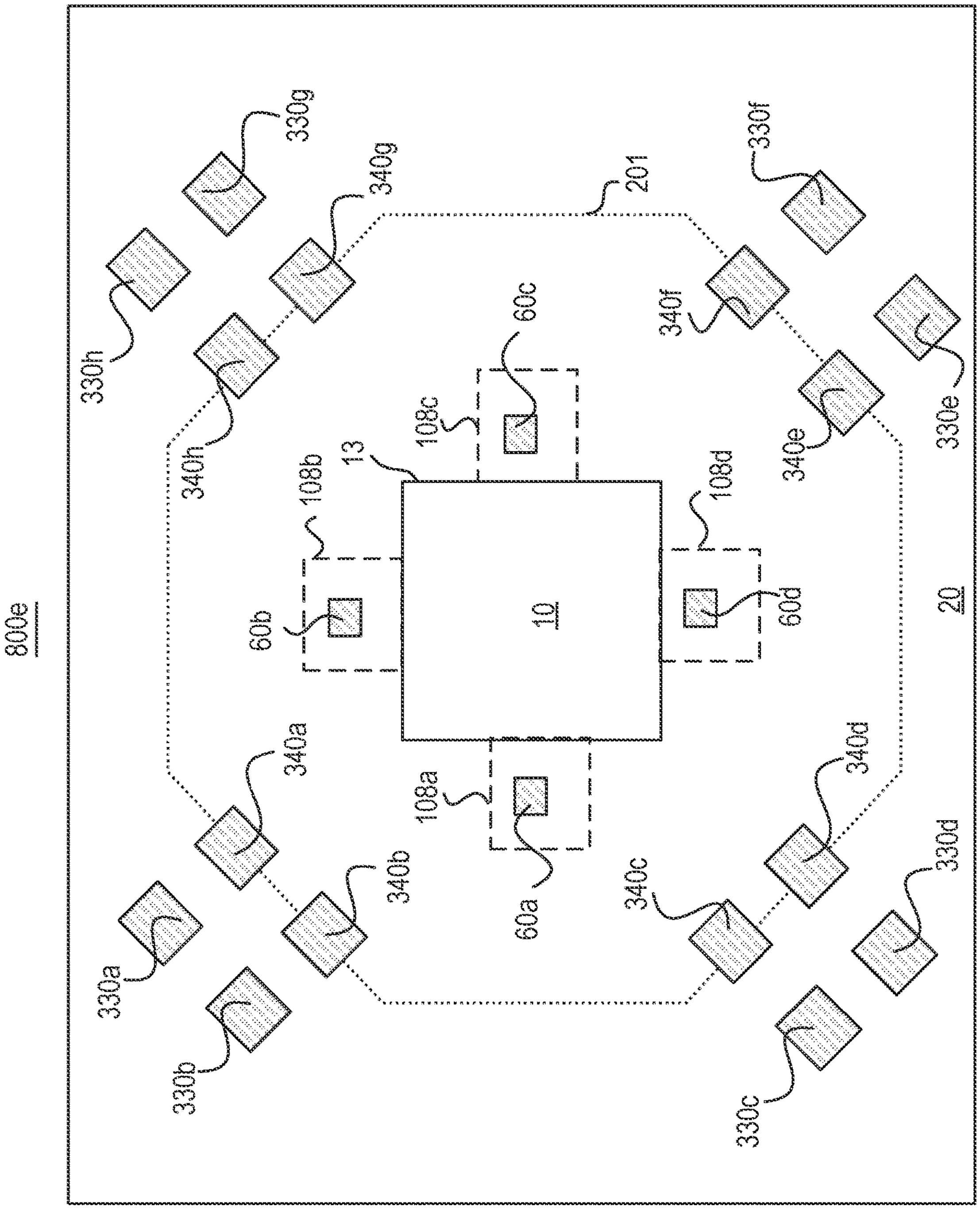

FIG. 8E illustrates a top view of a photo-detecting device, according to some embodiments. The photo-detecting device 800*e* is similar to the photo-detecting device 800*d* in FIG. 8D. The difference is described below. The arrangements of the readout electrodes 330*a*, 330*b*, 330*c*, 330*d* 330*e*, 330*f*, 330*g*, 330*h* and the control electrodes 340*a*, 340*b*, 340*c*, 340*d*, 340*e*, 340*f*, 340*g*, 340*h* are different, the arrangement of the sub-electrodes 60*a*, 60*b*, 60*c*, 60*d* is different, and the arrangement of the subregions 108*a*, 108*b*, 108*c*, 108*d* is different. For example, every two switches of the eight switches are disposed at the four corners of the absorption region 10 respectively, and the subregions 108*a*, 108*b*, 108*c*, 108*d* and the sub-electrodes 60*a*, 60*b*, 60*c*, 60*d* are disposed at respective side surfaces 13 of the absorption region 10.

Figure 9A:
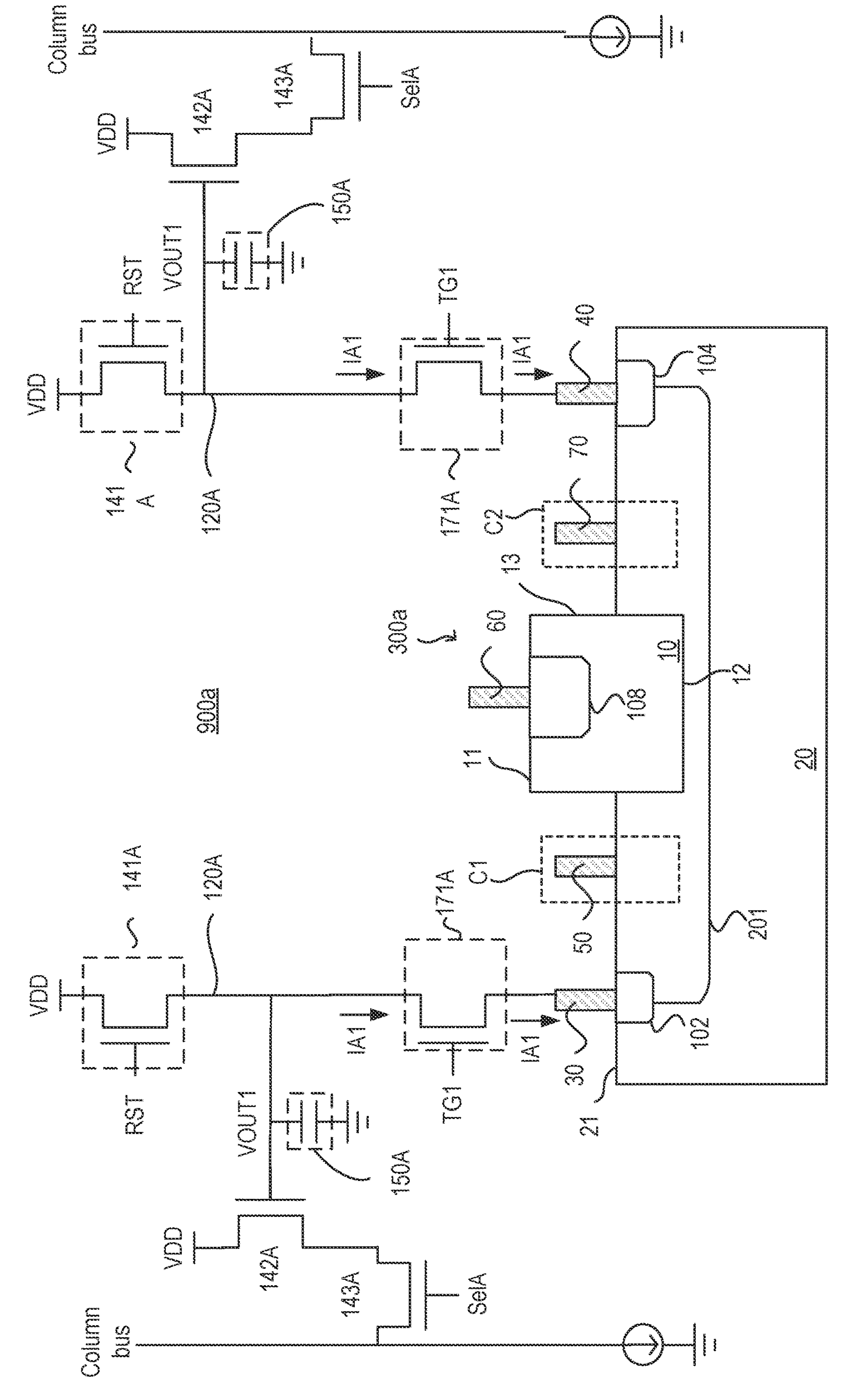
FIGS. 9A-9B show schematic diagrams of circuits of a photo-detecting apparatus, according to some embodiments.

FIG. 9A shows a schematic diagram of a photo-detecting apparatus, according to some embodiments. The photo-detecting apparatus 900*a* includes a pixel (not labeled) and a column bus electrically coupled to the pixel. The pixel includes a photo-detecting device and multiple readout circuits (not labeled) electrically coupled to the photo-detecting device and the column bus. The photo-detecting device can be any photo-detecting device as described in FIG. 3A through FIG. 3B, FIG. 4A through FIG. 4C, FIG. 5A through FIG. 5C, FIG. 0.6A through FIG. 6G, FIG. 7A through FIG. 7E, and FIG. 8A through FIG. 8E. For example, the photo-detecting device 300*a* in FIG. 3B is illustrated in FIG. 9A. Each of the readout circuits is similar to the readout circuit as described in FIG. 2E. The difference is described below. Each of the readout circuits is electrically coupled to the respective first doped region of the switches of the photo-detecting device for processing the carriers of the first type. For example, if the first doped region is of n-type, the readout circuits process the electrons collected from respective first doped region for further application.

The number of the readout circuits is the same as the number of switches. That is, the photo-detecting device includes N switches electrically coupled to the absorption region 10 and partially formed in the substrate 20, and the pixel of the photo-detecting apparatus further includes Z readout circuits electrically coupled to the photo-detecting device, where Z=N. For example, the number of the switches of the photo-detecting device in FIG. 3A through FIG. 3B, FIG. 4A through FIG. 4C, FIG. 5A through FIG. 5C, FIG. 6A through FIG. 6G is two, and the number of the readout circuits is two. For another example, the number of the switches of the photo-detecting device in FIG. 7A through FIG. 7C, and FIG. 8A through FIG. 8C is four, and the number of the readout circuits is four. For another example, the number of the switches of the photo-detecting device in FIG. 7D through FIG. 7E, and FIG. 8D through FIG. 8E is eight, and the number of the readout circuits is eight.

Figure 9B:
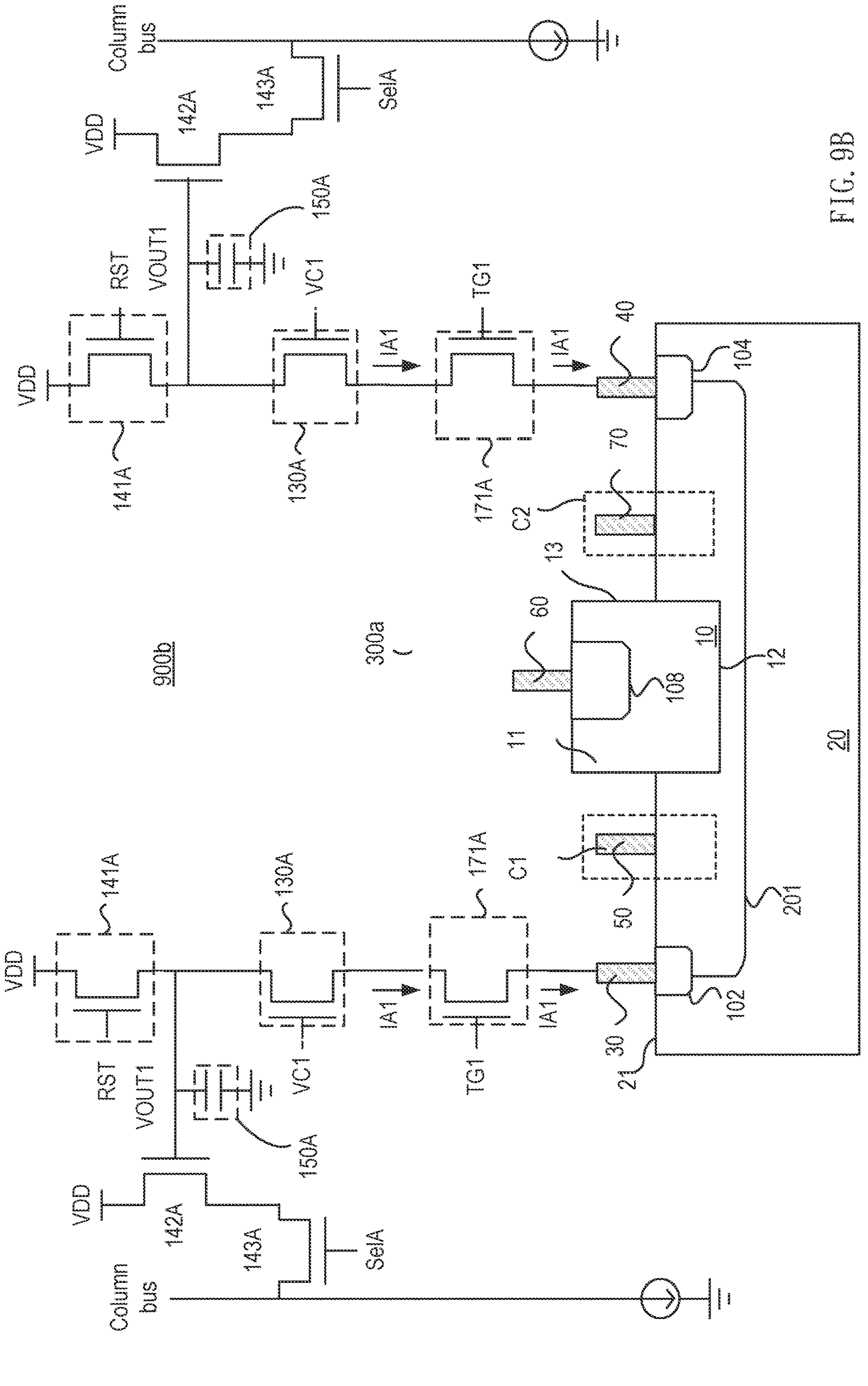

FIG. 9B shows a schematic diagram of a photo-detecting apparatus, according to some embodiments. The photo-detecting apparatus 900*b* is similar to the photo-detecting apparatus 900*a* in FIG. 9A. The difference is described below. Similar to the readout circuit as described in FIG. 2F, the readout circuit of the photo-detecting apparatus 900*b* further includes a voltage-control transistor 130A between the first/second switch of the photo-detecting device 300*a* and the capacitor 150A.

Figure 10A:
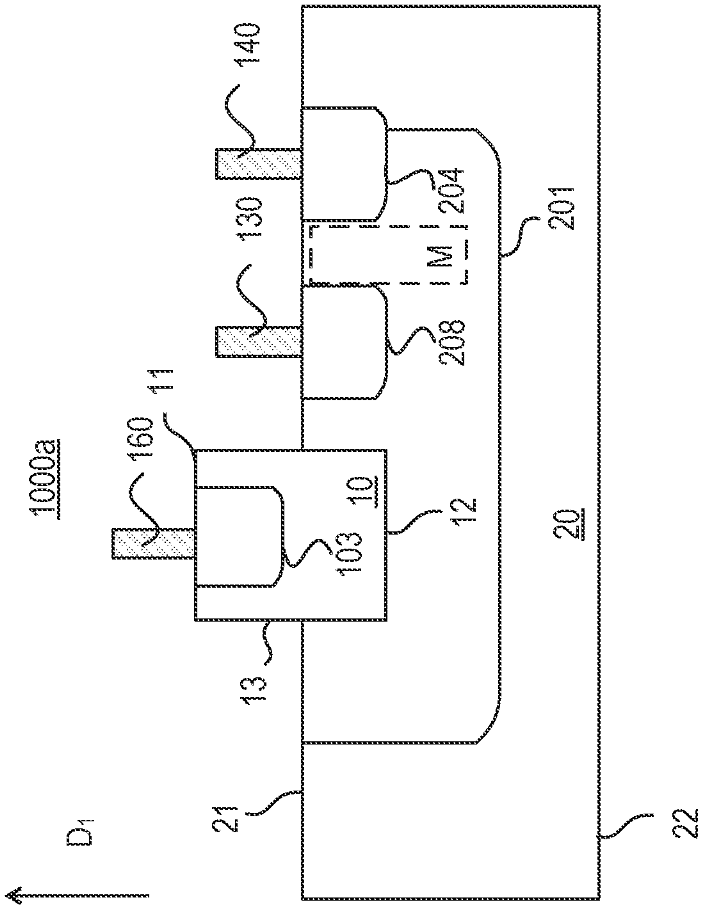
FIG. 10A illustrates a cross-sectional view of a photo-detecting device, according to some embodiments.

FIG. 10A illustrates a cross-sectional view of a photo-detecting device, according to some embodiments. The photo-detecting device includes an absorption region 10 and a substrate 20 supporting the absorption region 10. The absorption region 10 is similar to the absorption region 10 as described in FIG. 1A. The substrate 20 is similar to the substrate 20 as described in FIG. 1A. The difference between the photo-detecting device 1000*a* in FIG. 10A and the photo-detecting device 100*a* in FIG. 1A is described below. In some embodiments, the photo-detecting device 1000*a* further includes a first contact region 204 separated from the absorption region 10 and in the substrate 20. The photo-detecting device 1000*a* further includes a second contact region 103 in the absorption region 10.

In some embodiments, the second contact region 103 is of a conductivity type. The first contact region 204 is of a conductivity type different from the conductivity type of the second contact region 103. In some embodiments, the second contact region 103 includes a dopant having a peak doping concentration higher than the first peak doping concentration of the absorption region 10, for example, can be ranging from $1\times10^{18}$ $cm^{-3}$ and $5\times10^{20}$ $cm^{-3}$. In some embodiments, the first contact region 204 includes a dopant having a peak doping concentration higher than the second peak doping concentration of the second dopant of the substrate 20, for example, can be ranging from $1\times10^{18}$ $cm^{-3}$ and $5\times10^{20}$ $cm^{-3}$. In some embodiments, the second contact region 103 is not arranged over the first contact region 204 along the direction D1 substantially vertical to the first surface 21 of the substrate 20.

The photo-detecting device includes a first electrode 140 coupled to the first contact region 204 and a second electrode 160 coupled to the second contact region 103. The second electrode 160 is over the first surface 11 of the absorption region 10. The first electrode 140 is over the first surface 21 of the substrate 20. In some embodiments, the substrate 20 of the photo-detecting device 1000*a* includes a conducting region 201 similar to the conducting region 201 as described in FIG. 1A.

In some embodiments, the photo-detecting device 1000*a* further includes a third contact region 208 in the substrate 20. In some embodiments, the third contact region 208 is between the second contact region 103 and the first contact region 204. The third contact region 208 is of a conductivity type the same as the conductivity type of the second contact region 103. The third contact region 208 includes a conductivity type different from the conductivity type of the first contact region 204. In some embodiments, the third contact region 208 includes a dopant having a peak doping concentration higher than the second peak doping concentration of the conducting region 201, for example, can be between $1\times10^{18}$ $cm^{-3}$ and $5\times10^{20}$ $cm^{-3}$.

In some embodiments a distance between the first surface 21 of the substrate 20 and a location of the first contact region 204 having the peak dopant concentration is less than 30 nm. In some embodiments a distance between the first surface 21 of the substrate 20 and a location of the third contact region 208 having the peak dopant concentration is less than 30 nm.

In some embodiments, the third contact region 208 may be entirely overlapped with the conducting region 201. The third contact region 208 and the first contact region 204 are both beneath the first surface 21 of the substrate 20.

In some embodiments, the photo-detecting device further includes a third electrode 130 electrically coupled to the third contact region 208. The third electrode 130 and the first electrode 140 are coplanarly formed on the first surface 21 of the substrate 20, and thus a height difference between the third electrode 130 and the first electrode 140 can be reduced, which benefits the fabrication process afterwards The photo-detecting device 1000*a* can be a lock-in pixel or an avalanche phototransistor depending on the circuits electrically coupled to the photo-detecting device 1000*a* and/or the operating method of the photo-detecting device 1000*a*.

For example, if the photo-detecting device 1000*a* serves as a lock-in pixel, the third contact region 208 and the first contact region 204 can be regarded as a switch. A readout circuit is electrically coupled to the first contact region 204 through the first electrode 140, a control signal, which is a modulated signal, is electrically coupled to the third contact region 208 through the third electrode 130 for controlling the on and off state of the switch, and a voltage or ground may be applied to the second contact region 103 for evacuating the carriers not collected by the first contact region 204. The lock-in pixel can be included in an indirect TOF system.

In some embodiments, if the photo-detecting device 1000*a* serves as an avalanche phototransistor, the part of the substrate 20 or the part of the conducting region 201 between the third contact region 208 and the first contact region 204, where the carriers pass through, serves as a multiplication region M during the operation of the photo-detecting device 1000*a*. In the multiplication region, photo-carriers generate additional electrons and holes through impact ionization, which starts the chain reaction of avalanche multiplication. As a result, the photo-detecting device 1000*a* has a gain. In some embodiments, the substrate 20 supports the absorption region 10 and is capable of amplifying the carriers by avalanche multiplication at the same time. In some embodiments, the third contact region 208 may be a charge region. The avalanche phototransistor can be included in a direct TOF system.

A method for operating the photo-detecting device 1000*a* capable of collecting electrons in FIG. 10A, includes steps of, applying a first voltage to a first electrode 140, applying a second voltage to the second electrode 160, and applying a third voltage to a third electrode 130 to generate a first total current and form a reverse-biased p-n junction between the first electrode 140 and the third electrode 130; and receiving an incident light in the absorption region 10 to generate a second total current, where the second total current is larger than the first total current.

In some embodiments, the first voltage is greater than the second voltage. In some embodiments, the third voltage is between the first voltage and the second voltage.

In some embodiments, the first total current includes a first current and a second current. The first current flows from the first electrode 140 to the third electrode 130. The second current flows from the first electrode 140 to the second electrode 160.

In some embodiments, the second total current includes a third current. The third current flows from the first electrode 140 to the second electrode 160.

In some embodiments, the second total current includes the third current and a fourth current. The fourth current flows from the first electrode 140 to the third electrode 130.

In some embodiments, the second voltage applied to the first electrode is, for example, 0 Volts.

In some embodiments, the third voltage can be selected to sweep the photo-carriers from the absorption region 10 to the multiplication region, that is, the part of the substrate 20 or the part of the conducting region 201 between the third contact region 208 and the first contact region 204. In some embodiments, a voltage difference between the second voltage and third voltage is less than a voltage difference between the first voltage and the third voltage to facilitate the movement of photo-carriers from absorption region 10 to the multiplication region in the substrate 20 so as to multiply the photo-carriers. For example, when the second voltage applied to the second electrode 160 is 0 Volts, a third voltage applied to the third electrode 130 is 1V, and the first voltage applied to the first electrode 140 can be 7V.

In some embodiments, a voltage difference between the first voltage and the third voltage is less than an avalanche breakdown voltage of the photo-detecting device 1000*a*, at which the photo-detecting device 1000*a* initiates the chain reaction of avalanche multiplication, to operate the multiplication region in a linear mode.

In some embodiments, a voltage difference between the first voltage and the third voltage is higher than an avalanche breakdown voltage of the photo-detecting device 1000*a*, at which the photo-detecting device 1000*a* initiates the chain reaction of avalanche multiplication, to operate the multiplication region in a Geiger mode.

In some embodiments, the carriers collected by the first contact region 204 can be further processed by a circuit electrically coupled to the photo-detecting device 1000*a*.

In some embodiments, the carriers not collected by the first contact region 204 can move towards the second contact region 103 and can be further evacuated by a circuit electrically coupled to the photo-detecting device 1000*a*.

Similarly, by the design of the concentration and the material of the absorption region 10 and the carrier conducting layer, that is the substrate 20 in some embodiments, the photo-detecting device 1000*a* can have lower dark current.

Figure 10B:
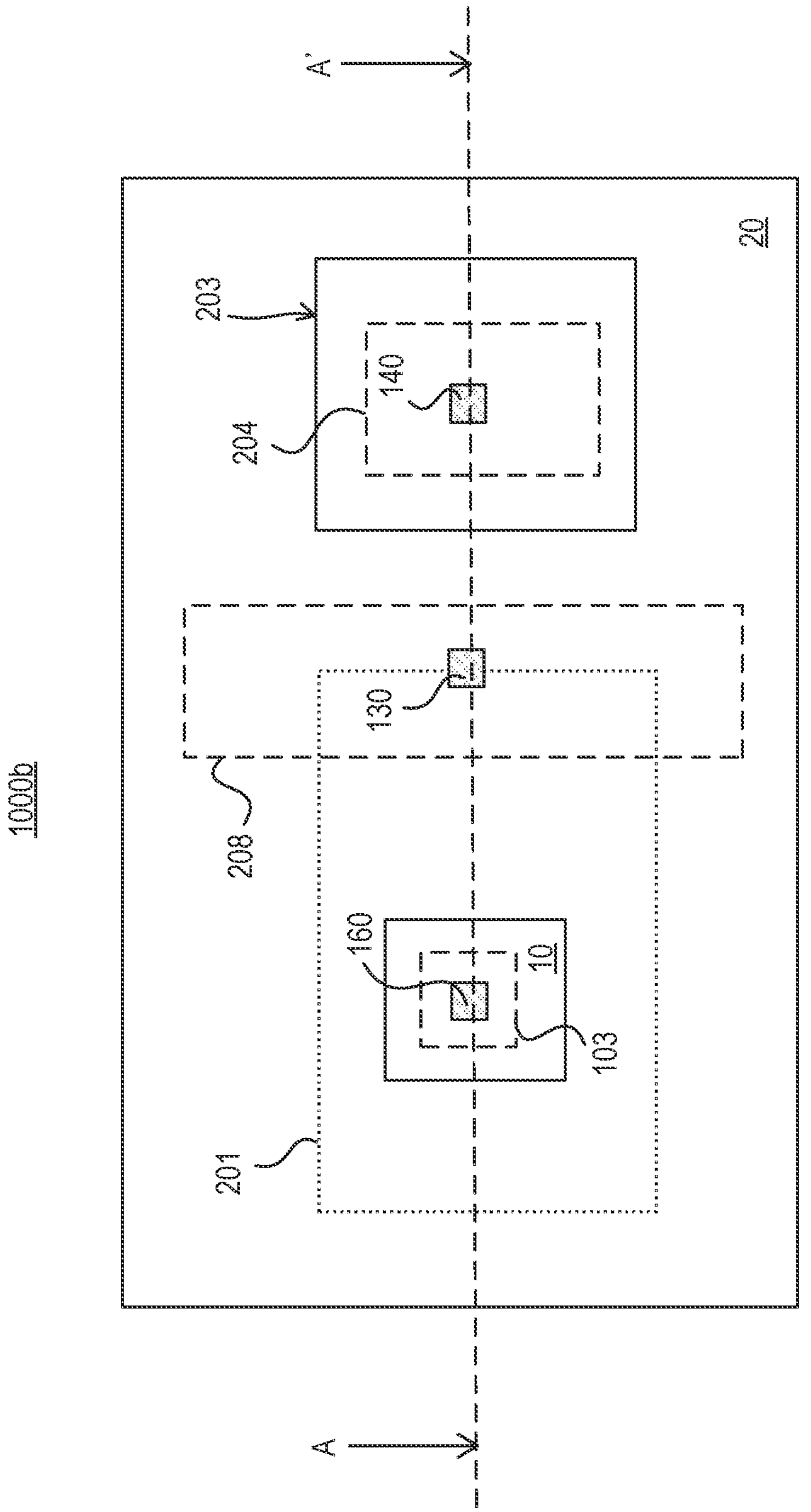
FIG. 10B illustrates a top view of a photo-detecting device, according to some embodiments.
Figure 10C:
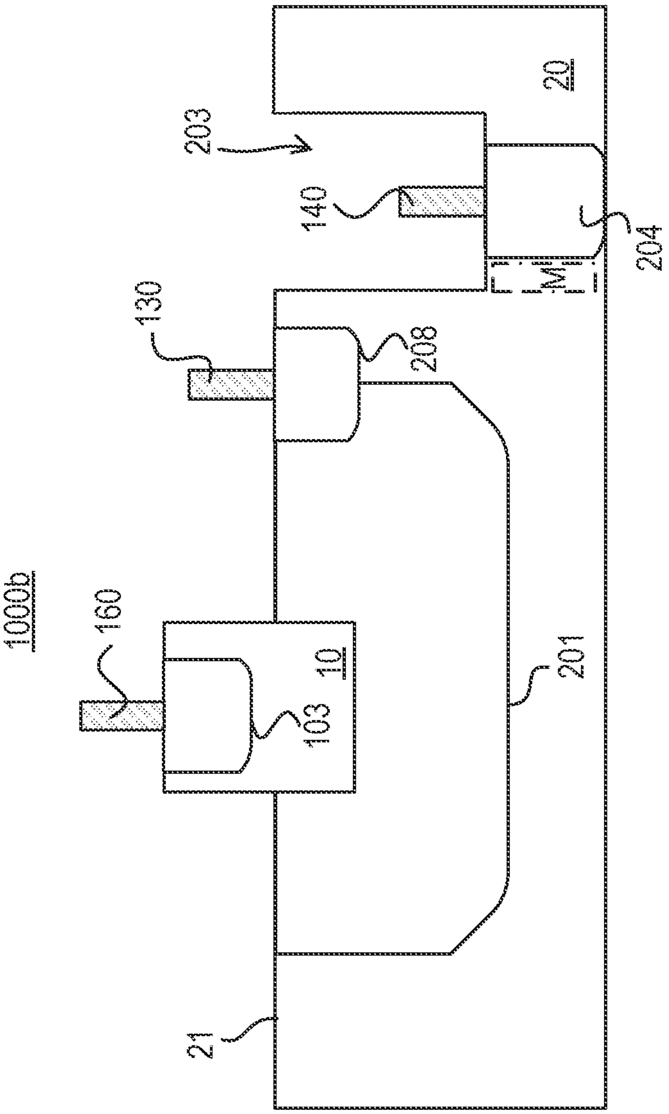
FIG. 10C illustrates a cross-sectional view along an A-A' line in FIG. 10B, according to some embodiments.

FIG. 10B illustrates a top view of a photo-detecting device, according to some embodiments. FIG. 10C illustrates a cross-sectional view along an A-A' line in FIG. 10B, according to some embodiments. The photo-detecting device 1000*b* in FIG. 10B is similar to the photo-detecting device 1000*a* in FIG. 10A. The difference is described below. Preferably, the photo-detecting device 1000*b* serves as an avalanche phototransistor. The photo-detecting device 1000*b* further includes a modification element 203 integrated with the substrate 20. The modification element 203 is for modifying the position where the multiplication occurs in the substrate 20. In some embodiments, the resistivity of the modification element 203 is higher than the resistivity of the substrate 20 so as to modify the position where the multiplication occurs in the substrate 20. Accordingly, more carriers can pass through the place where the strongest electric field locates, which increases the avalanche multiplication gain.

For example, the modification element 203 is a trench formed in the first surface 21 of the substrate 20. The trench can block the carriers from passing through a defined region of the substrate 20, and thus reduces the area in the substrate 20 where the carriers pass through. The trench has a depth, and a ratio of the depth to the thickness of the substrate 20 can be between 10% and 90%. The first contact region 204 is exposed in the trench to be electrically coupled to the first electrode 140. In some embodiments, a width of the trench can be greater than, substantially equal or less than a width of the first contact region 204. In some embodiments, a width of the trench can be greater than a width of the first contact region 204 so as to enforce carriers passing through the high-field region next to the first contact region 204.

By the modification element 203, the carriers, for example, electrons, are forced to pass through the multiplication region, where the strongest electric field locates, such as the region next to the first contact region 204, which increases the avalanche multiplication gain.

In some embodiments, the first electrode 140 is formed in the trench. A height difference is between the third electrode 130 and the first electrode 140.

In some embodiments, the conducting region 201 may be separated from the third contact region 208, overlapped with a part of the third contact region 208, overlapped with the entire third contact region 208, touches the corner of the trench, or partially overlapped with the first contact region 204.

In some embodiment, an insulating material may be filled in the trench.

Figure 10D:
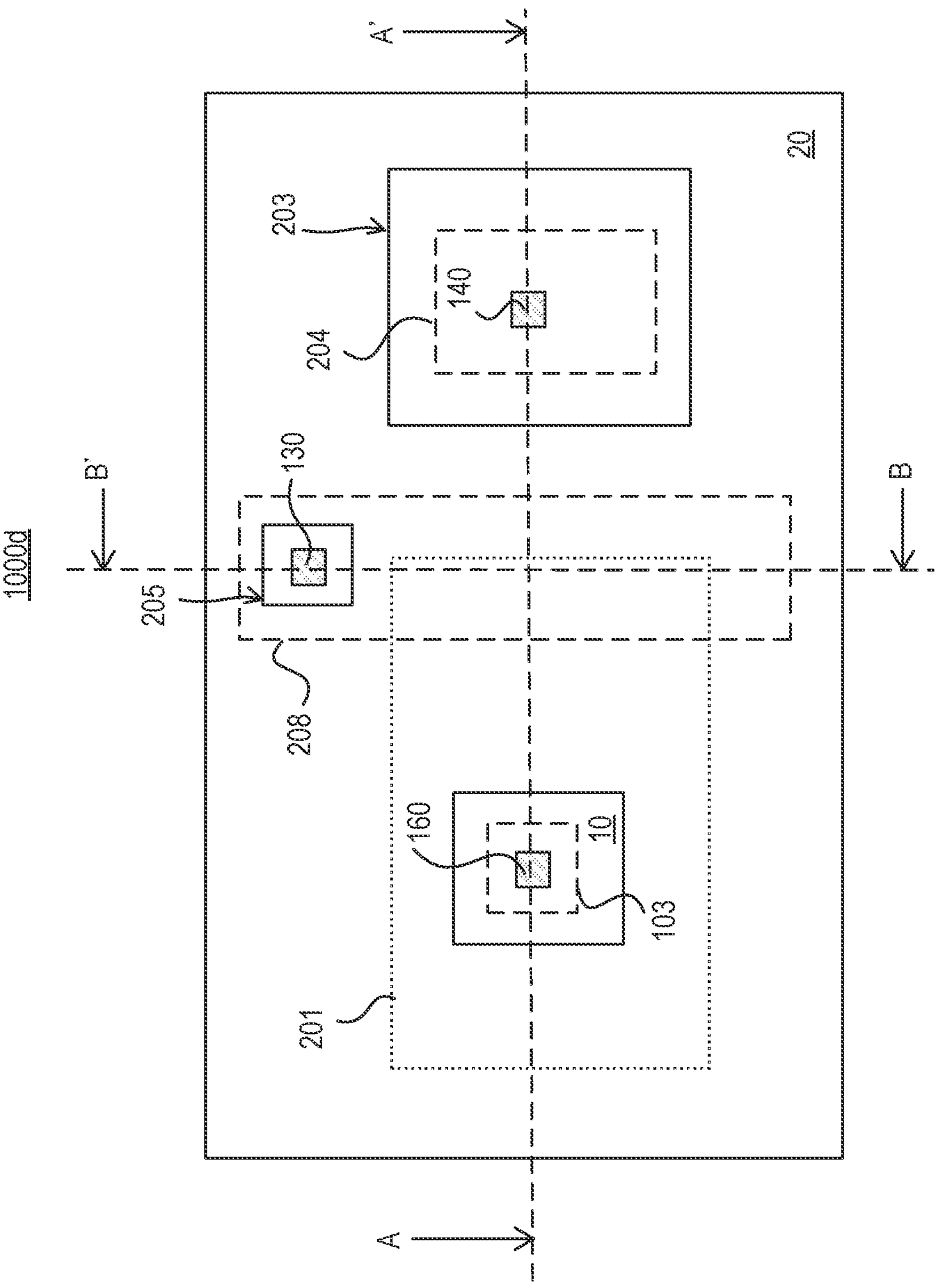
FIG. 10D illustrates a top view of a photo-detecting device, according to some embodiments.
Figure 10E:
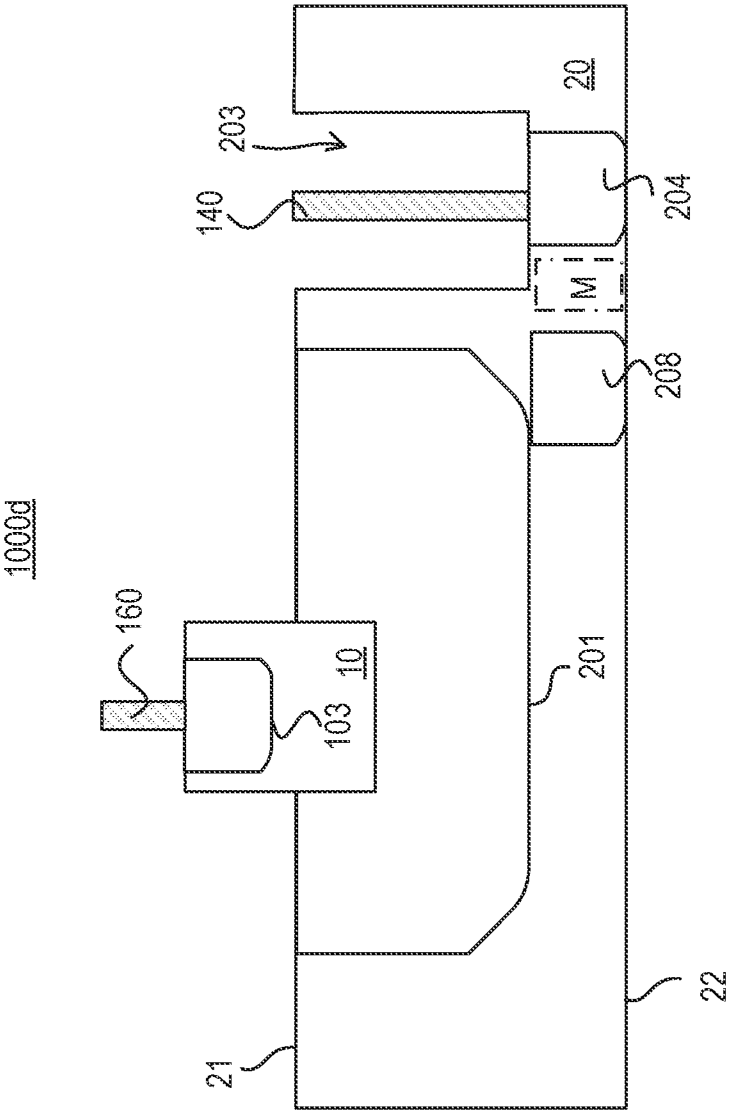
FIG. 10E illustrates a cross-sectional view along an A-A' line in FIG. 10D, according to some embodiments.
Figure 10F:
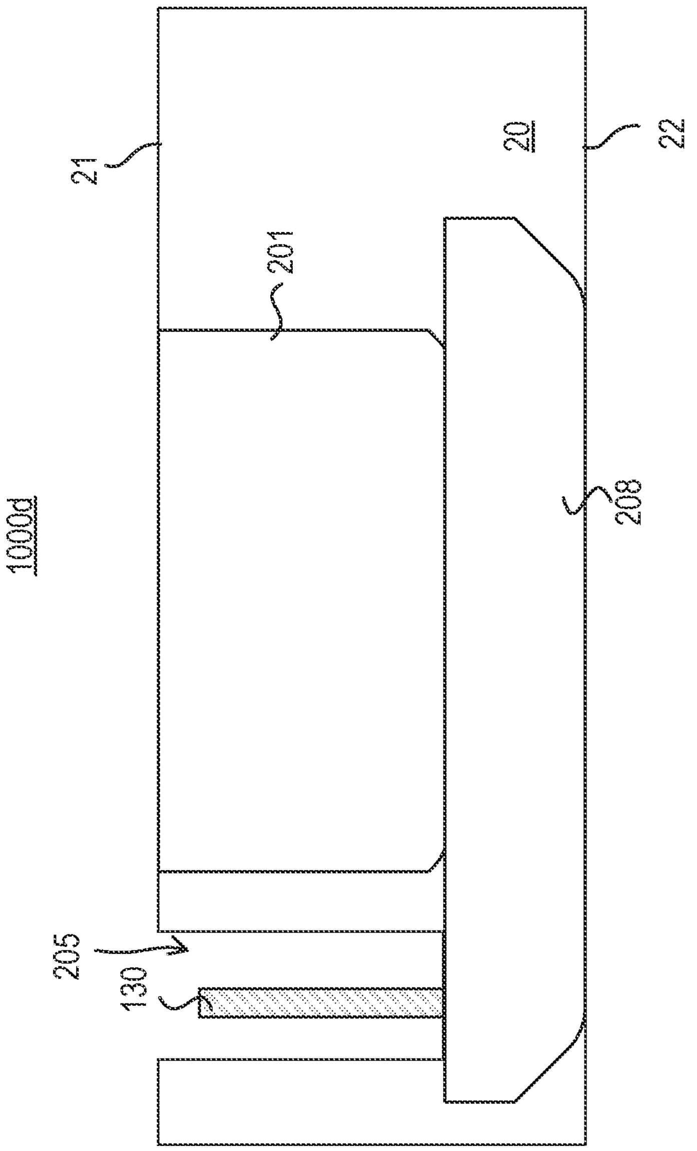
FIG. 10F illustrates a cross-sectional view along a B-B' line in FIG. 10D, according to some embodiments.

FIG. 10D illustrates a top view of a photo-detecting device, according to some embodiments. FIG. 10E illustrates a cross-sectional view along an A-A' line in FIG. 10D, according to some embodiments. FIG. 10F illustrates a cross-sectional view along a B-B' line in FIG. 10D, according to some embodiments. The photo-detecting device 1000_d_ in FIG. 10D is similar to the photo-detecting device 1000_b_ in FIG. 10B. The difference is described below. In some embodiments a distance between the first surface 21 of the substrate 20 and a location of the third contact region 208 having the peak dopant concentration is greater than 30 nm. In some embodiments, the photo-detecting device 1000_d_ further includes a recess 205 formed in the first surface 21 of the substrate 20 and exposing the third contact region 208. The third electrode 130 is formed in the recess 205 to be electrically coupled to the third contact region 208. Since the distance between the first surface 21 of the substrate 20 and a location of the third contact region 208 having the peak dopant concentration is greater than 30 nm, a distance between the third contact region 208 and the first contact region 204 is shorter, which further confines the traveling path of the carriers so as to force more carriers passing through the place where the strongest electric field locates. Accordingly, the avalanche multiplication gain is further improved. In some embodiments, an insulating material may be filled in the recess 205. The first electrode may include interconnects or plugs.

Figure 10G:
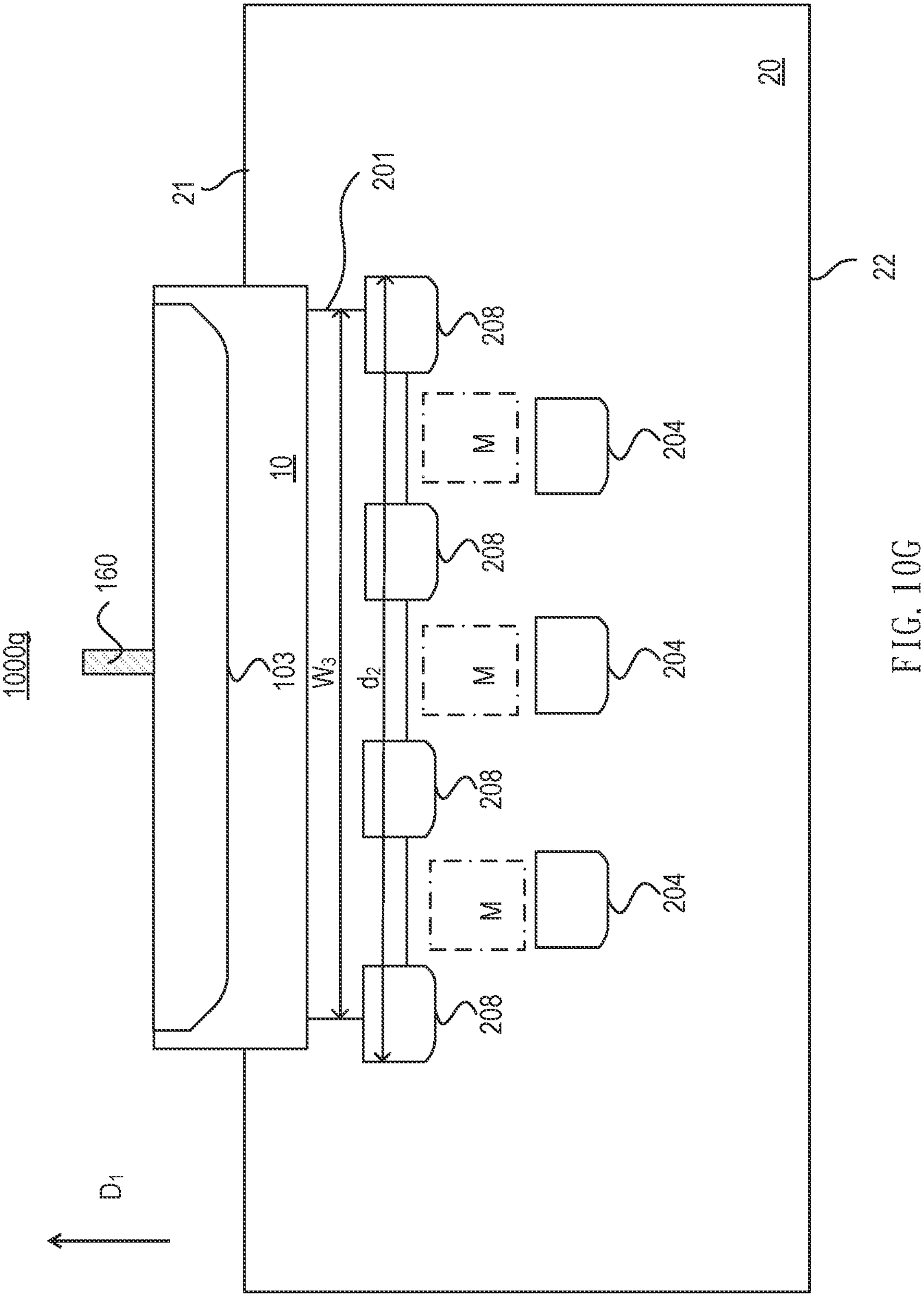
FIG. 10G illustrates a cross-sectional view of a photo-detecting device, according to some embodiments.

FIG. 10G illustrates a cross-sectional view of a photo-detecting device, according to some embodiments. The photo-detecting device 1000_g_ in FIG. 10G is similar to the photo-detecting device 1000_d_ in FIG. TOD. The difference is described below. In some embodiments, the photo-detecting device 1000_g_ includes multiple third contact regions 208 and multiple first contact regions 204. The third contact regions 208 and multiple first contact regions 204 are in a staggered arrangement. By this design, multiple multiplication regions can be formed between the multiple third contact regions 208 and multiple first contact regions 204, providing a more uniform electric field profile compared to the photo-detecting device 1000_d_. In addition, the carriers mainly drift along the direction D1 substantially vertical to the first surface 21 of the substrate 20, which increases the speed of the photo-detecting device 1000_g_ because the vertical transit distance is usually shorter.

In some embodiments, the second contact region 103 is arranged over the first contact regions 204 along the direction D1 substantially vertical to the first surface 21 of the substrate 20. In some embodiments, a maximum distance d2 between two outermost third contact regions 208 is greater than a width w3 of the conducting region 201, which forces carriers generated from the absorption region 10 passing through the multiple multiplication regions between the multiple third contact regions 208 and multiple first contact regions 204 instead of moving into other undesired region in the substrate 20.

In some embodiments, the multiple third contact regions 208 may be separated from one another. In some embodiments, the multiple first contact regions 204 may be separated from one another. In some embodiments, the multiple third contact regions 208 may be a continuous region. In some embodiments, the multiple first contact regions 204 may be a continuous region.

In some embodiments, the first contact regions 204 may be in an interdigitated arrangement from a top view of a first plane (not shown). In some embodiments, the third contact regions 208 may be in an interdigitated arrangement from a top view of a second plane (not shown) different form the first plane.

In some embodiments, one or more third electrodes 130 can be electrically coupled to the third contact regions 208 through any suitable structures, such as vias, from another cross-sectional view of the photo-detecting device 1000_g_ taken along from another plane. In some embodiments, one or more first electrodes 140 can be electrically coupled to the first contact regions 204 through any suitable structures, such as vias, from another cross-sectional view of the photo-detecting device 1000_g_ taken along from another plane.

Figure 10H:
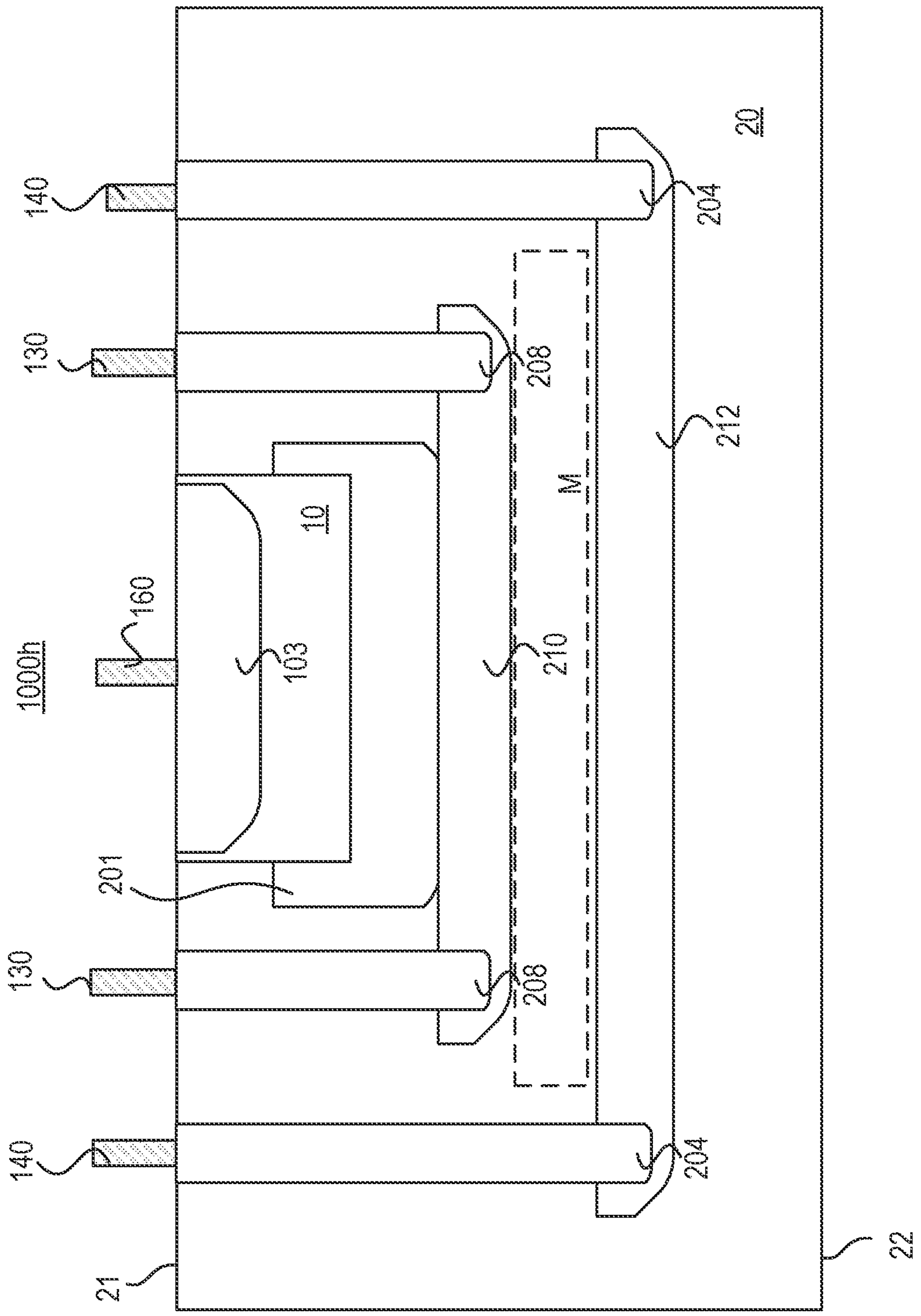
FIG. 10H illustrates a cross-sectional view of a photo-detecting device, according to some embodiments.

FIG. 10H illustrates a cross-sectional view of a photo-detecting device, according to some embodiments. The photo-detecting device 1000_h_ in FIG. 10H is similar to the photo-detecting device 1000_a_ in FIG. 10A. The difference is described below.

The photo-detecting device 1000_h_ further includes a middle-doped region 210 in the substrate 20 and may partially overlapped with the conducting region 201. The middle-doped region 210 is of a conductivity type the same as the conductivity type of the third contact region 208. The middle-doped region 210 includes a dopant having a peak doping concentration lower than peak doping concentration of the third contact region 208, for example, can be between $1\times10^{16}$ $cm^{-3}$ and $1\times10^{18}$ $cm^{-3}$.

The photo-detecting device 1000_h_ further includes a lower-doped region 212 in the substrate 20. The lower-doped region 212 is of a conductivity type the same as the conductivity type of the first contact region 204. The lower-doped region 212 includes a dopant having a peak doping concentration lower than peak doping concentration of the first contact region 204, for example, can be between $1\times10^{18}$ $cm^{-3}$ and $1\times10^{20}$ $cm^{-3}$.

The middle-doped region 210 is between the lower-doped region 212 and the second contact region 103 along a direction substantially vertical to the first surface 21 of the substrate 20. In some embodiments, a position where the peak doping concentration of the lower-doped region 212 locates is deeper than the position where the peak doping concentration of the middle-doped region 210 locates.

In some embodiments, the depth of the third contact region 208 is less than the depth of the first contact region 204. The depth is measured from the first surface 21 of the substrate 20 along a direction substantially perpendicular to the first surface 21 of the substrate 20. The depth is to a position where the dopant profile of the dopant reaches a certain concentration, such as $1\times10^{15}$ $cm^{-3}$.

A multiplication region M can be formed between the lower-doped region 212 and the middle-doped region 210 during the operation of the photo-detecting device 1000_h_. The multiplication region M is configured to receive the one or more charge carriers from the middle-doped region 210 and generate one or more additional charge carriers. The multiplication region M has a thickness that is normal to the first surface 21 and that is sufficient for the generation of one or more additional charge carriers from the one or more carriers that are generated in the absorption region 10. The thickness of the multiplication region M can range, for example, between 100-500 nanometers (nm). The thickness may determine the voltage drop of the multiplication region M to reach avalanche breakdown. For example, a thickness of 100 nm corresponds to about 5-6 Volts voltage drop required to achieve avalanche breakdown in the multiplication region M. In another example, a thickness of 300 nm corresponds to about 13-14 Volts voltage drop required to achieve avalanche breakdown in the multiplication region M.

In some embodiments, the shape of the third contact region 208, the shape of the first contact region 204, the shape of the third electrode 130, and the shape of the first electrode 140 may be but not limited to a ring.

Compared to the photo-detecting device 1000*c* in FIG. 10C, the multiplication region M in the photo-detecting device 1000*h* can be formed in the bulk area of the substrate 20, which avoids defects that may present at the trench surface described in FIG. 10C. As a result, the dark current is further reduced. Furthermore, a height difference between the third electrode 130 and the first electrode 140 can be reduced and thus the fabrication process afterwards will be benefit from this design.

Figure 10I:
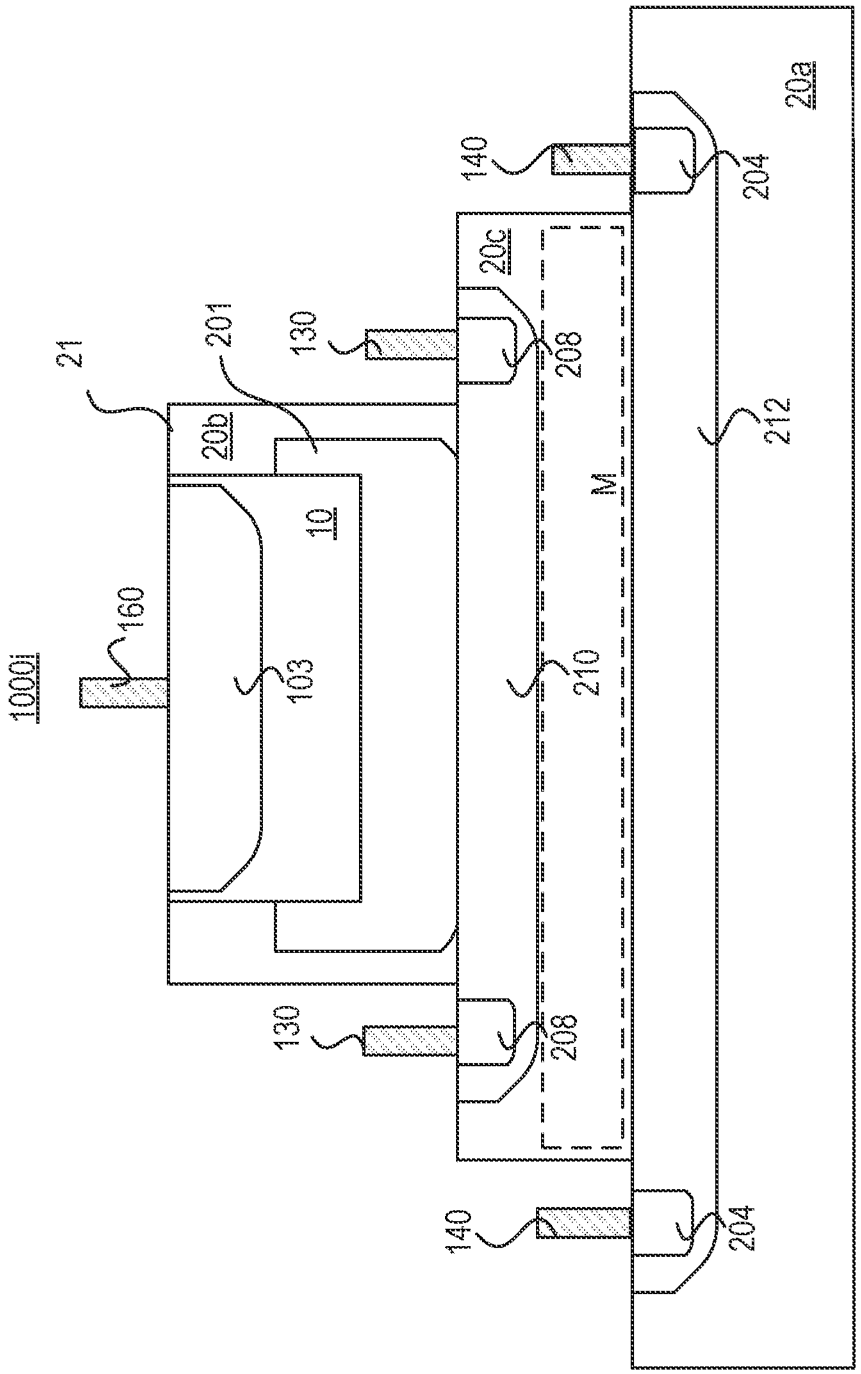
FIG. 10I illustrates a cross-sectional view of a photo-detecting device, according to some embodiments.

FIG. 10I illustrates a cross-sectional view of a photo-detecting device, according to some embodiments. The photo-detecting device 1000*i* in FIG. 10I is similar to the photo-detecting device 1000*h* in FIG. 10H. The difference is described below. The substrate 20 includes a base portion 20*a*, an upper portion 20*b* and a middle portion 20*c*. The middle portion 20*c* is between the base portion 20*a* and the upper portion 20*b*. The absorption region 10, the second contact region 103 and the conducting region 201 are in the upper portion 20*b*. The third contact region 208 is in the middle portion 20*c*. The first contact region 204 is in the base portion 20*a*. The upper portion 20*b* has a width less than a width of the middle portion 20*c*, and the third contact region 208 is exposed to be electrically coupled to the third electrode 130. The middle portion 20*c* has a width less than a width of the base portion 20*a*, and the first contact region 204 is exposed to be electrically coupled to the first electrode 140.

The middle-doped region 210 is in the middle portion 20*c*. The lower-doped region 212 is in the base portion 20*a*. Compared to the photo-detecting device 1000*c* in FIG. 10C, the multiplication region M in the photo-detecting device 1000*h* can be formed in the bulk area of the middle portion 20*c*, which avoids defects that may present at the trench surface described in FIG. 10C. As a result, the dark current is further reduced.

Figure 11A:
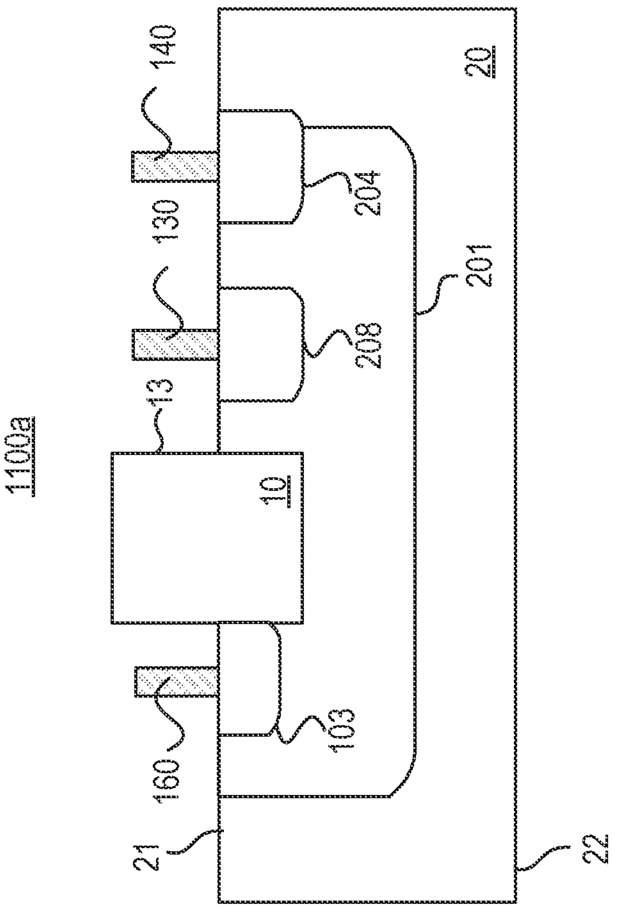
FIG. 11A illustrates a cross-sectional view of a photo-detecting device, according to some embodiments.

FIG. 11A illustrates a cross-sectional view of a photo-detecting device, according to some embodiments. The photo-detecting device 1100*a* in FIG. 11A is similar to the photo-detecting device 1000*a* in FIG. 10A. The difference is described below.

The second contact region 103 is in the substrate 20. In other words, the peak doping concentration of the second contact region 103 lies in the substrate 20. In some embodiment, the second contact region 103 is below the first surface 21 of the substrate 20 and is in direct contact with the absorption region 10, for example, the second contact region 103 may be in contact with or overlapped with one of the side surfaces 13 of the absorption region 10 that is opposite to the third contact region 208 and/or the first contact region 204. As a result, the carriers generated from the absorption region 10 can move from the absorption region 10 towards the second contact region 103 through the heterointerface between the absorption region 10 and the substrate 20. The second electrode 160 is over the first surface 21 of the substrate 20.

By having the second contact region 103 in the substrate 20 instead of in the absorption region 10, the second electrode 160, the first electrode 140 and the third electrode 130 can all be coplanarly formed above the first surface 21 of the substrate 20. Therefore, a height difference between the any two of the second electrode 160, the third electrode 130 and the first electrode 140 can be reduced and thus the fabrication process afterwards will be benefit from this design. Besides, the area of the absorption region 10 absorbing the optical signal can be larger.

Figure 11B:
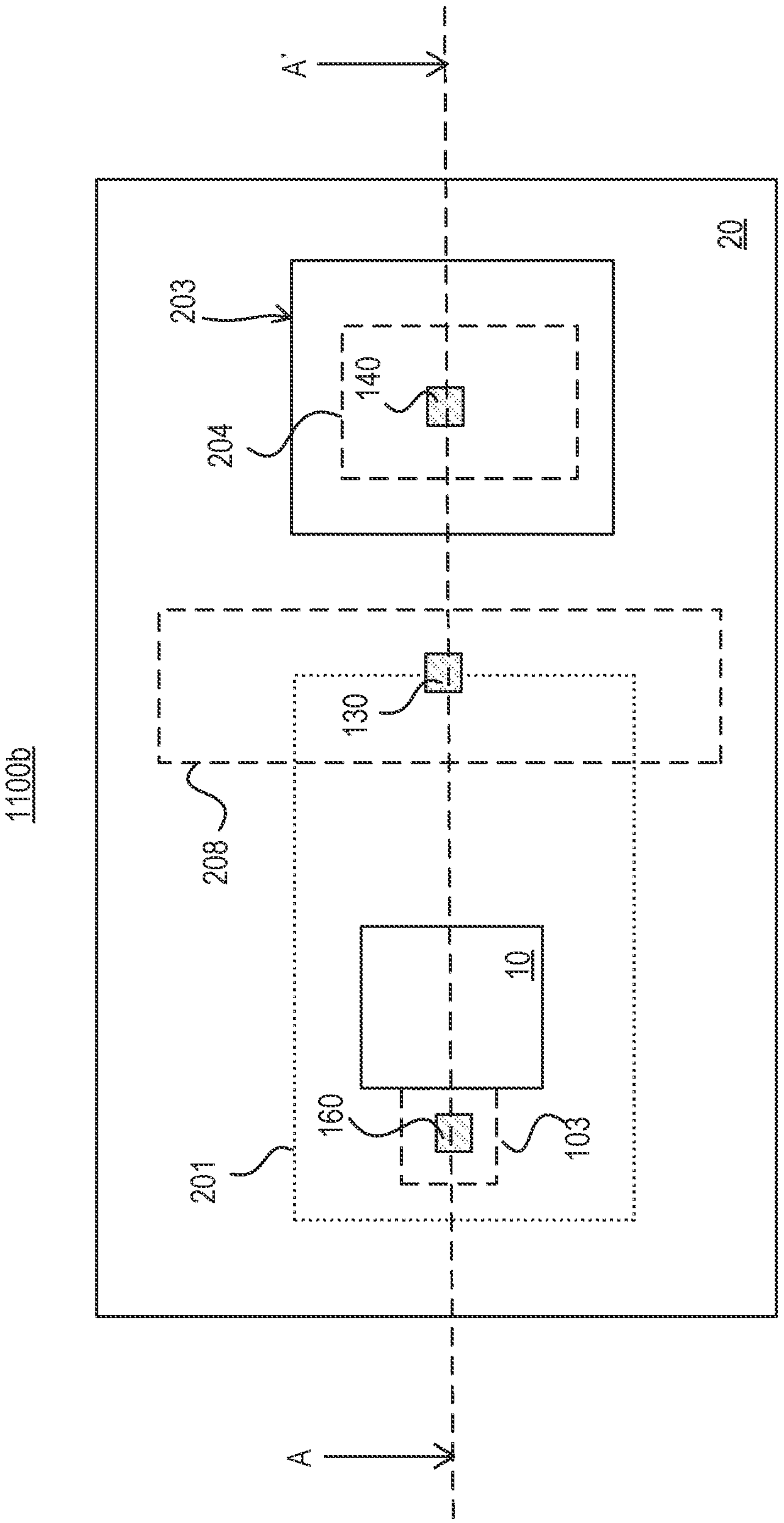
FIG. 11B illustrates a top view of a photo-detecting device, according to some embodiments.
Figure 11C:
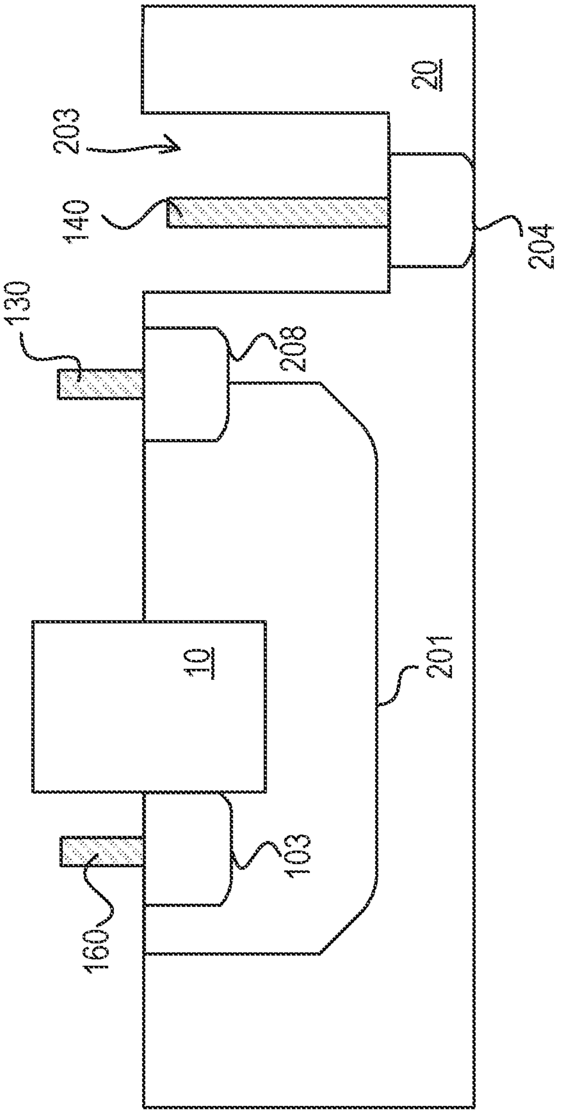
FIG. 11C illustrates a cross-sectional view along an A-A' line in FIG. 11B, according to some embodiments.

FIG. 11B illustrates a top view of a photo-detecting device, according to some embodiments. FIG. 11C illustrates a cross-sectional view along an A-A' line in FIG. 11B, according to some embodiments. The photo-detecting device 1100*b* in FIG. 11B is similar to the photo-detecting device 1100*a* in FIG. 11A. The difference is described below. The photo-detecting device 1100*b* further includes a modification element 203 integrated with the substrate 20. The modification element 203 is similar to the modification element 203 as described in FIGS. 10B and 10C.

Figure 11D:
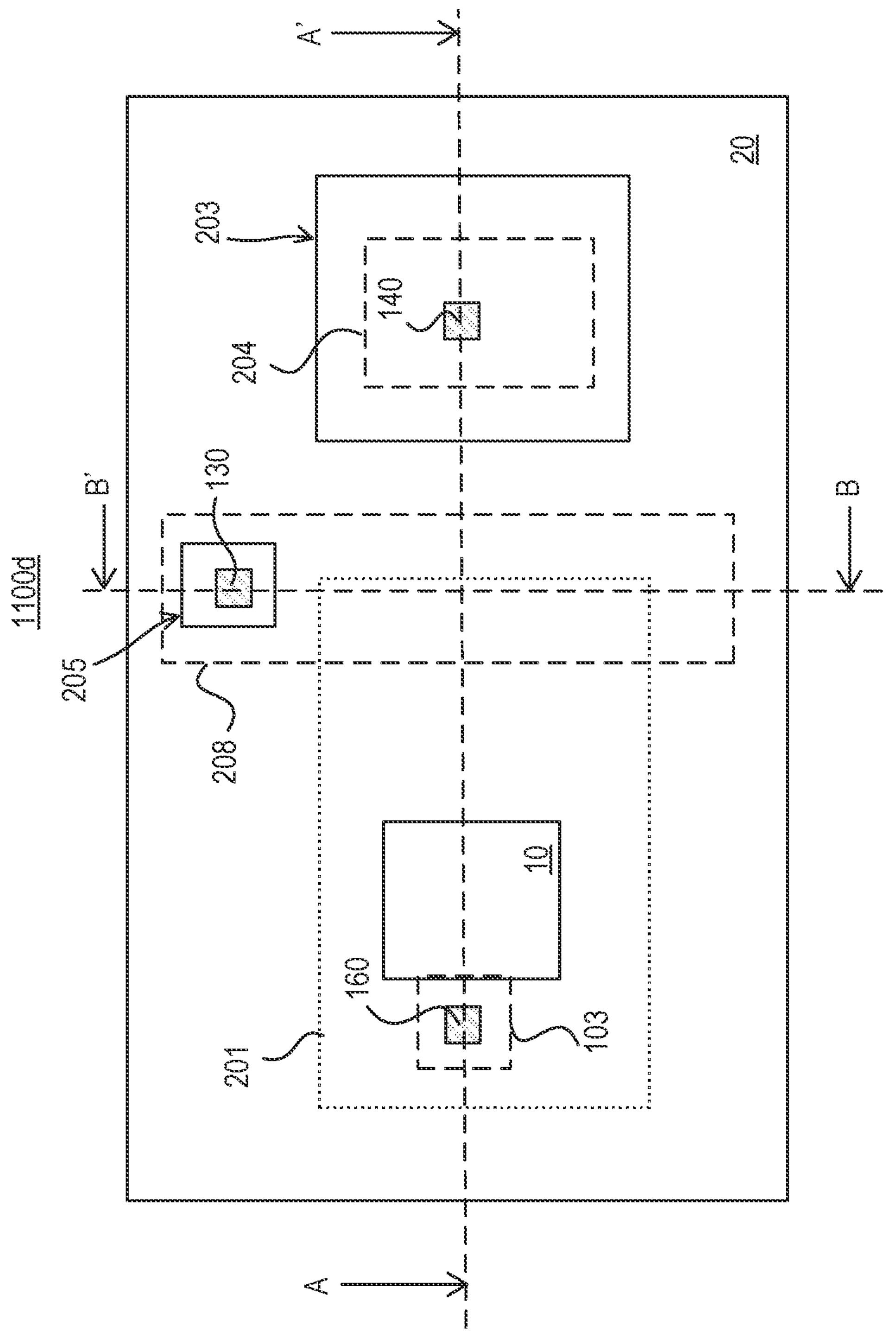
FIG. 11D illustrates a top view of a photo-detecting device, according to some embodiments.
Figure 11E:
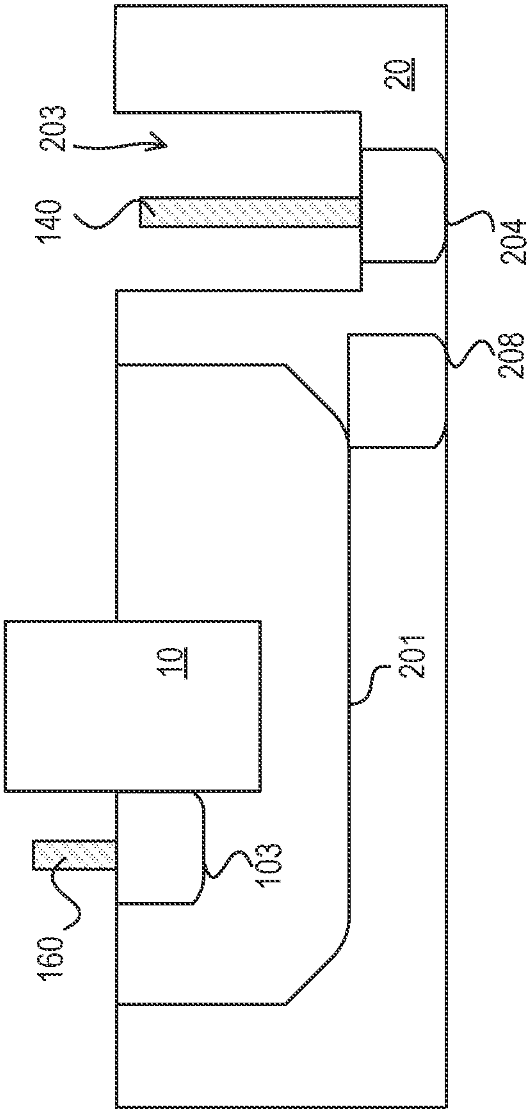
FIG. 11E illustrates a cross-sectional view along an A-A' line in FIG. 11D, according to some embodiments.

FIG. 11D illustrates a top view of a photo-detecting device, according to some embodiments. FIG. 11E illustrates a cross-sectional view along an A-A' line in FIG. 11D, according to some embodiments. A cross-sectional view along a B-B' line in FIG. 11D is the same as FIG. 10F. The photo-detecting device 1100*d* in FIG. 11D is similar to the photo-detecting device 1100*b* in FIG. 11B. The difference is described below. The third contact region 208 is similar to the third contact region 208 in FIG. 10D and FIG. 10E. Besides, the photo-detecting device 1100*d* further includes a recess 205 similar to the recess 205 as described in FIG. 10D and FIG. 10F, and the third electrode 130 is formed in the recess 205 to be electrically coupled to the third contact region 208.

Figure 12A:
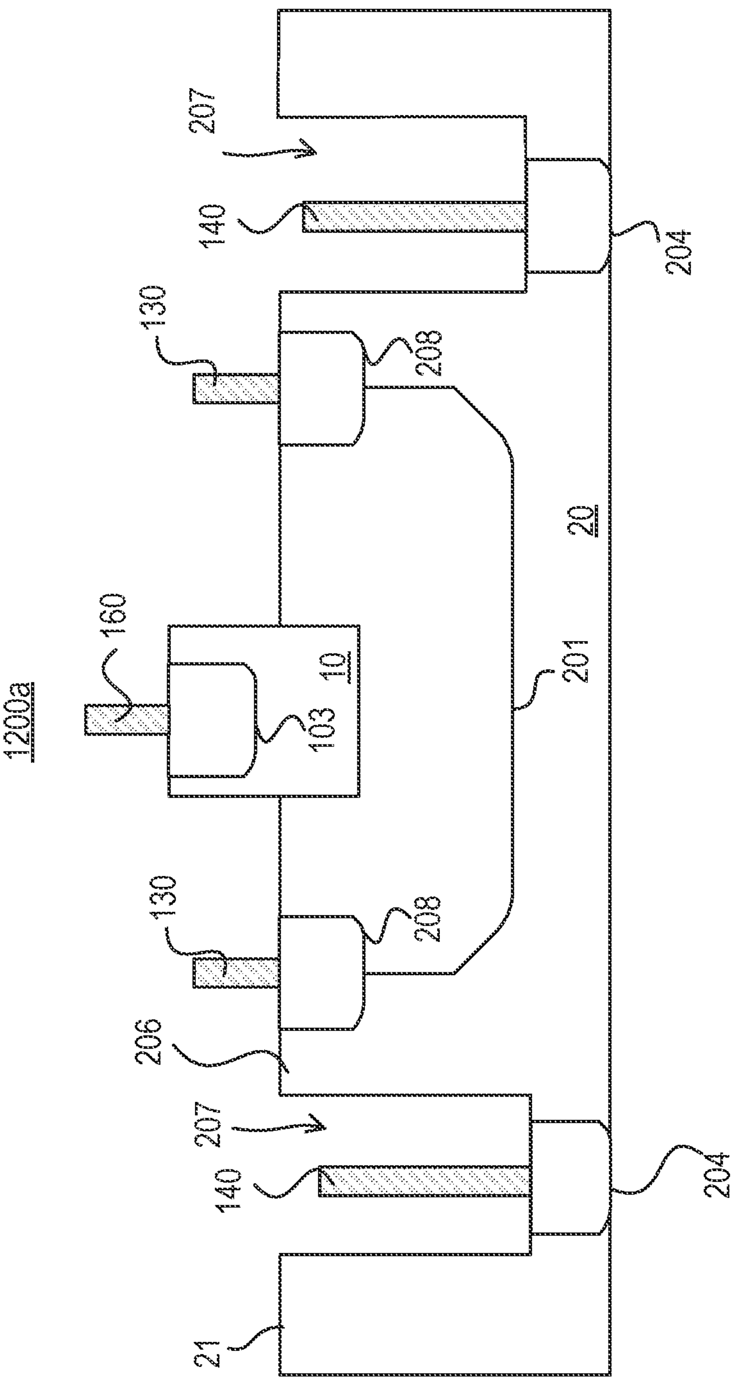
FIGS. 12A-12C illustrate cross-sectional views of the absorption region of a photo-detecting device, according to some embodiments.

FIG. 12A illustrates a cross-sectional view of a photo-detecting device, according to some embodiments. The photo-detecting device 1200*a* in FIG. 12A is similar to the photo-detecting device 1000*c* in FIG. 10C. The difference is described below. From the cross-sectional view of a photo-detecting device, the photo-detecting device 1200*a* includes two third contact regions 208, two first contact regions 204, two third electrodes 130 and two first electrodes 140. The third contact regions 208 are disposed at two opposite sides of the absorption region 10, and the two third electrodes 130 are electrically coupled to the respective third contact region 208. The first contact regions 204 are disposed at two opposite sides of the absorption region 10, and the first electrodes 140 are electrically coupled to the respective first contact region 204. A distance between the third contact regions 208 is less than a distance between the first contact regions 204. The substrate 20 further includes a waveguide 206 associated with the absorption region 10 for guiding and/or confining the incident optical signal passing through a defined region of the substrate 20. For example, the waveguide 206 may be a ridge defined by two trenches 207. The ridge is with a width greater than a width of the absorption region 10. An incident optical signal can be confined and propagate along the ridge. The trench may be similar to the trench mentioned in FIG. 10B and FIG. 10C, and may also be a modification element 203 as mentioned in FIG. 10B and FIG. 10C. For example, carriers are forced to pass through the multiplication region where the strongest electric field locates, such as the region near the corner of each of the trenches, which increases the avalanche multiplication gain. Similar to FIG. 10B and FIG. 10C, each of the first contact regions 204 is exposed in the respective trench 207 for electrically coupled to the respective first electrode 140.

Figure 12B:
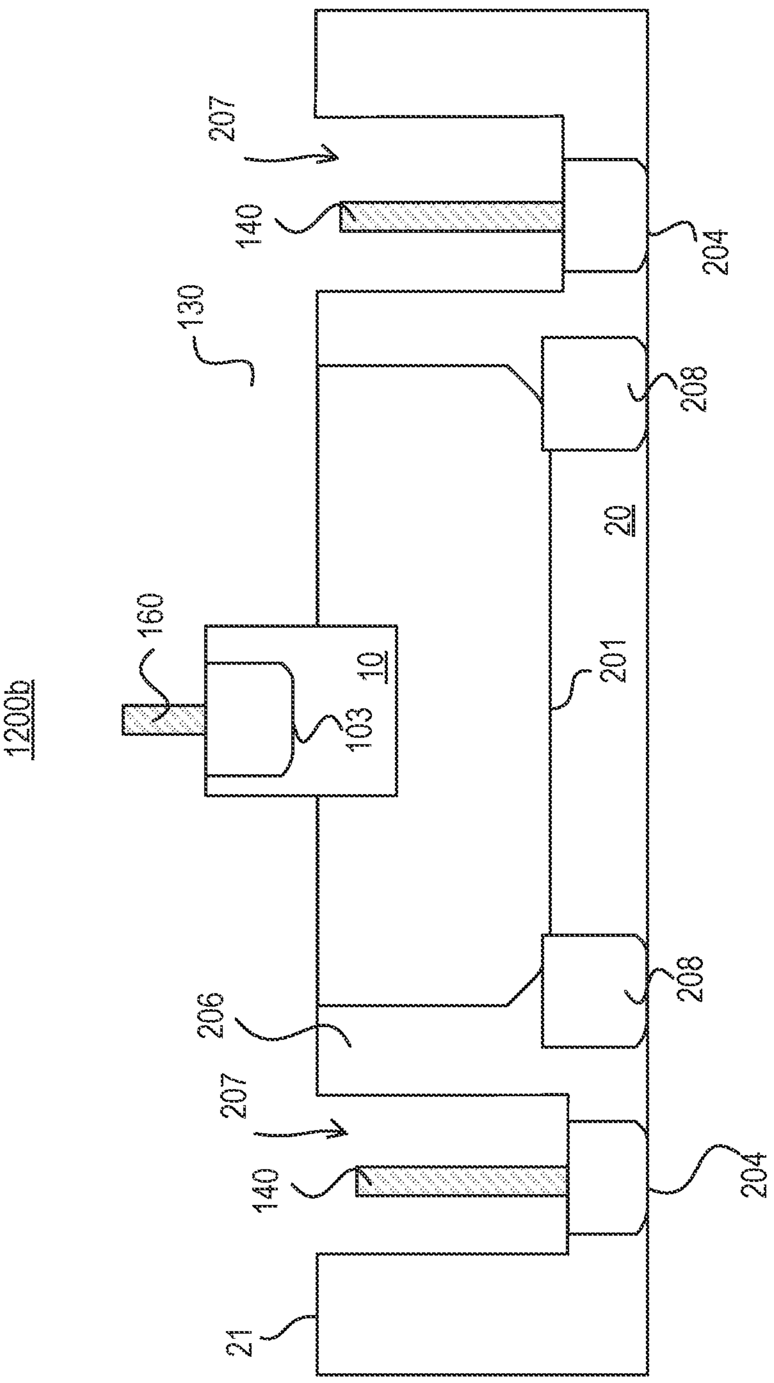

FIG. 12B illustrates a cross-sectional view of a photo-detecting device, according to some embodiments. The photo-detecting device 1200*b* in FIG. 12B is similar to the photo-detecting device 1100*a* in FIG. 12A. The difference is described below. The third contact regions 208 are similar to the third contact region 208 in FIG. 10D and FIG. 10E. For example, a distance between the first surface 21 of the substrate 20 and a location of each of the third contact regions 208 having the peak dopant concentration is greater than 30 nm.

Figure 12C:
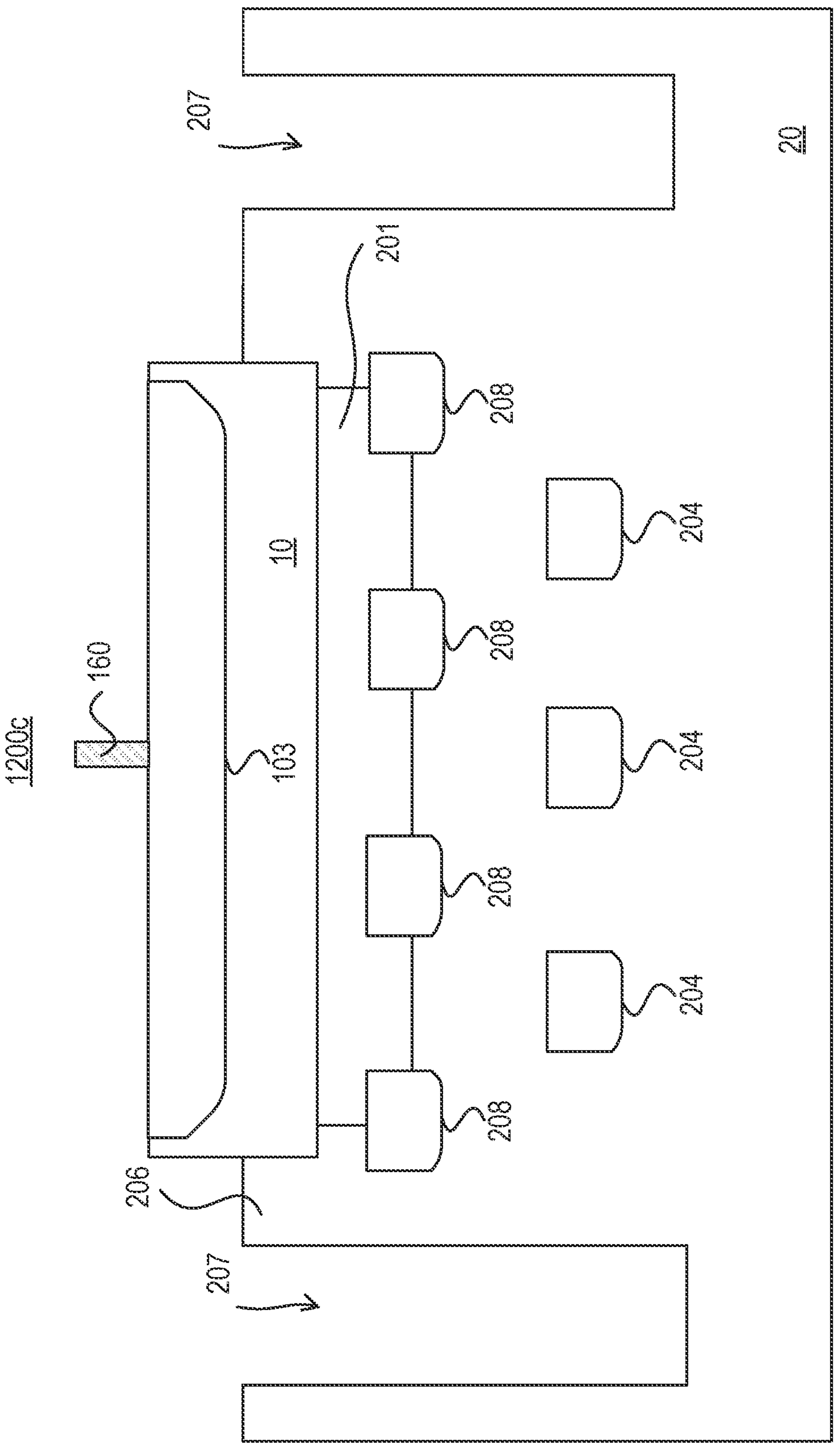

FIG. 12C illustrates a cross-sectional view of a photo-detecting device, according to some embodiments. The photo-detecting device 1200*c* in FIG. 12C is similar to the photo-detecting device 1000*g* in FIG. 10G. The difference is described below. The photo-detecting device 1200*c* further includes a waveguide 206 integrated with the substrate 20, where the waveguide 206 is similar to the waveguide 206 described in FIG. 12A.

Figure 13A:
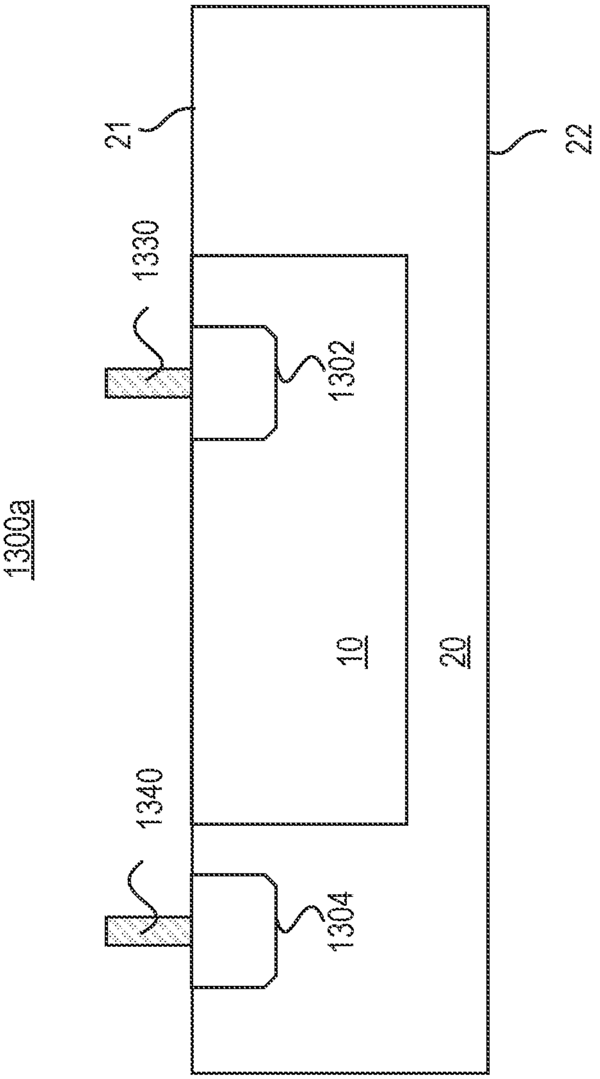
FIG. 13A illustrates a top view of a photo-detecting device, according to some embodiments.

FIG. 13A illustrates a cross-sectional view of a photo-detecting device, according to some embodiments. The photo-detecting device includes an absorption region 10 and a substrate 20 supporting the absorption region 10. The absorption region 10 is similar to the absorption region 10 as described in FIG. 1A. The substrate 20 is similar to the substrate 20 as described in FIG. 1A. The difference between the photo-detecting device 1300*a* in FIG. 13A and the photo-detecting device 100*a* in FIG. 1A is described below.

The photo-detecting device 1300*a* includes a collector region 1302 and an emitter region 1304 separated from the collector region 1302. In some embodiments, the collector region 1302 is in the absorption region 10. The emitter region 1304 is outside of the absorption region 10 and is in the substrate 20. The collector region 1302 is for collecting amplified photo-carriers generated from the absorption region 10. The collector region 1302 is of a conductivity type. The emitter region 1304 is of a conductivity type the same as the conductivity type of the collector region 1302. The conductivity type of the absorption region 10 is the same as the conductivity type of the collector region 1302. For example, the conductivity type of the absorption region 10 is p-type, and the conductivity type of the collector region 1302 and the conductivity type of the emitter region 1304 are p-type. In some embodiments, the collector region 1302 includes a dopant and has a dopant profile with a peak dopant concentration higher than the first peak doping concentration of the absorption region 10, for example, may be ranging from $5\times10^{18}$ $cm^{-3}$ to $5\times10^{20}$ $cm^{-3}$.

In some embodiments, the emitter region 1304 includes a dopant and has a dopant profile with a peak dopant concentration higher than the second peak doping concentration of the second dopant of the substrate 20, for example, can be ranging from, $1\times10^{17}$ $cm^{-3}$ to $5\times10^{18}$ $cm^{-3}$.

The photo-detecting device 1300*a* includes a first electrode 1330 electrically coupled to the collector region 1302 and includes a second electrode 1340 electrically coupled to the emitter region 1304. The first electrode 1330 serves as a collector electrode. The second electrode 1340 serves as an emitter electrode.

In some embodiments, similar to the conducting area described in FIG. 1A, a conducting area (not shown) can be formed in the carrier conducting layer, that is the substrate 20 in some embodiments. The conducting region 201 is between the emitter region 1304 and the absorption region 10. In some embodiments, the conducting region 201 is partially overlapped with the absorption region 10 and the emitter region 1304 for confining a path of the carriers generated from the absorption region 10 moving towards the emitter region 1304. In some embodiments, the conducting region 201 has a depth measured from the first surface 21 of the substrate 20 along a direction substantially perpendicular to the first surface 21 of the substrate 20. The depth is to a position where the dopant profile of the second dopant reaches a certain concentration, such as $1\times10^{15}$ $cm^{-3}$.

Similarly, by the design of the concentration and the material of the absorption region 10 and the carrier conducting layer, that is the substrate 20 in some embodiments, the photo-detecting device 1300*a* can have lower dark current.

In some embodiments, a method for operating the photo-detecting device 1300*a* includes the steps of: generating a reversed-biased PN junction between the absorption region 10 and the substrate 20 and generating a forward-biased PN junction between the substrate 20 and the emitter region 1304; and receiving an incident light in the absorption region 10 to generate an amplified photocurrent.

For example, the photo-detecting device 1300*a* may include a p-doped emitter region 1304, a n-doped substrate 20, a p-doped absorption region 10, and an p-doped collector region 1302. The PN junction between the p-doped emitter region 1304 and the n-doped substrate 20 is forward-biased such that a hole-current is emitted into the n-doped substrate 20. The PN junction between the p-doped absorption region 10 and the n-doped substrate 20 is reverse-biased such that the emitted hole-current is collected by the first electrode 1330. When light (e.g., a light at 940 nm, 1310 nm, or any suitable wavelength) is incident on the photo-detecting device 1300*a*, photo-carriers including electrons and holes are generated in the absorption region 10. The photo-generated holes are collected by the first electrode 1330. The photo-generated electrons are directed towards the n-doped substrate 20, which causes the forward-bias to increase due to charge neutrality. The increased forward-bias further increases the hole-current being collected by the first electrode 1330, resulting in an amplified hole-current generated by the photo-detecting device 1300*a*.

Accordingly, a second electrical signal collected by the collector region 1302 is greater than the first electrical signal generated by the absorption region 10, and thus the photo-detecting device 1300*a* is with gain and thus is with improved signal to noise ratio.

In some embodiments, a method for operating the photo-detecting device 1300*a* capable of collecting holes includes the steps of: applying a first voltage V1 to the first electrode 1330 and applying a second voltage V2 to the second electrode 1340 to generate a first current flowing from the second electrode 1340 to the first electrode 1330, where the second voltage V2 is higher than the first voltage V1; and receiving an incident light in the absorption region 10 to generate a second current flowing from the second electrode 1340 to the first electrode 1330 after the absorption region 10 generates photo-carriers from the incident light, where the second current is larger than the first current.

In some embodiments, a method for operating the photo-detecting device 1300*a* capable of collecting holes includes the steps of: applying a second voltage V2 to the second electrode 1340 to form a forward-bias between the emitter region 1304 and the substrate 20 to form a first hole current, and applying a first voltage to the first electrode 1330 to form a reverse-bias between the substrate 20 and an absorption region 10 to collect a portion of the first hole current, where the second voltage V2 is higher than the first voltage V1; receiving an incident light in the absorption region 10 to generate photo-carriers including electrons and holes; and amplifying a portion of the holes of the photo-carriers to generate a second hole current; and collecting a portion of the second hole current by the collector region 1302, where the second hole current is larger than the first hole current.

Figure 13B:
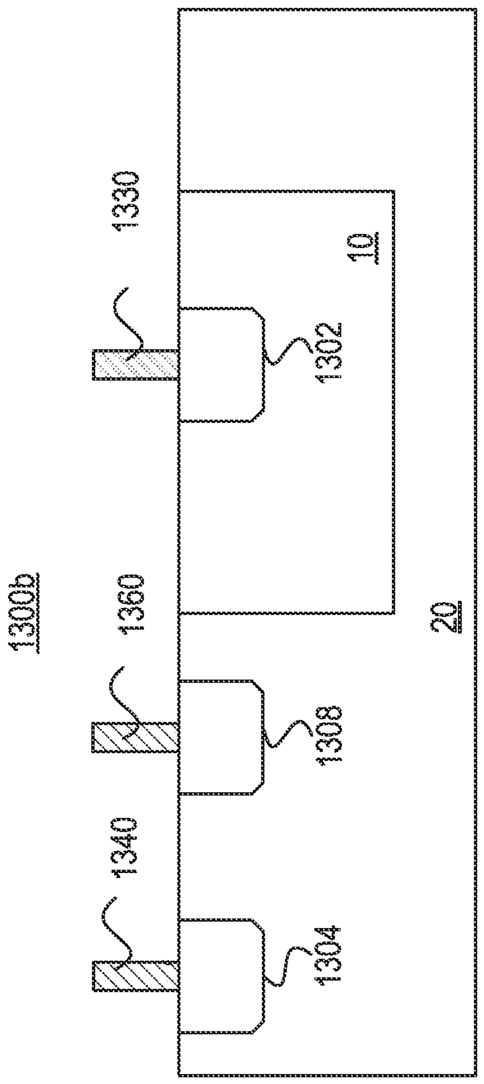
FIG. 13B illustrates a top view of a photo-detecting device, according to some embodiments.

FIG. 13B illustrates a cross-sectional view of a photo-detecting device, according to some embodiments. The photo-detecting device 1300*b* in FIG. 13B is similar to the photo-detecting device 1300*a* in FIG. 13A. The difference is described below. The photo-detecting device further includes a base region 1308 and a third electrode 1360 electrically coupled to the base region 1308. The third electrode 1360 serves as a base electrode. In some embodiments, the base region 1308 is between the collector region 1302 and the emitter region 1304. The base region 1308 is of a conductivity type different from the conductivity type of the collector region 1302. In some embodiments, base region 1308 is in the substrate 20.

In some embodiments, the base region 1308 includes a dopant and has a dopant profile with a peak dopant concentration higher than the second peak doping concentration of the second dopant of the substrate 20, for example, can be ranging from $1\times10^{17}$ $cm^{-3}$ to $5\times10^{18}$ $cm^{-3}$.

The third electrode 1360 is for biasing the base region 1308. In some embodiments, the third electrode 1360 is for evacuating the photo-carriers with opposite type and not collected by the first electrode 1330 during the operation of the photo-detecting device 1300*b*. For example, if the photo-detecting device 1300*b* is configured to collect holes, which are further processed by such as circuitry, the third electrode 1360 is for evacuating electrons. Therefore, the photo-detecting device 1300*b* can have improved reliability.

In some embodiments, a method for operating the photo-detecting device 1300*b* capable of collecting holes includes the steps of: applying a second voltage V2 to the second electrode 1340 to form a forward-bias between the emitter region 1304 and the substrate 20 to form a first hole current, and applying a first voltage to the first electrode 1330 to form a reverse-bias between the substrate 20 and an absorption region 10 to collect a portion of the first hole current, where the second voltage V2 is higher than the first voltage V1; applying a third voltage to a third electrode 1360 electrically coupled to abase region 1308 of the photo-detecting device; receiving an incident light in the absorption region 10 to generate photo-carriers including electrons and holes; and amplifying a portion of the holes of the photo-carriers to generate a second hole current; and collecting a portion of the second hole current by the collector region 1302, and where the third voltage V3 is between the first voltage V1 and the second voltage V2.

A reverse-biased is formed across the p-n junction between the collector region 1302 and the base region 1308, and a forward-biased is formed across the p-n junction between the emitter region 1304 and the base region 1308. In some embodiments, where the step of the applying the third voltage V3 to the third electrode 1360 and the step of applying the first voltage V1 to the first electrode 30 and applying the second voltage V2 to the second electrode 1340 are operated at the same time.

In some embodiments, the arrangement of the third electrode 1360, first electrode 1330 and the second electrode 1340 and the arrangement of the base region 1308, collector region 1302 and the emitter region 1304 can be different. For example, in some embodiments, the second electrode 1340 is between the first electrode 1330 and the third electrode 1360. The emitter region 1304 is between the collector region 1302 and the base region 1308.

Figure 14A:
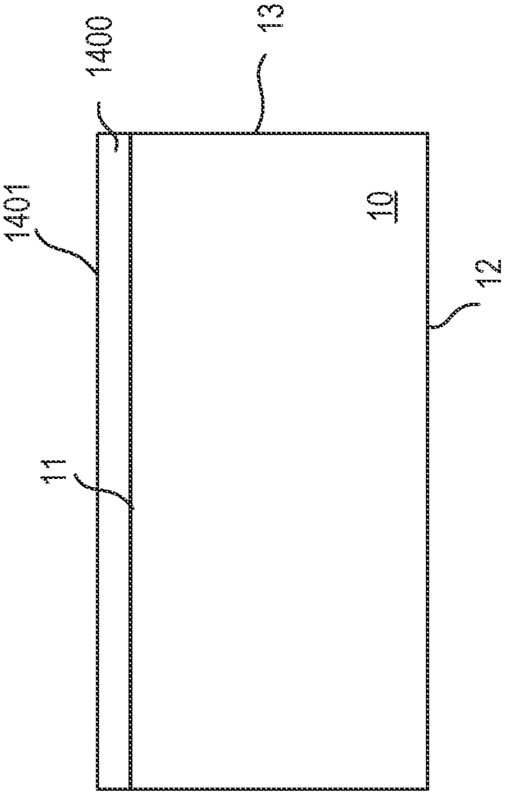
FIG. 14A illustrates a cross-sectional view of a portion of the photo-detecting device, according to some embodiments.
Figure 14B:
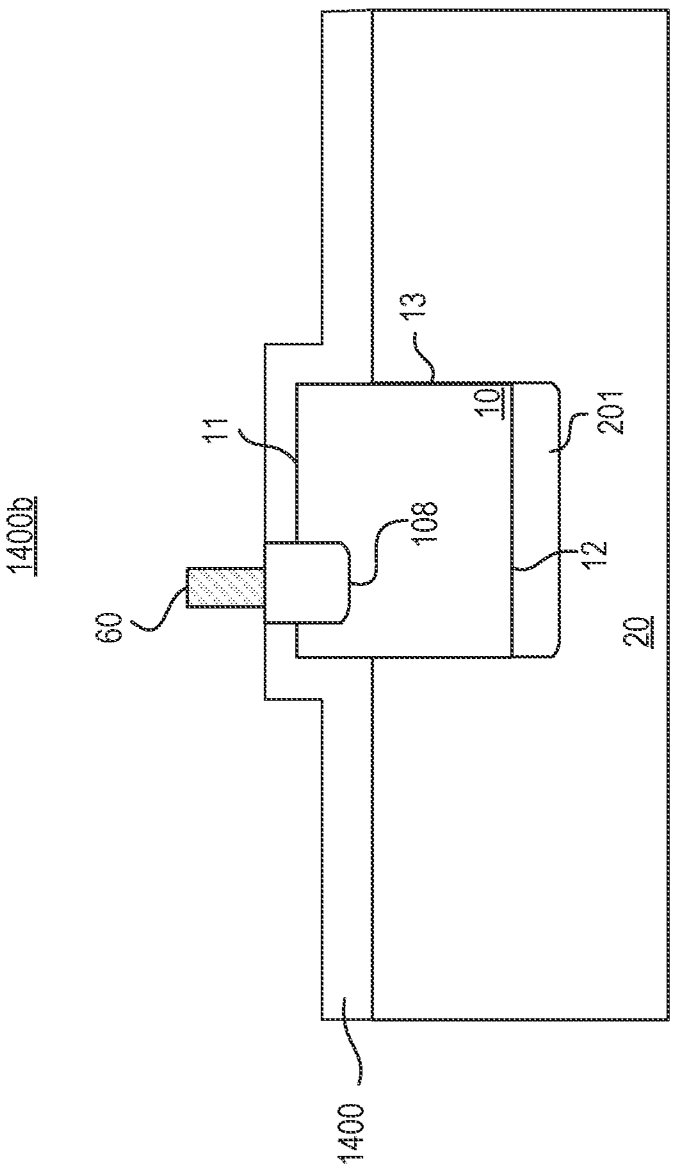
FIG. 14B illustrates a cross-sectional view along a line passing second doped region 108 of the photo-detecting device, according to some embodiments.

FIG. 14A illustrates a cross-sectional view of a portion of a photo-detecting device, according to some embodiments. The photo-detecting device can be any photo-detecting device described before. The photo-detecting device further includes a passivation layer 1400 over a first surface 11 of the absorption region 10. In some embodiments, the passivation layer 1400 further covers a portion of the first surface 21 of the substrate 20, and the readout electrodes 330*a*, 330*b* and the control electrodes 340*a*, 340*b* may be or may not be over a first surface 1401 of the passivation layer 1400. In some embodiments, the absorption region 10 is protruded from the first surface 21 of the substrate 20, and the passivation layer 1400 further covers side surfaces 13 of the absorption region 10 exposed from the substrate 20. That is, the passivation layer 1400 may be conformally formed on the absorption region 10 and the substrate 20 as shown in FIG. 14B. In some embodiments, the second electrode 60 is formed on a surface of the passivation layer 1400 higher than a surface of the passivation layer 1400 where the readout electrodes 330*a*, 330*b* and the control electrodes 340*a*, 340*b* may be formed. In some embodiments, the control electrodes 340*a*, 340*b*, the readout electrodes 330*a*, 330*b* and the second electrode 60 are all disposed over the of the first surface of the carrier conducting layer. That is, the control electrodes 340*a*, 340*b*, the readout electrodes 330*a*, 330*b* and the second electrode 60 are over a same side of the carrier conducting layer, that is the passivation layer 1400 in some embodiments, which is benefit for the backend fabrication process afterwards.

The passivation layer 1400 may include amorphous silicon, poly silicon, epitaxial silicon, aluminum oxide (e.g., $Al_xO_y$), silicon oxide (e.g., $Si_xO_y$), Ge oxide (e.g., $Ge_xO_y$), germanium-silicon (e.g., GeSi), silicon nitride family (e.g., $Si_xN_y$), high-k materials (e.g., $HfO_x$, $ZnO_x$, $LaO_x$, $LaSiO_x$), and any combination thereof. The presence of the passivation layer 1400 may have various effects. For example, the passivation layer 1400 may act as a surface passivation layer to the absorption region 10, which may reduce dark current or leakage current generated by defects occurred at the exposed surface of the absorption region 10. In some embodiments, the passivation layer 1400 may have a thickness between 20 nm and 100 nm. FIG. 14B illustrates a cross-sectional view along a line passing through second doped region 108 of the photo-detecting device, according to some embodiments. In some embodiments, a part of the doped region in the absorption region 10, such as second doped region 108 or the second contact region 103 may be formed in the corresponding portions of the passivation layer 1400. That is, the dopant of the doped region, such as the second doped region 108 or the second contact region 103, may be in the corresponding portions of the passivation layer 1400 between the absorption region 10 and the respective electrode.

Figure 14C:
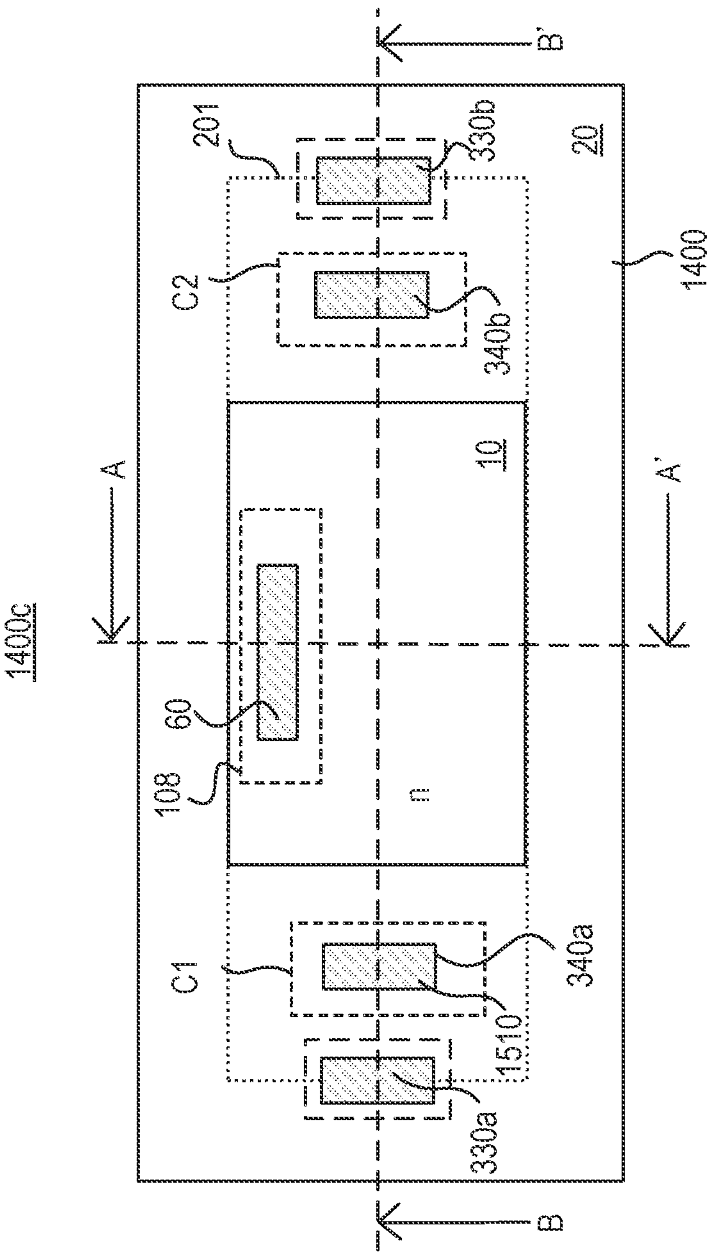
FIG. 14C illustrates a top view of a photo-detecting device, according to some embodiments.
Figure 14D:
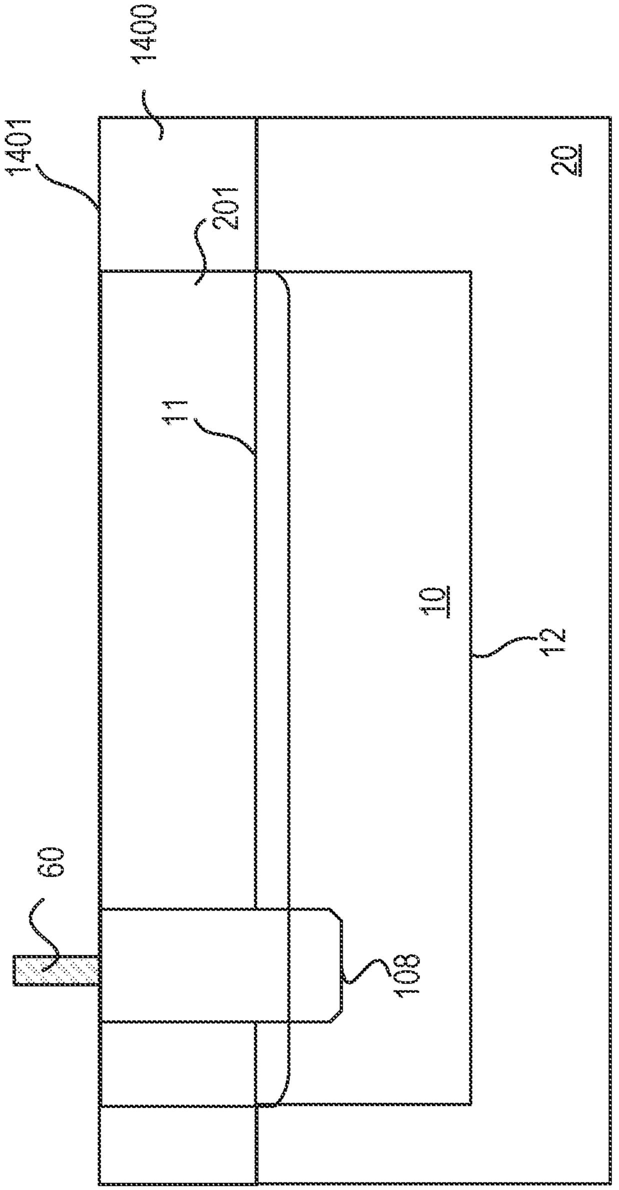
FIG. 14D illustrates a cross-sectional view along an A-A' line in FIG. 14B, according to some embodiments.
Figure 14E:
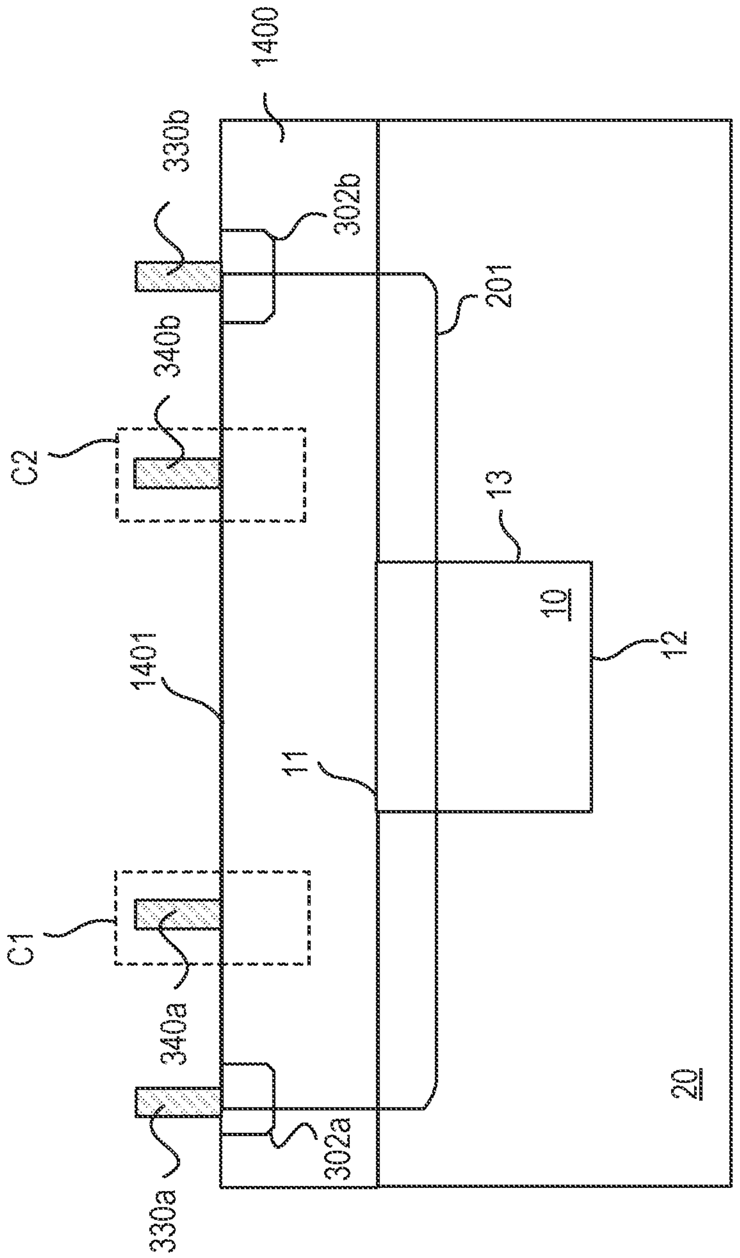
FIG. 14E illustrates a cross-sectional view along a B-B' line in FIG. 14B, according to some embodiments.

FIG. 14C illustrates a top view of a photo-detecting device, according to some embodiments. FIG. 14D illustrates a cross-sectional view along an A-A' line in FIG. 14C, according to some embodiments. FIG. 14E illustrates a cross-sectional view along a B-B' line in FIG. 14C, according to some embodiments. The photo-detecting device 1400*c* in FIG. 14C is similar to the photo-detecting device 300*a* in FIG. 3A. The difference is described below. The absorption region 10 is fully embedded in the substrate 20. The photo-detecting device 1400*c* includes a passivation layer 1400 on the absorption region 10 and the substrate 20, where the passivation layer 1400 is similar to the passivation layer 1400 described in FIG. 14A. In some embodiments, the thickness of the passivation layer 1400 can be between 100 nm and 500 nm. The readout electrodes 330*a*, 330*b* and the control electrodes 340*a*, 340*b* are over the first surface 1401 of the passivation layer 1400 and are separated from the absorption region 10. In some embodiments, the readout electrodes 330*a*, 330*b*, the control electrodes 340*a*, 340*b* and the second electrode 60 are coplanarly formed on the passivation layer 1400, and thus a height difference between the electrodes can be reduced. The carrier conducting layer is in the passivation layer 1400 instead of the substrate 20. That is, the heterointerface is between the passivation layer 1400 and the absorption region 10. In some embodiments, the first surface 11 of the absorption region 10 is at least partially in direct contact with the passivation layer 1400 and thus the heterointerface is formed between the absorption region 10 and the passivation layer 1400. The substrate 20 may be intrinsic and may not be limited to the description in FIG. 1A.

In some embodiments, the second doped region 108 is similar to the second doped region 108 describe in FIG. 3A. The difference is described below. The second doped region 108 is in passivation layer 1400 and in the absorption region 10. In some embodiments, the second doped region 108 has a depth equal to or greater than a thickness of the passivation layer 1400, so as to guide the carriers with the second type to move towards the second electrode 60 and to be further evacuated by a circuit. The depth is measured from the first surface 1401 of the passivation layer 1400, along a direction substantially perpendicular to the first surface 1401 of the passivation layer 1400. The depth is to a position where the dopant profile of the fourth dopant reaches a certain concentration, such as $1\times10^{15}$ $cm^{-3}$.

Similar to the photo-detecting device 100*a* in FIG. 1A, in some embodiments, a doping concentration of the first dopant at the heterointerface between the absorption region 10 and the carrier conducting layer, that is the passivation layer 1400 in some embodiment, is equal to or greater than $1\times10^{16}$ $cm^{-3}$. In some embodiments, the doping concentration of the first dopant at the heterointerface can be between $1\times10^{16}$ $cm^{-3}$ and $1\times10^{20}$ $cm^{-3}$ or between $1\times10^{17}$ $cm^{-3}$ and $1\times10^{20}$ $cm^{-3}$. In some embodiments, a doping concentration of the second dopant at the heterointerface is lower than the doping concentration of the first dopant at the heterointerface. In some embodiments, a doping concentration of the second dopant at the heterointerface between $1\times10^{12}$ $cm^{-3}$ and $1\times10^{17}$ $cm^{-3}$.

In some embodiment, the concentration of the graded doping profile of the first dopant is gradually deceased from the second surface 12 to the first surface 11 of the absorption region 10 so as to facilitate the moving of the carriers, such as the electrons if the first doped regions 302*a*, 302*b* are of n-type.

In some embodiments, the first switch (not labeled) and the second switch (not labeled) are partially formed in the carrier conducting layer, that is the passivation layer 1400 in some embodiments. In some embodiments, the first doped regions 302*a*, 302*b* are in the passivation layer 1400. In some embodiments, the third peak doping concentrations of the first doped regions 302*a*, 302*b* lie in the passivation layer 1400.

In some embodiments, the depth of each of the first doped regions 302*a*, 302*b* is less than a thickness of the passivation layer 1400. The depth is measured from the first surface 1401 of the passivation layer 1400 to a position where the dopant profile reaches a certain concentration, such as $1\times10^{15}$ $cm^{-3}$.

In some embodiments, the absorption function and the carrier control function such as demodulation of the carriers and collection of the carriers operate in the absorption region 10 and the carrier conducting layer, that is, the passivation layer 1400 in some embodiments, respectively.

In some embodiments, a conducting region 201 can be formed in the carrier conducting layer, that is the passivation layer 1400 in some embodiments. The conducting region 201 can be similar to the conducting region 201 described in FIG. 3A, such as the conducting region 201 is overlapped with a portion of the first doped regions 302*a*, 302*b* in the passivation layer 1400. The difference is described below. In some embodiments, the conducting region 201 has a depth equal to or greater than a thickness of the passivation layer 1400, so as to confine and guide the carriers with the first type to move towards one of the first doped regions 302*a*, 302*b*. The depth is measured from the first surface 1401 of the passivation layer 1400, along a direction substantially perpendicular to the first surface 1401 of the passivation layer 1400. The depth is to a position where the dopant profile of the second dopant reaches a certain concentration, such as $1\times10^{15}$ $cm^{-3}$.

Figure 14F:
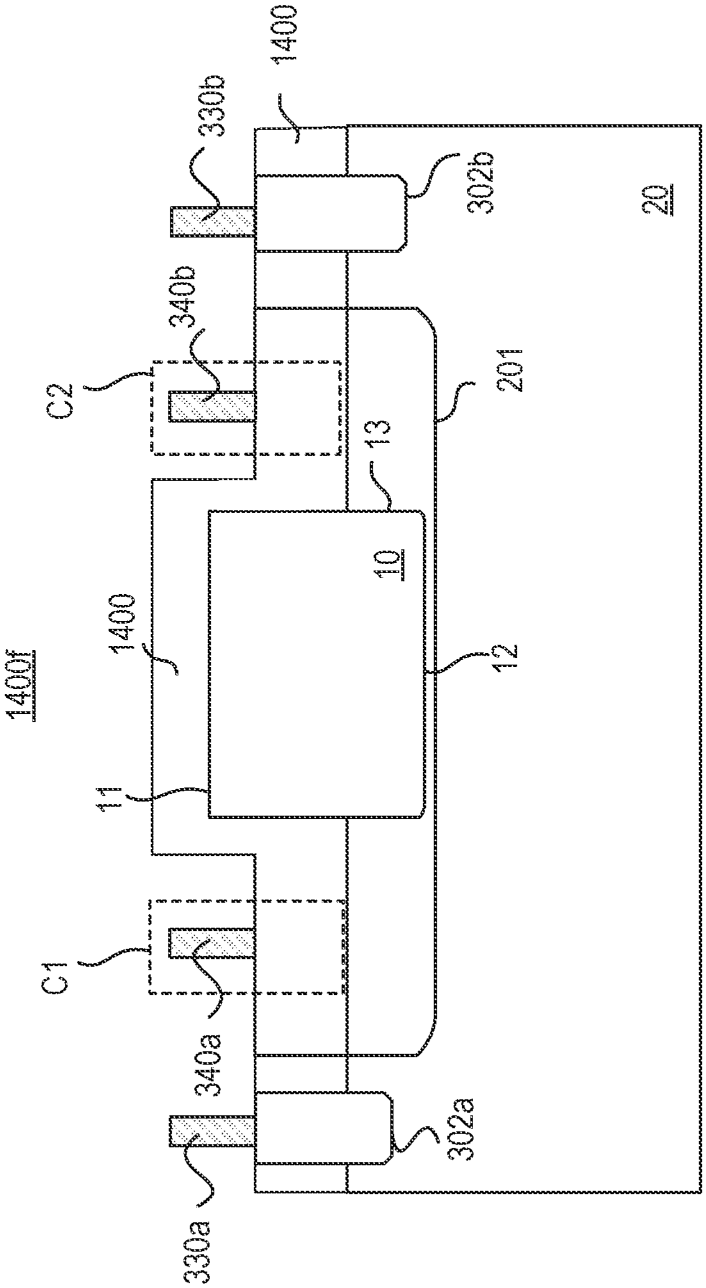
FIG. 14F illustrates a cross-sectional view of a photo-detecting device, according to some embodiments.

In some embodiments, a width of the absorption region 10 is less than a distance between the distance between the two control electrodes 340*a*, 340*b*, which can reduce the leakage current between the two control electrodes 340*a*, 340*b*. FIG. 14F illustrates a cross-sectional view of a photo-detecting device, according to some embodiments. The photo-detecting device 1400*f* in FIG. 14F is similar to the photo-detecting device 1400*e* in FIG. 14E. The difference is described below. The absorption region 10 is partially embedded in the substrate 20. The passivation layer 1400 is conformally formed on the absorption region 10 and the substrate 20 to cover the exposed side surfaces 13 of the absorption region 10. The conducting region 201 can surround the absorption region 10 or overlapped with all of the surfaces of the absorption region 10, that is, overlapped with the first surface 11, the second surface 12, and all of the side surfaces 13 of the absorption region 10.

In some embodiments, the depth of each of the first doped regions 302*a*,302*b* is greater than a thickness of the passivation layer 1400. The depth is measured from the first surface 1401 of the passivation layer 1400 to a position where the dopant profile reaches a certain concentration, such as $1\times10^{15}$ $cm^{-3}$. In some embodiments, the depth of each of the first doped regions 302*a*,302*b* is less than a thickness of the passivation layer 1400. The depth is measured from the first surface 1401 of the passivation layer 1400 to a position where the dopant profile reaches a certain concentration, such as $1\times10^{15}$ $cm^{-3}$.

Figure 14G:
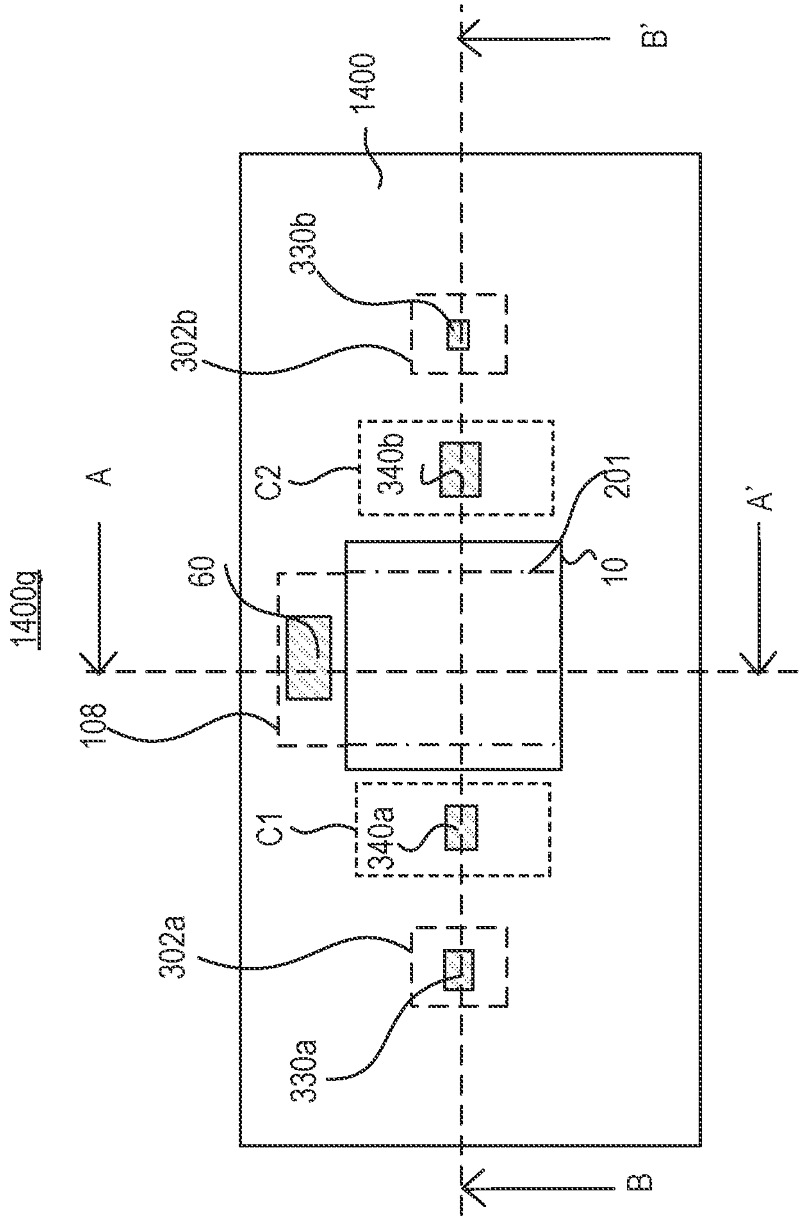
FIG. 14G illustrates a top view of a photo-detecting device, according to some embodiments.
Figure 14H:
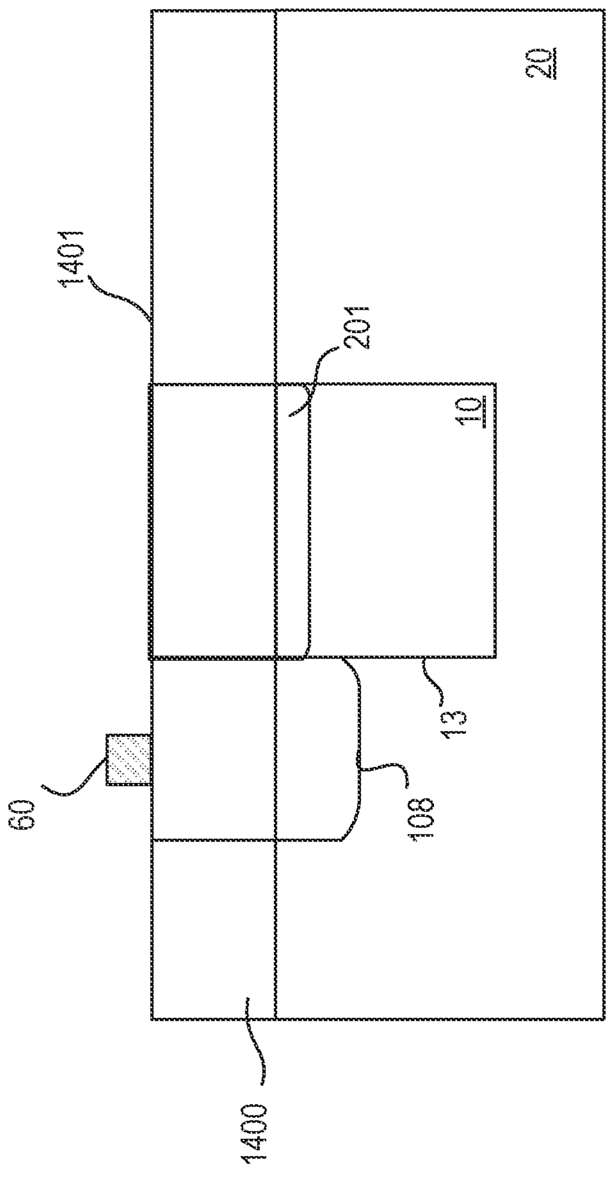
FIG. 14H illustrates a cross-sectional view along an A-A' line in FIG. 14G, according to some embodiments.
Figure 14I:
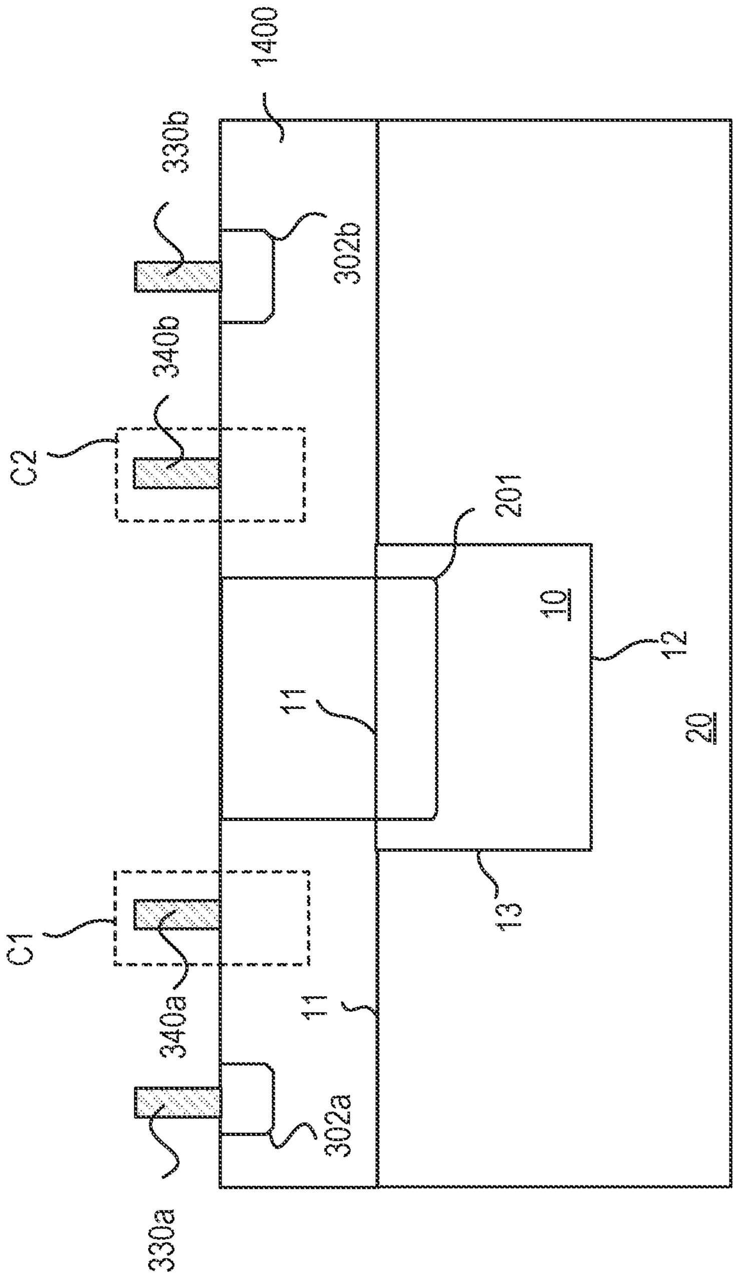
FIG. 14I illustrates a cross-sectional view along a B-B' line in FIG. 14G, according to some embodiments.

FIG. 14G illustrates a top view of a photo-detecting device, according to some embodiments. FIG. 14H illustrates a cross-sectional view along an A-A' line in FIG. 14G, according to some embodiments. FIG. 14I illustrates a cross-sectional view along a B-B' line in FIG. 14G, according to some embodiments. The photo-detecting device 1400*g* in FIG. 14G is similar to the photo-detecting device 1400*c* in FIG. 14C. The difference is described below. The second doped region 108 is in the substrate 20. In other words, the fourth peak doping concentration of the second doped region 108 lies in the substrate 20. In some embodiment, the second doped region 108 is below the first surface 1401 of the passivation layer 1400 and is in direct contact with the absorption region 10, for example, the second doped region 108 may be in contact with or overlapped with one of the side surfaces 13 of the absorption region 10. As a result, the carriers generated from the absorption region 10 can move from the absorption region 10 towards the second doped region 108 through the heterointerface between the absorption region 10 and the substrate 20. The second electrode 60 is over the first surface 1401 of the passivation layer 1400.

Figure 14J:
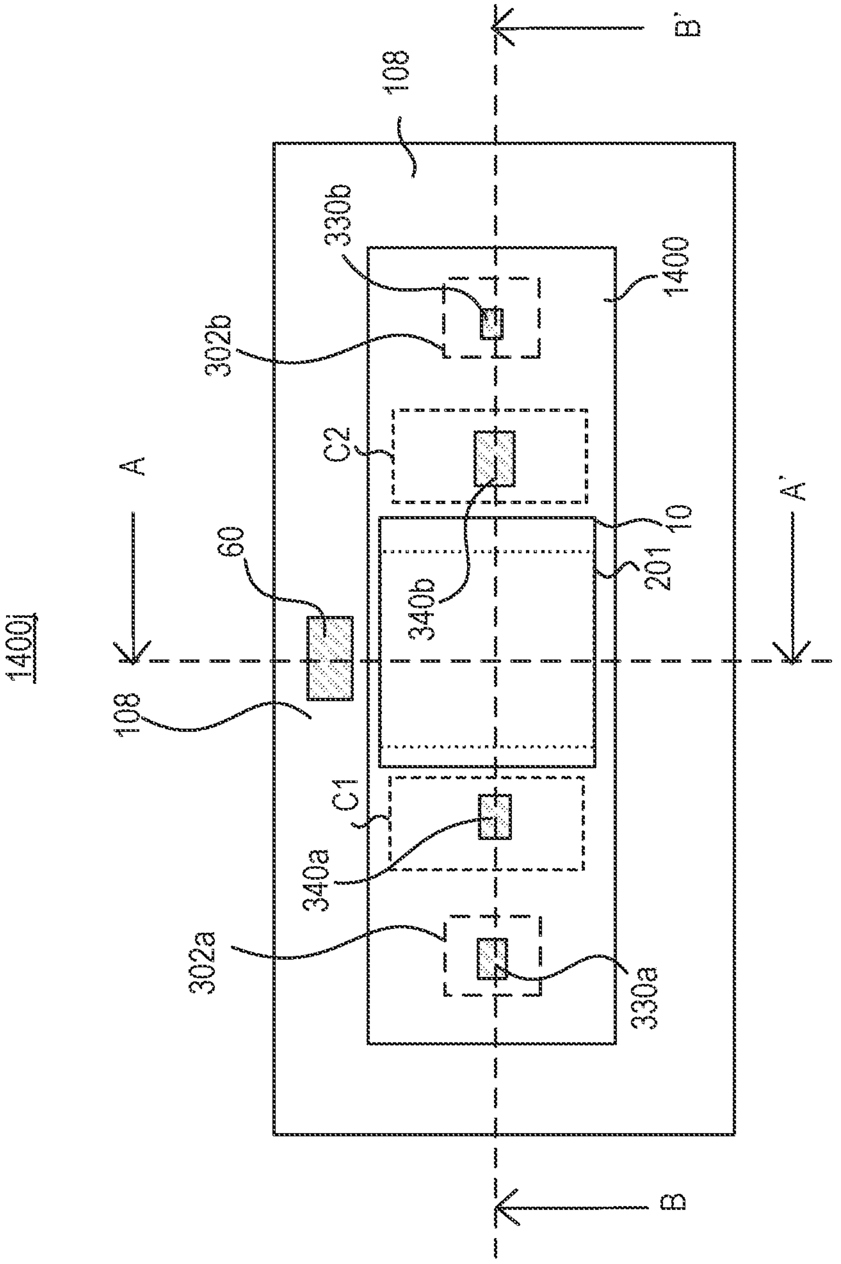
FIG. 14J illustrates a top view of a photo-detecting device, according to some embodiments.
Figure 14K:
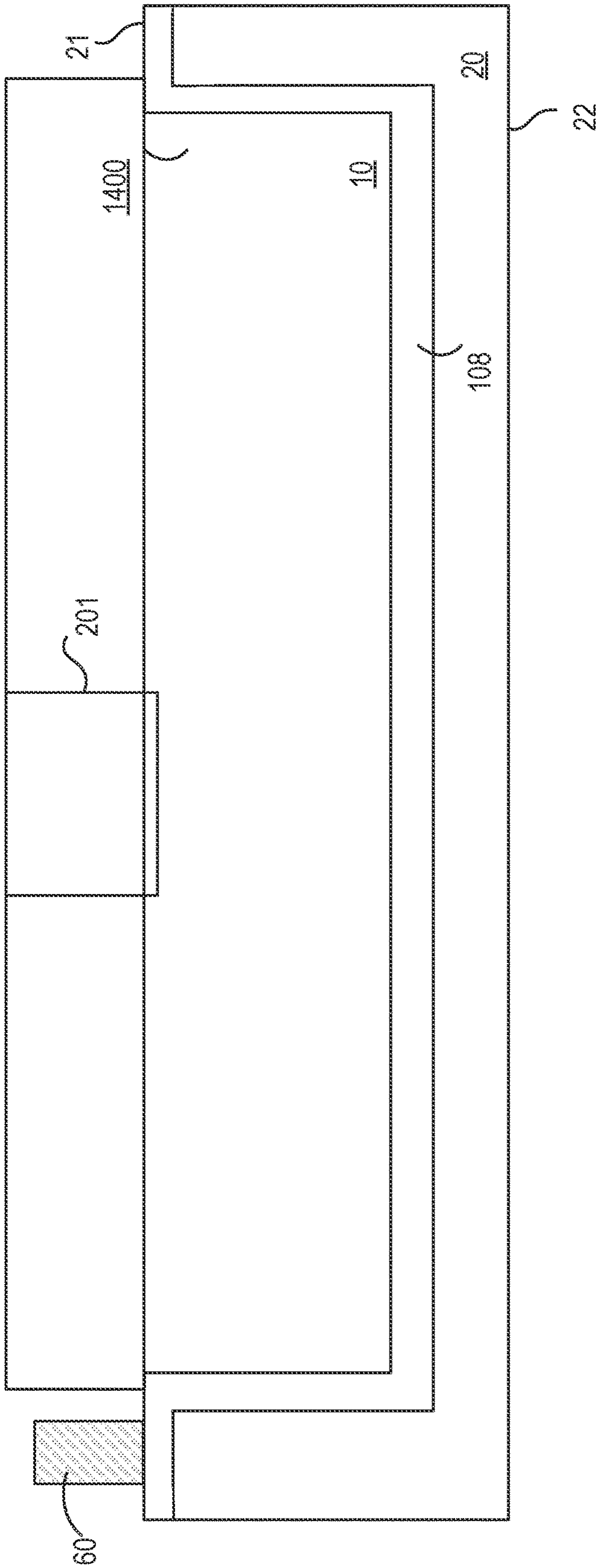
FIG. 14K illustrates a cross-sectional view along an A-A' line in FIG. 14J, according to some embodiments.
Figure 14L:
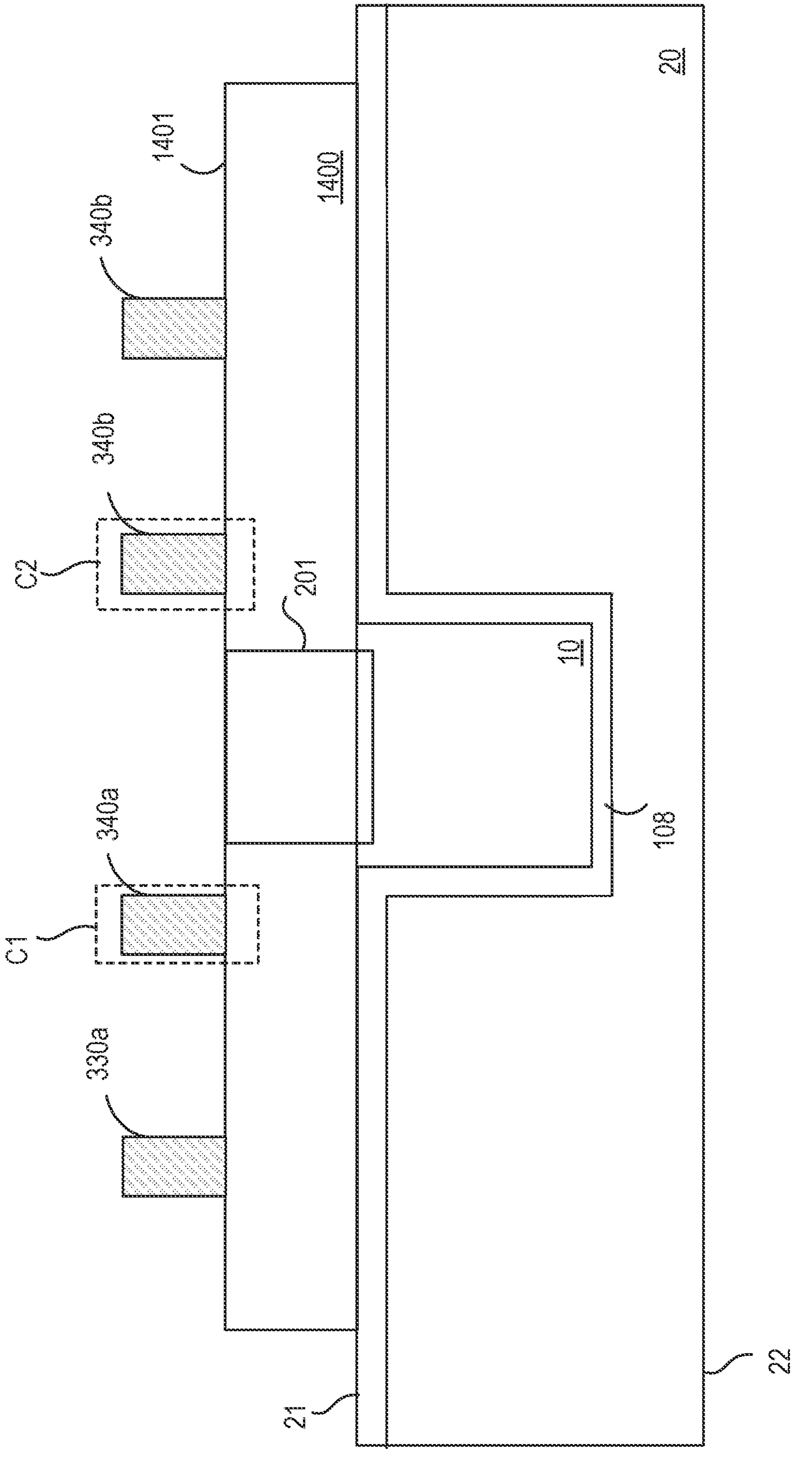
FIG. 14L illustrates a cross-sectional view along a B-B' line in FIG. 14J, according to some embodiments.

FIG. 14J illustrates a top view of a photo-detecting device, according to some embodiments. FIG. 14K illustrates a cross-sectional view along an A-A' line in FIG. 14J, according to some embodiments. FIG. 14K illustrates a cross-sectional view along a B-B' line in FIG. 14J, according to some embodiments. The photo-detecting device 1400*j* in FIG. 14J is similar to the photo-detecting device 1400*g* in FIG. 14G. The difference is described below. In some embodiments, a width of the conducting region 201 is less than a distance between the distance between the two control electrodes 340*a*, 340*b*. The second doped region 108 may surround at least a portion of the absorption region 10. The second doped region 108 may block photo-generated charges in the absorption region 10 from reaching the substrate 20, which increases the collection efficiency of photo-generated carriers of the photo-detecting device 1400*f*. The second doped region 108 may also block photo-generated charges in the substrate 20 from reaching the absorption region 10, which increases the speed of photo-generated carriers of the photo-detecting device 1400*j*. The second doped region 108 may include a material the same as the material of the absorption region 10, the same as the material of the substrate 20, a material as a combination of the material of the absorption region 10 and the material of the substrate 20, or different from the material of the absorption region 10 and the material of the substrate 20. In some embodiments, the shape of the second doped region 108 may be but not limited to a ring. In some embodiments, the second doped region 108 may reduce the cross talk between two adjacent pixels of the photo-detecting apparatus. In some embodiments, the second doped region 108 extends to reach the first surface 21 of the substrate 20.

Please also refer FIG. 15A, which illustrates atop view of a photo-detecting device, according to some embodiments. The photo-detecting device 1500*a* further includes a confined region 180*a* between the absorption region 10 and the first doped regions 102 to cover at least a part of the heterointerface between the absorption region 10 and the substrate 20. The confined region 180*a* acts as a high-barrier region or a blocking region, and has a conductivity type (e.g., p-doped) different from the conductivity type of the first doped regions 102 or the conducting region 201 (e.g., n-doped). The confined region 180*a* may be formed in the substrate 20, or in the absorption region 10, or partially in the substrate 20 and partially in the absorption region 10.

In some embodiments, the confined region 180*a* includes a dopant having a peak doping concentration. For example, the peak doping concentration can be equal to or greater than $1\times10^{16}$ $cm^{-3}$. In some embodiments, the confined region 180*a* may have a step or gradient dopant profile laterally (i.e., along the surface 21) and/or vertically (i.e., perpendicular to the surface 21) to form a path of which the carriers may be guided to the conducting region 201.

In some embodiments, at least a part of the conducting region 201 is formed to be in direct contact with the absorption region 10 for allowing photo-carriers to move from the absorption region 10 towards the first doped region 102. In some embodiments, the peak doping concentration of the confined region 180*a* is lower than the second peak doping concentration of the conducting region 201. In some embodiments, the peak doping concentration of the confined region 180*a* is higher than the second peak doping concentration of the conducting region 201, depending on the conductivity type. For example, when the photodiode is configured to collect electrons, the confined region 180*a* is of p-type, and the first doped region 102 is of n-type. After the photo-carriers are generated from the absorption region 10, the holes will be evacuated through the second doped region 108 and the second electrode 60, and the electrons will be confined by the confined region 180*a* and move from the absorption region 10 towards the first doped region 102 through the conducting region 201 instead of moving out from the whole heterointerface between the absorption region 10 and the substrate 20.

Please also refer FIG. 15B, which illustrates a top view of a photo-detecting device 1500*b*, according to some embodiments. In some embodiments, the confined region 180*a* is extended to cover two or more sides of the absorption region 10 to further confine the carriers to pass through the conducting region 201 instead of moving out from other sides of the absorption region 10. The peak doping concentration of the confined region 180*a* may be higher or lower than the peak doping concentration of the second doped region 108. In some embodiments, the confined region 180*a* and the second doped region 108 are formed by two different fabrication process steps, such as using different masks.

Please also refer FIG. 15C, which illustrates a top view of a photo-detecting device 1500*c*, according to some embodiments. The difference is the second doped region 108 is formed in the substrate 20 and the second electrode 60 is over the first surface of the substrate 20. In some embodiments, the second doped region 108 may function as the confined region 180*a* described above. In other words, the second doped region 108 can both evacuate the carriers not collected by the first doped region 102 and confine the carriers to be collected from the absorption region 10 towards the first doped region 102 through the conducting region 201 at one of the side surfaces 13 instead of moving out from other side surfaces 13 of the absorption region 10.

Figure 16A:
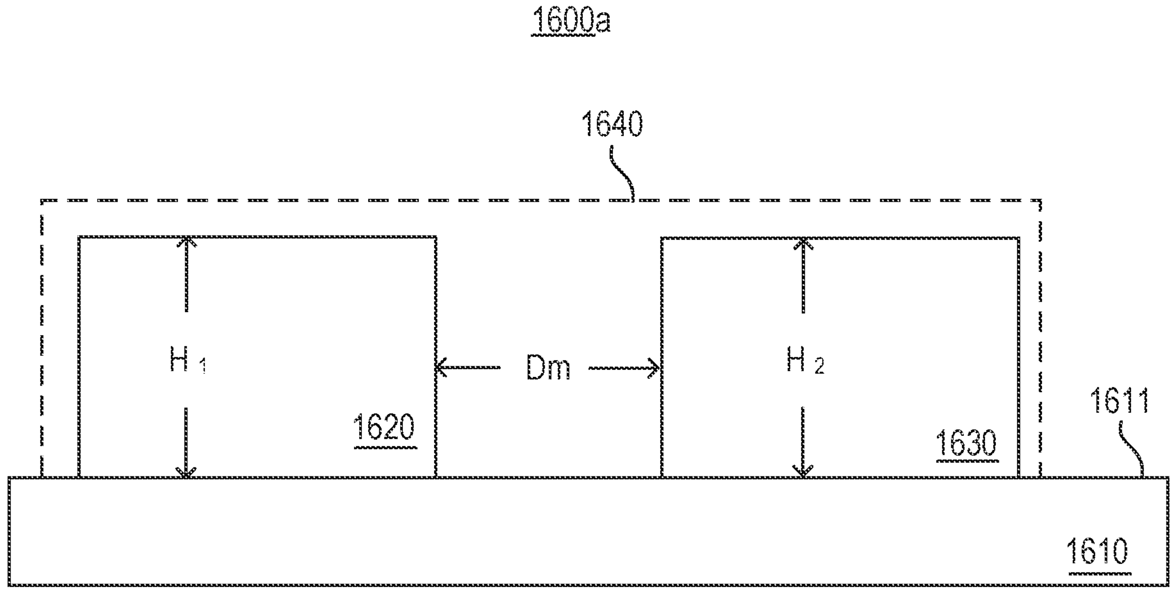
FIG. 16A illustrates exemplary embodiments of an optical sensing apparatus.

FIG. 16A illustrates exemplary embodiments of an optical sensing apparatus 1600*a*. The optical sensing apparatus includes a semiconductor substrate 1610 composed of a first material (e.g., Si) and a transmitter-receiver set 1640 supported by the semiconductor substrate 1610. The transmitter-receiver set 1640 includes a photodetector 1620 and a light source 1630. The photodetector 1620 includes an absorption region (e.g., 10 in FIG. 1A) composed of a second material including germanium and configured to receive an optical signal (e.g., reflected light in FIG. 22B) and to generate photo-carriers in response to the optical signal. In some embodiments, a bandgap of the semiconductor substrate 1610 is greater than a bandgap of the absorption region 10 and the band gap of the light-emitting region of the light source 1630. The photodetector 1620 may be substantially the same or similar to any photo-detecting device as disclosed in the present disclosure.

The light source 1630 includes a light-emitting region (not shown) composed of a third material (which may or may not be the same as the second material) including germanium and configured to emit a light (e.g., emitted light in FIG. 18B) toward a target. The first material is different from the second material and the third material. For example, the first material includes silicon, the second material includes germanium, and the third material includes germanium. In some embodiments, the second material and the third material include $Ge_xSi_{1-x}$, where $0<x\leq1$. The light-emitting region is configured to emit a light having a peak wavelength in IR region such as NIR region or SWIR region, for example, not less than 800 nm (e.g., 800 to 2500 nm or 1400 nm to 3000 nm).

The absorption region (e.g., 10 in FIG. 1A) includes at least a property different from a property of the light-emitting region, where the property includes strain, conductivity type, peak doping concentration, or a ratio of the peak doping concentration to a peak doping concentration of the semiconductor substrate. For example, the strain of the absorption region is different from the strain of the light-emitting region. For another example, the peak doping concentration of the absorption region is different from the peak doping concentration of the light-emitting region. For another example, the ratio of the peak doping concentration of the absorption region to the peak doping concentration of the semiconductor substrate is different from the ratio of the peak doping concentration of the light-emitting region to the peak doping concentration of the semiconductor substrate. In some embodiments, the property is selected from a group consisting of strain, conductivity type, peak doping concentration, and a ratio of the peak doping concentration to a peak doping concentration of the semiconductor substrate. In some embodiments, the light source 1630 includes multiple electrodes (e.g., a first electrode and a second electrode) configured to electrically connect to an external power source (e.g., a voltage source for forward-bias). The first electrode and the second electrode can be the same or different and include a transparent conductive material, a metal or an alloy.

In some embodiments, the light source 1630 is a light-emitting diode. In some embodiments, the light-emitting region of the light source 1630 may be doped with an n-type dopant having a peak concentration not less than $1\times10^{18}$ $cm^{-3}$, such as $2\times10^{19}$ $cm^{-3}$, for increasing the emission efficiency of the light-emitting region. In some embodiments, the light-emitting region has a tensile strain relative to the semiconductor substrate 1610 or the layer on which epitaxially grow for increasing the emission efficiency of the light-emitting region. For example, the light-emitting region can be doped with an n-type dopant and has a tensile strain both for increasing the emission efficiency of the light-emitting region. For example, the light-emitting region may have a tensile strain of about 0.2% and is doped with an n-type dopant having a peak concentration not less than $5\times10^{19}$ $cm^{-3}$ (e.g., $1\times10^{20}$ $cm^{-3}$). For another example, the light-emitting region may have a tensile strain ranging from 1% to 3% and is doped with an n-type dopant having a peak concentration not less than $5\times10^{18}$ $cm^{-3}$ (e.g., $1\times10^{19}$ $cm^{-3}$).

In some embodiments, a part of the photodetector 1620 and a part of the light source 1630 are formed over a surface 1611 of the semiconductor substrate 1610. For example, the absorption region of the light source 1630 and the light-emitting region of the light source 1630 are over the surface 1611 of the semiconductor substrate 1610. In some embodiments, as referenced in FIG. 1A, a height $H_1$ of the photodetector 1620 protruded from the surface 1611 of the semiconductor substrate 1610 is substantially the same as a height $H_2$ of the light source 1630 protruded from the surface 1611 of the semiconductor substrate 1610. In other words, a top surface of the photodetector 1620 (e.g., a top surface of the second electrode 60 and/or a top surface of the first electrode 30 in FIG. 1A) and a top surface of first electrode and/or the second electrode of the light source 1630 are coplanar, which facilitates the manufacturing process afterwards. In some embodiments, a minimum distance Dm between the light source 1630 and the photodetector 1620 in a same transmitter-receiver set 1640 is not more than 7000 μm, or not more than 5000 μm.

Figure 16B:
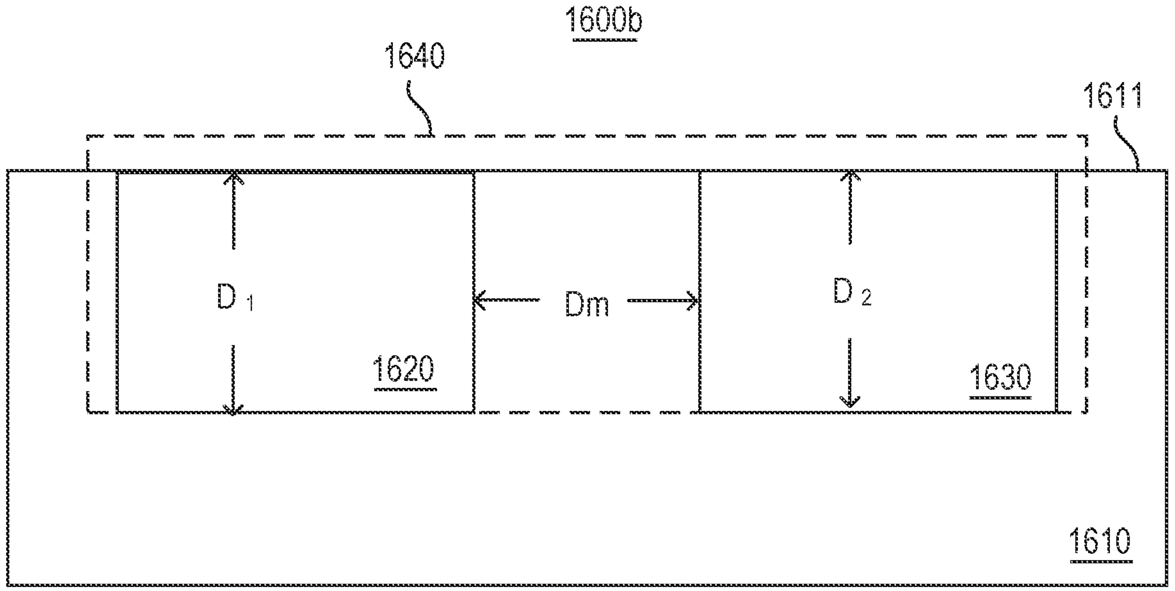
FIG. 16B illustrates exemplary embodiments of an optical sensing apparatus.
Figure 16C:
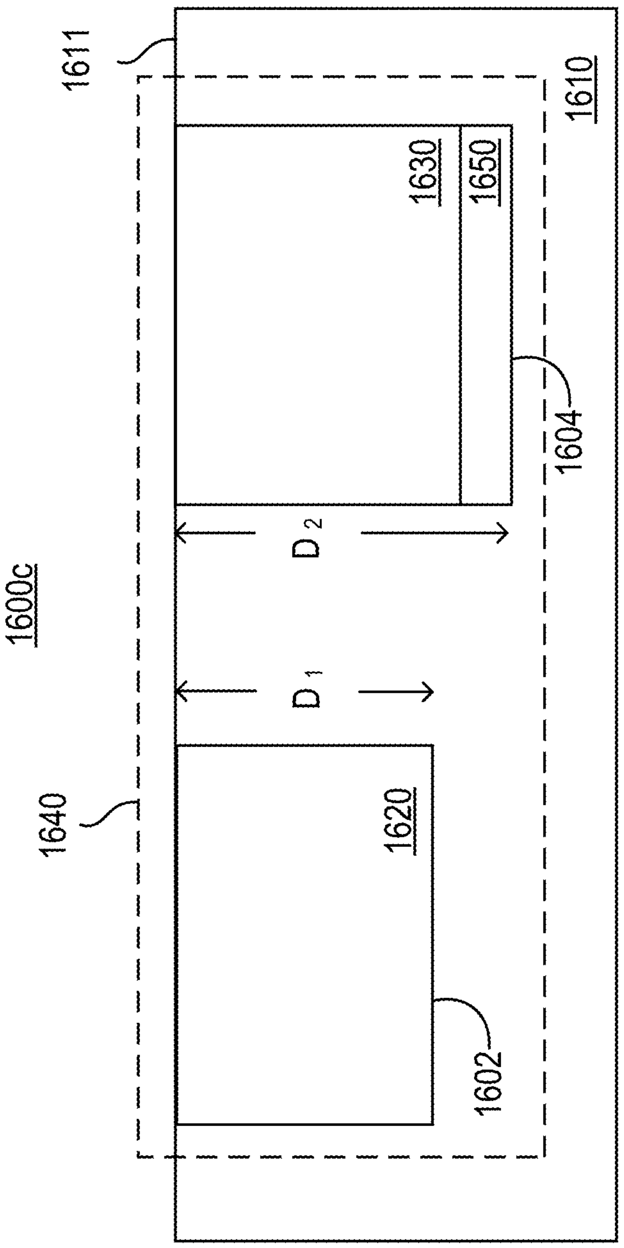
FIG. 16C illustrates exemplary embodiments of an optical sensing apparatus.

FIG. 16B illustrates exemplary embodiments of an optical sensing apparatus 1600*b*. FIG. 16C illustrates exemplary embodiments of an optical sensing apparatus 1600*c*. In some embodiments, the semiconductor substrate 1610 includes multiple recesses for accommodating a part of the photodetector 1620 and a part of the light source 1630 respectively. In other words, a part of the photodetector 1620 and a part of the light source 1630 are embedded in the semiconductor substrate 1610. For example, the absorption region of the light source 1630 and the light-emitting region of the light source 1630 are embedded in the semiconductor substrate 1610. In some embodiments, as referenced in FIG. 16B, the depth D1 of the part of the photodetector 1620 embedded in the semiconductor substrate 1610 and the depth D2 of the part of the light source 1630 embedded in the semiconductor substrate 1610 are substantially the same. In some embodiments, as referenced in FIG. 16C, the depth D1 of the part of the photodetector 1620 embedded in the semiconductor substrate 1610 and the depth D2 of the part of the light source 1630 embedded in the semiconductor substrate 1610 are different, for example, the depth D1 of the photodetector 1620 embedded in the semiconductor substrate 1610 may be less (or more) than the depth D2 of the light source 1630 embedded in the semiconductor substrate 1610. By this design, the property and/or the structure of the photodetector 1620 and of the light source 1630 can be independently controlled but remain manufacturing convenience afterwards. For example, since the depth D2 of the recess 1604 for accommodating the light source 1630 is greater than the depth D1 of the recess 1602 for accommodating the photodetector 1620, a space for accommodating the means for adjusting the strain of the light-emitting region of the light source 1630 and/or the peak doping concentration of the light-emitting region is generated to avoid height difference between the light source 3 and the photodetector 1620. For example, one or more buffer layers 1650 for adjusting the strain of the light-emitting region of the light source 1630 can be formed in the recess 1604 of the semiconductor substrate 1610 prior to the formation of the light-emitting region of the light source 1630. Before forming the first electrode 30 and/or the second electrode 60 electrically coupled to the photodetector 1620 and before forming the first electrode and/or the second electrode electrically coupled to the light source 1630, the uppermost semiconductor surface of the photodetector 1620 and the uppermost semiconductor surface of the light source 1630 are substantially coplanar, for example, may be also coplanar with the surface 1611 of the semiconductor substrate 1610, which facilitates the manufacturing process afterwards. In some embodiments, a minimum distance Dm between the recess 1604 for accommodating the light source 1630 and recess 1602 for accommodating the photodetector 1620 in a same transmitter-receiver set 1640 is not more than 7000 μm, or not more than 5000 μm.

In the present disclosure, since the optical sensing apparatus includes a transmitter-receiver set including a photodetector and a light source both include germanium and integrated on a same semiconductor substrate, the optical sensing apparatus can be compact, the manufacturing process can be simplified and the manufacturing cost may be lower.

In some embodiments, the conductivity type of the absorption region 10 (e.g., p-type) is different from the conductivity type (e.g., n-type) of the light-emitting region of the light source 1630. In some embodiments, the first peak doping concentration of the absorption region 10 is different from the peak doping concentration of the light-emitting region of the light source 1630. In some embodiments, the strain of the absorption region 10 and the strain of the light-emitting region of the light source 1630 are different. In some embodiments, a ratio of the first peak doping concentration of the absorption region 10 to the second peak doping concentration and a ratio of the peak doping concentration of the light-emitting region of the light source 1630 are different. Accordingly, in a same transmitter-receiver set 1640 where the photodetector 1620 and the light source 1630 both include germanium, the photodetector 1620 can achieve with low dark current and the light source 1630 is with an improved emission efficiency.

In some embodiments, the optical sensing apparatus further includes a spacer (not shown) between the light source 1630 and the photodetector 1620 for shielding the photodetector 1620 from absorbing the light emitted directly from the light source 1630. In some embodiments, the optical sensing apparatus further includes a first optical element over the light source 1630 for guiding the light toward a target and/or increasing field of view. The first optical element may include, but is not limited to a diffuser. In some embodiments, the optical sensing apparatus further includes a second optical element overt the photodetector 1620 for converging an incoming optical signal to enter the absorption region 10. The second optical element may include, but is not limited to a lens.

Figure 17A:
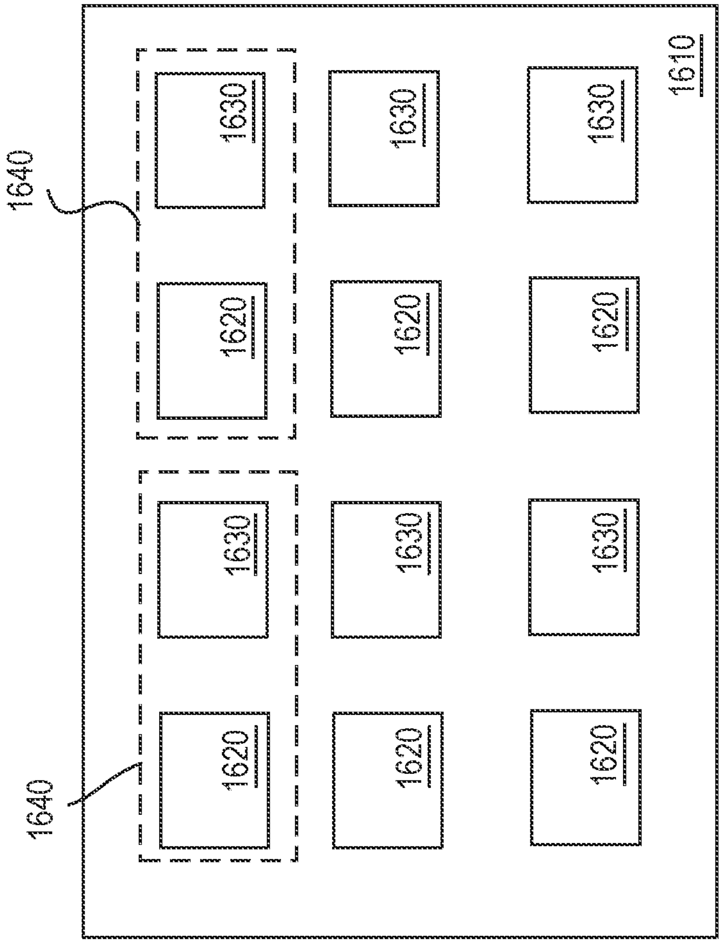
FIG. 17A illustrates a top view of an optical sensing apparatus, according to some embodiments.

FIG. 17A illustrates a top view of an optical sensing apparatus, according to some embodiments. In some embodiments, the optical sensing apparatus includes multiple transmitter-receiver sets 1640 arranged in one-dimensional or two-dimensional array, where each transmitter-receiver set 1640 includes a light source 1630 and a photodetector 1620.

Figure 17B:
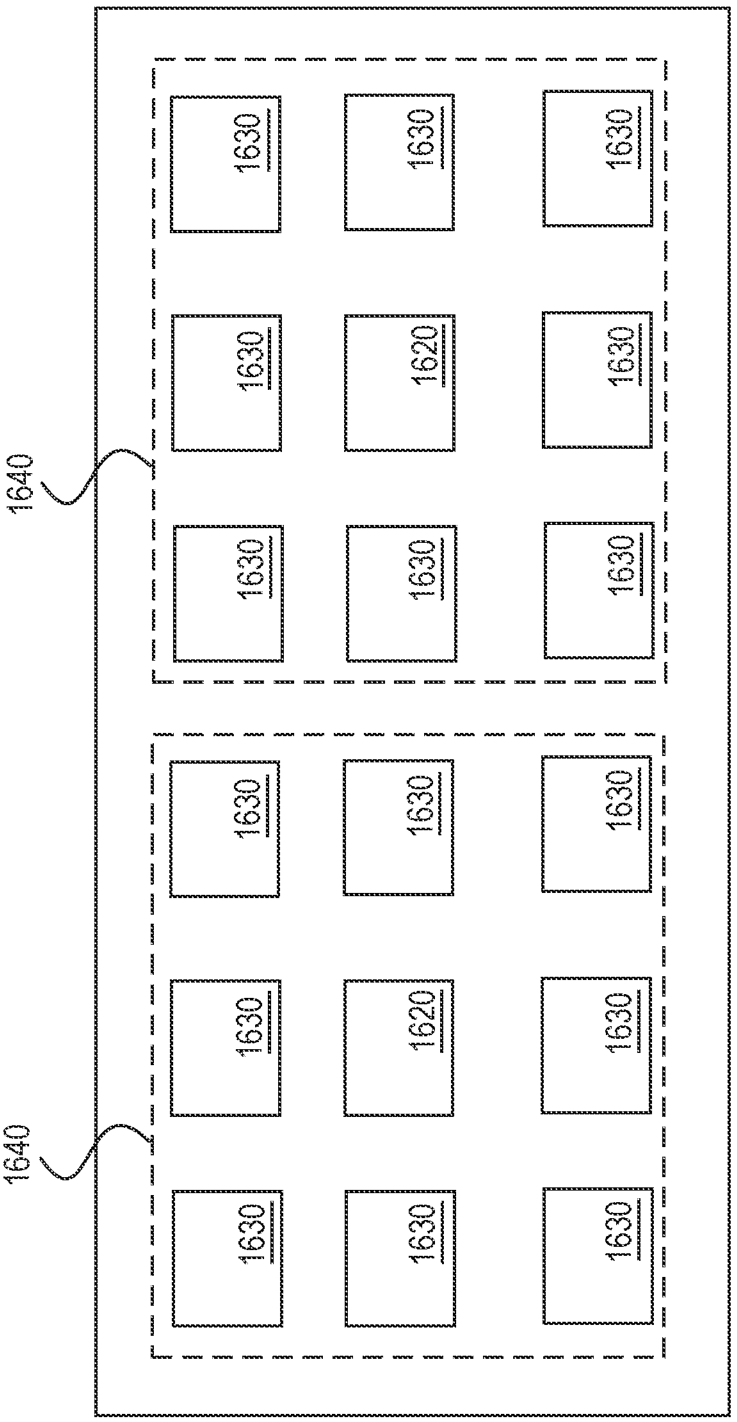
FIG. 17B illustrates a top view of an optical sensing apparatus, according to some embodiments.

FIG. 17B illustrates a top view of an optical sensing apparatus, according to some embodiments. In some embodiments, the transmitter-receiver sets 1640 includes multiple light sources 1630 surrounding the photodetector 1620. The number of the light sources 1630 is not limited to eight as shown in FIG. 17B. For another example, the transmitter-receiver sets 1640 may include two light sources 1630 disposed at two opposite sides of the photodetector 1620. By this design, the illumination range covered by the multiple light sources 1630 is increased around the photodetector 1620.

Figure 17C:
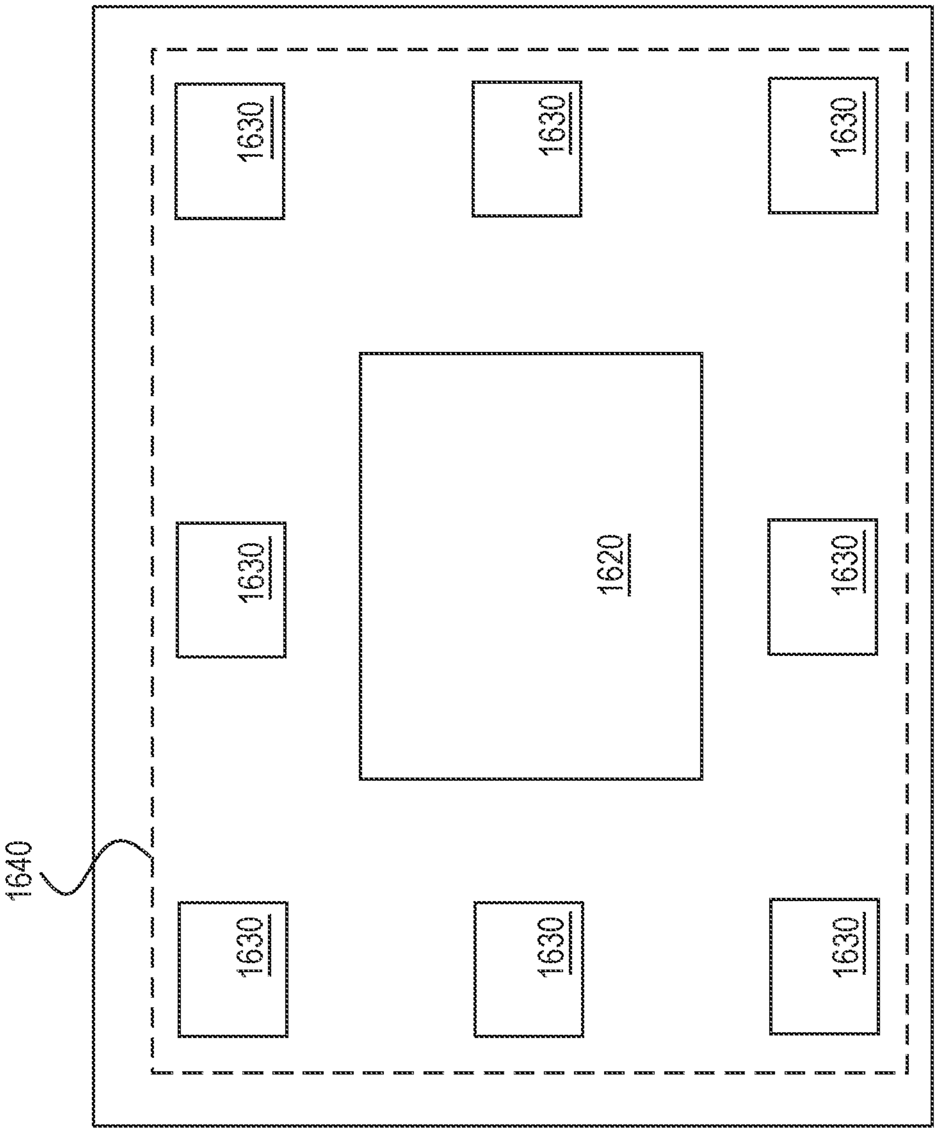
FIG. 17C illustrates a top view of an optical sensing apparatus, according to some embodiments.

FIG. 17C illustrates a top view of an optical sensing apparatus, according to some embodiments. In some embodiments, the area of the absorption region of the photodetector 1620 is different from an area of the light-emitting region of the light source 1630. For example, the area of the absorption region of the photodetector 1620 is greater than an area of the light-emitting region of a single light source 1630. By this design, a detection area of a single transmitter-receiver sets 1640 is increased.

Figure 18A:
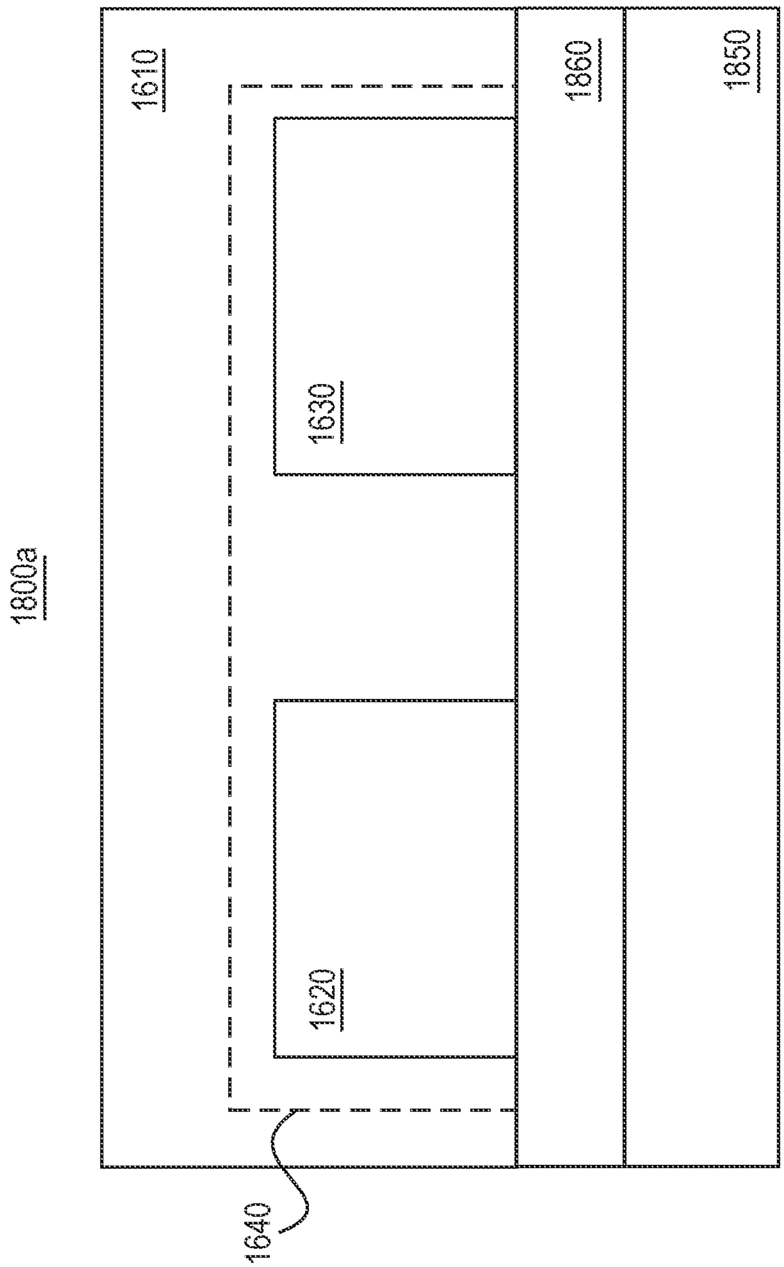
FIG. 18A illustrates a cross-sectional of an optical sensing apparatus, according to some embodiments.

FIG. 18A illustrates a cross-sectional of an optical sensing apparatus, according to some embodiments. In some embodiments, the optical sensing apparatus 1800*a* further includes an integrated circuit layer 1850 and a bonding layer 1860 between the integrated circuit layer 1850 and the transmitter-receiver set 1640 for connecting the integrated circuit layer 1850 with the transmitter-receiver set 1640. The integrated circuit layer 1850 may include an integrated circuit including a driver configured to control the light source 1630. The integrated circuit layer 1850 may further include a control circuit configured to control the photodetector 1620. The integrated circuit layer 1850 may further include readout circuit configured to process the photo-carriers (e.g., electrons when the first doped region 102 is n-type) generated by the photodetector 1620. The bonding layer 1860, for example, may include interconnects for electrical connection between the integrated circuit layer 1850 and the transmitter-receiver set 1640 and dielectric material for electrical isolation between the interconnects. The driver and/or the control circuit can be, for example, a complementary metal-oxide semiconductor (CMOS) device, a TFT device, or a combination thereof.

In some embodiments, the photodetector 1620 is configured for proximity sensing to detect if a target object is within a sensing area or depth sensing by direct or indirect time-of-flight (TOF) method to determine a depth information of a target object. The optical sensing apparatus can be included in such as a LiDAR (light detection and ranging) system, display apparatus, AR (augmented reality) or VR (virtual reality) apparatus, eye-tracking system.

Figure 18B:
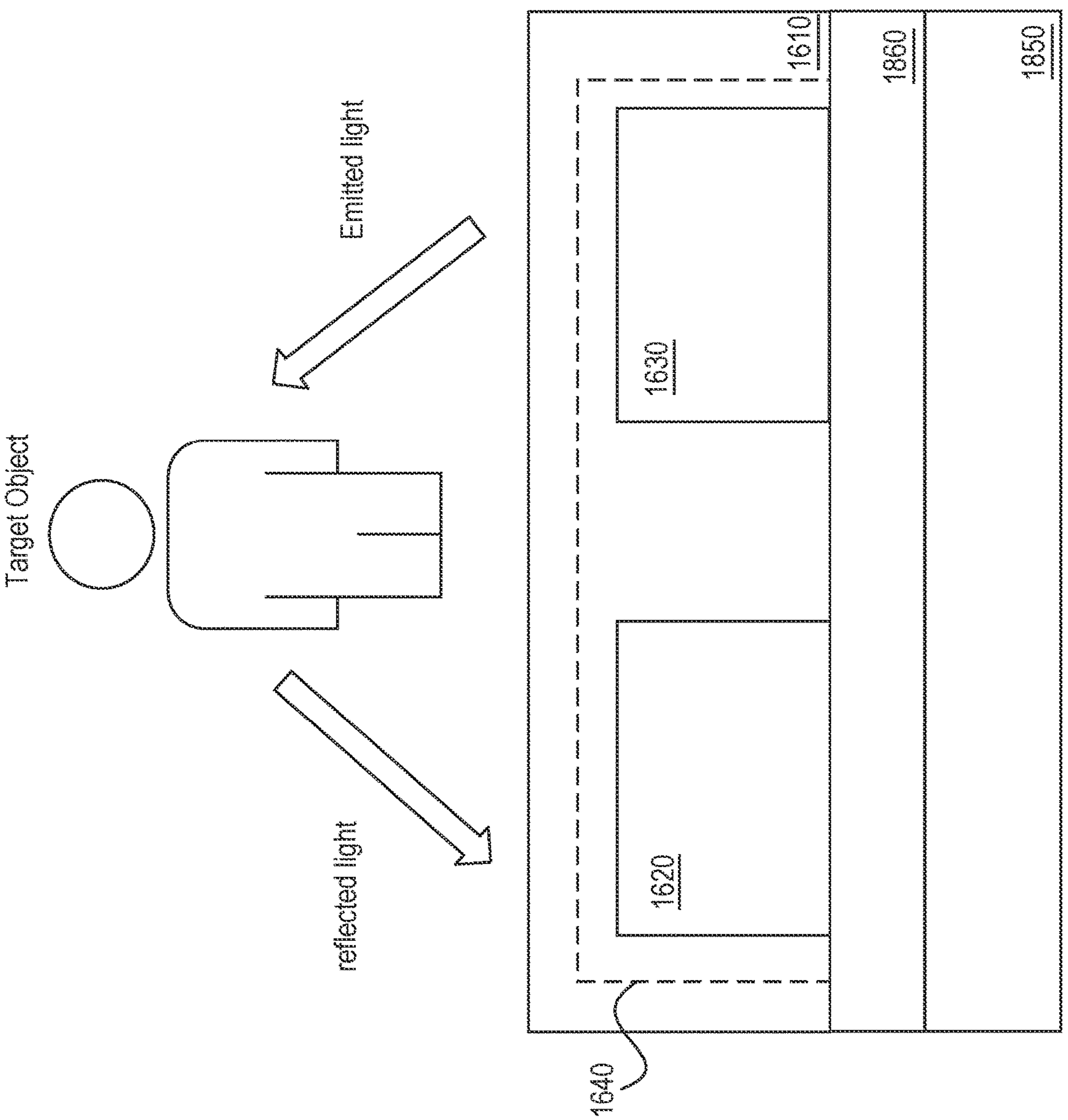
FIG. 18B illustrates an operating method of an optical sensing apparatus, according to some embodiments.

FIG. 18B illustrates a method of operating an optical sensing apparatus, according to some embodiments. The method includes (1) emitting light, by a forward-biased light source 1630 of a transmitter-receiver set 1640, towards a target object, and (2) receiving reflected light from the target object, by a reverse-biased photodetector 1620 of the transmitter-receiver set 1640.

In some embodiments, the method of operating the optical sensing apparatus further includes determining depth information of the target object by a time difference between the light emitted by the forward-biased light source 1630 of the transmitter-receiver set 1640 and the reflected light detected by the reverse-biased photodetector 1620 of the transmitter-receiver set 1640. In some embodiment, the light may be light pulse. Alternatively, the method of operating the optical sensing apparatus further includes determining depth information of the target object by a phase difference between the light emitted by the forward-biased light source 1630 of the transmitter-receiver set 1640 and the reflected light detected by the reverse-biased photodetector 1620 of the transmitter-receiver set 1640. In some embodiment, the light may be modulated light pulse. Alternatively, the method of operating the optical sensing apparatus further includes determining proximity information of the target object by determining that the reflected light detected by the reverse-biased photodetector 1620 of the transmitter-receiver set 1640 exceeds a threshold. In some embodiment, the light may be a continuous light.

Figure 19A:
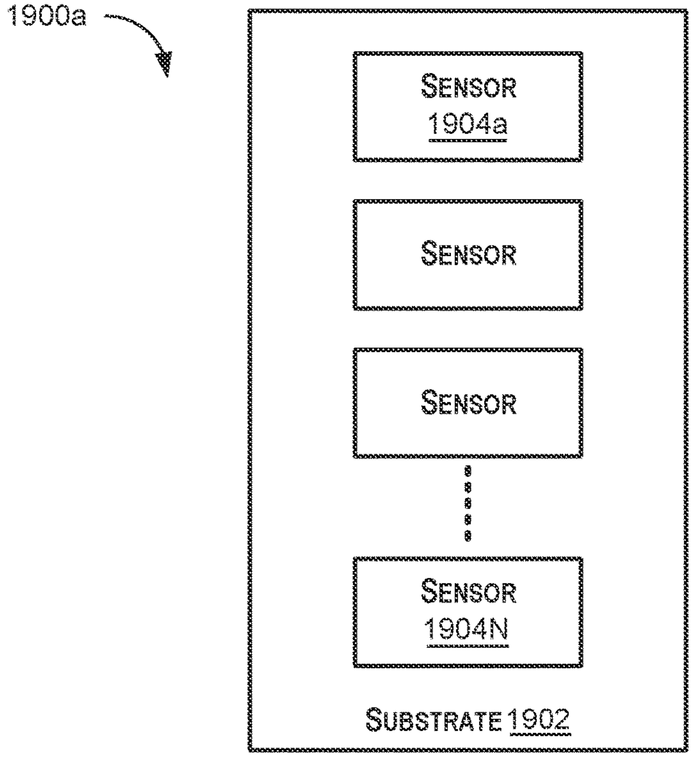
FIG. 19A depicts a block diagram of an example photo-detector array according to example aspects of the present disclosure.

Referring now to FIG. 19A, a one-dimensional photodetector array 1900*a* is depicted. The one-dimensional photodetector array 1900*a* includes a substrate 1902 (e.g., silicon substrate) and N photodetectors 1904 (e.g., germanium photodetectors) arranged in a one-dimensional array, where N is any positive integer. The one-dimensional photodetector array 1900*a* can be used to implement, for example, the photodetector 1620 as described in reference to FIG. 16A or the image sensor array 2652 as described in FIG. 26B. In some other implementations, the one-dimensional photodetector array 1900*a* can be partitioned to include more than one photodetector.

Figure 19B:
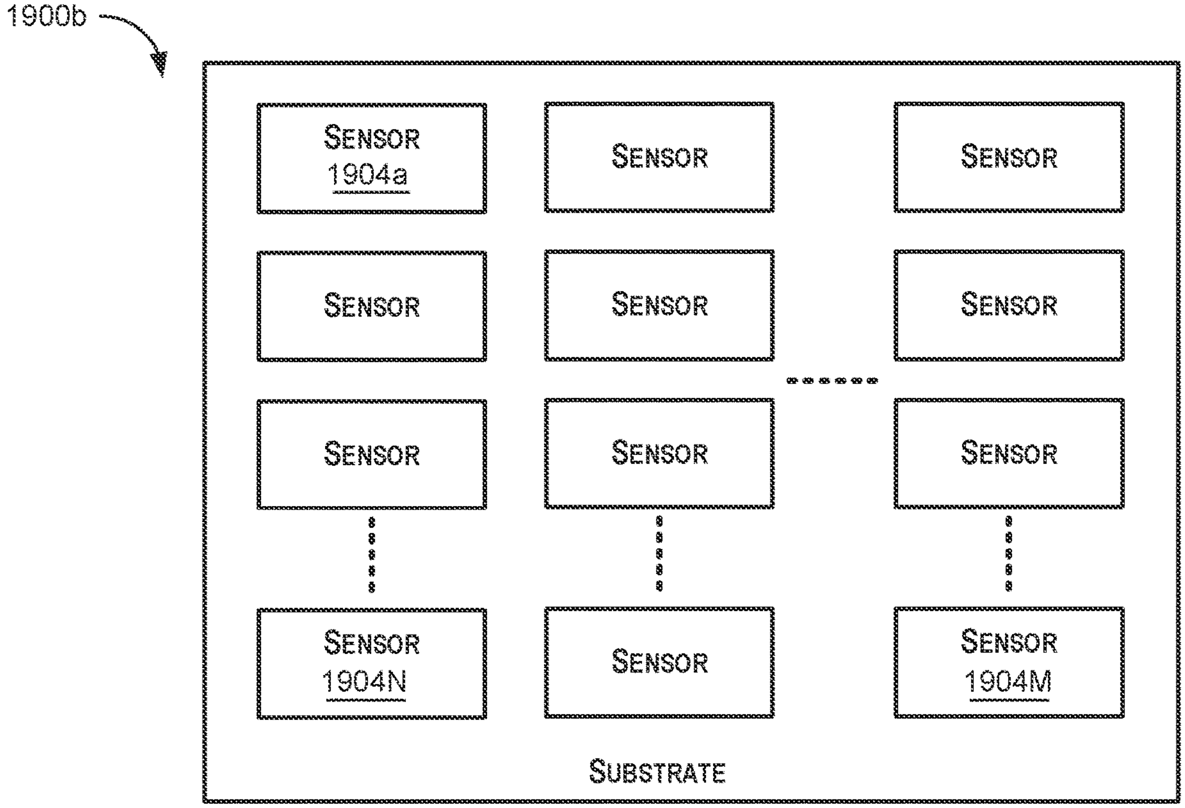
FIG. 19B depicts a block diagram of an example photo-detector array according to example aspects of the present disclosure.

Referring now to FIG. 19B, a two-dimensional photodetector array 1900*b* is depicted. The two-dimensional photodetector array 1900*b* includes a substrate 1902 (e.g., silicon substrate) and M×N photodetectors 1904 (e.g., germanium photodetectors) arranged in a two-dimensional array, where M and N are any positive integers. The two-dimensional photodetector array 1900*b* can be used to implement, for example, the photodetector 1620 as described in reference to FIG. 16A or the image sensor array 2652 as described in FIG. 26B. In some other implementations, the two-dimensional photodetector array 1900*b* can be partitioned to include more than one photodetector.

Figure 20:
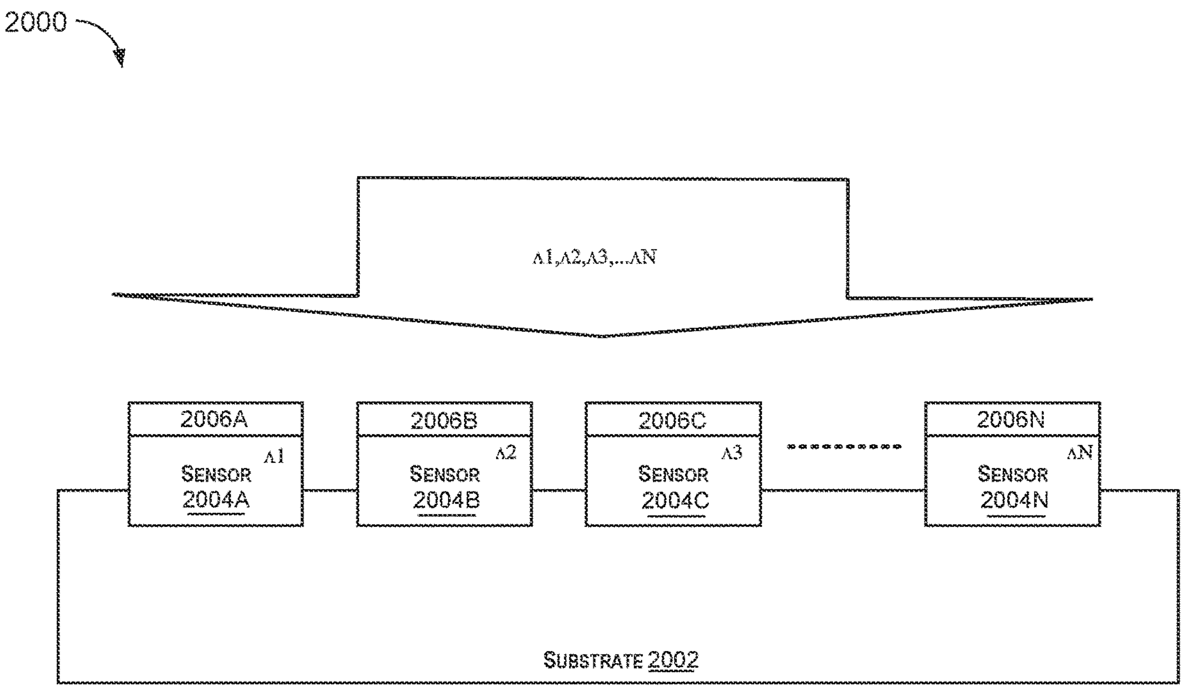
FIG. 20 depicts an example photo-detector array according to example aspects of the present disclosure.

Referring now to FIG. 20, a front-side-incident (FSI) photodetector array 2000 is depicted. The FSI photodetector array 2000 may be 1D array (as depicted in FIG. 19A) or 2D array (as depicted in FIG. 19B). The FSI photodetector array 2000 includes a substrate 2002 (e.g., silicon substrate) and N photodetectors 2004A-N (e.g., germanium photodetectors). The FSI photodetector array 2000 further includes N optical filters 2006A-N that each corresponds to one of the N photodetectors 2004. In some implementations, each of the N optical filters 2006A-N is a bandpass filter that is configured to pass an incident light having a wavelength (e.g., λ1) within a corresponding wavelength range, and blocks light having a wavelength (e.g., λ2) outside the corresponding wavelength range. The optical filters 2006A-N may be implemented using an absorption material, or multi-layer coating, or in-plane periodic/aperiodic grating. As an example, the bandpass filters 2006A, 2006B, 2006C, . . . , and 2006N may be configured to pass light having a wavelength of λ1, λ2, λ3, . . . , and λN, respectively. A broadband light that includes wavelengths λ1 to λN is incident to the FSI photodetector array 2000, and the bandpass filters 2006A, 2006B, 2006C, . . . , and 2006N may then filter the broadband light such that each of the sensors 2004A, 2004B, 2004C, and 2004N receives light having a wavelength of λ1, λ2, λ3, and λN, respectively. The detected signals at different wavelengths can be used for optical spectroscopy applications, for example.

Figure 21:
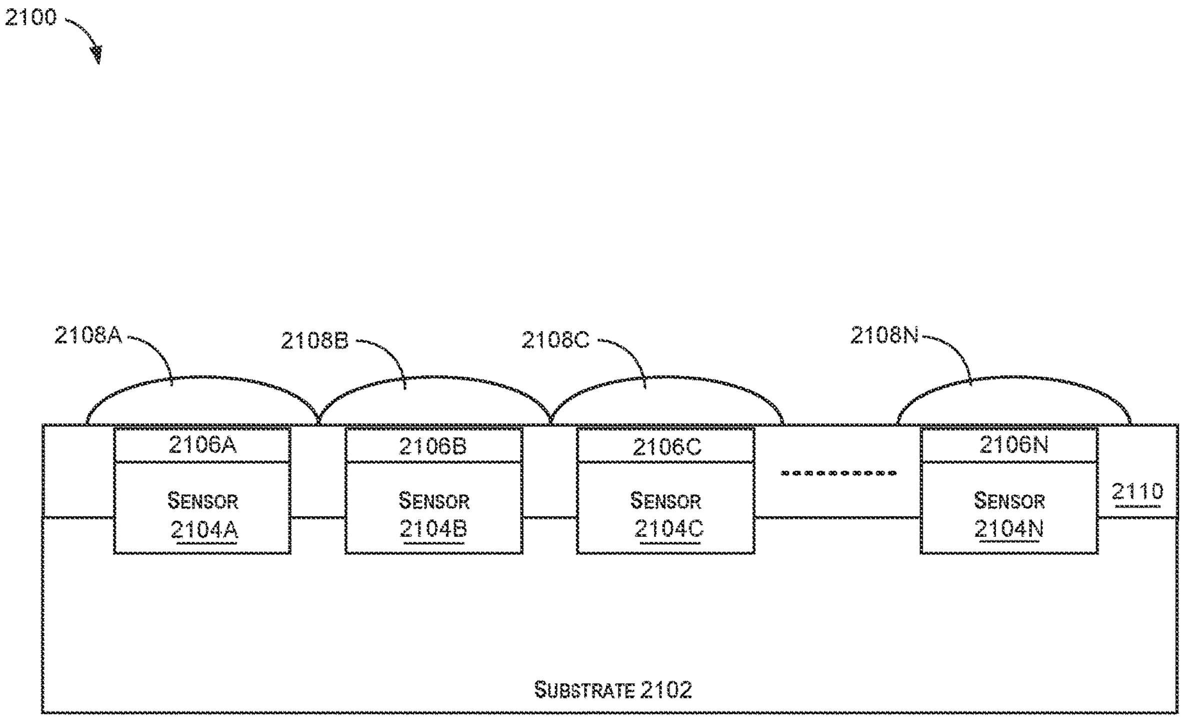
FIG. 21 depicts an example photo-detector array according to example aspects of the present disclosure.

Referring now to FIG. 21, a FSI photodetector array 2100 is depicted. The FSI photodetector array 2100 is similar to the FSI photodetector array 2000 and further includes micro-lens array 2108A-N for directing (e.g., focusing) the incident light to the photodetectors 2104A-B. The micro-lens array 2108A-N may be formed using silicon, oxide, polymer, or any other suitable materials. The FSI photodetector array 2000 may include a spacer 2110 to form a planar surface prior to forming the micro-lens array 2108A-N over the filter 2106A-N.

Figure 22:
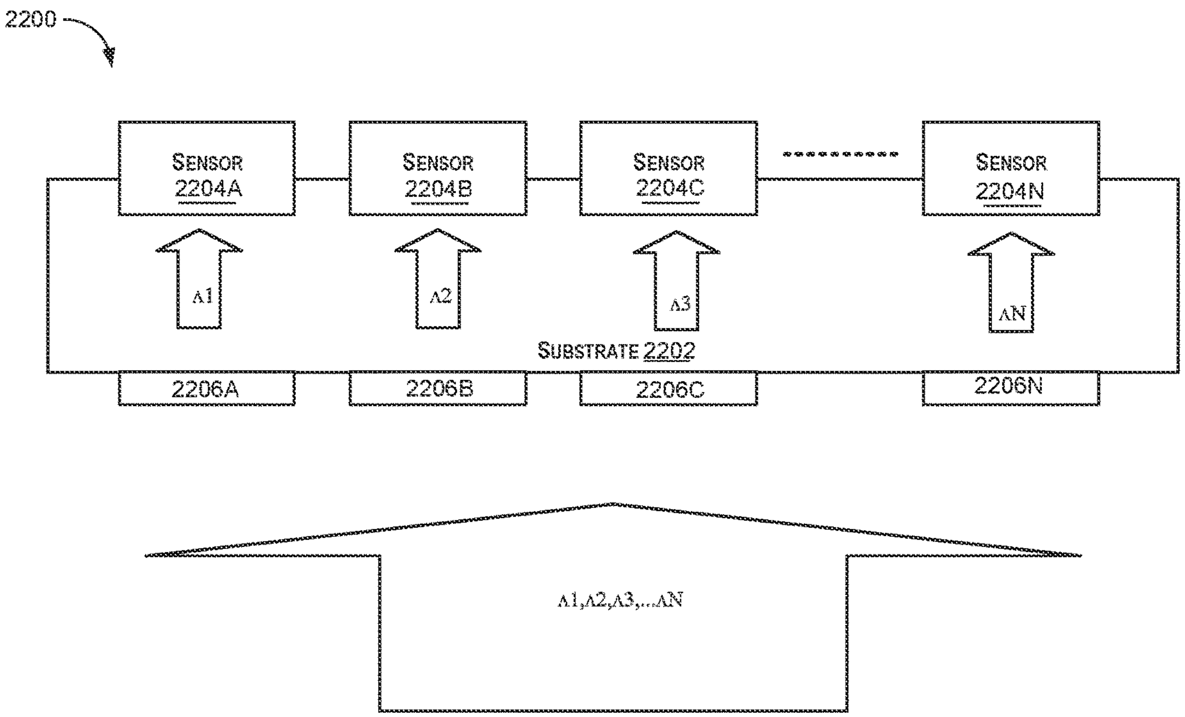
FIG. 22 depicts an example photo-detector array according to example aspects of the present disclosure.

Referring now to FIG. 22, a back-side-incident (BSI) photodetector array 2200 is depicted. The BSI photodetector array 2200 may be 1D array (as depicted in FIG. 19A) or 2D array (as depicted in FIG. 19B). The BSI photodetector array 2200 includes a substrate 2202 (e.g., silicon substrate) and N photodetectors 2204 (e.g., germanium photodetectors). The BSI photodetector array 2200 further includes N optical filters 2206 formed on the back of the substrate 2202 that each corresponds to one of the N photodetectors 2204. In some implementations, each of the N optical filters 2206 is a bandpass filter that is configured to pass an incident light having a wavelength (e.g., λ1) within a corresponding wavelength range, and blocks light having a wavelength (e.g., λ2) outside the corresponding wavelength range. The optical filters 2206 may be implemented using an absorption material, or multi-layer coating, or in-plane periodic/aperiodic grating. As an example, the bandpass filters 2206A, 2206B, 2206C, . . . , and 2206N may be configured to pass light having a wavelength of λ1, λ2, λ3, . . . , and λN, respectively. A broadband light that includes wavelengths λ1 to λN is incident to the BSI photodetector array 2200, and the bandpass filters 2206A, 2206B, 2206C, . . . , and 2206N may then filter the broadband light such that each of the sensors 2204A, 2204B, 2204C, and 2204N receives light having a wavelength of λ1, λ2, λ3, and λN, respectively. The detected signals at different wavelengths can be used for optical spectroscopy applications, for example.

Figure 23:
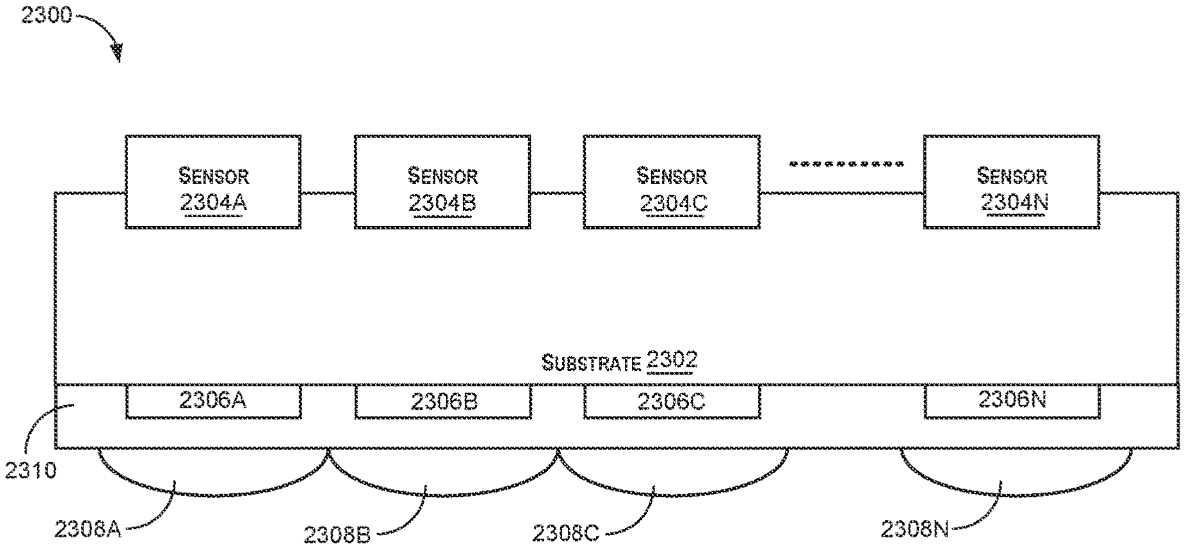
FIG. 23 depicts an example photo-detector array according to example aspects of the present disclosure.

Referring now to FIG. 23, a BSI photodetector array 2300 is depicted. The BSI photodetector array 2300 is similar to the BSI photodetector array 2200 and further includes micro-lens array 2308A-N for directing (e.g., focusing) the incident light to the photodetectors 2304A-N. The micro-lens array 2308A-N may be formed using silicon, oxide, polymer, or any other suitable materials. The BSI photodetector array 2300 may include a spacer 2310 to form a planar surface prior to forming the micro-lens array 2308 over the filter 2306A-N.

Figure 24A:
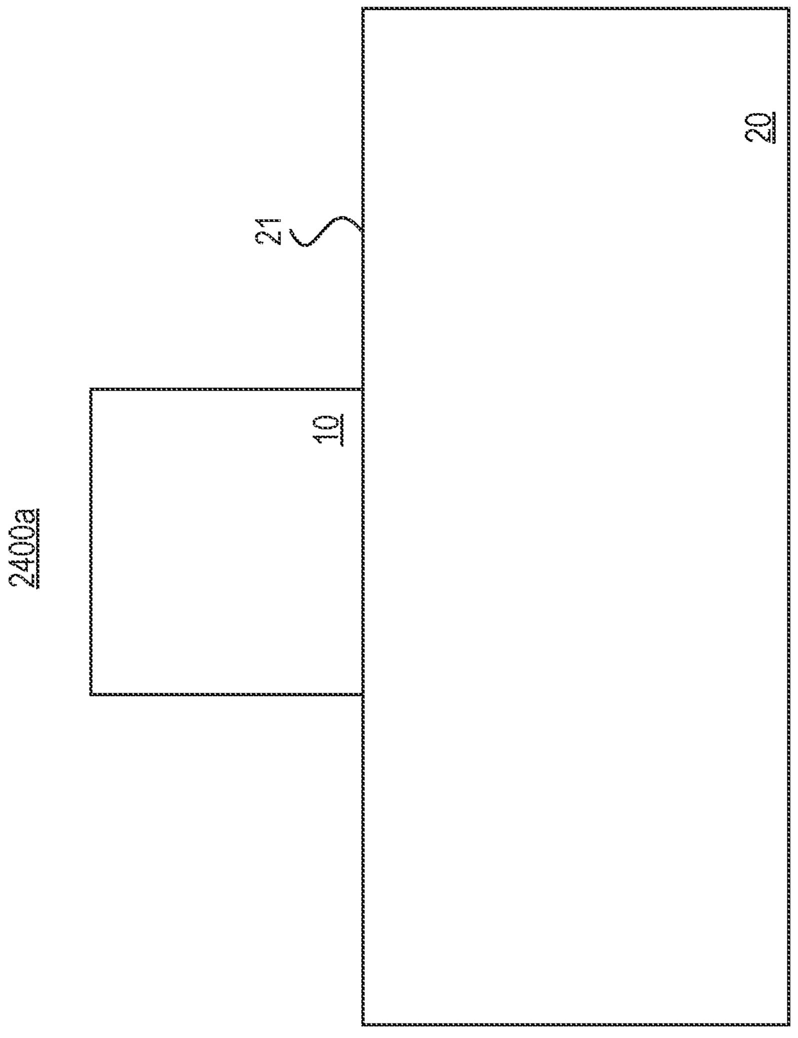
FIGS. 24A-24C illustrate cross-sectional views of a portion of a photo-detecting device.
Figure 24B:
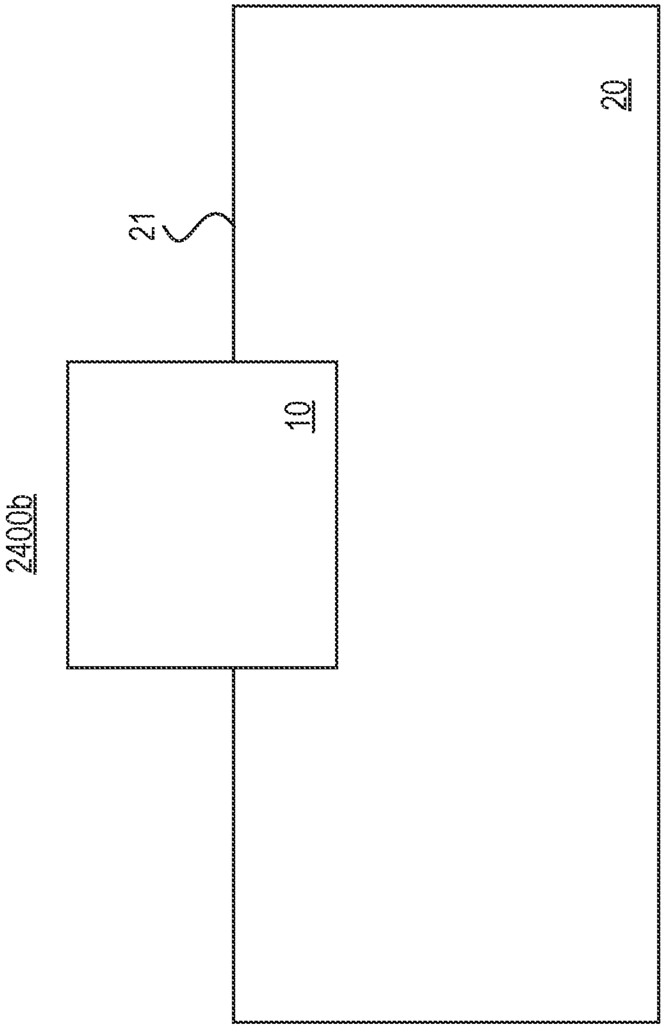
Figure 24C:
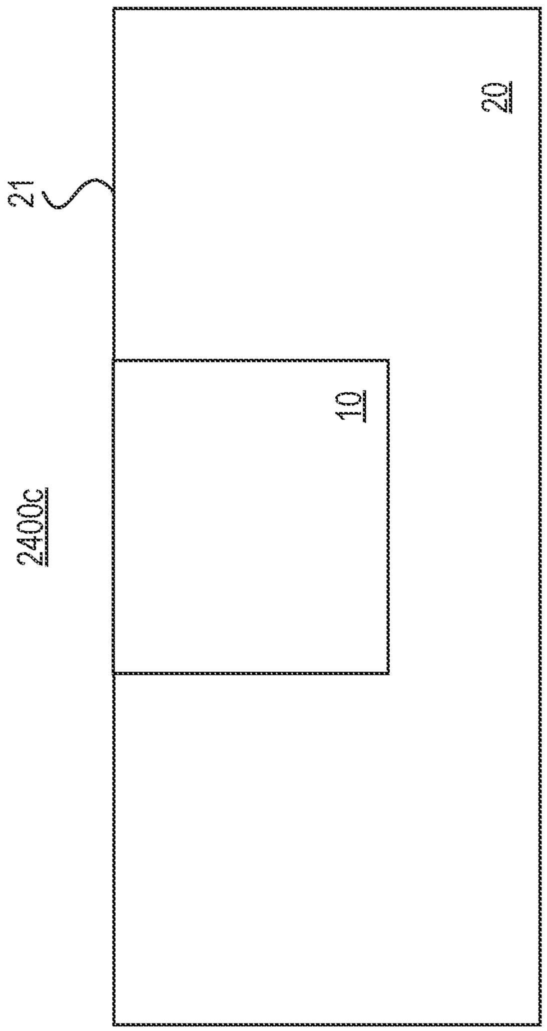

FIGS. 24A-24C illustrate cross-sectional views of a portion of a photo-detecting device 2400*a*, 2400*b*, 2400*c*, according to some embodiments. The photo-detecting device can include a structure substantially the same as any embodiments described before. In some embodiments, if not specifically mentioned in the previous description, referring to FIG. 24A, the absorption region 10 can be entirely on the first surface 21 of the substrate 20. Referring to FIG. 24B, the absorption region 10 can be partially embedded in the substrate 20. That is, a part of each of the side surfaces are in contact with the substrate 20. Referring to FIG. 24C, the absorption region 10 can be entirely embedded in the substrate 20. That is, the side surfaces are in contact with the substrate 20.

FIGS. 25A-25D show the examples of the control regions C1, C2, C3, C4 of a photo-detecting device according to some embodiments. The photo-detecting device can include a structure substantially the same as any embodiments described before.

Figure 25A:
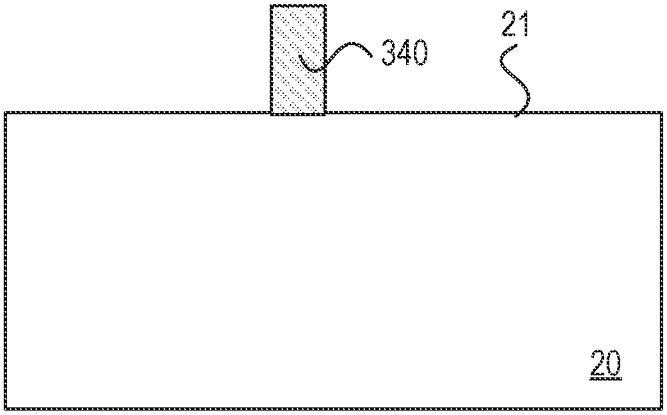
FIGS. 25A-25D show the examples of the control regions of a photo-detecting device according to some embodiments.

Referring to FIG. 25A, in some embodiments, the control electrode 340 can be over the first surface 21 of the substrate 20 with an intrinsic region right under the control electrode 340. The control electrode 340 may lead to formation of a Schottky contact, an Ohmic contact, or a combination thereof having an intermediate characteristic between the two, depending on various factors including the material of the substrate 20 or the material of the passivation layer and/or the material of the control electrode 340 and/or the dopant or defect level of the substrate 20 or the passivation layer 1400. The control electrode 340 may be any one of the control electrodes 340*a*, 340*b*, 340*c*, 340*d*.

Figure 25B:
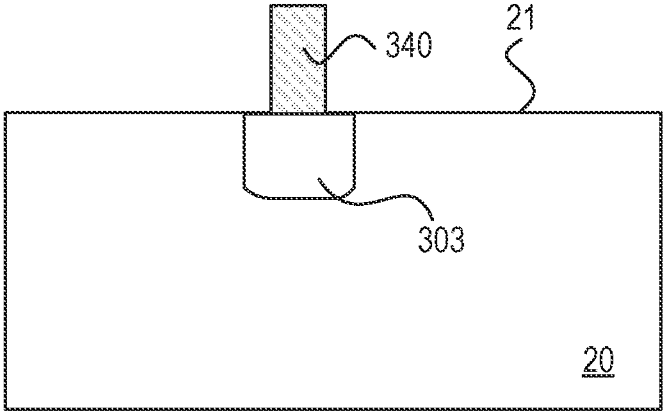

Referring to FIG. 25B, in some embodiments, the control region of the switch further includes a doped region 303 under the control electrodes 340 and in the substrate 20. In some embodiments, the doped region 303 is of a conductivity type different from the conductivity type of the first doped regions 302*a*,302*b*. In some embodiments, the doped region 303 include a dopant and a dopant profile. The peak dopant concentrations of the doped region 303 depend on the material of the control electrode 340 and/or the material of the substrate 20 and/or the dopant or defect level of the substrate 20, for example, between $1\times10^{17}$ $cm^{-3}$ to $5\times10^{20}$ $cm^{-3}$. The doped region 303 forms a Schottky or an Ohmic contact or a combination thereof with the control electrode 340. The doped region is for demodulating the carriers generated from the absorption region 10 based on the control of the control signals. The control electrode 340 may be any one of the control electrodes 340*a*, 340*b*, 340*c*, 340*d*.

Figure 25C:
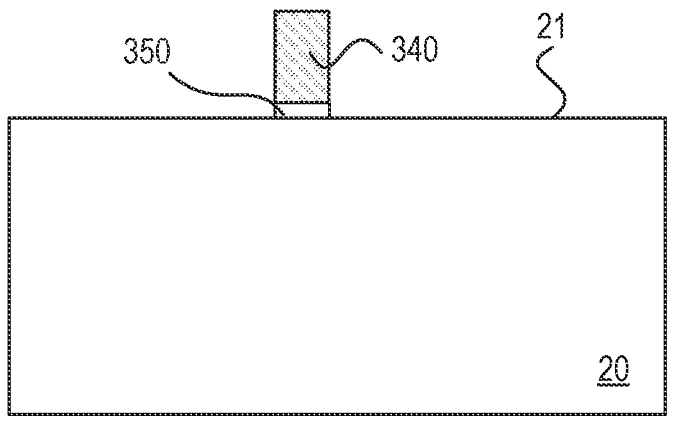

Referring to FIG. 25C, in some embodiments, the control region of the switch further includes a dielectric layer 350 between the substrate 20 and the control electrode 340. The dielectric layer 350 prevents direct current conduction from the control electrode 340 to the substrate 20, but allows an electric field to be established within the substrate 20 in response to an application of a voltage to the control electrode 340. The established electric field between two of the control regions, for example, between the control regions C1, C2, may attract or repel charge carriers within the substrate 20. The control electrode 340 may be any one of the control electrodes 340*a*, 340*b*, 340*c*, 340*d*.

Figure 25D:
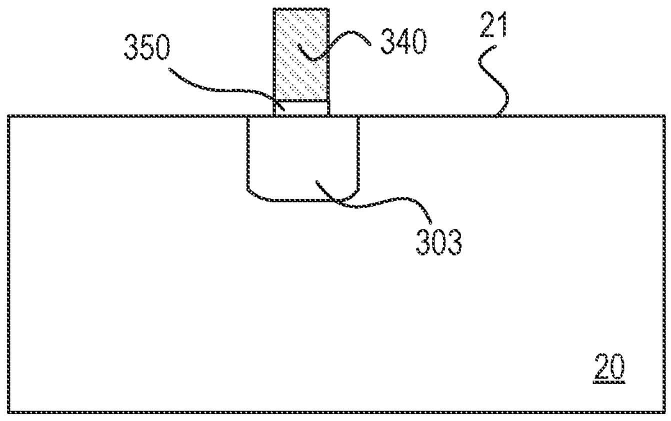

Referring to FIG. 25D, in some embodiments, the control region of the switch further includes a doped region 303 under the control electrodes 340 and in the substrate 20, and also includes a dielectric layer 350 between the substrate 20 and the control electrode 340. The control electrode 340 may be any one of the control electrodes 340*a*, 340*b*, 340*c*, 340*d*.

In some embodiments, the region of the carrier conducting layer right under the readout electrode may be intrinsic. For example, the region of the substrate right under the readout electrode of each of the switches may be intrinsic. For another example, the region of the passivation layer right under the readout electrode of each of the switches may be intrinsic. The readout electrode may lead to formation of a Schottky contact, an Ohmic contact, or a combination thereof having an intermediate characteristic between the two, depending on various factors including the material of the substrate 20 or the material of the passivation layer 1400 or the material of the passivation layer and/or the material of the readout electrode and/or the dopant or defect level of the substrate 20 or the passivation layer 1400.

In some embodiments, the dielectric layer 350 may include, but is not limited to $SiO_2$. In some embodiments, the dielectric layer 350 may include a high-k material including, but is not limited to, $Si_3N_4$, SiON, $SiN_x$, $SiO_x$, $GeO_x$, $Al_2O_3$, $Y_2O_3$, $TiO_2$, $HfO_2$ or $ZrO_2$. In some embodiments, the dielectric layer 350 may include semiconductor material but is not limited to amorphous Si, polycrystalline Si, crystalline Si, germanium-silicon, or a combination thereof.

In some embodiments, the conducting region 201 of the photo-detecting device can be any suitable design. Taking the conducting region 201 of the photo-detecting device in FIGS. 3A-3B, 4A-4C, 5A-5C, 6A-6G, 7A-7E, 8A-8E, 14C-14L as an example, a width of the conducting region 201 can be less than a distance between the control electrodes 340*a*, 340*b*. In some embodiments, the conducting region 201 may not be overlapped with any portion of the two doped regions 303 described in FIGS. 25B and 25D. In some embodiments, the conducting region 201 may be overlapped with a portion of the two doped regions 303 described in FIGS. 25B and 25D. In some embodiments, the conducting region 201 may be overlapped with the entire doped regions 303 described in FIGS. 25B and 25D. In some embodiments, the conducting region 201 may not be overlapped with any portion of each of the first doped regions 302*a*, 302*b*. In some embodiments, the conducting region 201 may be overlapped with a portion of each of the first doped regions 302*a*, 302*b*. In some embodiments, the conducting region 201 may be overlapped with the entire first doped regions 302*a*, 302*b*.

Taking the conducting region 201 of the photo-detecting device in FIGS. 10A, and 11A as another example, the conducting region 201 may not be overlapped with any portion of the third contact region 208. In some embodiments, the conducting region 201 may be overlapped with a portion of the third contact region 208. In some embodiments, the conducting region 201 may be overlapped with the entire third contact region 208. In some embodiments, the conducting region 201 may not be overlapped with any portion of the first contact region 204. In some embodiments, the conducting region 201 may be overlapped with a portion of the first contact region 204. In some embodiments, the conducting region 201 may be overlapped with the entire first contact region 204.

Taking the conducting region 201 of the photo-detecting device in FIGS. 1A-1D, and 2A-2F as another example, the conducting region 201 may not be overlapped with any portion of the first doped region 102. In some embodiments, the conducting region 201 may be overlapped with a portion of the first doped region 102. In some embodiments, the conducting region 201 may be overlapped with the entire the first doped region 102.

In some embodiments, any photo-detecting device mentioned above, for example, the photo-detecting device in FIGS. 1A-11E, 13A-15C, may include a waveguide similar to the waveguide 206 described in FIGS. 12A-12C, for guiding and/or confining the incident optical signal passing through a defined region of the substrate 20.

Figure 26A:
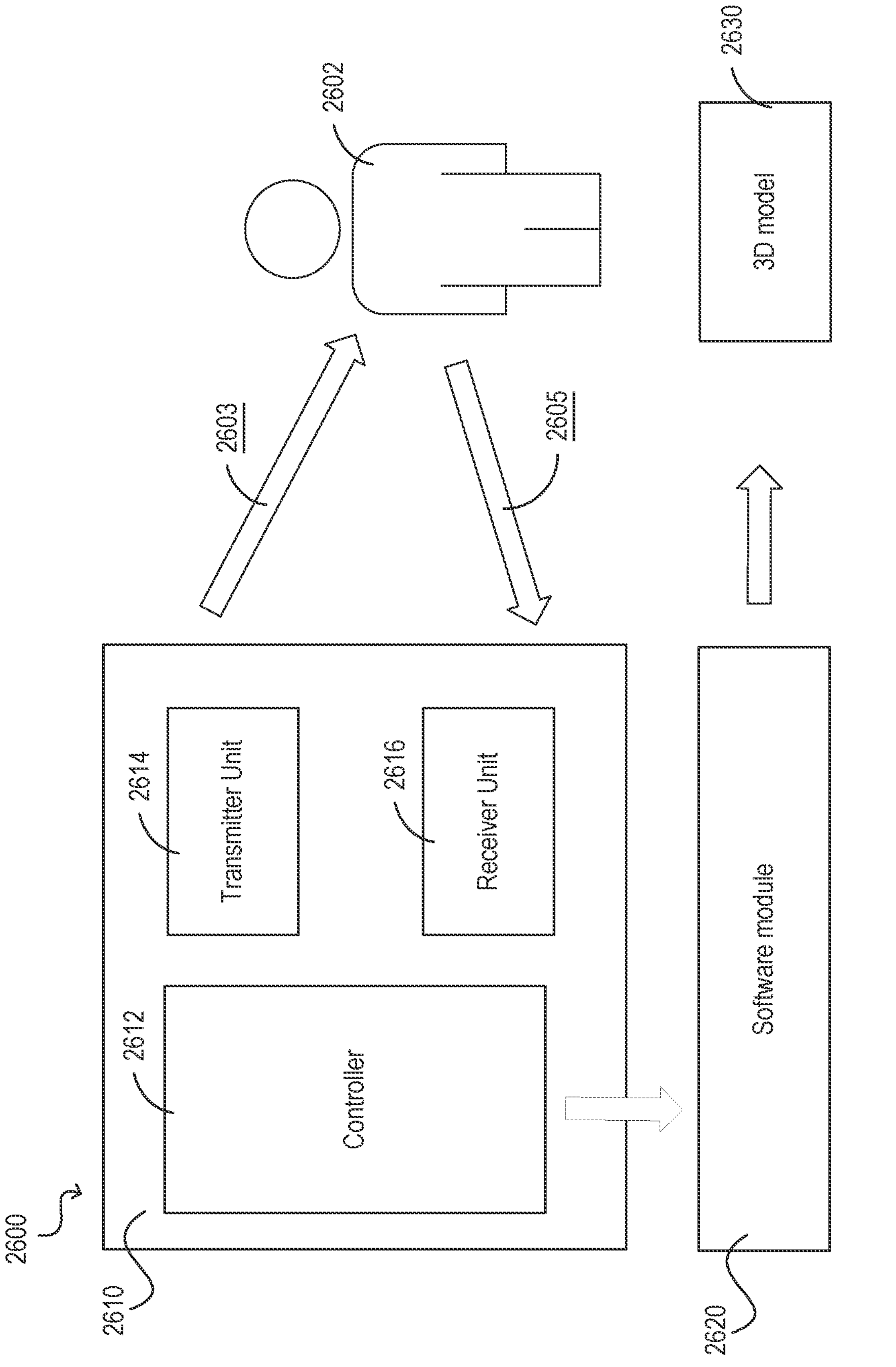
FIG. 26A is a block diagram of an example embodiment of an imaging system.

FIG. 26A is a block diagram of an example embodiment of an imaging system 2600. The imaging system 2600 may include a sensing module 2610 and a software module 2620 configured to reconstruct a three-dimensional (3D) model 2630 of a detected object. The imaging system 2600 or the sensing module 2610 may be implemented on a mobile device (e.g., a smartphone, a tablet, vehicle, drone, etc.), an ancillary device (e.g., a wearable device) for a mobile device, a computing system on a vehicle or in a fixed facility (e.g., a factory), a robotics system, a surveillance system, or any other suitable device and/or system.

The sensing module 2610 includes a transmitter unit 2614, a receiver unit 2616, and a controller 2612. During operation, the transmitter unit 2614 may emit an emitted light 2603 toward a target object 2602. The receiver unit 2616 may receive reflected light 2605 reflected from the target object 2602. The controller 2612 may drive at least the transmitter unit 2614 and the receiver unit 2616. In some implementations, the receiver unit 2616 and the controller 2612 are implemented on one semiconductor chip, such as a system-on-a-chip (SoC). In some cases, the transmitter unit 2614 is implemented by two different semiconductor chips, such a laser emitter chip on III-V substrate and a Si laser driver chip on Si substrate.

The transmitter unit 2614 may include one or more light sources, control circuitry controlling the one or more light sources, and/or optical structures for manipulating the light emitted from the one or more light sources. In some embodiments, the light source may include one or more light emitting diodes (LEDs) or vertical-cavity surface-emitting lasers (VCSELs) emitting light that can be absorbed by the absorption region in the photo-detecting apparatus. For example, the one or more LEDs or VCSEL may emit light with a peak wavelength within a visible wavelength range (e.g., a wavelength that is visible to the human eye), such as 570 nm, 670 nm, or any other applicable wavelengths. For another example, the one or more LEDs or VCSEL may emit light with a peak wavelength above the visible wavelength range, such as 850 nm, 940 nm, 1050 nm, 1064 nm, 1310 nm, 1350 nm, 1550 nm, or any other applicable wavelengths.

In some embodiments, the emitted light from the light sources may be collimated by the one or more optical structures. For example, the optical structures may include one or more collimating lens.

The receiver unit 2616 may include one or more photo-detecting apparatus according to any embodiment as mentioned above, e.g., 100*a*, 100*b*, 100*c*, 100*d*, 200*a*, 200*b*, 200*c*, 200*d*, 200*e*, 200*f*, 300*a*, or 400*a* 1500*a*, 1500*b*, or 1500*c*. The receiver unit 2616 may further include a control circuitry for controlling the control circuitry and/or optical structures for manipulating the light reflected from the target object toward the one or more photo-detecting apparatus. In some implementations, the optical structures include one or more lens that receive a collimated light and focus the collimated light towards the one or more photo-detecting apparatus.

In some embodiments, the controller 2612 includes a timing generator and a processing unit. The timing generator receives a reference clock signal and provides timing signals to the transmitter unit for modulating the emitted light. The timing signals are also provided to the receiver unit 2616 for controlling the collection of the photo-carriers. The processing unit processes the photo-carriers generated and collected by the receiver unit 2616 and determines raw data of the target object. The processing unit may include control circuitry, one or more signal processors for processing the information output from the photo-detecting apparatus, and/or computer storage medium that may store instructions for determining the raw data of the target object or store the raw data of the target object. As an example, the controller 2612 in an i-ToF sensor determines a distance between two points by using the phase difference between light emitted by the transmitter unit and light received by the receiver unit.

The software module 2620 may be implemented to perform in applications such as facial recognition, eye-tracking, gesture recognition, 3-dimensional model scanning/video recording, motion tracking, autonomous vehicles, and/or augmented/virtual reality.

Figure 26B:
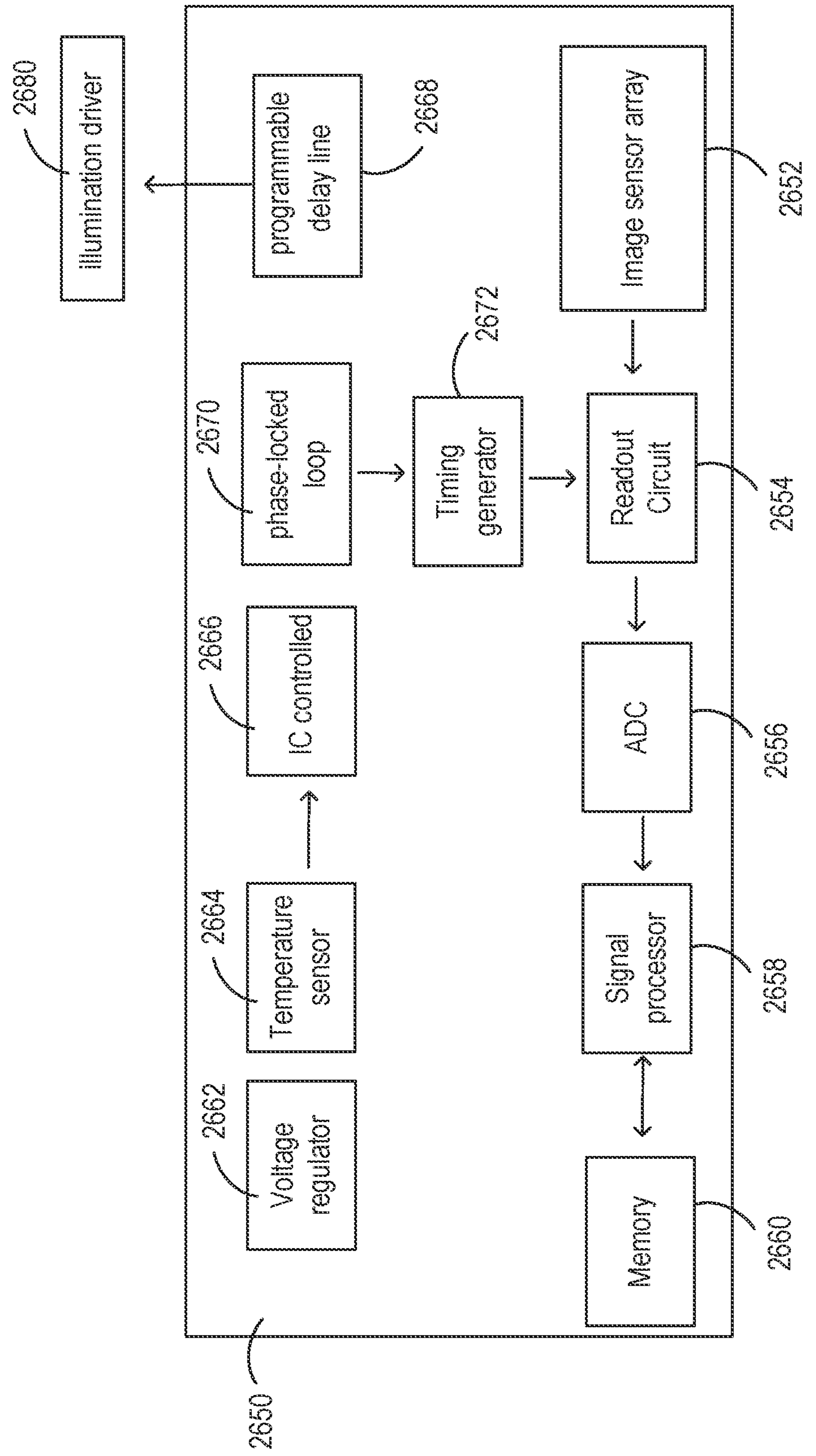
FIG. 26B shows a block diagram of an example receiver unit or the controller.

FIG. 26B shows a block diagram of an example device 2650 that can be a receiver unit or a controller. Here, an image sensor array 2652 (e.g., 240×180-pixel array) may be implemented using any implementations of the photo-detecting apparatus described in the present disclosure, e.g., 100*a*, 100*b*, 100*c*, 100*d*, 200*a*, 200*b*, 200*c*, 200*d*, 200*e*, 200*f*, 300*a*, 400*a*, 1500*a*, 1500*b*, or 1500*c*. A phase-locked loop (PLL) circuit 2670 (e.g., an integer-N PLL) may generate a clock signal (e.g., four-phase system clocks) for modulation and demodulation. Before sending to the image sensor array 2652 and an external illumination driver 2680, these clock signals may be gated and/or conditioned by a timing generator 2672 for a preset integration time and different operation modes. A programmable delay line 2668 may be added in the illumination driver path to delay the clock signals.

A voltage regulator 2662 may be used to control an operating voltage of the image sensor array 2652. For example, N voltage domains may be used for an image sensor. A temperature sensor 2664 may be implemented for the possible use of depth calibration and power control, and the IC controller 2666 can access the temperature information from the temperature sensor 2664.

The readout circuit 2654 of the photo-detecting apparatus bridges each of the photo-detecting apparatus of the image sensor array 2652 to a column analog-to-digital converter (ADC) 2656, where the ADC 2656 outputs may be further processed and integrated in the digital domain by a signal processor 2658 before reaching an output interface. A memory 2660 may be used to store the outputs by the signal processor 2658. In some implementations, the output interface may be implemented using a 2-lane, 1.2 Gb/s D-PHY MIPI transmitter, or using CMOS outputs for low-speed/low-cost systems. The digital data further conditioned by the signal processor 2658 is send out through a MIPI interface for further processing.

An inter-integrated circuit (I2C) interface may be used to access all of the functional blocks described here.

Figure 27:
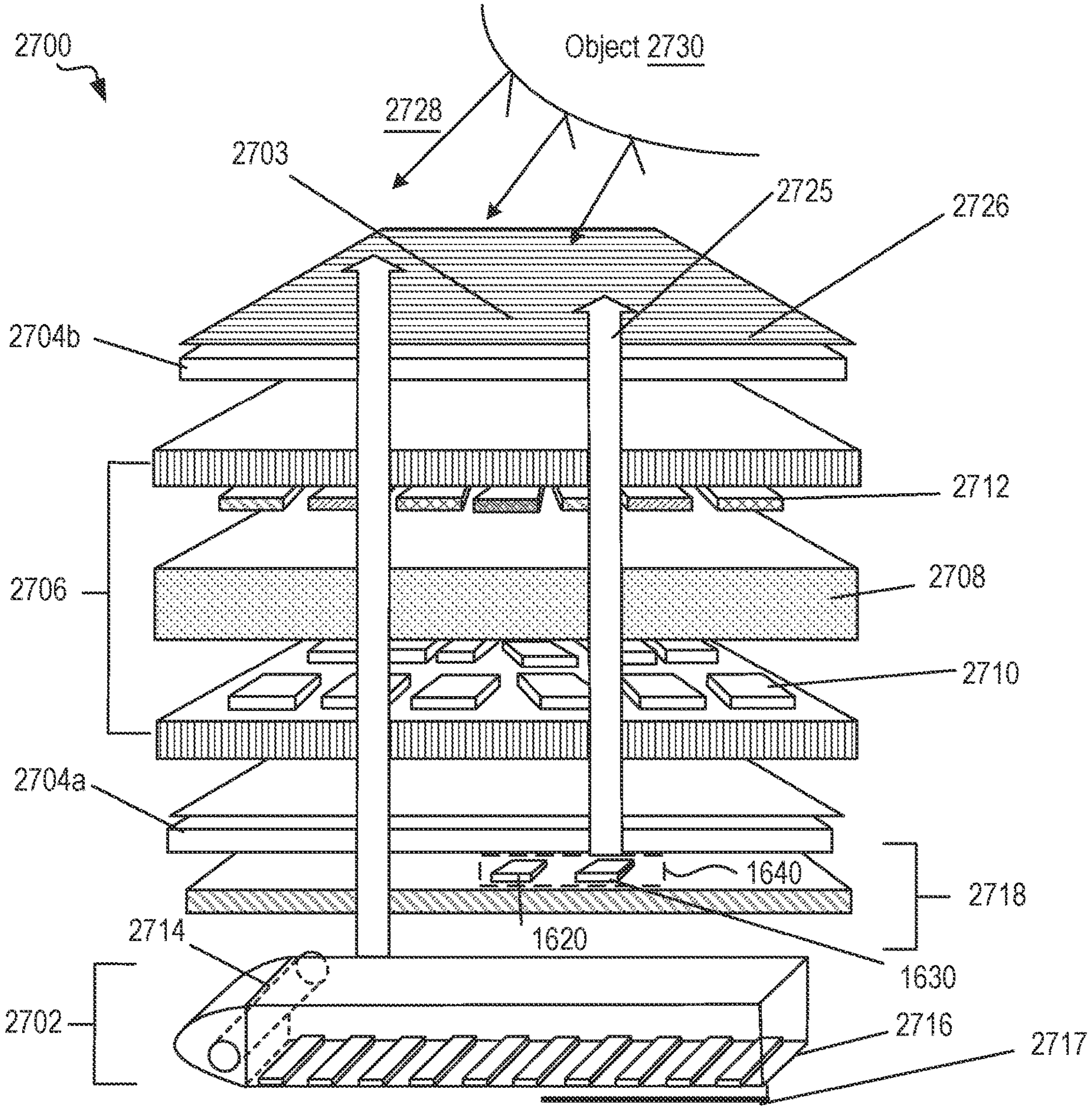
FIG. 27 is a schematic of an example display apparatus.

FIG. 27 is a schematic of an example display apparatus 2700 (e.g., liquid crystal-based display apparatus), which includes a backlight module 2702 emitting visible light 2703, a rear polarizer 2704*a* and a front polarizer 2704*b*, and a glass substrate module 2706. The glass substrate module 2706 includes the liquid crystal layer 2708, a TFT circuits layer 2710, and a color filter layer 2712. The backlight module 2702 includes a backlight source 2714, e.g., LEDs or fluorescent lamp, a light guiding plate 2716, and, optionally, a reflector 2717.

Additionally, the display apparatus 2700 includes an optical sensing apparatus 2718 according to any embodiments as mentioned above. For example, the optical sensing apparatus 2718 may include multiple transmitter-receiver sets 1640 as described in FIG. 17A, FIG. 17B or FIG. 17C and/or include integrated circuit layer 2150 including driver controlling the light source 1630 and the control circuit controlling the photodetector 1620.

In some embodiments, as depicted by example display apparatus 2700 in FIG. 27, the optical sensing apparatus 2718 is located between the backlight module 2702 and the rear polarizer 2704*a*, where light 2725 (e.g., NIR light) from the light source 1630 is directed substantially normal to a surface 2726 of the display apparatus 2700. Reflected NIR light 2728 that is reflected from a target object 2730 can be absorbed by the photodetector 1620 of the transmitter-receiver sets 1640 of the optical sensing apparatus 2718.

In some embodiments, p-type dopant includes a group-III element. In some embodiments, p-type dopant is boron. In some embodiments, n-type dopant includes a group-V element. In some embodiments, n-type dopant is phosphorous In the present disclosure, if not specifically mention, the absorption region is configured to absorb photons having a peak wavelength in an invisible wavelength range equal to or greater than 800 nm, such as 850 nm, 940 nm, 1050 nm, 1064 nm, 1310 nm, 1350 nm, or 1550 nm or any suitable wavelength range. In some embodiments, the absorption region receives an optical signal and converts the optical signal into electrical signals. The absorption region can be in any suitable shape, such as, but not limited to, cylinder, rectangular prism.

In the present disclosure, if not specifically mention, the absorption region has a thickness depending on the wavelength of photons to be detected and the material of the absorption region. In some embodiments, when the absorption region includes germanium and is designed to absorb photons having a wavelength equal to or greater than 800 nm, the absorption region has a thickness equal to or greater than 0.1 μm. In some embodiments, the absorption region includes germanium and is designed to absorb photons having a wavelength between 800 nm and 2000 nm, the absorption region has a thickness between 0.1 μm and 2.5 μm. In some embodiments, the absorption region has a thickness between 1 μm and 2.5 μm for higher quantum efficiency. In some embodiments, the absorption region may be grown using a blanket epitaxy, a selective epitaxy, or other applicable techniques.

In the present disclosure, if not specifically mention, the light shield has the optical window for defining the position of the absorbed region in the absorption region. In other words, the optical window is for allowing the incident optical signal enter into the absorption region and defining the absorbed region. In some embodiments, the light shield is on a second surface of the substrate distant from the absorption region when an incident light enters the absorption region from the second surface of the substrate. In some embodiments, a shape of the optical window can be ellipse, circle, rectangular, square, rhombus, octagon or any other suitable shape from a top view of the optical window.

In the present disclosure, if not specifically mention, in a same pixel, the type of the carriers collected by the first doped region of one of the switches and the type of the carriers collected by the first doped region of the other switch are the same. For example, when the photo-detecting apparatus is configured to collects electrons, when the first switch is switched on and the second switch is switched off, the first doped region in the first switch collects electrons of the photo-carriers generated from the absorption region, and when the second switch is switched on and the first switch is switched off, the first doped region in the second switch also collects electrons of the photo-carriers generated from the absorption region.

In the present disclosure, if not specifically mention, the first electrode, second electrode, readout electrode, and the control electrode include metals or alloys. For example, the first electrode, second electrode, readout electrode, and the control electrode include Al, Cu, W, Ti, Ta—TaN—Cu stack or Ti—TiN—W stack.

In the present disclosure, the photo-detecting apparatus, the optical apparatus or the photodiode may be used in consumer electronics products, image sensors, high-speed optical receiver, proximity, biometric sensing, data communications, direct/indirect time-of-flight (TOF) ranging or imaging sensors, medical devices, and many other suitable applications.

In some embodiments, if not specifically mention, the cross-sectional views shown in the present disclosure may be a cross-sectional view along any possible cross-sectional line of a photo-detecting apparatus or a photo-detecting device.

As used herein and not otherwise defined, the terms "substantially" and "about" are used to describe and account for small variations. When used in conjunction with an event or circumstance, the terms can encompass instances in which the event or circumstance occurs precisely as well as instances in which the event or circumstance occurs to a close approximation. For example, when used in conjunction with a numerical value, the terms can encompass a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

While the disclosure has been described by way of example and in terms of a preferred embodiment, it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

Those skilled in the art will readily observe that numerous modifications and alterations of the device and method may be made while retaining the teachings of the disclosure. Accordingly, the above disclosure should be construed as limited only by the metes and bounds of the appended claims.

What is claimed is:

1. An optical sensing apparatus, comprising:
a semiconductor substrate composed of a first material, wherein the semiconductor substrate includes a planar surface; and
a transmitter-receiver set supported by the semiconductor substrate and comprising:
one or more photodetectors each comprising an absorption region composed of a second material comprising germanium formed in a first recess of the semiconductor substrate and configured to receive an optical signal reflected from a target outside of the optical sensing apparatus and to generate photo-carriers in response to the optical signal, wherein the one or more photodetectors are configured for sensing to detect information of the target; and
one or more light sources each comprising a light-emitting region composed of a third material comprising germanium formed in a second recess of the semiconductor substrate and configured to emit a light out of the optical sensing apparatus toward the target,
wherein the absorption region comprises at least a property different from a property of the light-emitting region, wherein the property includes strain, conductivity type, peak doping concentration, or a ratio of the peak doping concentration to a peak doping concentration of the semiconductor substrate,
wherein the first material is different from the second material and the third material, wherein the one or more light sources are configured to emit the light at a direction that is out-of-plane from the planar surface of the semiconductor substrate towards the target outside of the optical sensing apparatus,
wherein the one or more photodetectors are configured to receive the optical signal at a direction that is out-of-plane from the planar surface of the semiconductor substrate from the target outside of the optical sensing apparatus,
wherein a first depth of the first recess is less than a second depth of the second recess, and
wherein the transmitter-receiver set comprises one or more buffer layers for adjusting a strain of the light-emitting region formed in the second recess prior to the light-emitting region formed in the second recess.

2. The optical sensing apparatus of claim 1, further comprising: an integrated circuit layer; and
a bonding layer between the integrated circuit layer and the transmitter-receiver set,
wherein the integrated circuit layer comprises an integrated circuit configured to control the light source and process the photo-carriers generated by the photodetector.

3. The optical sensing apparatus of claim 1, wherein the transmitter-receiver set comprises multiple light sources surrounding the photodetector.

4. The optical sensing apparatus of claim 1, wherein an area of the absorption region is different from an area of the light-emitting region.

5. The optical sensing apparatus of claim 1, wherein the photodetector comprises a one-dimensional array or a two-dimensional array of absorption regions.

6. The optical sensing apparatus of claim 1, wherein the first material comprises silicon, and wherein the second material and the third material comprise germanium.

7. The optical sensing apparatus of claim 1, wherein the light-emitting region is doped with an n-type dopant, and wherein the absorption region is doped with a p-type dopant.

8. The optical sensing apparatus of claim 1, wherein a first uppermost surface of the one or more photodetectors and a second uppermost surface of the one or more light sources are coplanar with the planar surface of the semiconductor substrate.

9. An optical sensing apparatus, comprising:
a semiconductor substrate composed of a first material, wherein the semiconductor substrate includes a planar surface; and
a transmitter-receiver set supported by the semiconductor substrate and comprising:
one or more photodetectors each comprising:
an absorption region configured to receive an optical signal reflected from a target and configured to generate photo-carriers in response to the optical signal, wherein the absorption region is composed of a second material comprising germanium formed in a first recess of the semiconductor substrate and doped with a first dopant having a first conductivity type and a first peak doping concentration; and a carrier guiding region formed in the semiconductor substrate and doped with a second dopant having a second conductivity type different from the first conductivity type and a second peak doping concentration, wherein the carrier guiding region is in contact with the absorption region to form at least one heterointerface, and wherein a ratio between the first peak doping concentration of the absorption region and the second peak doping concentration of the carrier guiding region is equal to or greater than 10; and one or more light sources each comprising a light-emitting region composed of a third material comprising germanium formed in a second recess of the semiconductor substrate and configured to emit a light toward the target outside of the optical sensing apparatus, wherein the first material is different from the second material and the third material, wherein the one or more light sources are configured to emit the light at a direction that is out-of-plane from the planar surface of the semiconductor substrate towards the target outside of the optical sensing apparatus, wherein the one or more photodetectors are configured to receive the optical signal at a direction that is out-of-plane from the planar surface of the semiconductor substrate from the target outside of the optical sensing apparatus, wherein a first depth of the first recess is less than a second depth of the second recess, and wherein the transmitter-receiver set comprises one or more buffer layers for adjusting a strain of the light-emitting region formed in the second recess prior to the light-emitting region formed in the second recess.

10. The optical sensing apparatus of claim 9, wherein the first conductivity type is p-type, and the light-emitting region is doped with an n-type dopant.

11. The optical sensing apparatus of claim 9, further comprising:

an integrated circuit layer; and a bonding layer between the integrated circuit layer and the transmitter-receiver set, wherein the integrated circuit layer comprises an integrated circuit configured to control the light source and process the photo-carriers generated by the photodetector.

12. The optical sensing apparatus of claim 9, wherein the transmitter-receiver set comprises multiple light sources surrounding the photodetector.

13. The optical sensing apparatus of claim 9, wherein an area of the absorption region is different from an area of the light-emitting region.

14. The optical sensing apparatus of claim 9, wherein the light-emitting region has a strain different from the strain of the absorption region.

15. The optical sensing apparatus of claim 9, wherein the photodetector comprises a one-dimensional array or a two-dimensional array of absorption regions.

16. The optical sensing apparatus of claim 9, wherein the first material comprises silicon, the second material and the third material comprise germanium.

17. The optical sensing apparatus of claim 9, wherein the photodetector is configured for proximity sensing or depth sensing.

18. The optical sensing apparatus of claim 9, wherein a first uppermost surface of the one or more photodetectors and a second uppermost surface of the one or more light sources are coplanar with the planar surface of the semiconductor substrate.

* * * * *